United States Patent
Gorokhovsky

(10) Patent No.: US 10,304,665 B2
(45) Date of Patent: May 28, 2019

(54) REACTORS FOR PLASMA-ASSISTED PROCESSES AND ASSOCIATED METHODS

(71) Applicant: Vladimir Gorokhovsky, Lafayette, CO (US)

(72) Inventor: Vladimir Gorokhovsky, Lafayette, CO (US)

(73) Assignee: Nano-Product Engineering, LLC, Lafayette, CO (US)

( * ) Notice: Subject to any disclaimer, the term of this patent is extended or adjusted under 35 U.S.C. 154(b) by 399 days.

(21) Appl. No.: 15/047,284

(22) Filed: Feb. 18, 2016

(65) Prior Publication Data

US 2018/0247797 A1    Aug. 30, 2018

Related U.S. Application Data

(63) Continuation-in-part of application No. 14/483,093, filed on Sep. 10, 2014, now Pat. No. 9,761,424, which
(Continued)

(51) Int. Cl.
*H01J 37/32* (2006.01)
*C23C 16/27* (2006.01)
(Continued)

(52) U.S. Cl.
CPC .... *H01J 37/32633* (2013.01); *C23C 14/0605* (2013.01); *C23C 14/0641* (2013.01);
(Continued)

(58) Field of Classification Search
CPC ........... H01J 37/32055; H01J 37/32357; H01J 37/3244; H01J 37/32467; H01J 37/32522;
(Continued)

(56) References Cited

U.S. PATENT DOCUMENTS 636,270 A    11/1899 Loos
3,127,608 A    3/1964 Eldredge
(Continued)

FOREIGN PATENT DOCUMENTS

EP    2602354    12/2013
JP    06272037 A    9/1994
(Continued)

OTHER PUBLICATIONS

H.S.Shin, D.G.Goodwin, Deposition of diamond coatings on particles in a microwave plasma-emhanced fluidized bed reactor, Material letters 19 (1994) 119-122.
(Continued)

*Primary Examiner* — Rodney G McDonald
(74) *Attorney, Agent, or Firm* — Lathrop Gage LLP

(57) ABSTRACT

A reactor for plasma-assisted chemical vapor deposition includes a plasma duct for containing one or more substrates to be coated by ions; an arc discharge generation system for generating a flow of electrons through the plasma duct from a proximal end toward a distal end of the plasma duct; a gas inlet coupled to the distal end for receiving a reactive gas; a gas outlet coupled to the proximal end for removing at least a portion of the reactive gas to generate a flow of the reactive gas through the plasma duct from the distal end toward the proximal end, to generate the ions from collisions between the electrons and the reactive gas; and a separating baffle positioned for restricting flow of the reactive gas out of the plasma duct to maintain a high pressure in the plasma duct to increase rate of deposition of the ions onto the substrates.

20 Claims, 89 Drawing Sheets

Related U.S. Application Data is a continuation-in-part of application No. 13/602,316, filed on Sep. 3, 2012, now abandoned.

(60) Provisional application No. 61/532,023, filed on Sep. 7, 2011.

(51) Int. Cl.

| | |
|---|---|
| *C23C 16/34* | (2006.01) |
| *C23C 16/455* | (2006.01) |
| *C23C 16/458* | (2006.01) |
| *C23C 16/50* | (2006.01) |
| *C23C 16/442* | (2006.01) |
| *C23C 14/32* | (2006.01) |
| *C23C 14/50* | (2006.01) |
| *C23C 14/06* | (2006.01) |
| *C23C 14/22* | (2006.01) |
| *C23C 14/35* | (2006.01) |
| *C23C 14/56* | (2006.01) |
| *C23C 16/02* | (2006.01) |
| *C23C 16/04* | (2006.01) |
| *C23C 16/26* | (2006.01) |
| *H01J 37/34* | (2006.01) |

(52) U.S. Cl.
CPC ............ *C23C 14/22* (2013.01); *C23C 14/223* (2013.01); *C23C 14/325* (2013.01); *C23C 14/35* (2013.01); *C23C 14/50* (2013.01); *C23C 14/564* (2013.01); *C23C 16/029* (2013.01); *C23C 16/045* (2013.01); *C23C 16/26* (2013.01); *C23C 16/27* (2013.01); *C23C 16/342* (2013.01); *C23C 16/442* (2013.01); *C23C 16/458* (2013.01); *C23C 16/45591* (2013.01); *C23C 16/50* (2013.01); *H01J 37/32055* (2013.01); *H01J 37/3266* (2013.01); *H01J 37/32357* (2013.01); *H01J 37/32522* (2013.01); *H01J 37/32532* (2013.01); *H01J 37/32614* (2013.01); *H01J 37/32715* (2013.01); *H01J 37/32816* (2013.01); *H01J 37/3402* (2013.01); *H01J 37/3405* (2013.01); *H01J 37/3447* (2013.01); *H01J 37/3458* (2013.01); *H01J 2237/332* (2013.01)

(58) Field of Classification Search
CPC ........... H01J 37/32532; H01J 37/32614; H01J 37/32633; H01J 37/3266; H01J 37/32715; H01J 37/32816; H01J 37/3402; H01J 37/3405; H01J 37/3447; H01J 37/3458; H01J 2237/332
USPC ........................................ 204/298.41, 192.38
See application file for complete search history.

(56) References Cited

U.S. PATENT DOCUMENTS

| | | | |
|---|---|---|---|
| 4,038,171 A | 7/1977 | Moss et al. | |
| 4,111,783 A | 9/1978 | Bindell et al. | |
| 4,140,943 A | 2/1979 | Ehlers | |
| 4,404,077 A | 9/1983 | Fournier | |
| 4,434,038 A | 2/1984 | Morrison, Jr. | |
| 4,494,043 A | 1/1985 | Stallings et al. | |
| 4,588,490 A | 5/1986 | Cuomo et al. | |
| 4,730,334 A | 3/1988 | Collins et al. | |
| 4,762,756 A | 8/1988 | Bergmann et al. | |
| 5,026,466 A | 6/1991 | Wesemeyer et al. | |
| 5,076,051 A | 12/1991 | Naff et al. | |
| 5,087,434 A | 2/1992 | Frenklach et al. | |
| 5,111,656 A | 5/1992 | Simon et al. | |
| 5,133,849 A | 7/1992 | Kinoshita et al. | |
| 5,218,179 A | 6/1993 | Matossian | |
| 5,262,032 A | 11/1993 | Hartig et al. | |
| 5,294,322 A | 3/1994 | Vetter et al. | |
| 5,317,235 A | 5/1994 | Treglio | |
| 5,358,596 A | 10/1994 | Cappelli et al. | |
| 5,435,900 A | 7/1995 | Gorokhovsky | |
| 5,458,754 A | 10/1995 | Sathrum et al. | |
| 5,468,363 A | 11/1995 | Falabella | |
| 5,478,608 A | 12/1995 | Gorokhovsky | |
| 5,480,527 A | 1/1996 | Welty | |
| 5,486,096 A | 1/1996 | Hertel et al. | |
| 5,503,725 A | 4/1996 | Sablev et al. | |
| 5,554,255 A | 9/1996 | Karner et al. | |
| 5,578,831 A | 11/1996 | Hershcovitch | |
| 5,580,429 A | 12/1996 | Chan et al. | |
| 5,587,207 A | 12/1996 | Gorokhovsky | |
| 5,601,654 A | 2/1997 | Springer | |
| 5,616,373 A | 4/1997 | Karner et al. | |
| 5,640,843 A | 6/1997 | Aston | |
| 5,733,418 A | 3/1998 | Hershcovitch et al. | |
| 5,753,045 A | 5/1998 | Karner et al. | |
| 5,783,335 A | 7/1998 | Laia, Jr. et al. | |
| 5,858,477 A * | 1/1999 | Veerasamy | C03C 17/22 427/131 |
| 5,876,572 A | 3/1999 | Rickerby et al. | |
| 5,902,462 A | 5/1999 | Krauss | |
| 5,902,649 A | 5/1999 | Karner et al. | |
| 5,944,901 A | 8/1999 | Landes et al. | |
| 6,027,619 A * | 2/2000 | Cathey | C23C 14/046 204/192.38 |
| 6,042,900 A | 3/2000 | Rakhimov et al. | |
| 6,153,067 A | 11/2000 | Maishev et al. | |
| 6,296,742 B1 | 10/2001 | Kouznetsov | |
| 6,300,720 B1 | 10/2001 | Birx | |
| 6,477,216 B2 | 11/2002 | Koloc | |
| 6,495,002 B1 | 12/2002 | Klepper et al. | |
| 6,521,104 B1 | 2/2003 | Kidd et al. | |
| 6,630,799 B2 | 10/2003 | Fleming et al. | |
| 6,635,156 B1 | 10/2003 | Dodonov et al. | |
| 6,645,354 B1 | 11/2003 | Gorokhovsky | |
| 6,663,755 B2 | 12/2003 | Gorokhovsky | |
| 6,692,617 B1 | 2/2004 | Fu et al. | |
| 6,703,081 B2 | 3/2004 | Karner et al. | |
| 6,756,596 B2 | 6/2004 | Sathrum | |
| 6,758,949 B2 | 7/2004 | Wang et al. | |
| 6,767,436 B2 | 7/2004 | Wei | |
| 6,812,164 B2 | 11/2004 | Yamaguchi et al. | |
| 6,905,582 B2 | 6/2005 | Kidd et al. | |
| 6,922,455 B2 | 7/2005 | Jurczyk et al. | |
| 6,923,891 B2 | 8/2005 | Cheah et al. | |
| 6,926,811 B2 | 8/2005 | Morstein et al. | |
| 7,014,738 B2 | 3/2006 | Shi et al. | |
| 7,033,682 B1 | 4/2006 | Rai et al. | |
| 7,052,736 B2 | 5/2006 | Wei et al. | |
| 7,147,759 B2 | 12/2006 | Chistyakov | |
| 7,229,675 B1 | 6/2007 | Paderov et al. | |
| 7,252,745 B2 | 8/2007 | Gorokhovsky | |
| 7,300,559 B2 | 11/2007 | Gorokhovsky | |
| 7,327,089 B2 | 2/2008 | Madocks | |
| 7,351,480 B2 | 4/2008 | Wei et al. | |
| 7,381,311 B2 | 6/2008 | Aksenov et al. | |
| 7,459,704 B2 | 12/2008 | Olson et al. | |
| 7,498,587 B2 | 3/2009 | Welty | |
| 7,541,069 B2 | 6/2009 | Tudhope et al. | |
| 7,581,933 B2 | 9/2009 | Bruce et al. | |
| 7,744,039 B2 | 6/2010 | Miles et al. | |
| 8,034,459 B2 | 10/2011 | Wei et al. | |
| 8,105,660 B2 | 1/2012 | Tudhope et al. | |
| 8,118,561 B2 | 2/2012 | Bruce et al. | |
| 8,147,765 B2 | 4/2012 | Muradov et al. | |
| 8,157,976 B2 | 4/2012 | Druz et al. | |
| 8,282,794 B2 | 10/2012 | Gorokhovsky | |
| 8,500,975 B2 | 8/2013 | Le et al. | |
| 8,541,069 B2 | 9/2013 | Greenberg et al. | |
| 8,715,789 B2 | 5/2014 | Upadhyaya et al. | |
| 8,796,581 B2 | 8/2014 | Foret | |
| 8,895,115 B2 | 11/2014 | Gorokhovsky | |
| 9,257,263 B2 | 2/2016 | Gorokhovsky | |

(56) References Cited

U.S. PATENT DOCUMENTS

| | | | |
|---|---|---|---|
| 2002/0000368 A1* | 1/2002 | Weichart | H01J 37/321 204/192.12 |
| 2002/0007796 A1 | 1/2002 | Gorokhovsky | |
| 2002/0015788 A1* | 2/2002 | Callaway | C23C 14/541 427/248.1 |
| 2003/0047444 A1 | 3/2003 | Boxman | |
| 2003/0085123 A1 | 5/2003 | Shi et al. | |
| 2003/0089601 A1 | 5/2003 | Ding et al. | |
| 2004/0055538 A1* | 3/2004 | Gorokhovsky | C23C 14/0605 118/715 |
| 2004/0055884 A1 | 3/2004 | Fujii et al. | |
| 2004/0123801 A1 | 7/2004 | Lee et al. | |
| 2004/0126492 A1 | 7/2004 | Weaver et al. | |
| 2004/0168637 A1* | 9/2004 | Gorokhovsky | C23C 14/022 118/723 ER |
| 2004/0173929 A1* | 9/2004 | Ghosh | C23C 14/12 264/122 |
| 2004/0264044 A1 | 12/2004 | Konishi et al. | |
| 2005/0249983 A1 | 11/2005 | Stirniman et al. | |
| 2006/0251917 A1 | 11/2006 | Chiang et al. | |
| 2007/0000770 A1 | 1/2007 | Yamamoto | |
| 2007/0017804 A1 | 1/2007 | Myrtveit et al. | |
| 2007/0087185 A1 | 4/2007 | Wei et al. | |
| 2007/0137566 A1 | 6/2007 | Csell et al. | |
| 2008/0035470 A1 | 2/2008 | Tietema et al. | |
| 2008/0286108 A1 | 11/2008 | Lui et al. | |
| 2008/0298910 A1 | 12/2008 | Weber et al. | |
| 2009/0065350 A1 | 3/2009 | Anders | |
| 2009/0078565 A1 | 3/2009 | Rodmar et al. | |
| 2009/0092596 A1 | 4/2009 | Haley et al. | |
| 2009/0214787 A1 | 8/2009 | Wei et al. | |
| 2010/0063344 A1 | 3/2010 | Kotschenreuther et al. | |
| 2010/0086397 A1 | 4/2010 | Varanasi et al. | |
| 2010/0143700 A1 | 6/2010 | Champagne et al. | |
| 2010/0264016 A1 | 10/2010 | Anders et al. | |
| 2010/0314247 A1 | 12/2010 | Takashima | |
| 2011/0100800 A1 | 5/2011 | Gorokhovsky | |
| 2011/0111190 A1 | 5/2011 | Wei et al. | |
| 2011/0226617 A1 | 9/2011 | Hofmann et al. | |
| 2012/0008728 A1 | 1/2012 | Fleming | |
| 2012/0070963 A1 | 3/2012 | Martin et al. | |
| 2012/0114871 A1 | 5/2012 | Gorokhovsky | |
| 2012/0148762 A1 | 6/2012 | Wei et al. | |
| 2012/0199070 A1 | 8/2012 | Brondum | |
| 2012/0231177 A1 | 9/2012 | Wei et al. | |
| 2013/0122317 A1 | 5/2013 | Cheruvu et al. | |
| 2014/0076715 A1 | 3/2014 | Gorokhovsky et al. | |
| 2014/0076716 A1 | 3/2014 | Gorokhovsky et al. | |
| 2014/0076718 A1 | 3/2014 | Gorokhovsky et al. | |
| 2014/0093378 A1 | 4/2014 | Clavette et al. | |
| 2014/0272166 A1 | 9/2014 | Shim et al. | |

FOREIGN PATENT DOCUMENTS

| | | |
|---|---|---|
| RU | 2097868 | 11/1997 |
| RU | 2364003 | 8/2009 |
| RU | 2430992 | 5/2011 |
| SU | 289458 | 6/1968 |
| SU | 820635 | 12/1980 |
| SU | 1297337 | 11/1985 |
| SU | 1240325 | 2/1986 |
| SU | 1324178 | 3/1987 |
| SU | 1356947 | 8/1987 |
| SU | 1396950 | 1/1988 |
| SU | 1398760 | 1/1988 |
| SU | 1400457 | 2/1988 |
| SU | 1519519 | 7/1989 |

OTHER PUBLICATIONS

J. Karner, High current d.c. arc (HCDCA) technique for diamond deposition, Diamond and Related Materials 5 (1996) 217-220.

T. Kojima et al., Development of a plasma jetting fluidized bed reactor, Journal de Physique IV Colloque C2, suppl. au Journal de Physique 11, vol. 1, Sep. 1991, pp. C2-429-C2-436.

A. Feuerstein, A. Kleiman, Ti—N multilayer systems for compressor airfoils and erosion protection, Surface & Coatings Technology 204 (2009) 1092-1096.

H. Mitura, "Haemocompatibility of Non-Functionalized and Plasmachemical Functionalized Detonation Nanodiamond Particles," Archives of Metallurgy and Materials, vol. 60, No. 3, 2180-2189.

Aksenov et al. (2009) "Two-Cathode Filtered Vacuum-Arc Plasma Source," IEEE Transactions on Plasma Science. 37(8):1511-1516.

Aksenov et al. (2010) "Adjustment of the Ti—Al—N coatings deposited on C Two channel vacuum arc filtered plasma source (English Translation)," *Physical Surface Engineering (English Translation)*. 8(4):307-313. English Abstract Only.

Aksenov et al. (2011) "Plasma Streams Mixing in Two Channel T-Shaped Magnetic Filter," *Voprosy Atomnoj Nauki i Tekhniki*. 44:116-120.

Andersson et al. (2008) "Gasless Sputtering: Opportunities for Ultraclean Metallization, Coatings in Space, and Propulsion," *Applied Physics Letters*. 92:221503 pp. 1-3.

Bhat et al. (Nov. 1999) "Development of a Coating for Wear and Cracking Prevention in Die-Casting Dies by the Filtered Cathodic Arc Process," In; Transactions of the North American Die Casting Association, 20th International Die Casting Congress and Exposition. Cleveland, OH. pp. 391-399.

Bhattacharya (1999) "Advanced Thermal Barrier Coatings," *Universal Energy Systems, Inc.* Final Report to the Materials and Manufacturing Directorate Air Force Research Laboratory: May 3, 1999 to Feb. 3, 2000. Document No. AFRL-ML-WP-TR-2000-4099.

Degout et al. (1995) "High Current Density Triode Magnetron Sputtering," *Surface and Coating Technology*. 57:105-110.

Ensinger (1999) "Processing of powder surfaces by ion beam techniques," *Nuclear Instruments and Methods in Physics Research B*. 148:17-24.

Gorokhovsky (2005) "Characterization of Cascade Arc Assisted CVD Diamond Coating Technology. Part I. Plasma processing parameters," *Surface and Coatings Technology*. 194:344-362.

Gorokhovsky (2010) "LAFAD-Assisted Plasma Surface Engineering Processes for Wear and Corrosion Protection: A Review," In; *Advanced Ceramic Coatings and Interfaces V: Ceramic Engineering and Science Proceedings*. Eds.: Zhu , D.; Lin, H. p. 104-122.

Gorokhovsky et al. (1993) "Processes in Plasma-Arc Installations for Vacuum Depositions, Part I: Plasma Generation," *Surface and Coatings Technology*. 61:101-107.

Gorokhovsky et al. (1995) "Distributed Arc Sources," In; *Hanbook of Vacuum Arc Science and Technology*. Ed.: Boxman, R.; Martin, P.; Sanders, D. *Noyes Publications*. pp. 423-444.

Gorokhovsky et al. (1999) "Advantages of Filtered Arc Deposition," Business and Technical News from Balzers Materials. Issue 7.

Gorokhovsky et al. (1999) "Principles and Applications of Vacuum Arc Plasma-assisted Surface Engineering Technologies," In; *Proceedings of the GOI-UNDP International Workshop on Surface Endineering and Coatings*. Eds: Rajagopal, I.; Rajam, K.; Krishnan, R. *Allied Publishers Ltd*. Mumbai, India. pp. 381-399.

Gorokhovsky et al. (2008) "Deposition and characterization of hybrid filtered arc/magnetron multilayer nanocomposite cermet coatings for advanced tribological applications," *Wear*. 265:741-755.

Gorokhovsky et al. (2009) "Deposition of various metal, ceramic, and cermet coatings by an industrial-scale large area filtered arc deposition process," *J. Vac. Sci. Technol. A*. 27(4):1080-1095.

Gorokhovsky et al. (2009) "LAFAD Hard Ceramic and Cermet Coatings for Erosion Protection of Turbomachinery Components," In; Proceedings of ASME Turbo Expo 2009: Power for Land, Sea and Air. Orlando, Florida, USA. Document No. GT2009-59391.

Gorokhovsky et al. (Jan. 25, 2013) "Ion treatment by low pressure arc plasma immersion surface engineering processes," *Surface & Coatings Technology*. 215:431-439.

Gorokhovsky et al. (2011) "Evaluation of SOFC Interconnects Made of Ferritic Steels with Nano-Structured Oxi-Ceramic Protec-

(56) References Cited

OTHER PUBLICATIONS tive Coatings Deposited by the LAFAD Process," *Journal of The Electrochemical Society.* 158(5):6526-6535.
Li et al. (1999) "A description of metal-vapour production in a hollow-cylindrical magnetron sputtering discharge," *J. Phys. D: Appl. Phys.* 32:1039-1043.
Luchaninov (2012) "Coating System Ti—Al—N, Caused by PVD (English Translation)," *Physical Surface Engineering (English Translation).* 10(1):4-21. English Abstract Only.
Miley et al. (Jan. 8, 2014) "Cylindrical and Other IEC Geometries," In; Ch 9. *Inertial Electrostatic Confinement (IEC) Fusion: Fundamentals and Applications.* Springer. pp. 239-243.
Mitura et al. (1991) "The System for Depositing Hard Diamond-Like Films onto Complex-Shaped Machine Elements in an r.f. Arc Plasma," *Surface and Coatings Technology.* 47(1):106-112.
Novikov et al. (1991) "Superhard i-C coatings used in complex processes of surface strengthening of tools and machine parts," *Surface and Coatings Technology.* 47:770-791.
Posadowski (1993) "Discharge Density Increase for High Rate Magnetron Sputtering," In; *Multicomponent and Multilayered Thin Films for Advanced Microtechnoloqies: Techniques, Fundamentals, and Devices.* Ed.: Jurgen Engemann. Springer. pp. 109-113.
Sagas et al. (2011) "Influence of electromagnetic confinement on the characteristics of a triode magnetron sputtering system," *Vacuum.* 85:705-710.
Sanders (2000) "Review of cathodic arc deposition technology at the start of the new millennium," *Surface & Coatings Technology.* 133-134:78-90.
Shang (2002) "Plasma Injection for Hypersonic Blunt-Body Drag Reduction," *The American Institute of Aeronautics and Astronautics Journal.* 40:1178-1186.
Spatenka et al. (1997) "A comparison of internal plasma parameters in a conventional planar magnetron and a magnetron with additional plasma confinement," *Plasma Source Science and Technology.* 6:46-52.
Tisone et al. (1974) "Low-Voltage Triode Sputtering With a Confined Plasma: Part 1—Geometric Aspects of Deposition," *J. Vac. Sci. Technol.* 11(2):519-527.
VECOR "Dual Arc Evaporator with Plasma Separation," Brochure by VECOR. 101 Duranzo Aisle, Irvine, California 92606 USA.
Wakeham et al. (2009) "Low Temperature Remote Plasma Sputtering of Indium Tin Oxide for Flexible Display Applications," *Thin Solid Films.* pp. 518:1355-1358.
Zimmer (2005) "Vacuum arc deposition by using a Venetian blind particle filter," *Surface & Coatings Technology.* 200:440-443.
U.S. Appl. No. 14/483,093, Office Action dated Aug. 9, 2016, 10 pages.
U.S. Appl. No. 14/483,093, Response to Office Action Filed Nov. 8, 2016, 15 pages.
Zimmermann et al. (2008) "LARGE—A Plasma Torch for Surface Chemistry Applications and CVD Processes—A Status Report," Journal of Thermal Spray Technology. 17(5-6):617-622.
U.S. Appl. No. 14/483,093, Final Office Action dated Feb. 3, 2017, 10 pages.
Anders (1999) "Approaches to rid cathodic arc plasma of macro- and nanoparticles: a review." Berkeley, California, Surface and Coatings Technology, p. 319-330 [online] [Accessed on Aug. 28, 2018].
Non-Final Rejection for U.S. Appl. No. 15/047,189 dated Sep. 4, 2018, 18 pp.

\* cited by examiner

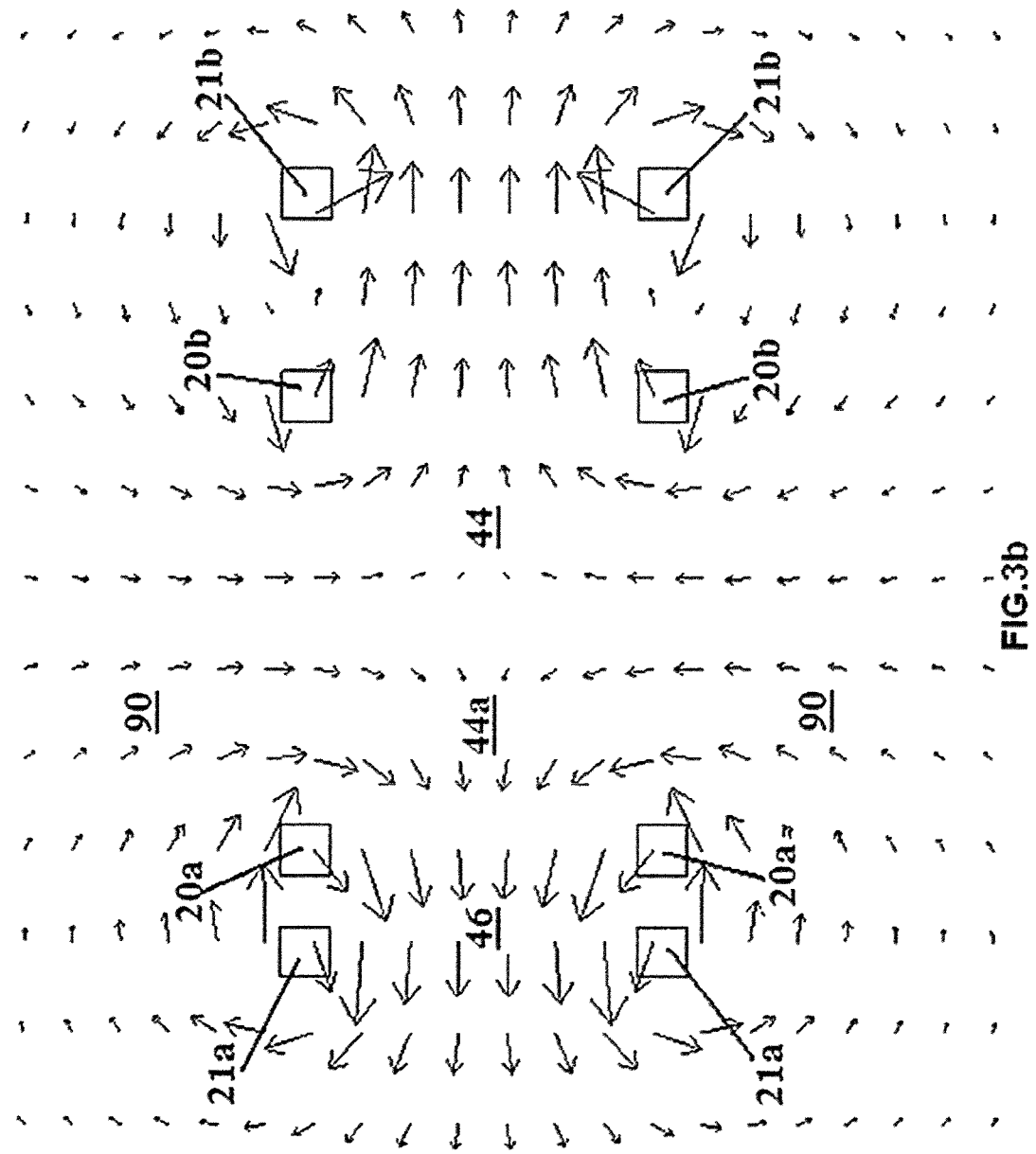

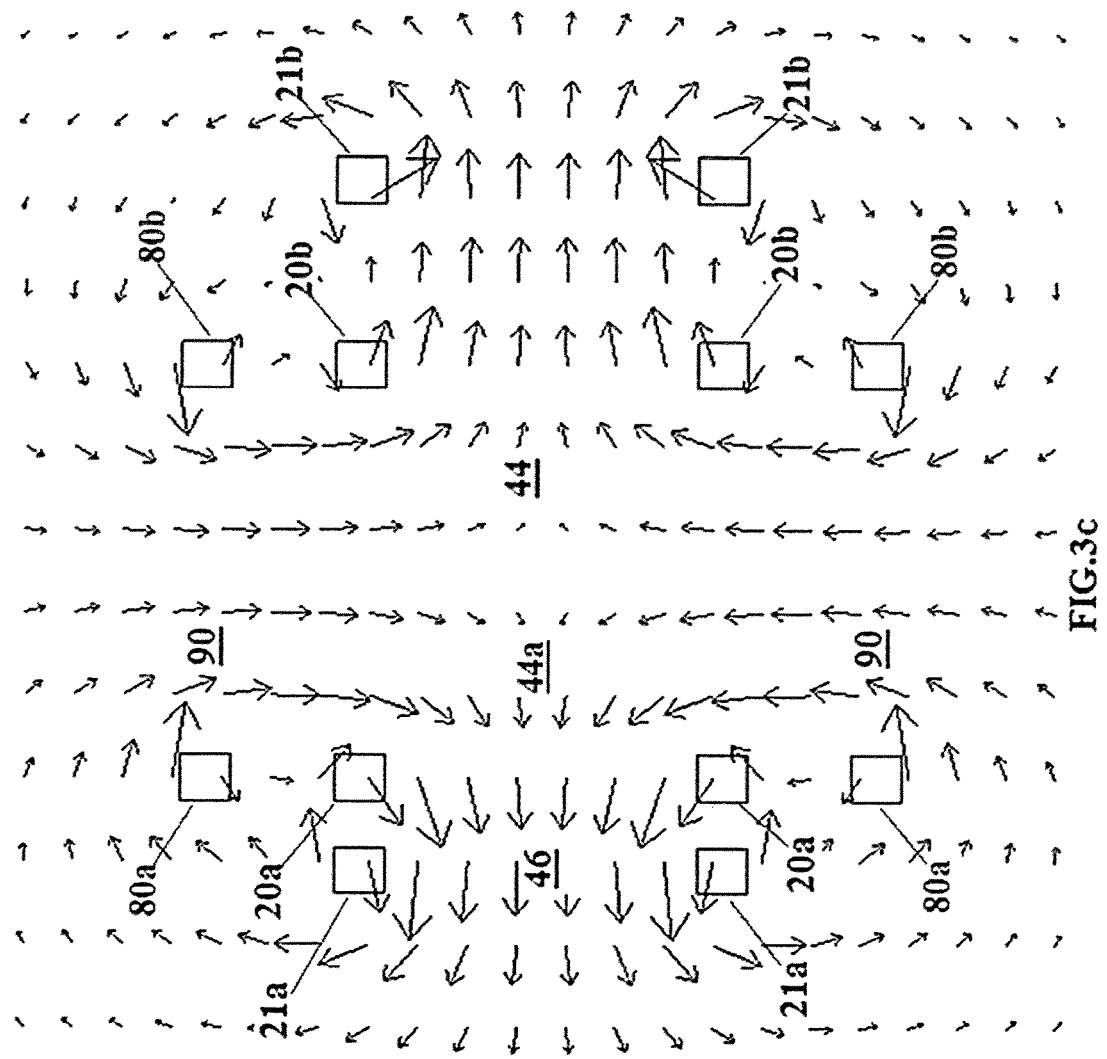

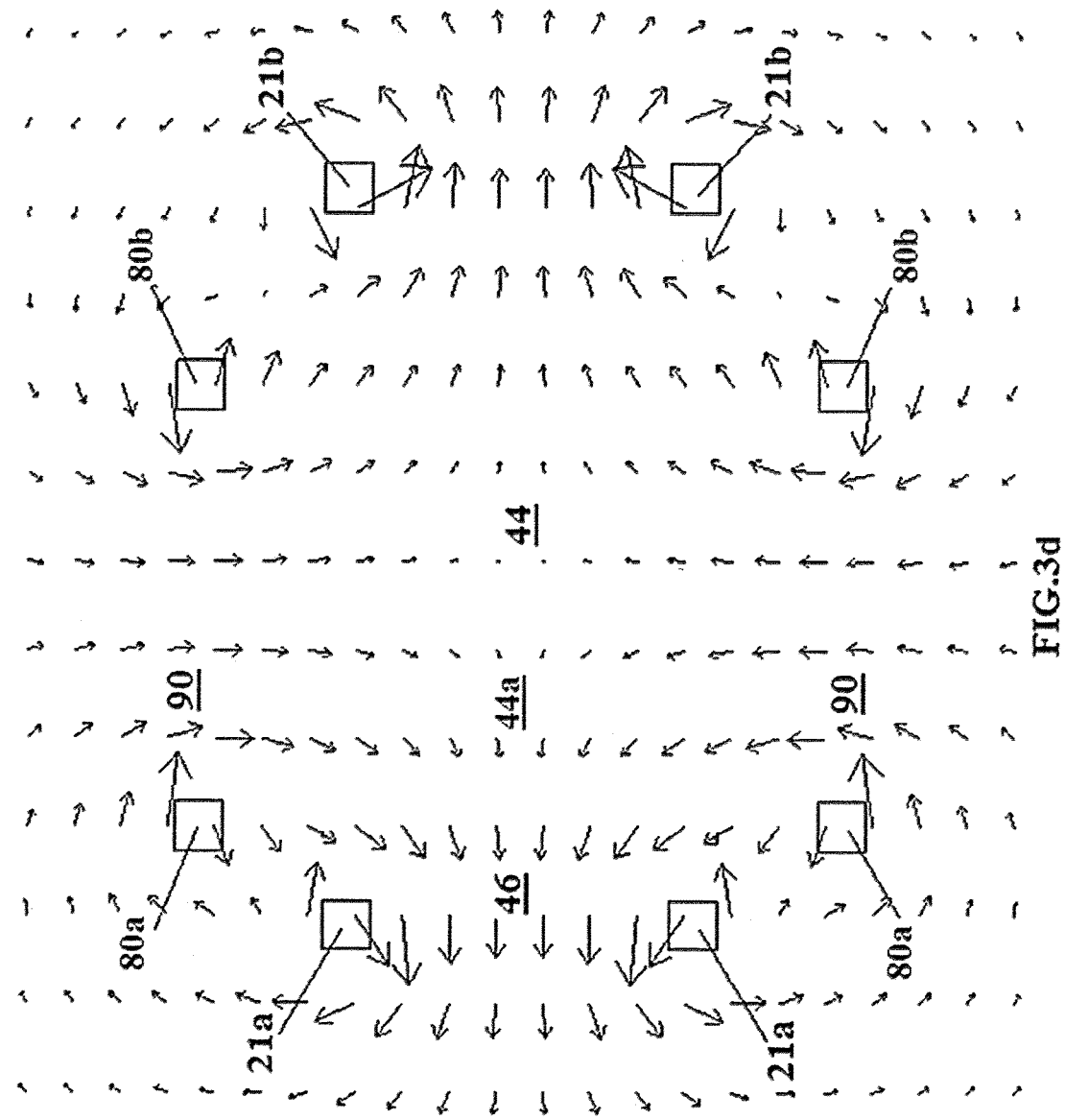

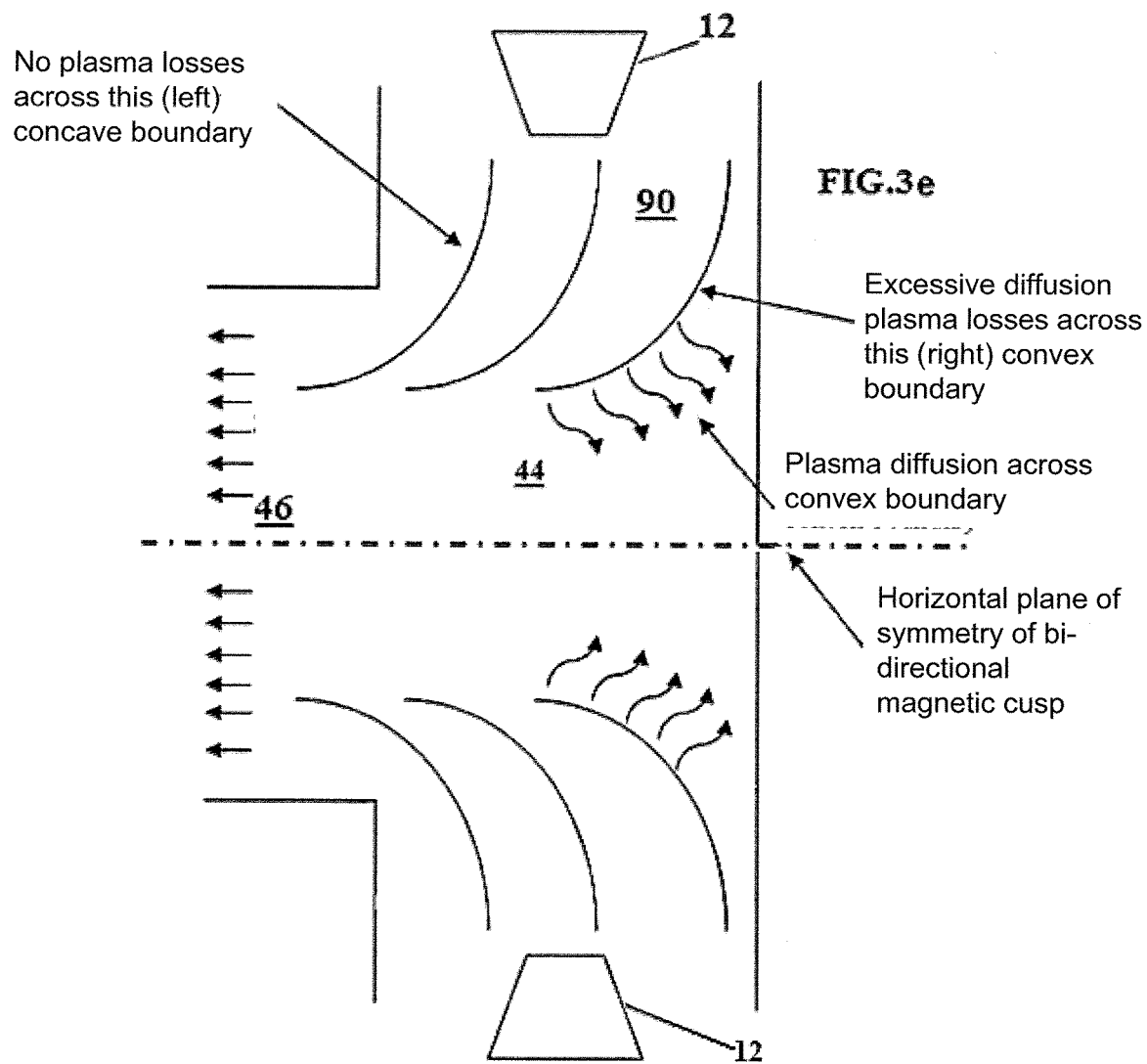

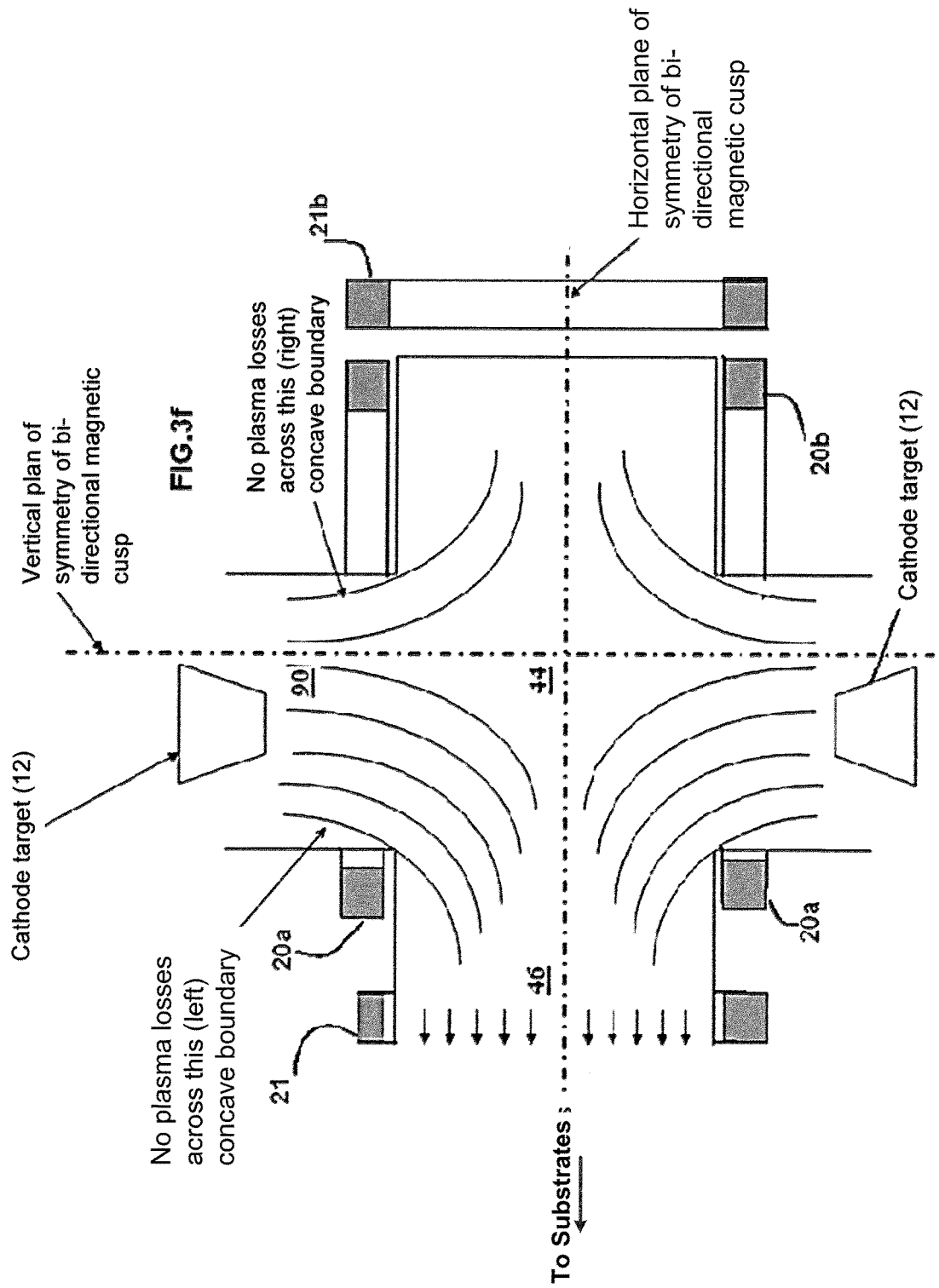

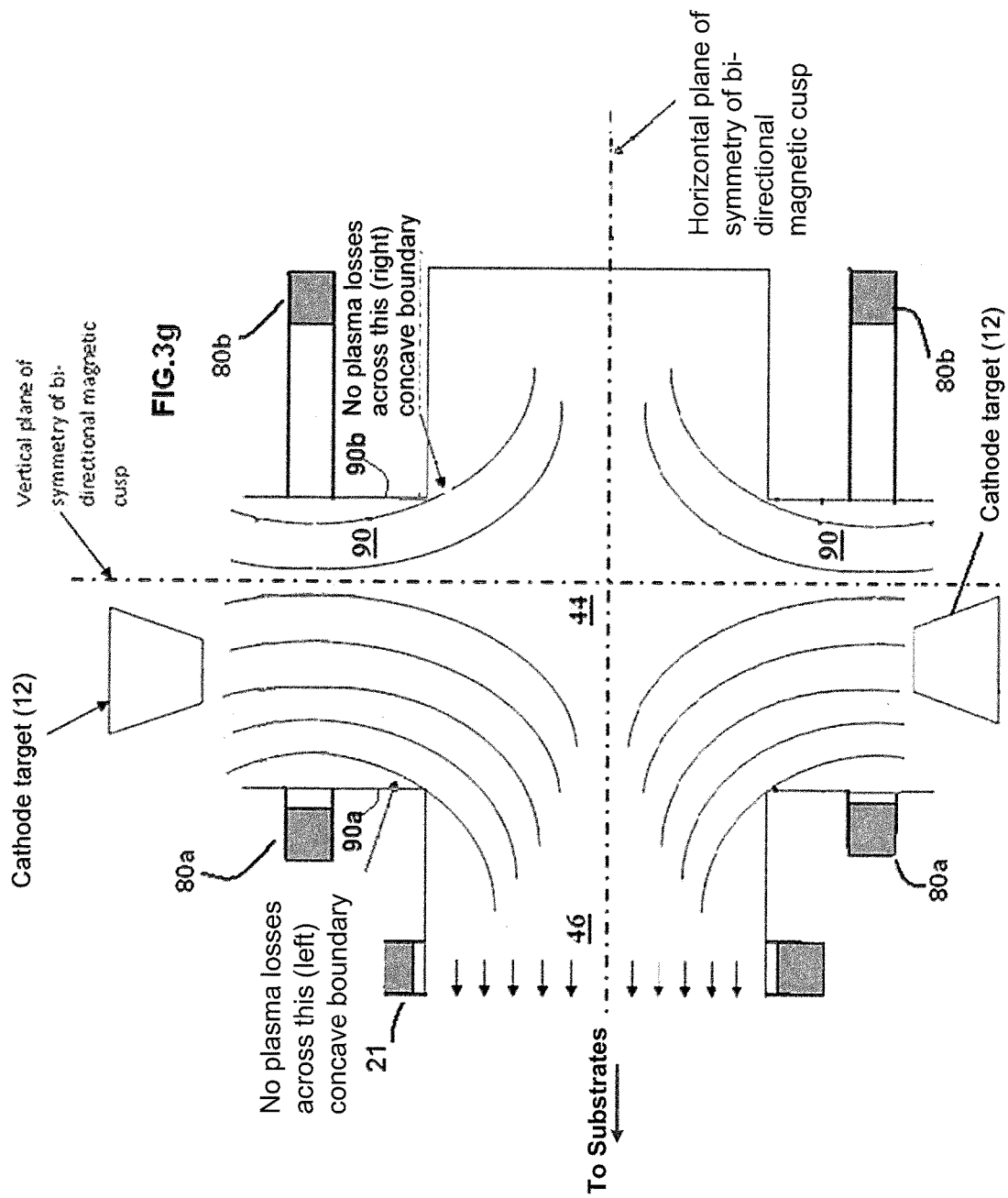

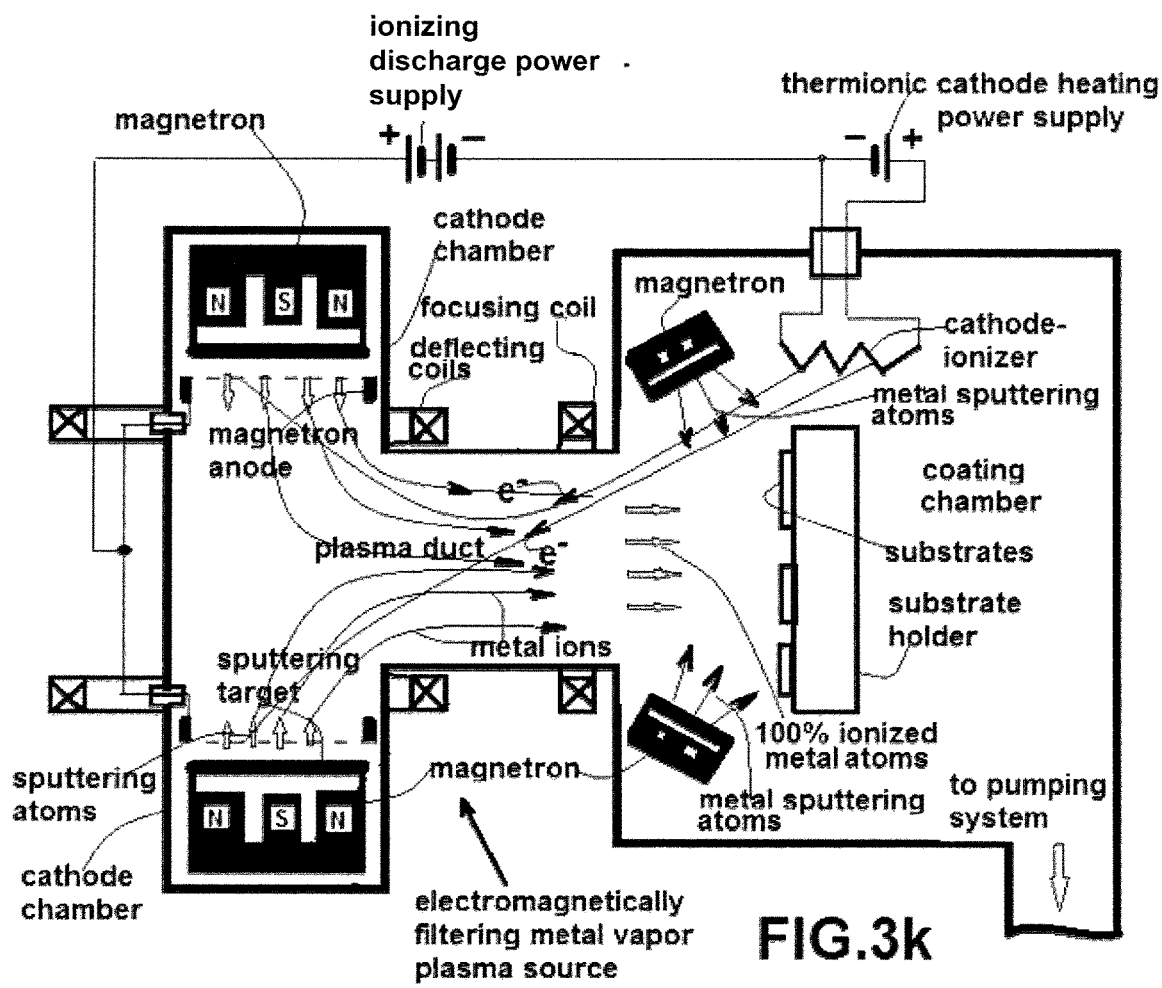

FIG. 3m

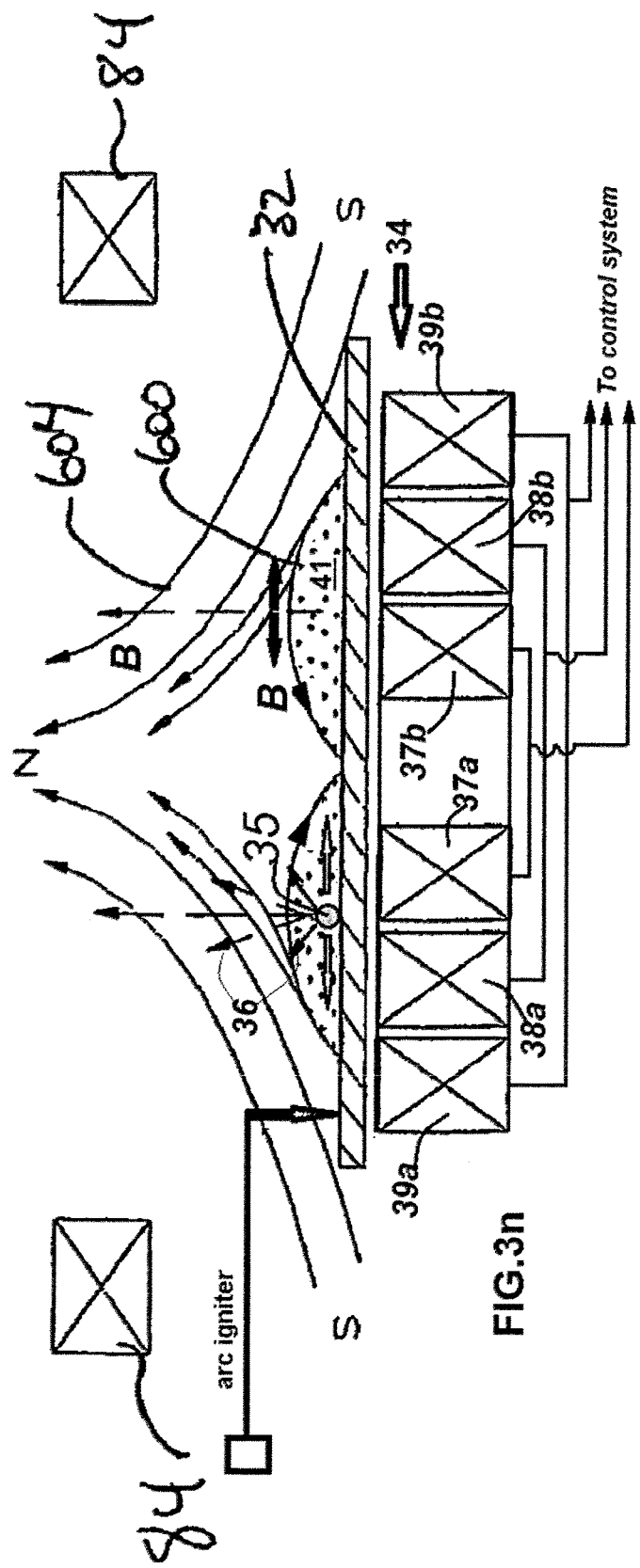

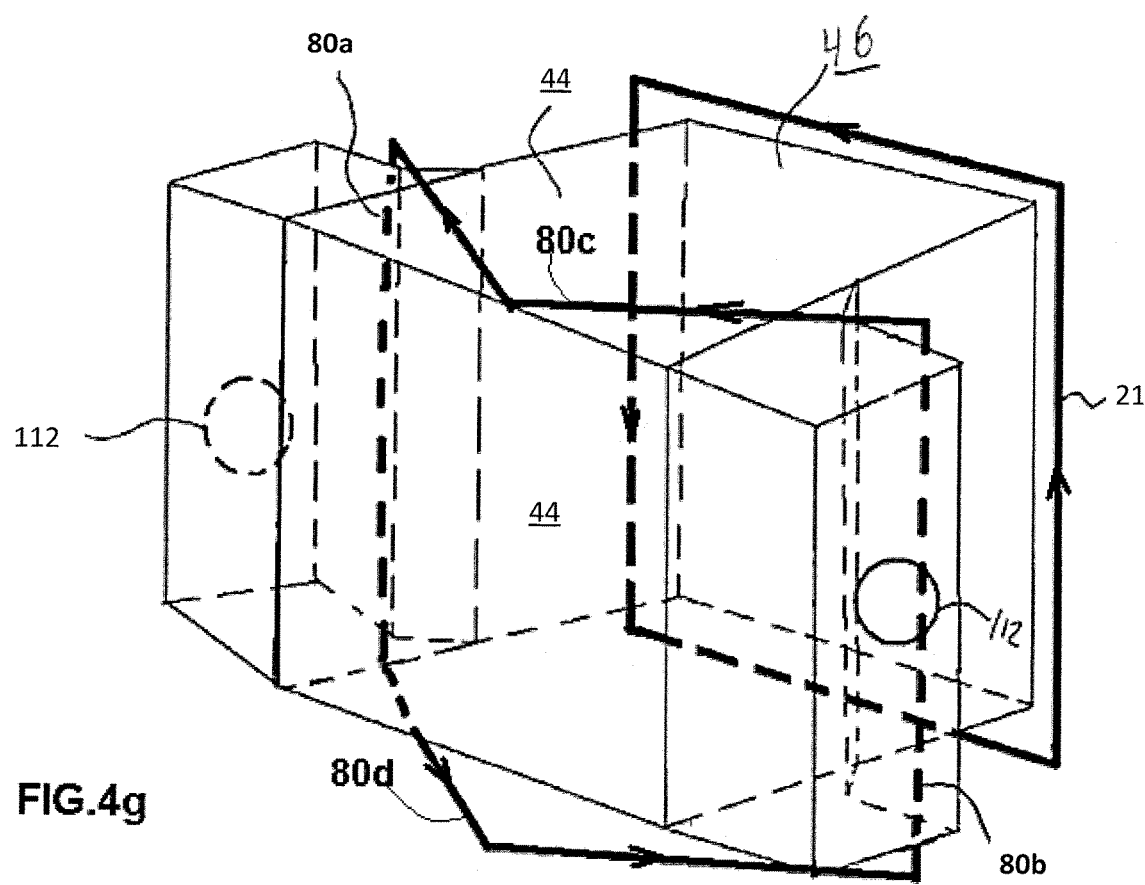

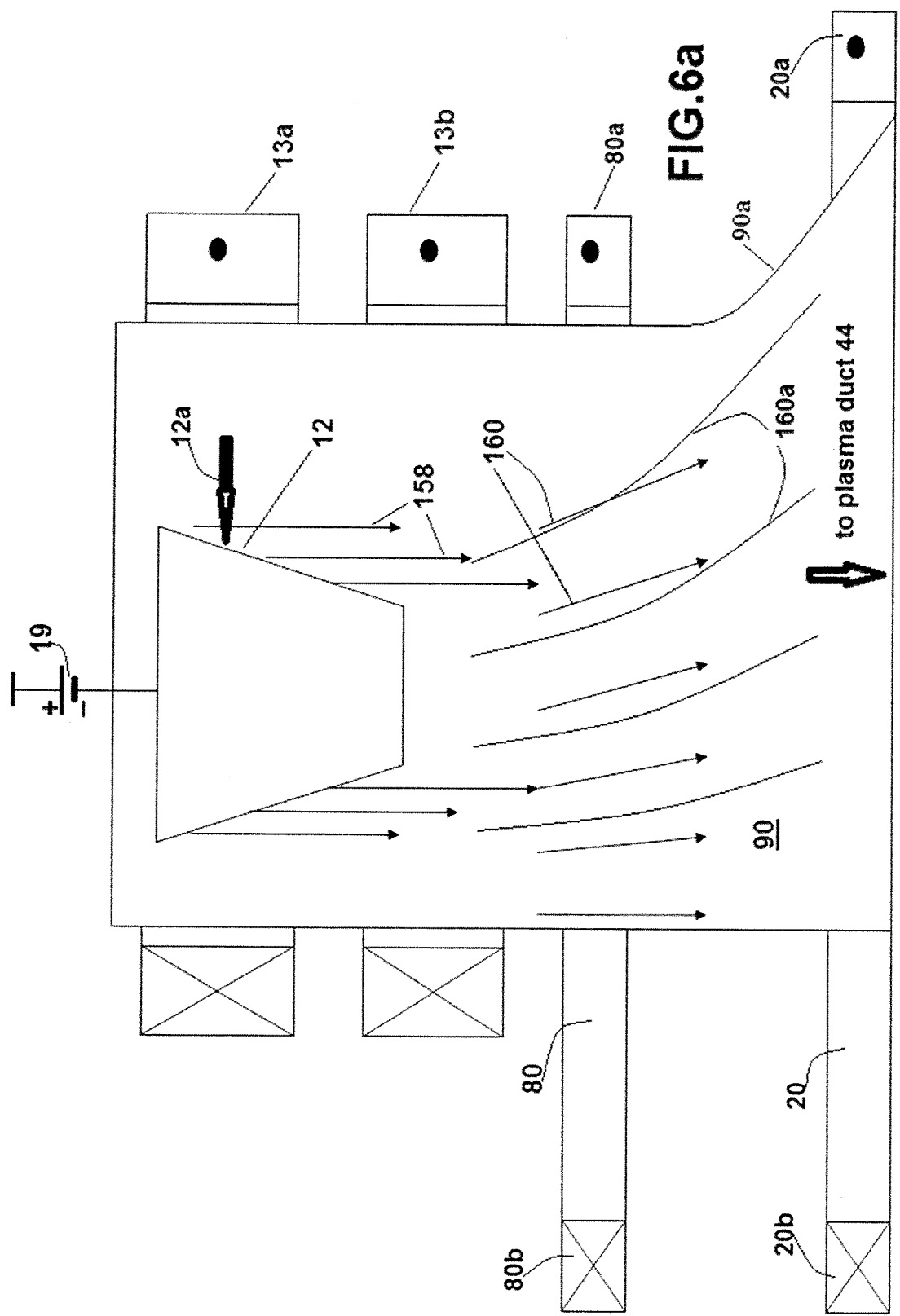

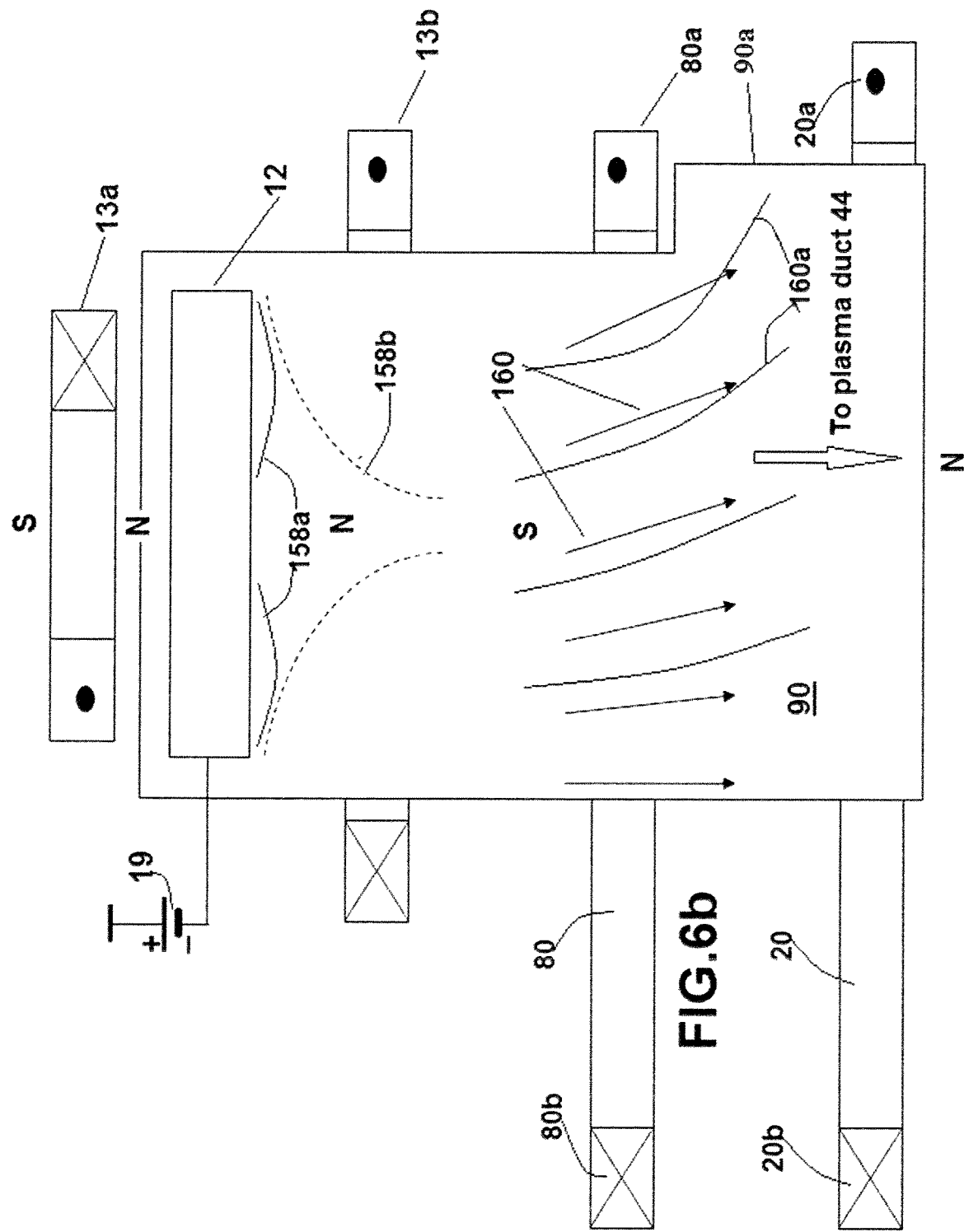

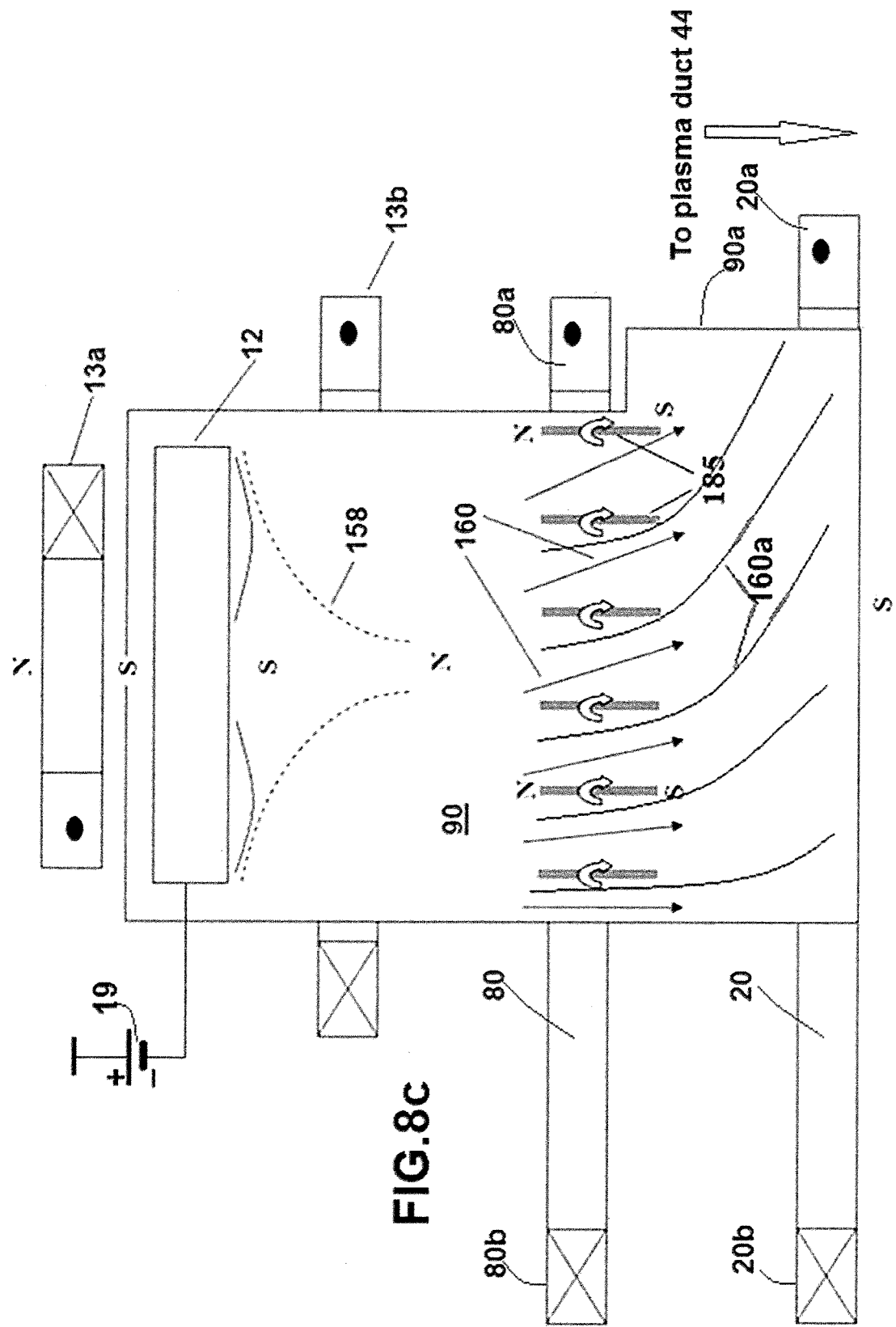

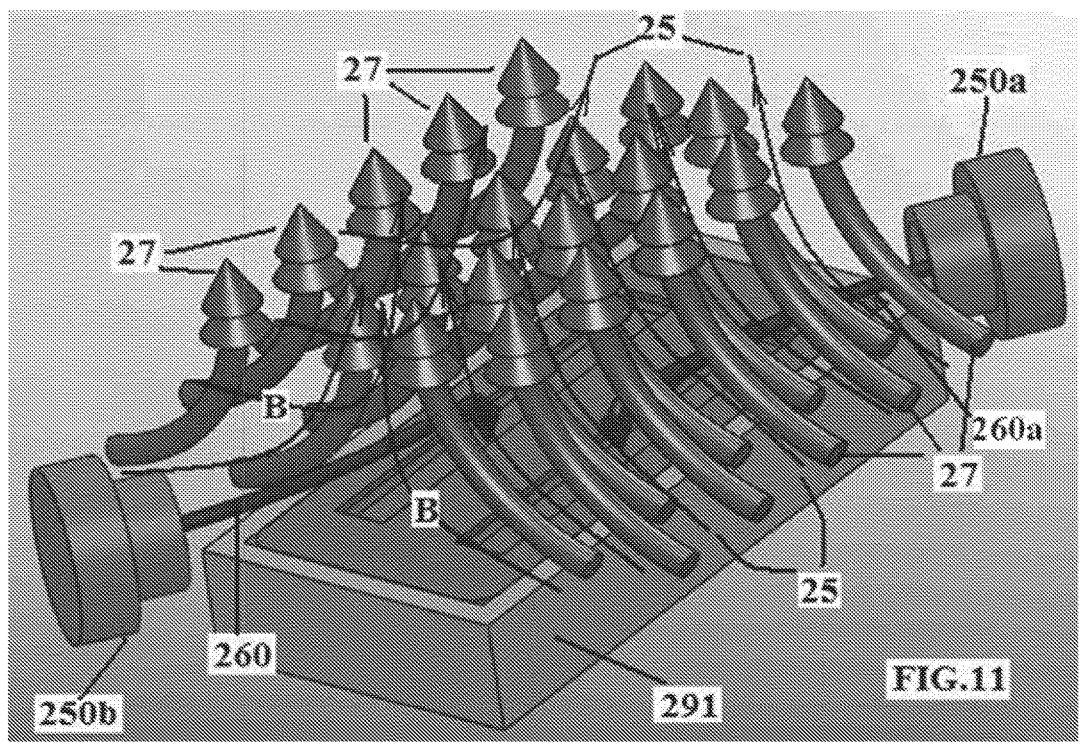

US 10,304,665 B2

REACTORS FOR PLASMA-ASSISTED PROCESSES AND ASSOCIATED METHODS

RELATED APPLICATIONS

This application is a continuation-in-part of U.S. patent application Ser. No. 14/483,093 filed Sep. 10, 2014, which is a continuation-in-part of U.S. patent application Ser. No. 13/602,316 filed Sep. 3, 2012 (now abandoned), which claims the benefit of priority from U.S. Provisional Patent Application Ser. No. 61/532,023 filed on Sep. 7, 2011. All of the aforementioned applications are incorporated herein by reference in their entireties.

FIELD OF THE INVENTION

This invention relates to the application of coatings in a vacuum apparatus. In particular, this invention relates to an apparatus which generates energetic particles and generates a plasma of a vaporized solid material for the application of coatings to surfaces of a substrate by way of condensation of plasma.

BACKGROUND OF THE INVENTION

Many types of vacuum arc coating apparatus utilize a cathodic arc source, in which an electric arc is formed between an anode and a cathode plate in a vacuum chamber. The arc generates a cathode spot on a target surface of the cathode, which evaporates the cathode material into the chamber. The cathodic evaporate disperses as a plasma within the chamber, and upon contact with the exposed surfaces of one or more substrates, coats the substrates with the cathode material, which may be metal, ceramic, etc. An example of such an arc coating apparatus is described in U.S. Pat. No. 3,793,179 issued Feb. 19, 1974 to Sablev, which is incorporated herein by reference.

An undesirable result of vacuum arc coating techniques is the creation of macroparticles, which are formed from molten cathode material vaporized by the arc. These macroparticles are ejected from the surface of the cathode material, and can contaminate the coating as it is deposited on the substrate. The resulting coating may be pitted or irregular, which at best presents an aesthetic disadvantage, but is particularly problematic in the case of coatings on precision instruments.

A number of techniques have been employed to reduce the incidence of macroparticles contacting the substrate. Conventionally a vacuum arc coating apparatus may be constructed with a filtering mechanism that uses electromagnetic fields which direct or deflect the plasma stream. Because macroparticles are neutral, they are not influenced by these electromagnetic fields. Such an apparatus can therefore provide a plasma duct between the cathode chamber and a coating chamber, wherein the substrate holder is installed off of the optical axis of the plasma source. Focusing and deflecting electromagnets around the apparatus thus direct the plasma stream towards the substrate, while the macroparticles, uninfluenced by the electromagnets, would continue to travel in a straight line from the cathode. An example of such an apparatus is described and illustrated in U.S. Pat. No. 5,435,900 issued Jul. 25, 1995 to Gorokhovsky for an "Apparatus for Application of Coatings in Vacuum", which is incorporated herein by reference.

Another such apparatus is described in the article "Properties of Tetrahedral Amorphous Carbon Prepared by Vacuum Arc Deposition", Diamond and Related Materials published in the United States by D. R. McKenzie in 1991 (pages 51 through 59). This apparatus consists of a plasma duct made as a quarter section of a tore surrounded by a magnetic system that directs the plasma stream. The plasma duct communicates with two chambers, one chamber which accommodates a plasma source and a coating chamber which accommodates a substrate holder. The configuration of this apparatus limits the dimensions of the substrate to be coated to 200 mm, which significantly limits the range of its application. Furthermore, there is no provision in the tore-shaped plasma duct for changing the configuration of the magnetic field, other than the magnetic field intensity. Empirically, in such an apparatus the maximum value of the ionic current at the exit of the plasma duct cannot exceed one percent of the arc current. This is related to the turbulence of the plasma stream in the tore, which causes a drastic rise in the diffusion losses of ions on the tore walls.

Another method used to reduce the incidence of macroparticles reaching the substrate is a mechanical filter consisting of a baffle, or set of baffles, interposed between the plasma source and the plasma duct and/or between the plasma duct and the substrate. Filters taught by the prior art consist of simple stationary baffles of fixed dimension, such as is described in U.S. Pat. No. 5,279,723 issued Jan. 18, 1994 to Falabella et al. and in U.S. Pat. No. 5,435,900 to Gorokhovsky, which are incorporated herein by reference. In these filters the baffles are disposed along the plasma duct walls leaving substantial portion of the macroparticles which are crossing the area near the center of the plasma duct, far from the plasma duct walls, not trapped.

SUMMARY

In an embodiment, a reactor for plasma assisted chemical vapor deposition includes a plasma duct configured to contain one or more substrates to be coated by ions. The reactor further includes a remote arc discharge generation system for generating a flow of electrons through the plasma duct in direction from a proximal end of the plasma duct toward a distal end of the plasma duct. The reactor also includes a gas inlet coupled to the distal end for receiving a reactive gas, and a gas outlet coupled to the proximal end for removing at least a portion of the reactive gas to generate a flow of the reactive gas through the plasma duct in direction from the distal end toward the proximal end, so as to generate the ions from collisions between the electrons and the reactive gas. Furthermore, the reactor includes a separating baffle positioned between the plasma duct and the gas outlet for restricting flow of the reactive gas out of the plasma duct to maintain a high pressure in the plasma duct to increase rate of deposition of the ions onto the substrates, the separating baffle being configured with at least one opening between the cathode chamber and the plasma duct, each of the at least one opening having transverse extent in range from 1 mm to 5 cm.

In an embodiment, a reactor-based method for plasma assisted chemical vapor deposition includes (a) flowing a reactive gas through a plasma duct in direction from a distal end of the plasma duct toward a proximal end of the plasma duct, wherein the plasma duct containing one or more substrates to be coated, (b) flowing electrons through the plasma duct in direction from the proximal end toward the distal end to cooperate with the reactive gas to form a remote arc discharge plasma throughout the plasma duct so as to deposit, onto the substrates, ions generated in the remote arc discharge plasma, and (c) restricting gas flow out of the plasma duct to maintain a high pressure of the reactive gas in the plasma duct to increase rate of deposition of the ions onto the substrates.

In an embodiment, a reactor for plasma-assisted generation of energetic particles includes a plasma duct and a shielded cathodic arc source positioned in a cathode chamber coupled to a proximal end of the plasma duct. The reactor also includes a distal anode, positioned in an anode chamber at a distal end of the plasma duct, for cooperating with a cathode of the cathodic arc source to generate a remote arc discharge through the plasma duct. In addition, the reactor includes (a) a gas inlet coupled to the distal end for receiving a reactive gas to facilitate reactions between the reactive gas and electrons of the remote arc discharge, and (b) an array of wire electrodes disposed coaxially with the plasma duct for, when the wire electrodes are positively biased, extending the remote arc discharge and generating a plasma sheath around each of the wire electrodes to further facilitate the reactions. The reactor further includes a magnetic solenoid surrounding at least a portion of the plasma duct for radially confining a plasma, associated with the remote arc discharge, in the plasma duct. Furthermore, the reactor includes an output port for outputting energetic ions generated from the reactions and accelerated by applying a positive bias voltage to the plasma duct.

BRIEF DESCRIPTION OF THE DRAWINGS

In drawings which illustrate by way of example only preferred embodiments of the invention, FIG. 3b is a magnetic vector diagram representing distribution of magnetic force lines generated by deflecting coils installed along the plasma duct as in FIG. 3a, FIG. 3c is an exemplary magnetic vector diagram representing distribution of magnetic force lines generated by the deflecting coils in conjunction with a pair of deflection offset coils, FIG. 3d is an exemplary magnetic vector diagram representing distribution of magnetic force lines in a configuration of magnetic coils, with the inner plasma duct deflecting coils removed, FIG. 3e is an exemplary schematic diagram showing plasma transport in a unidirectional magnetic field cusp, FIG. 3f is an exemplary schematic diagram showing plasma transport in a bi-directional magnetic field cusp, FIG. 3g is a variation of schematic diagram of FIG. 3f showing plasma transport in a bi-directional magnetic field cusp in which deflection coils are disposed in offset position in relation to the plasma duct;

FIG. 3k is a variation of schematic diagram of FIG. 3j utilizing filtered magnetron sputtering metal vapor plasma source magnetically coupled with two magnetron sources in the coating chamber;

FIG. 3m is a plan view of the filtered magnetron-arc coating apparatus of FIG. 3L utilizing unipolar DC pulse power supplies for magnetron anodes;

FIG. 3n is schematic elevation of a planar cathodic arc source utilizing plurality of magnetic steering coils;

FIG. 6a is an exemplary schematic plan view of a cathode chamber utilizing a frustoconical primary cathode target, FIG. 6b is an exemplary schematic plan view of a cathode chamber utilizing a planar primary cathode target, FIG. 8c is a schematic view of a cathode chamber of the filtered cathodic arc source shown in FIG. 3b utilizing a set of stream baffles installed near the entrance to the plasma duct chamber, in an embodiment.

FIG. 11 is a schematic illustration of a hybrid dual filtered cathodic arc source utilizing an electron beam evaporator with two electron beam guns installed adjacent to the cathode chambers, in an embodiment.

DETAILED DESCRIPTION OF THE INVENTION

Figure 1:
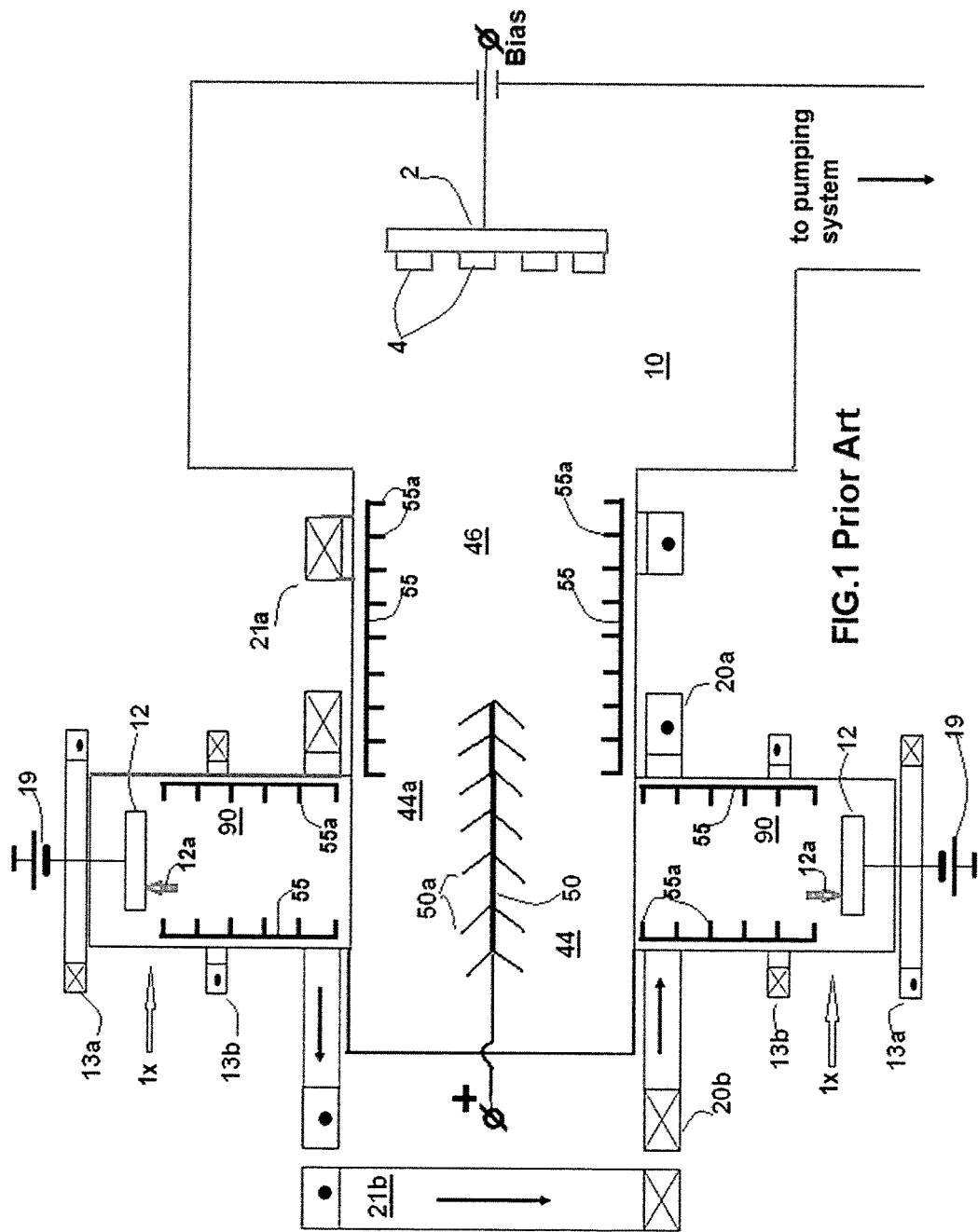
FIG. 1 is a schematic plan view of a prior art vacuum arc coating apparatus.

This invention is an improvement of the advanced coating and surface treatment system described in D. G. Bhat, V. I. Gorokhovsky, R. Bhattacharya, R. Shivpuri, K. Kulkarni, "Development of a Coating for Wear and Cracking Prevention in Die-Casting Dies by the Filtered Cathodic Arc Process," in Transactions of the North American Die Casting Association, 20th International Die Casting Congress and Exposition, Cleveland, Ohio, November 1999, pp. 391-399, the entire disclosures of which are hereby incorporated by reference, the source and method of controlling vapor plasma flow taught by U.S. Pat. Application No. 2011/0100800 to Gorokhovsky and the apparatus taught by U.S. Pat. No. 5,435,900 issued Jul. 25, 1995 to Gorokhovsky which incorporates a plasma source 1x, utilizing the cathodic arc target 12 with arc igniter 12a mounted in a cathode chamber 90, a plasma duct 44 surrounded by the deflecting magnetic system, and a substrate holder 2 mounted in the coating chamber 10 off of the optical axis of cathodic arc target 12, where the steering electromagnet 13a is surrounded the cathode chamber 90 behind the target 12 and the focusing electromagnet 13b is surrounded the cathode chamber 90 in front of the target 12 as illustrated in FIG. 1. Plasma duct 44 is designed in the form of a parallelepiped with coating chamber 10 and cathode chamber 90 mounted on adjacent planes. The magnetic system that forces the plasma stream towards substrates 4 consists of linear conductors arranged along the edges of the parallelepiped. Plasma duct 44 has plates 55 with wall baffles 55a connected to the positive pole of the current source (not shown) or grounded and mounted on one or more planes of the plasma duct 44 and/or on the walls of the cathode chambers 90 (not occupied by the plasma source). These plates 55 with baffles 55a, which are charged essentially positive in relation to surrounding plasma environment, serve as deflecting electrodes to establish an electric field in a direction transverse to the magnetic field lines, to duct plasma flow toward the substrate to be coated. FIG. 1 illustrates one deflecting electrode 50 with baffles 50a for capturing macroparticles from the vapor plasma flow generated by the primary plasma sources 1x. The advantages provided by U.S. Pat. No. 5,435,900 to Gorokhovsky include increasing the range of dimensions of articles (substrates) which can be coated, and providing the user with the option of changing the configuration of the magnetic field in order to increase ionic current at the exit of the plasma duct to 2 to 3 percent of the arc current. This design is also incorporates the advanced coating and surface treatment system described in D. G. Bhat, V. I. Gorokhovsky, R. Bhattacharya, R. Shivpuri, K. Kulkarni, "Development of a Coating for Wear and Cracking Prevention in Die-Casting Dies by the Filtered Cathodic Arc Process," in Transactions of the North American Die Casting Association, 20th International Die Casting Congress and Exposition, Cleveland, Ohio, November 1999, pp. 391-399, the entire disclosures of which are hereby incorporated by reference.

If the potential of the deflecting electrode ($V_d$) located opposite the plasma source is greater than the potential of the plasma source wall ($V_w$), an electric field occurs between them. The intensity of the electric field is given by:

$$E \propto \frac{V_d - V_w}{d} \propto \sigma [1 + (\omega_e \tau_e)^2] I_d \quad (1)$$

d is the distance between the plate and the plasma duct wall,
$\omega_e$ is the gyro frequency of magnetized plasma electrons,
$\tau_e$ is the characteristic time between electron collisions,
$\sigma$ is the specific resistivity of the plasma in the absence of a magnetic field, and
$I_d$ is the current of the deflecting electrode.

Because $\omega_e$ is proportional to the plasma-guiding magnetic field B, (i.e. $\omega_e \propto B$), the transversal electric field $E_t$ as determined by formula (1) will be proportional to $B^2$, as shown by the following equation:

$$E_t \propto \sigma[1+(\omega_e \tau_e)^2] I_d \propto B_t^2 I_d \qquad (2)$$

where $B_t$ is the component of the magnetic field which is tangential to the surface of the deflecting electrode.

An ion is influenced by the force:

$$F_i = Q_i \times E_i \qquad (3)$$

where $Q_i$ is the ion charge. Combining formulae (2) and (3) yields:

$$F_i \propto Q_i B_t^2 I_d \qquad (4)$$

This force causes an ion to turn away from the wall opposite the plasma source and directs it towards the substrate to be coated.

Another method used to reduce the incidence of macroparticles reaching the substrate is a mechanical filter consisting of a baffle, or set of baffles, interposed between the plasma source and the plasma duct and/or between the plasma duct and the substrate. Filters taught by the prior art consist of simple stationary baffles of fixed dimension, such as is described in U.S. Pat. No. 5,279,723 issued Jan. 18, 1994 to Falabella et al. and in U.S. Pat. No. 5,435,900 to Gorokhovsky, which are incorporated herein by reference. In these filters the baffles are disposed along the plasma duct walls leaving substantial portion of the macroparticles which are crossing the area near the center of the plasma duct, far from the plasma duct walls, not trapped.

Another disadvantage of U.S. Pat. No. 5,435,900 to Gorokhovsky is that the focusing coils of the primary cathodic arc sources which are installed in the cathode chambers focus the cathodic arc metal vapor plasma, having a large kinetic energy ranging from 40 eV to 200 eV, toward the center of the plasma duct chamber. The deflecting magnetic field takes this high velocity metal ion stream and starts to rotate it around the edges of the plasma duct chamber adjacent to the main chamber too late, which results in excessive losses of metal vapor plasma on the walls of the plasma duct chamber.

The present invention overcomes some or all of the above primary art disadvantages by providing mechanisms for the effective deflection of a plasma flow, simultaneously providing both high metal vapor plasma transport efficiency and high efficiency of trapping the neutral metal atoms, clusters and macroparticles.

In one embodiment the invention provides a coating chamber disposed off of the optical axis of a filtered cathodic arc source consisting of a rectangular plasma duct chamber with deflection portion of the plasma duct chamber having at least one cathode chamber attached to its side wall and an exit tunnel portion connected to the coating chamber. Baffles for trapping the macroparticles are positioned along the walls of cathode chamber and plasma duct chamber not occupied by vapor deposition sources. The tunnel portion of the plasma duct chamber is surrounded by a focusing coil, and two rectangular main deflecting coils are attached to the opposite sides of the deflecting portion of the plasma duct while an offset deflecting coil surrounds the cathode chamber upstream of the entrance into the plasma duct, allowing the deflection of the vapor plasma flow to commence prior to its entering into the plasma duct area, which effectively reduces the losses of filtered metal vapor plasma.

In a further embodiment of the invention at least two cathode chambers are attached to the opposite walls of the plasma duct of rectangular plasma duct chamber. The offset deflecting conductors are attached to the front face of the cathode chambers in the offset position in relation to the plasma duct chamber, which allows for the deflection of metal vapor plasma before it enters into the plasma duct area, substantially reducing plasma losses and increases deposition and target utilization rates.

The deflection portion of the plasma duct may have a shape of rectangular or triangular prism or a prism of other cross section having the same plane of symmetry with the exit tunnel portion of the plasma duct. The main deflecting coils may form a frame aligned along the rectangular or triangular prism or a prism of other cross-section having the same plane of symmetry with the plasma duct.

In a further embodiment the plasma duct chamber is cylindrical and cathode chambers are attached to the plasma duct portion of the plasma duct around the axis of the exit of the cathode chamber and/or at the entrance of the tunnel portion of the plasma duct chamber. The offset deflection coil is attached to the front faces of the cathode chambers on side of coating chamber.

In a further embodiment the array of thin wire anode electrodes are provided within the cylindrical plasma duct. The remote arc plasma is established within the plasma duct between the primary cathode in cathode chamber and remote anode in anode chamber. The high voltage positive voltage pulses are applied to the plasma duct and wire electrodes to increase plasma potential in the area adjacent to the plasma duct wall thereby accelerating the ions toward axes of the plasma duct, where high energy ions collide and generate high energetic particles by nuclear reaction.

In a further embodiment stream baffles are positioned at the exit of the cathode chamber and/or at the entrance to the tunnel portion of the plasma duct chamber, disposed across the metal vapor plasma flow. The stream baffles may have independent position control or, alternatively, at least a portion of them may be made of magnetic materials so they will self-align along either deflecting or focusing magnetic streamlines, which allows for an even further increase in macroparticle filtration.

The invention also provides a multiple-cathode apparatus suitable for use in plasma-immersed processes as ion implantation, ionitriding, ion cleaning and the like. In these embodiments a first filtered cathodic arc source containing one or more cathodes generates cathodic evaporate for coating the substrate, while the deflecting and focusing magnetic fields positioned to affect a second filtered cathodic arc source are deactivated so that cathodic evaporate does not flow toward the substrates. The second filtered cathodic arc source thus functions as a powerful electron emitter for plasma immersed treatment of the substrates.

Optionally in these embodiments a load lock shutter comprising a metallic grid is disposed between the plasma duct and the coating chamber, to control communication between the plasma source and the coating chamber. Where particularly contaminant-free conditions are required the load lock shutter can be closed to contain macroparticles and metal vapor within the cathode chamber(s) and plasma duct, but permit the passage of electrons into the coating chamber to thus increase the ionization level of the gaseous component within the coating chamber. The load lock shutter can further be charged with a negative potential, to thus serve as an electron accelerator and ion extractor. Optionally load lock shutters may also be provided between the filtered cathodic arc source and the plasma duct, and/or between the cathodes and the deflecting electrode within a filtered cathodic arc source.

The invention further provides an apparatus for the application of coatings in a vacuum comprising at least one filtered cathodic arc source, the apparatus comprising at least one cathode with at least one igniter contained within at least one cathode chamber, at least one anode associated with the cathode for generating an arc discharge, and a plasma duct in communication with the cathode chamber and with a substrate chamber containing a substrate holder for mounting at least one substrate to be coated, the substrate holder being positioned off of an optical axis of the cathode, the plasma duct comprising a deflection section in communication with the at least one cathode chamber, and a plurality of stream baffles disposed or movable to an orientation generally transverse to a plane parallel to a direction of plasma flow in the deflection section of the plasma duct, each stream baffle having a generally positive potential in relation to the plasma potential, whereby target ions pass through the spaces between the stream baffles while ions having a different weight or charge than the target ions follow a trajectory into the faces of the baffles, such that at least some of the ions having a different weight or charge than the target ions are blocked from reaching the substrates.

The invention further provides a filtered cathodic arc apparatus including (a) a cathodic arc source including (i) at least one cathode and at least one igniter contained within at least one cathode chamber, respectively, (ii) at least one anode associated with the cathode for generating arc discharge, and (iii) at least one stabilizing coil, disposed behind or surrounding a respective cathode, for controlling position of the arc discharge; (b) a substrate chamber containing a substrate holder for mounting at least one substrate to be coated, the substrate holder being positioned non-coincidental with an optical axis of the at least one cathode; (c) a plasma duct, in communication with each cathode chamber and the substrate chamber and comprising (i) at least one focusing coil surrounding a focusing tunnel section of the plasma duct for generating a focusing magnetic field and (ii) at least one deflecting coil generating a deflecting magnetic field for deflecting the plasma along a path toward the substrate chamber; and (d) at least one magnetron facing the substrate holder, the magnetron being positioned such that at least a portion of magnetic force lines of the focusing magnetic field overlap and are substantially parallel with at least a portion of magnetic force lines generated by the magnetron, wherein each arc source couples with a magnetron source to increase an ionization rate of a magnetron sputtering flow.

The invention further provides a method of coating a substrate in an apparatus for the application of coatings in a vacuum comprising at least one filtered cathodic arc source, the apparatus comprising at least one cathode contained within at least one cathode chamber, at least one anode associated with the cathode, and a plasma duct in communication with the cathode chamber and with a substrate chamber containing a substrate holder for mounting at least one substrate to be coated, the substrate holder being positioned off of an optical axis of the cathode, the method comprising: a. generating an arc discharge, and b. generating a deflecting magnetic field in the cathode chamber for deflecting a plasma flow from the arc source into the plasma duct, the deflecting magnetic field deflecting plasma toward the substrate chamber before the plasma has exited the cathode chamber.

The invention further provides a method of coating a substrate in an apparatus for the application of coatings in a vacuum comprising at least one filtered cathodic arc source, the apparatus comprising at least one cathode contained within at least one cathode chamber, at least one anode associated with the cathode, and a plasma duct in communication with the cathode chamber and with a substrate chamber containing a substrate holder for mounting at least one substrate to be coated, the substrate holder being positioned off of an optical axis of the cathode, the method comprising, in any order:

a. generating an arc discharge, b. applying to a plurality of stream baffles a generally positive potential in relation to the plasma potential, and c. orienting the plurality of stream baffles in an orientation generally transverse to a plane parallel to a direction of plasma flow in the deflection section of the plasma duct, whereby target ions pass through the spaces between the stream baffles while ions having a different weight or charge than the target ions follow a trajectory into the faces of the baffles, such that at least some of the ions having a different weight or charge than the target ions are blocked from reaching the substrates.

The invention further provides a filtered cathodic arc method of generation of energetic particles comprising the apparatus comprising at least one cathode contained within at least one cathode chamber at least one proximal anode associated with the cathode for generating a primary arc discharge, at least one primary arc power supply having negative output connected to the cathode and positive output connected to the primary proximal anode or grounded generating a voltage drop between the cathode and the primary anode, at least one distal anode contained within distal anode chamber associated with the cathode for generating a remote arc discharge, a tubular plasma duct disposed between the cathode chamber and the distal anode, at least one remote arc power supply having negative output connected to the cathode and positive output connected to the distal anode for generating remote arc discharge along the plasma duct, an array of wire electrodes disposed coaxially within the plasma duct and electrically connected to the plasma duct, at least one low voltage high current plasma duct power supply having negative output connected to the cathode and positive output connected to the plasma duct, at least one unipolar power supply having positive output connected to the plasma duct and negative output connected to the cathode, at least one solenoid surrounding the plasma duct, the method comprising:

a. injecting the plasma creating gas into the apparatus, the gas pressure is ranging from 1E-6 to 1000 torr;

b. generating a primary arc discharge in a cathode chamber, the primary arc current and voltage are ranging from 50 A to 500 A and from 20 V to 50V respectively;

c. generating the remote arc discharge plasma between the cathode in cathode chamber and the distal anode in distal anode chamber;

d. generating a remote arc discharge within the plasma duct between the cathode and the plasma duct, the remote arc plasma is filling the space within the array of wire electrodes, the discharge current and voltage are ranging from 50 A to 10,000 A and from 30V to 500V respectively;

e. generating longitudinal magnetic field along the plasma duct for confinement of the remote arc plasma and accelerated ions, the magnetic field ranges from 0.01 T to 20 T;

f. applying positive pulse voltage to the plasma duct, the voltage amplitude is ranging from 0.1 kV to 10,000 kV, for generating high positive potential within array of wire electrodes wherein ions generated by the remote arc discharge are accelerating from the high positive potential area occupied by wire electrodes toward axes of the plasma duct where energetic particles are produced by collision of ions.

FIG. 1 illustrates a prior art apparatus for the application of coatings in a vacuum as shown in U.S. Pat. No. 5,435,900 to Gorokhovsky. The apparatus comprises two cathode chambers 90 disposed opposite to each other and symmetrical in relationship to the plane of symmetry of the rectangular plasma duct 44. The cathodic arc plasma sources 1x are positioned at the entrance of the cathode chambers 90. Each of the plasma sources comprises a cathode target 12 with arc igniter 12a disposed in a cathode chamber 90 in communication with a plasma duct 44 in the form of a parallelepiped. The cathode target 12 is surrounded by a steering coil 13a located upstream of (i.e. behind) or surrounding the cathode target and a focusing coil 13b located downstream (i.e. in front) of the cathode, and the anodes (not shown) are positioned on planes of the cathode chamber adjacent to the cathode 12 to create an electric arc discharge when an arc current power supply 19 is activated. The plasma duct 44 is in communication with a substrate chamber 10, in which a substrate holder 2 supporting the substrates 4 is positioned. The substrate holder 2 is thus located off of the optical axis of the cathode 12, preferably at approximately a right angle, to minimize the exposure of the substrates 4 to the flow of neutral particles.

In FIG. 1 a deflecting magnetic system comprises four rectangular deflecting coils: two deflecting coils 20 are positioned at the side walls of the rectangular plasma duct chamber 44 opposite to each other, a third deflecting coil 21b is positioned around the back wall of the plasma duct chamber 44, and a fourth coil, a focusing coil 21, is positioned around the exit tunnel portion 46 of the plasma duct 44 adjacent to the substrate chamber 10. A deflecting magnetic field is generated by deflecting conductors 20a of the deflecting coils, which are positioned perpendicular to the plane of rotation of the vapor plasma flow emitted from the cathode targets 12, so that the deflecting magnetic field has the general shape of circles concentric to the deflecting conductors 20a. The deflecting magnetic fields created by linear conductors 20a of the side deflecting coils located along the edges of the plasma duct adjacent to the substrate chamber are of unidirectional magnetic field cusp geometry. The back coil 21b allows for the control of the deflecting magnetic field by changing the magnetic field generated by closing conductors 20b of the side coils parallel to the deflecting conductors 20a. The magnetic field created by the back coil 21b can be used to reduce or completely eliminate the magnetic field created by the closing conductors 20b of the two side deflecting coils 20 parallel to the front focusing conductors of the focusing coil 21. The preferable direction of electric current in the side coils 20 and back coil 21b arrangement is shown by the arrows in FIG. 1. The front focusing coil 21 focuses the metal vapor plasma toward the substrates to be coated 10.

On the walls of plasma duct 44 are mounted plate electrodes 55 provided with diaphragm filters or baffles 55a, spaced from the walls of the plasma duct and optionally electrically insulated therefrom, for deflecting the flow of plasma away from the optical axis of the cathode 12 and through the plasma duct 44. In the embodiment shown a positively charged deflecting and dividing electrode 50 with attached baffles 50a is located along a plane of symmetry of the plasma duct. This dividing electrode effectively separates two opposite parts of the deflection section 44a of the plasma duct 44. The deflecting electrodes 55 may be located on any wall adjoining the wall on which the cathode target 12 is positioned. In these positions, the deflecting electrodes 55 with baffles 55a serve both as baffles which trap macroparticles and as a deflecting element which redirects the plasma stream toward the substrates by repelling the positively charged ions. The deflecting electrodes may be at floating potential, which is positive relative to the surrounding magnetically insulated plasma or positively biased by connecting it to the positive pole of an auxiliary current source (not shown). In any case they are biased positively in relation to the cathodes 12. It can be seen from the schematic illustration of plasma flows in this prior art apparatus shown in FIG. 2 that in this case a substantial amount of metal vapor plasma will flow in a direction along the axis of the cathode chamber 90, and will eventually be lost to the walls of the plasma duct 44. The reason for this is that the metal vapor plasma generated on the evaporating surface of the cathode targets 12 has a large kinetic energy (ranging from 40 eV to 200 eV) and continues its propagation along the axis of the cathode chamber by inertia. The deflection of this plasma flow toward the substrate chamber 10 by the deflecting coils 20 positioned around the plasma duct is occurring too late, so only small fraction of the metal plasma is deflected toward the substrate chamber 10 and used in a coating deposition process.

Although the magnetic field does not influence ions directly, a strong tangential magnetic field confines electron clouds, which in turn creates an electric field that repels ions. Thus, in the deflecting region the electric field generated by deflecting electrodes has little influence on ions entrained in the plasma stream, so ions tend to accumulate on the deflecting electrode 50 disposed along the plane of symmetry of the plasma duct 44 or on surrounding walls of the deflection section 44a of the plasma duct 44 and its exit tunnel section 46 because the residual component of their momentum along the optical axis of the cathode 12 exceeds the deflecting force of the deflecting field generated by deflecting linear conductor 20a of the deflecting coil 20 which is positioned adjacent to the cathode chamber 90 and the exit tunnel section 46 of the plasma duct 44.

Figure 2:
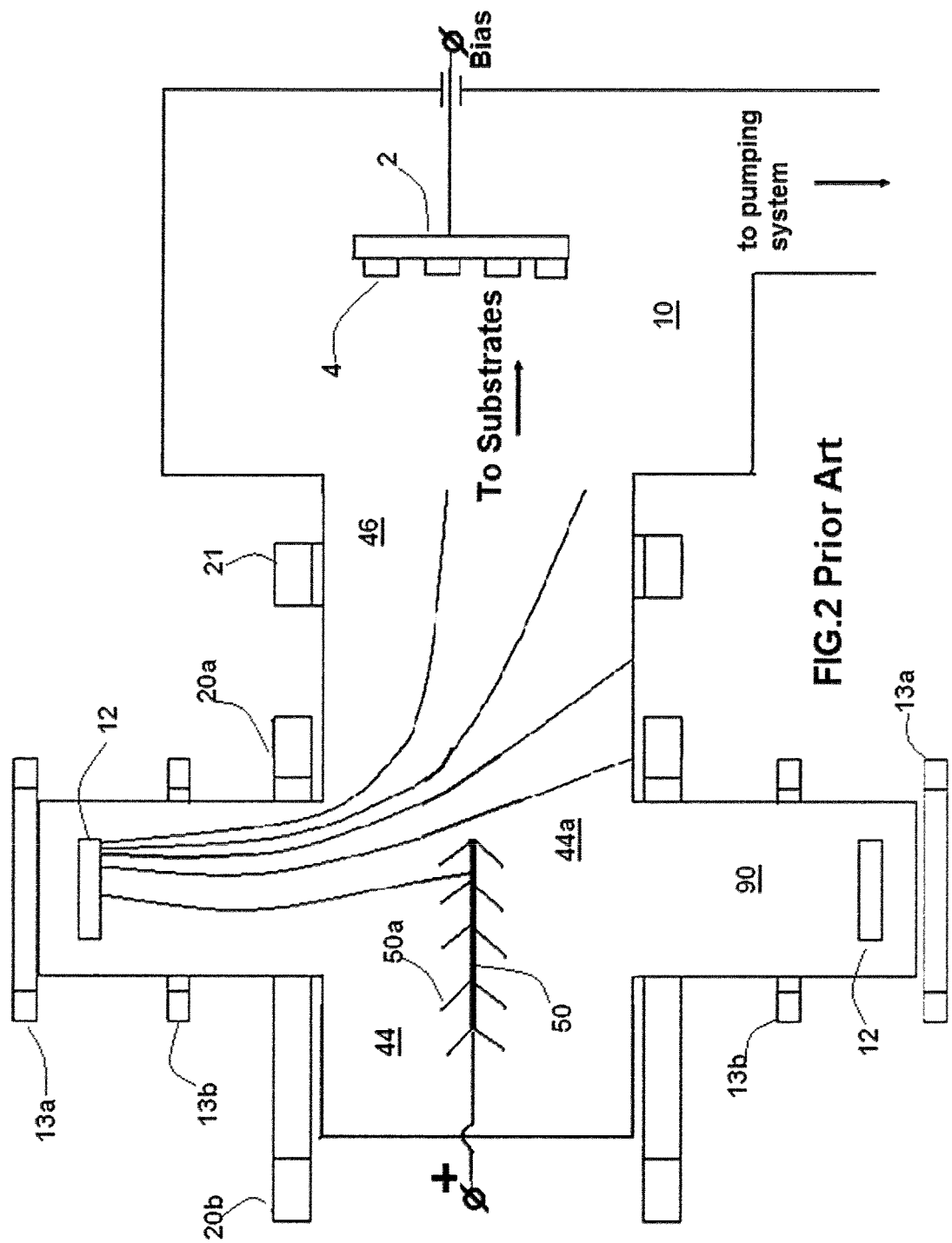
FIG. 2 is a schematic plan view of a prior art dual-cathode filtered arc source illustrating the flow of plasma resulting in metal vapor plasma losses.

The main disadvantage of the prior art apparatus shown in FIG. 1 is that the deflection of the focused vapor plasma generated by the primary cathodic arc sources only begins when the focused plasma flow enters the plasma duct. Since metal ions of the cathodic arc vapor plasma have a large kinetic energy, this late start of the deflection leads to large metal ion losses from the large portion of the metal vapor ion flow which proceeds along the axis of the cathode chamber by inertia and is largely unaffected by the deflecting magnetic field in the deflection section 44a of the plasma duct 44. This is illustrated in FIG. 2 which shows the distribution of the vapor plasma flow lines within the cathode chamber 90 and within the deflection portion of the plasma duct 44a. It can be seen that substantial deflection from the direction along the cathode chamber 90 axes toward the substrate holder 2 in the coating chamber 10 occurs well beyond the exit of the cathode chamber 90. This results in insufficient time to deflect the metal vapor plasma stream generated by the cathodes 12 in the cathode chambers 90 to avoid large losses against the walls of the plasma duct chamber 44. Where the metal vapor plasma stream is not deflected 90° toward substrate chamber 10, a large portion of the metal vapor plasma will be lost to the walls of the plasma duct chamber 44 or dividing baffle 50 even before entering into the focusing exit tunnel section 46, while large amount of vapor plasma will be also lost to the walls of the exit tunnel section 46 of the plasma duct 44.

Figure 3A:
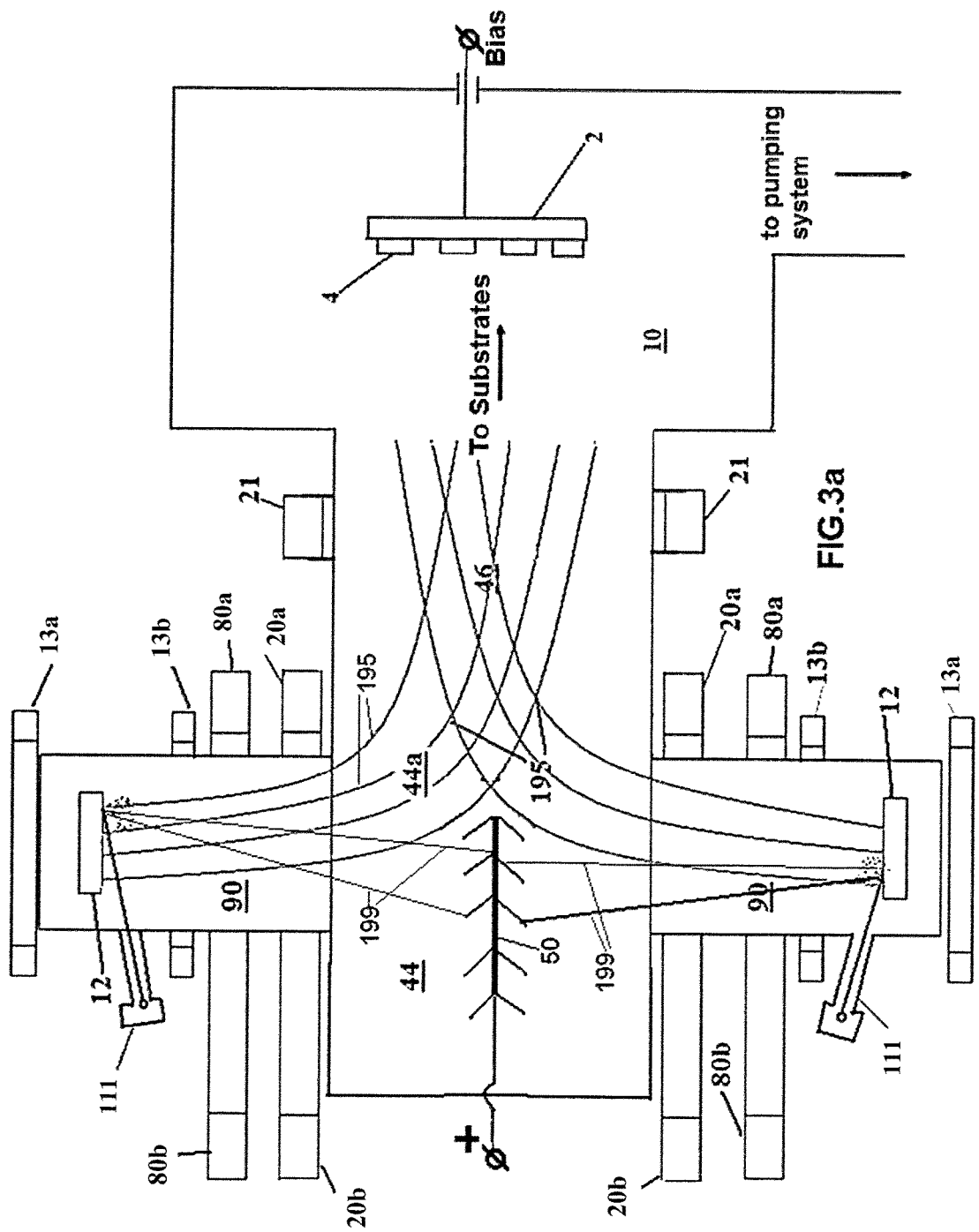
FIG. 3a is a partial schematic plan view of one filtered cathodic arc deposition apparatus in an embodiment of the invention.

According to the invention the filtered cathodic arc apparatus is provided with an electromagnetic system for beginning the deflection of the metal vapor plasma stream generated by a vacuum arc cathode in the cathode chamber, before it enters into plasma duct. This is accomplished by deflecting the magnetic field streamlines in the exit portion of the cathode chamber before it enters the plasma duct 44 as illustrated in FIG. 3a which shows an embodiment of a filtered cathodic arc deposition method and apparatus of present invention. In this embodiment of the invention the cathode target 12 is positioned at the top of cathode chamber 90 between a steering coil 13a and a focusing coil 13b. A pair of main deflecting coils 20 and focusing coil 21 can be positioned along the edges of the rectangular plasma duct 44 and its tunnel portion 46 as shown in FIG. 2 and described in a prior art U.S. Pat. No. 5,435,900 issued Jul. 25, 1995 to Gorokhovsky, which is incorporated herein by reference. This design is also incorporates the advanced coating and surface treatment system described in D. G. Bhat, V. I. Gorokhovsky, R. Bhattacharya, R. Shivpuri, K. Kulkarni, "Development of a Coating for Wear and Cracking Prevention in Die-Casting Dies by the Filtered Cathodic Arc Process," in Transactions of the North American Die Casting Association, 20th International Die Casting Congress and Exposition, Cleveland, Ohio, November 1999, pp. 391-399, the entire disclosures of which are hereby incorporated by reference. Optionally, additional deflecting coil is positioned around the back wall of the plasma duct chamber 44 (not shown). A laser arc ignition 111 is used to initiate the arc discharge at the face surface of the target 12. The additional offset deflecting coils 80 surrounding the cathode chamber comprise the proximate offset front deflecting conductors 80a facing the substrate chamber 10 and positioned next to the cathode chamber wall, and distal offset closing conductors 80b positioned remote from the cathode chamber. The offset deflecting coil 80 allows for the deflection of the cathodic arc plasma flow to start at an earlier stage, inside the cathode chamber 90, which results in a dramatic increase of the filtered vapor plasma 195 which passes the deflecting section of the plasma duct 44a and the tunnel exit portion 46 of the plasma duct chamber 44 without striking its walls. At the same time the macroparticles having straight trajectories 199 not affected by electrical and/or magnetic field are trapped on walls of the cathode chambers 90, plasma duct 40 and baffles. This design has demonstrated substantial increase in vapor plasma transport efficiency of the macroparticle filter.

FIGS. 3b through 3d illustrate the magnetic field distribution in the apparatus shown in FIG. 3a, which was prepared by 2D finite element calculation. In FIG. 3b both the main deflecting conductors 20 and focusing conductors 21 had a current of 2400 amperes, while the offset conductors 80 were turned OFF. It can be seen that in this case the magnetic field starts turning toward the coating chamber (not shown) only downstream of deflecting conductors 20 adjacent to the plasma duct 40.

When the offset deflecting conductors 80 are turned ON with the offset coil current of 1800 amperes, the turning of the magnetic force lines starts near the offset deflecting conductors 80a adjacent to the cathode chambers 90 as illustrated in FIG. 3c. The early turning of the magnetic force lines is can be seen even when the deflecting conductors 20a are turned OFF, but offset proximate deflecting conductors 80a are turned ON with current of 1800 amperes as shown in FIG. 3d.

FIGS. 3e through 3g illustrate the plasma transport efficiency in unidirectional vs. bidirectional plasma duct. The convex plasma boundary in an unidirectional plasma duct shown in FIG. 3e results in excessive plasma losses by diffusion across the convex plasma boundary toward back walls of the cathode chamber 90 and plasma duct 44. The plasma losses across the concave plasma boundaries forming in bi-directional cusp configuration shown in FIG. 3f are substantially reduced. The efficiency of plasma transport can be further improved by creating the concave boundaries of the vapor plasma stream and bending the plasma stream already in a cathode chamber 90 as illustrated in FIG. 3g. To keep the concave shape of both downstream and upstream magnetic force lines both in the cathode chamber 90 and within the plasma duct 44 the midpoint between the offset proximate deflecting conductor 80a and the offset distal closing deflecting conductor 80b of the offset deflecting coil 80 must be disposed within the cathode chamber 90. In case if the proximate and distal deflecting conductors belong to different deflecting coils their respective currents can be adjusted independently from each other hence they can provide concave magnetic field topology on both sides 90a nearest to the substrate chamber and 90b farthest from the substrate chamber of the cathode chamber 90 even when the distance between these conductors greater than two times the width of the cathode chamber 90. For example, the distance between closing linear conductors 80b and the center of the cathode target 12 may be chosen to be between 1.2 and 10 times the distance between the center of the cathode target 12 and the back walls 90b of the cathode chamber 90. When the distance between the closing linear conductors 80b and the center of the cathode target 12 is outside of the range defined from 1.2 to 10 times the effect of concave deflecting magnetic field within cathode chamber 90 for suppressing plasma diffusion losses is nearly disappearing.

The critical issue for improving the efficiency of vapor plasma transport in curvilinear magnetic field is a necessity to avoid the magnetic field crossing the walls of cathode chambers and plasma duct. The vapor plasma stream generated at the evaporating surface of the primary cathode targets 12 is transported largely along the magnetic field lines. Any vapor plasma flow which is confined to the portion of the magnetic field lines that are crossing the walls at the turning point between cathode chambers 90 and the plasma duct 44 is condensing on the walls and contributing to the losses of the plasma vapor from the useful coating deposition process. According to the present invention, the walls 90a of the cathode chambers 90 adjacent to the plasma duct on the side facing the substrate chamber where the plasma flow is turning toward the substrate chamber may be either moved forward (downstream toward the substrate chamber), as shown for example in FIGS. 6b, 7a and 7b, or bent to follow the peripheral magnetic force lines as shown in FIG. 6a so the magnetic force lines 160a will not cross the walls of the cathode chambers. The cathode target 12 can be positioned eccentrically in substrate chamber to leave more space for plasma to turn toward substrate holder in the substrate chamber without crossing the cathode chamber 90 walls as illustrated in FIG. 6a. This design of the cathode chambers 90 is especially favorable for the present invention since it forms a starting point for deflection of the magnetic force lines already in the cathode chamber 90 prior to entering the plasma duct 44.

The combination of filtered cathodic arc source with magnetron sputtering source in one hybrid coating deposition chamber layout allows producing metal vapor plasma with controlled ion-to-atoms ratio, which is advantageous for deposition of coatings with superior functional properties for various applications. The prior art design of the variation of filtered vapor plasma apparatus shown in FIG. 1, representing a hybrid filtered cathodic arc-magnetron sputtering apparatus combining unidirectional dual filtered cathodic arc source magnetically coupled with magnetron sputtering coating deposition sources in one coating system layout are shown illustratively in FIGS. 3h,i. The design of this variation incorporates the advanced coating and surface treatment system described in D. G. Bhat, V. I. Gorokhovsky, R. Bhattacharya, R. Shivpuri, K. Kulkarni, "Development of a Coating for Wear and Cracking Prevention in Die-Casting Dies by the Filtered Cathodic Arc Process," in Transactions of the North American Die Casting Association, 20th International Die Casting Congress and Exposition, Cleveland, Ohio, November 1999, pp. 391-399, the entire disclosures of which is hereby incorporated by reference and also presented in the source and method of controlling vapor plasma flow taught by U.S. Pat. Application No. 2011/0100800 to Gorokhovsky which is incorporated by reference.

Figure 3H:
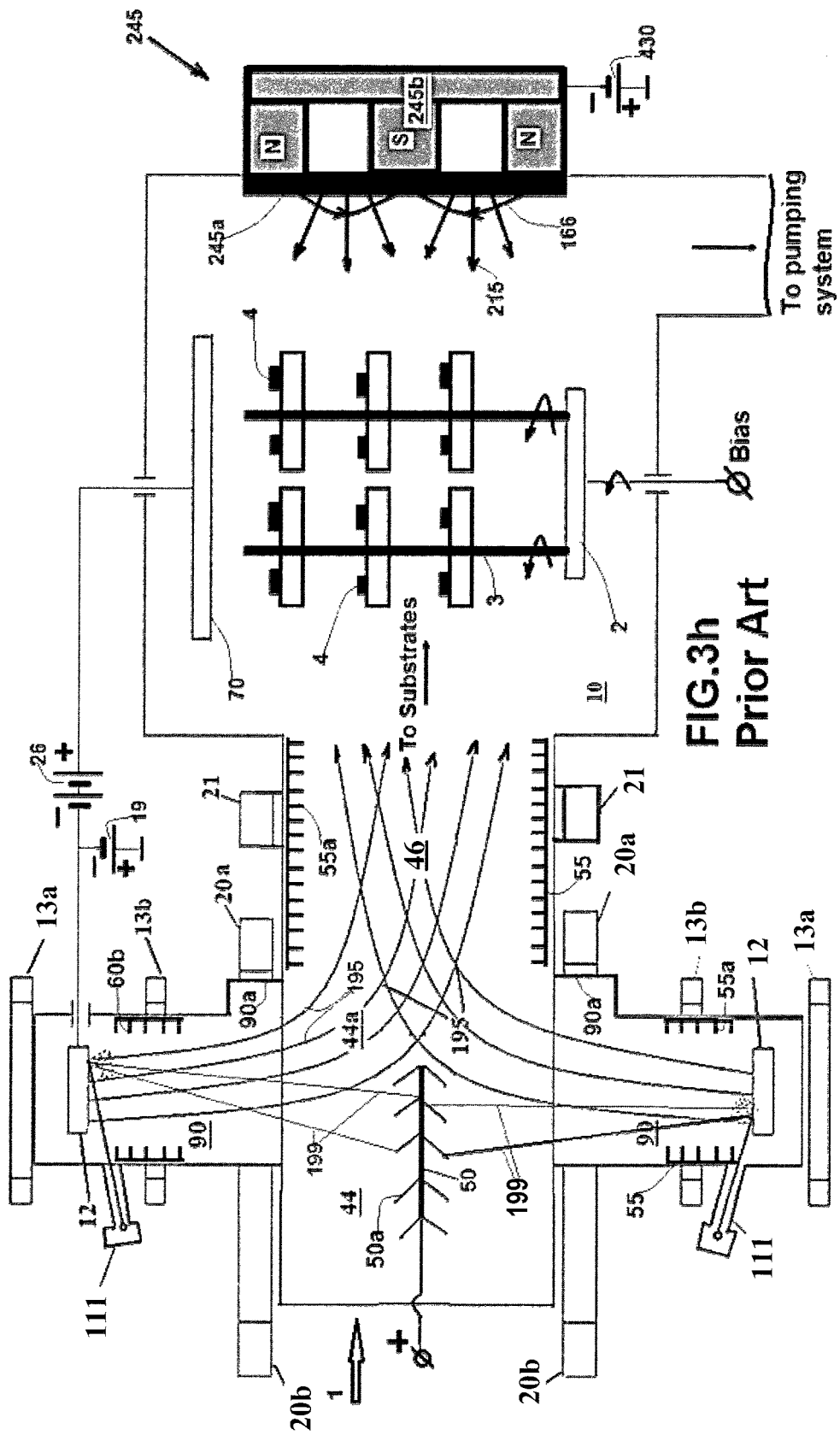
FIG. 3h is a plan view of a prior art rectangular filtered cathodic arc deposition system utilizing magnetron sputtering source located in the coating chamber.

In reference to FIG. 3h, a magnetron sputtering source 245 includes sputtering target 245a and magnetic yoke 245b. Magnetron sputtering source 245 is attached to the wall of coating chamber 10 opposite to the unidirectional dual filtered cathodic arc source 1. Magnetron sputtering source 245 is powered by the magnetron power supply 430. A rotational substrate-holding turntable 2 with substrates 4 to be coated positioned on rotating satellites-shafts 3 is positioned between the magnetron source 245 and filtered cathodic arc source 1. Optionally, a remote anode 70 is provided in coating chamber 10 to increase ionization of the metal vapor-gaseous plasma environment by establishing a remote arc discharge between the at least one cathode 12 in cathode chamber 90 of the filtered cathodic arc source 1, connected to the negative pole of remote arc power supply 26, and remote anode 70 connected to the positive pole of the power supply 26. In this design, substrates 4 are subjected to (a) nearly 100% ionized metal vapor plasma flow 195 generated by filtered cathodic arc source 1 and (b) nearly neutral metal atom sputtering flow 215 generated by magnetron sputtering source 245.

Figure 3I:
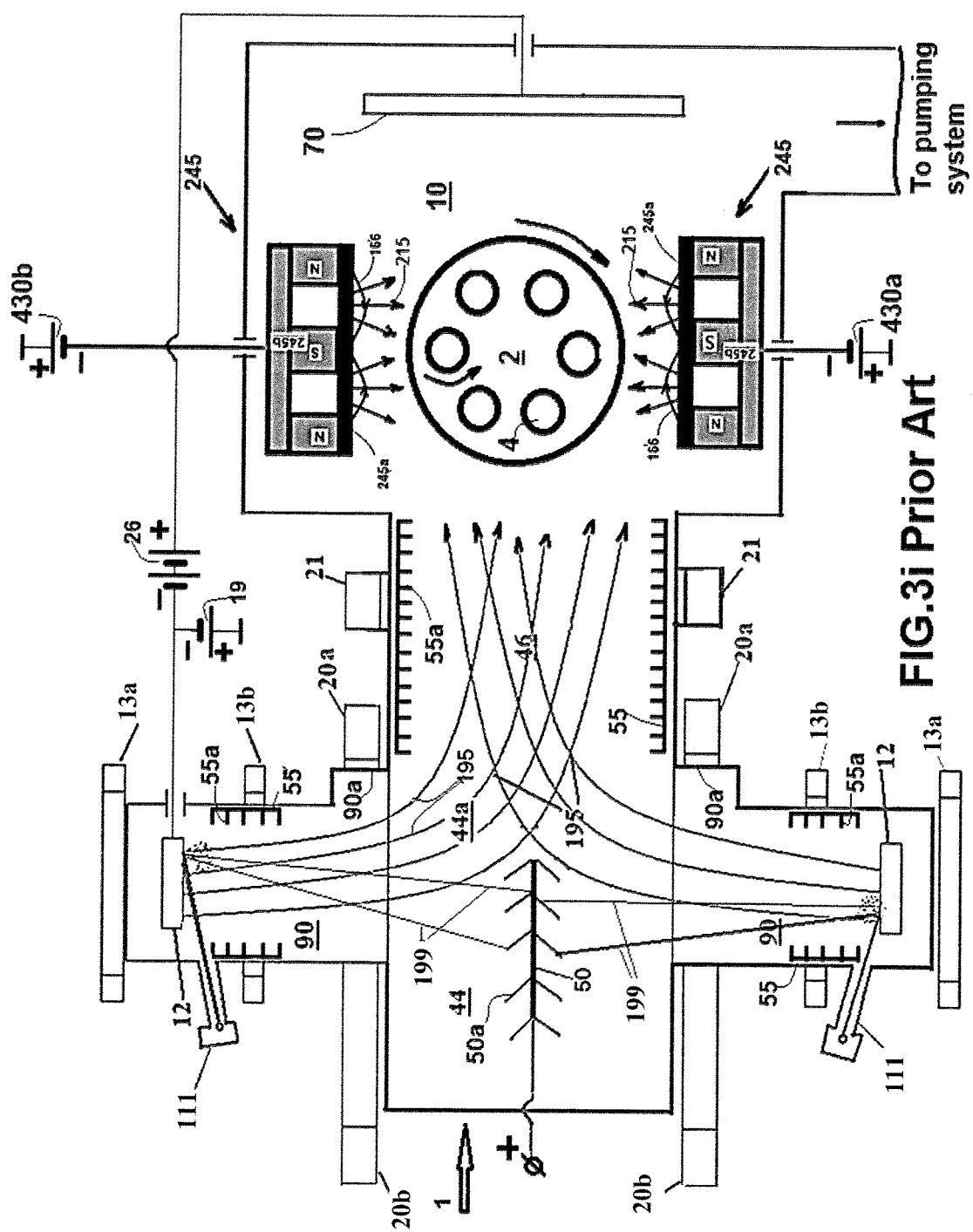
FIG. 3i is a plan view of a prior art rectangular filtered cathodic arc deposition system utilizing two opposite magnetron sputtering sources located in the coating chamber.

FIG. 3i illustrates a design similar to that shown in FIG. 3h except for including two magnetron sputtering sources 245 attached to opposing side walls of coating chamber 10 and magnetically coupled to the unidirectional filtered cathodic arc metal vapor plasma source. A disadvantage of the designs shown in FIGS. 3h and 3i is that each substrate 4 is only alternatingly subjected to vapor plasma flow 195 and metal atomic sputtering flow 215. Any given individual substrate 4 is not simultaneously subjected to both vapor plasma flow 195 and metal atomic sputtering flow 215. Consequently, when, during the coating deposition cycle, a substrate 4 is subjected only to the non-ionized nearly neutral magnetron sputtering atom metal flow 215, the resulting magnetron sputtering layer has low density, high level of defects and low functional properties due to the lack of metal ion bombardment from ionized metal vapor plasma flow 195 during the magnetron sputtering deposition stage.

Figure 3J:
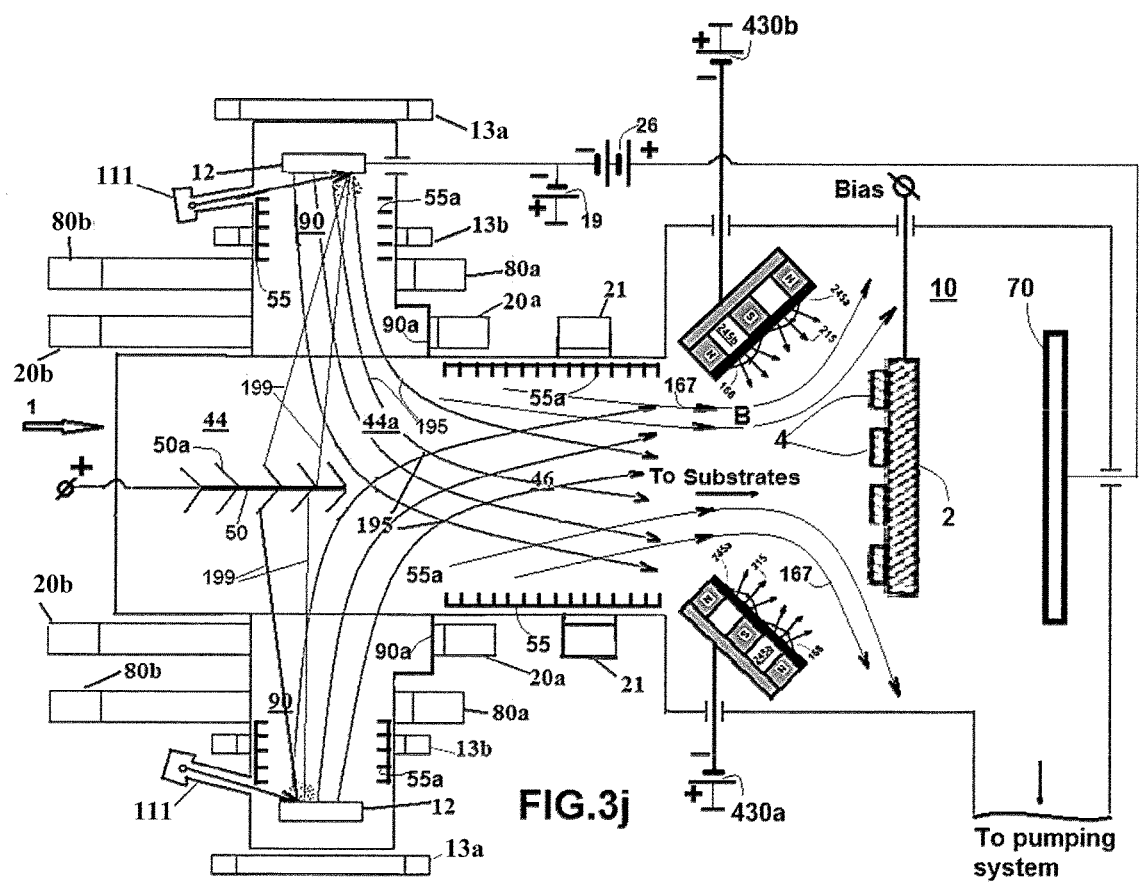
FIG. 3j is a plan view of rectangular filtered cathodic arc deposition system utilizing two opposite magnetron sputtering sources generating magnetron sputtering flow coincided with filtered arc plasma flow.

FIG. 3j schematically illustrates one exemplary hybrid coincided filtered arc-magnetron sputtering deposition apparatus 300. Deposition apparatus 300 represents an improvement over the prior art apparatus of FIGS. 3h,i. Deposition apparatus 300 overcomes the above mentioned disadvantage of the prior art coating apparatus by spatially overlapping metal atom sputtering flow 215 with vapor plasma flow 195 such that substrate 4 may be subjected to metal atom sputtering flow 215 and metal vapor plasma flow 195 at the same time. In deposition apparatus 300, at least one magnetron source 245 is positioned such that non-ionized metal atomic magnetron sputtering flow 215 generated by magnetron targets 245a coincides with nearly 100% ionized metal vapor plasma flow 195 generated by dual filtered cathodic arc source 1. In this case, the ion-to-(atom+ion) ratio in the metal vapor plasma generating by this hybrid coincided filtered arc-magnetron sputtering process can be independently regulated from 0 to 100% by adjusting (a) the flux of metal vapor plasma flow 195 generated by filtered cathodic arc source 1 and/or (b) the flux of metal atom sputtering flow 215 generated by magnetron sputtering source 245. The hybrid coincided filtered arc metal vapor plasma assisted magnetron sputtering deposition process provides an unexpected effect of dramatically improving morphology, microstructure and functional properties of magnetron sputtering coatings by hammering them by bombardment of metal ions of the same nature as magnetron sputtering metal atoms when the targets of the filtered arc source and adjacent magnetron sputtering targets are made of the same metal. Another unexpected result of the hybrid co-directed, coincided metal vapor plasma assisted magnetron sputtering process illustrated in FIG. 3j, which is in contrast to the prior art combinatorial process with separate deposition of metal vapor plasma and magnetron sputtering flow illustrated in FIG. 3i, is that when the filtered arc source targets and adjacent magnetron targets are made of different metals the hybrid coincided filtered arc assisted magnetron sputtering deposition process is able to deposit nanostructured nanocomposite coatings utilizing the composition of mixed metal vapor plasma atoms generated by the filtered arc source and metal atoms generated by the adjacent magnetron sputtering sources. Without departing from the scope hereof, deposition apparatus 300 may include only one filtered cathodic arc source 1 or more than two filtered cathodic arc sources 1.

In the particular embodiment shown in FIG. 3j, two magnetron sputtering sources 245 are positioned adjacent to both exit tunnel section 46 of plasma guide 44 and coating chamber 10 while targets 245a of both magnetron sputtering sources 245 face the same spot on substrate holder 2. Thus, metal atom sputtering flow 215 from both magnetron sputtering sources 245 onto substrate holder 2 and substrates 4 coincides with deposition of metal ions of metal vapor plasma flow 195 generated by filtered cathodic arc source 1.

Without departing from the scope hereof, deposition apparatus 300 may include only one magnetron sputtering source 245 or more than two magnetron sputtering source 245, wherein each magnetron sputtering source 245 is positioned to coincide deposition of the associated metal atom sputtering flow 215 onto substrate(s) 4 with deposition of metal vapor plasma flow 195 generated by filtered cathodic arc source 1. Also without departing from the scope hereof, magnetron sputtering source(s) 245 may be placed in plasma guide 44, see for example FIGS. 10a and 10b.

In deposition apparatus 300, each magnetron sputtering source 245 is magnetically coupled with the magnetic field of filtered cathodic arc source 1 within exit section 46 of plasma duct 44 and into coating chamber 10. In on implementation, the focusing magnetic force lines 167 generated by focusing magnetic coil 21 near exit tunnel section 46 overlap and are codirectional with magnetron magnetic force lines 166 of each magnetron sputtering source 245 on the side of the surface of magnetron target 245a facing substrate holder 2. Herein, "codirectional" magnetic field lines refers to magnetic field lines that generally point in the same direction, as opposed to in opposite directions. Codirectional magnetic field lines need not be parallel and may have directions that deviate from each other, as long as this angular deviation is insufficient to magnetically misdirect the vapor plasma flow from filtered cathodic arc source 1 to miss substrates 4.

In deposition apparatus 300, unidirectional dual filtered cathodic arc source 1 is optionally provided with a pair of offset deflection coils 80. Each offset coil 80 surrounds cathode chamber 90 having deflecting conductor 80*a* proximate to the wall 90*a* of the cathode chamber 90 facing coating chamber 10, while its closing conductor 80*b* is positioned distant from the opposite wall of the cathode chamber 90 facing away from the coating chamber 10. In this design, the deflection of metal vapor plasma flow 195 generated by the cathodic arc evaporation process on the surface of cathode target 12 starts already in cathode chamber 90 prior to entering the deflection section 44*a* of the plasma duct 44, which results in increased efficiency of transport of metal vapor plasma toward coating chamber 10, thereby increasing the productivity of the filtered cathodic arc coating deposition process.

FIG. 3*k* schematically illustrates one exemplary hybrid coincided filtered vapor plasma-magnetron sputtering deposition apparatus 310 with a remote arc discharge. Deposition apparatus 310 utilizes the dual unidirectional rectangular electromagnetic filter for extracting the metal ions from the primary metal vapor plasma sources and transporting them toward the coating chamber. Each primary metal plasma source may be either a magnetron sputtering source or a cathodic arc evaporating source. The primary metal plasma sources are positioned in two opposing cathode chambers attached to opposing walls of the rectangular plasma duct.

In the particular embodiment shown in FIG. 3*k*, the primary metal vapor plasma sources in the cathode chambers are magnetron sputtering sources having anodes spaced from the magnetron targets. The substrates to be coated are located on substrate holder in the coating chamber out of the direct line-in-sight of the magnetron targets positioned in the cathode chambers.

Deposition apparatus 310 includes an electron emitting cathode-ionizer source, which can be for example thermionic cathode source, hollow cathode source or vacuum arc cathode source. The cathode-ionizer source is located in the coating chamber. However, without departing from the scope hereof, the cathode-ionizer source may be located elsewhere in the coating chamber or within the plasma duct. The cathode ionizer is connected to the negative pole of the ionizing power supply while its positive pole is connected to the magnetron anodes of the primary metal plasma sources. The remote arc discharge, thus generated between the cathode-ionizer and the magnetron anodes positioned in front of the magnetron targets in the cathode chambers, increases the ionization rate of the magnetron sputtering metal atomic flow which is otherwise typically below 0.1%. The metal ions are transported along the curvilinear deflecting magnetic field generated by a pair of deflecting coils and turned around the corner of the cathode chamber by the magnetic field generated by the deflecting linear conductor facing the coating chamber toward the exit tunnel section of the plasma duct. In the exit tunnel section of the plasma duct, the flow of metal ions is focused by the focusing coil toward the substrates to be coated in the coating chamber.

Deposition apparatus 310 includes an additional pair of magnetron sputtering sources located in the coating chamber near the exit of the plasma duct into the coating chamber. The additional magnetron sputtering sources are magnetically coupled with the focusing magnetic field generated by the focusing coil. The magnetron targets of the additional magnetron sputtering sources face the substrates to be coated, on the substrate holder in the coating chamber, in such a manner that the generally neutral flow of sputtering metal atoms generating by the additional magnetron sputtering sources is focused to the same spot on the substrate holder as the nearly 100% ionized metal vapor plasma flow generated by the filtered metal vapor plasma source. Thus, deposition apparatus 310 coincides the deposition of the 100% ionized metal vapor plasma flow with neutral metal atomic sputtering flow, resulting in the advantages discussed above in reference to FIG. 3. Deposition apparatus 310 allows controlling the ionization rate of the spatially overlapping deposited metal atom plasma with ion-to-(ion+atom) ratio ranging from 0 to 100% depending on intensity of the metal vapor plasma flux generated by the filtered metal vapor source vs. metal atomic sputtering flux generated by the additional magnetron sputtering sources located in the coating chamber.

Figure 3L:
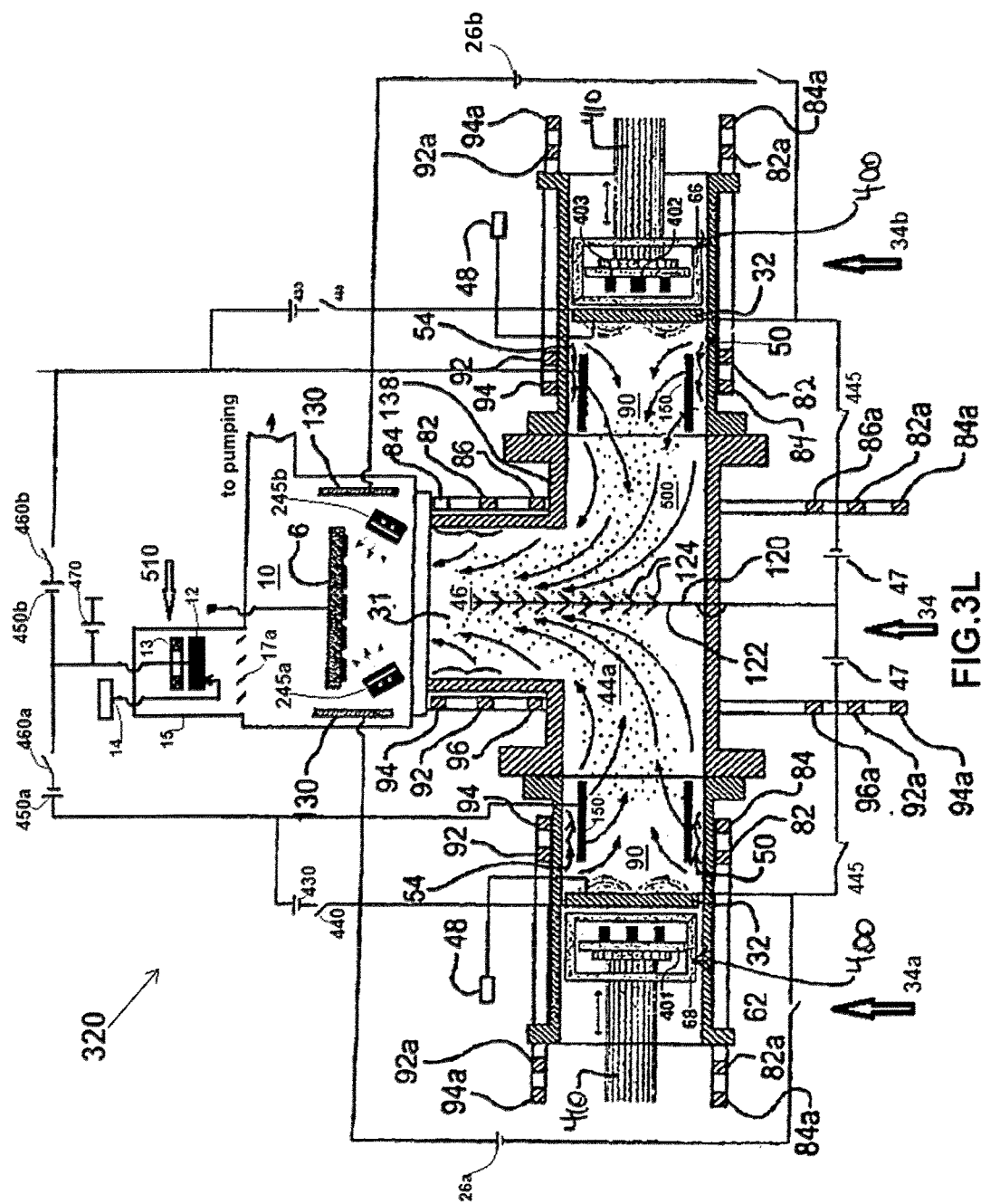
FIG. 3L is a plan view of the filtered magnetron-arc coating apparatus of FIG. 3k utilizing shielded cathodic arc source for ionization of magnetron sputtering flow.

FIG. 3L illustrates one exemplary hybrid coincided filtered vapor plasma-magnetron sputtering deposition apparatus 320 for combined deposition of a filtered vapor plasma and metal atom sputtering flow 215. Deposition apparatus 320 includes convertible magnetron-arc sources that may operate both in magnetron sputtering mode and in cathodic arc evaporation mode to produce the filtered vapor plasma. The filtered vapor plasma is at least partly ionized. In certain embodiments, the filtered vapor plasma is fully or nearly fully ionized. Deposition apparatus 320 is an embodiment of deposition apparatus 310.

Deposition apparatus 320 includes a dual rectangular metal vapor plasma source 34 that has two primary vapor sources 34*a* and 34*b*. Each primary vapor plasma source includes a target 32. Each target 32 is a cathode plate and is provided with an additional high current low voltage power supplies 47 connected to the cathode target plate 32 via switches 445 and an arc igniter 48. Cathode plates 32 are positioned in cathode chambers 90 at opposite ends of the housing 138. Cathode plates 32 are in communication, through a parallelepipedal plasma duct 31, with a substrate holder 6 in coating chamber 10. Plasma duct 31 includes deflecting section 44*a* and the exit tunnel section 46. On each side, a magnetron high voltage low current power supply 430 is connected to the target plate 32 via a switch 440. The magnetron magnet set can preferably be moved away from the target 32 by using a shaft 410 attached to a magnet holding plate 401.

Figure 3M:
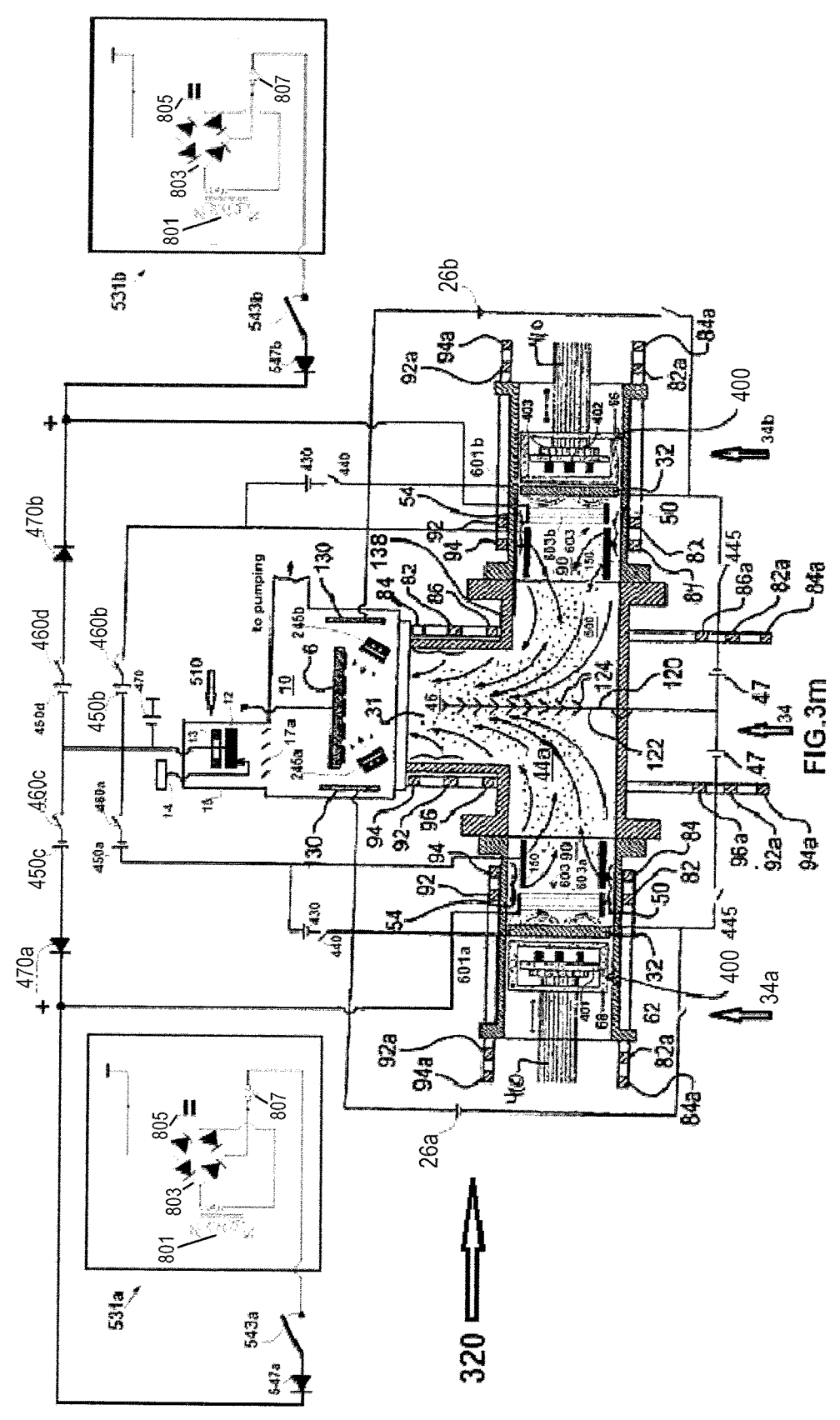

In an embodiment of deposition apparatus 320, each cathode chamber 90 includes proximate internal grid anodes 603 (shown in FIG. 3*m*). Internal grid anodes 603 are configured as an array of wires 603*a* and 603*b* supported by the grid anode holders 601*a* and 601*b* are spaced from the sputtering front surface of each of the opposite targets 32.

Deposition apparatus 320 includes a distant internal anode (deflecting electrode) 120 and additional tubular internal anodes 150. Anodes 120 and 150 (and anodes 603 shown in FIG. 3*m*) are defined herein as "internal" because they are disposed within the plasma duct/coating chambers between the cathode plates 32 and the substrate holder 6. Additional tubular internal anodes 150 may be installed along the walls of the cathode chambers 90 downstream from the targets 32 surrounding the discharge area near the targets 32 spaced from the walls of the cathode chambers 90. Anodes 150 serve as anodes to the cathode targets 32. Optionally, one or more of internal anodes 120, the grid anodes 603 and the tubular anodes 150, are electrically coupled with one or more cathode ionizers installed elsewhere in coating chamber 10 or in plasma duct 31.

Distant internal anode (deflecting electrode) 120 includes a linear plate 122 having baffles 124, and is disposed along plasma duct 31 at the approximate center between the two cathode plates 32. Baffles 124 increase the anodic surface area, effectively functioning as a chain of internal anodes, which provides better stabilization and steering of arc spots. Baffles 124 also serve to trap macroparticles emitted from the evaporation surface of primary vapor sources 34a and 34b. This "dividing" anode 120 also serves to repel ions and thus deflect the plasma streams toward substrate holder 6.

The primary metal vapor plasma sources 34a and 34b include cathode assemblies 400 installed in the cathode chambers 90 (shown in FIG. 3L and FIG. 3m). Each primary metal vapor plasma source 34a, 34b is a convertible magnetron-arc source capable of operating both in magnetron sputtering mode and in cathodic vacuum arc evaporation mode depending on the position of a magnetic steering and plasma confinement system. This magnetic steering and plasma confinement system includes a set of central magnets 402 and peripheral magnets 403 attached to a magnet holding plate 401 disposed behind the cathode target plate 32 within enclosures 66, 68. Each enclosure 66 and 68 is installed on a movable shaft 410 behind target 32. The magnetic steering and plasma confinement system creates an arch-shaped closed loop magnetic field configuration in front of targets 32. In magnetron sputtering mode, the confining and steering magnets are moved close to target 32 to increase the strength of the closed loop confining magnetic field in front of the target 32 and consequently the plasma density of the magnetron discharge. In cathodic arc evaporation mode, the confining and steering magnets are moved further from target 32 to reduce the strength of the steering magnetic field in front of target 32. The ignition of the vacuum arc discharge on evaporating surface of the target 32 is provided by mechanical igniter 48. The closed loop confining and steering magnetic field lines in front of targets 32 overlaps and are co-directional with the focusing magnetic field 50, 54 created by magnetic conductors 82, 84, and 92, 94. This allows for the extraction of an increased amount of magnetron metal sputtering plasma or cathodic arc vapor plasma from the area near target 32 toward exit tunnel section 46 via deflection section 44a of the plasma-guide portion of the electro-magnetic vapor plasma filter chamber 31. The mixed vapor-gaseous plasma flow is confined in a curvilinear magnetic field created by focusing conductors 82, 84 and 92, 94 and deflecting conductors 86, 96, while the corresponding closing linear conductors 82a, 84a, 86a, 92a, 94a, 96a are positioned distant from the targets 32 and back side 500 of the plasma duct chamber 31 to minimize their influence plasma transportation along the cathode chambers 90 and deflecting section 44a of the plasma duct 31 toward coating chamber 10. In this embodiment targets 32 are positioned in a magnetic half-cusp area on a side 500 of the deflecting section 44a of the plasma guide chamber 31 where the magnetic force lines converge toward dividing anode 120. This ensures that all vapor-gaseous plasma extracted from the magnetron discharge generated in cathode chambers 90 will be focused and directed toward the substrates to be coated on substrate holder 6, while neutral droplets and macroparticles are removed from the plasma flow and trapped by baffles 124 and/or other baffles optionally disposed on walls of the cathode chambers 90 and/or on walls of the deflecting section 44a of the plasma duct 31 not occupied by plasma sources 34a and 34b.

Auxiliary arc cathodes may be installed elsewhere in the coating apparatus, out of optical alignment from the magnetron-arc cathode targets 32 as illustrated in FIGS. 3k, 3L, and 3m. For example, FIG. 3k shows a thermionic cathode-ionizer (hot filament or hollow cathode) installed in the coating chamber, to establish an auxiliary arc discharge between the auxiliary cathode-ionizer and the tubular magnetron anodes in a coating chamber. In an embodiment, deposition apparatus 320 includes a shielded cathodic vacuum arc source 510 coupled with magnetron anodes 150 in cathode chambers 90 for ionization of metal vapor flow in cathode chambers 90. Vacuum arc cathode-ionizer 510 may be installed in the coating chamber 10, to establish an auxiliary arc discharge between the cathode target 12 and the internal tubular anodes 150 as illustrated in FIG. 3L (and optionally wire anodes 603 shown in FIG. 3m). This results in an increase of the ionization rate of the magnetron discharge plasma while also increasing the ionization rate of the gaseous component of the plasma environment in the coating chamber, allowing magnetron sputtering at lower operating pressures, and improving coating quality by increasing ionization and activation of the vapor-gaseous plasma environment, while eliminating droplets, macroparticles and neutral clusters from metal-gaseous vapor plasma flow.

The embodiments of FIGS. 3L and 3m may further include one or more external anodes 130 surrounding the substrate holder 6. Anodes 130 are defined herein as "external" because they are disposed outside of the plasma duct 31. Thus, the external anodes 130 do not deflect the plasma, but instead repel ions to prevent diffusion losses on the walls of the housing 138 and to prolong ionization of the gaseous plasma, thus improving coating efficiency. Such external anodes 130 can also be provided along any desired portion of the housing 138. The external anode 130 which is installed in the coating chamber 10 may serve as remote anode to establish an remote arc discharge between the cathode targets 32 in the cathode chambers 90 and remote anode 130 which is powered by remote arc power supplies 26a and 26b. The remote arc plasma associated with this remote arc discharge allows for increased ionization and activation of the metal vapor-gaseous plasma environment in coating chamber 10, hence improving qualities of deposited coatings. Additionally, coating chamber 10 itself, or some portion thereof, may be grounded to serve as an anode. Optionally, the remote arc discharge for ionization and activation of the plasma environment in the coating chamber 10 may be established between (a) a cathode target 12 of the cathode ionizer source 510 and (b) the remote anode 130. The internal anodes 603, 150, 120 and external anode 130 are preferably electrically isolated and, for this purpose, each may be provided with an independent power supply, which allows for better control over their independent functions.

In exemplary operation of this embodiment in a filtered magnetron sputtering mode, a sputtering gas such as argon is injected through sputtering gas inlets (not shown) in the vicinity of both magnetron target plates 32 installed at opposite sides of the filtered plasma arc source apparatus. A reactive gas (for example nitrogen and/or acetylene) may optionally be supplied into the coating chamber, for deposition of cermet coatings (TiN, TiC, TiCN etc.). Switch 445 is disconnected and the arc power supply 47 is turned off. Switch 440 is activated to connect the negative pole of the magnetron power supply 430 to the target plate 32. The magnetron plasma discharge is largely confined by the arch-shaped magnetron magnetic field in the vicinity of the magnetron target cathode plate 32, forming a generally rectangular plasma ring along the gap between the edge magnet set 403 and the central magnet set 402. An erosion zone is formed by plasma sputtering on the evaporation surface of the magnetron target 32 along the path of the magnetron closed loop discharge, where the plasma density is strongest. The focusing magnetic field created by focusing conductors 82, 84 and 92, 94 creates converging magnetic field lines in front of the magnetron targets 32, i.e. over the target surface, which extracts vapor plasma flux from the magnetron discharge and focuses it toward the exit tunnel section 46 of the plasma-guide portion of the electromagnetic vapor plasma filter chamber 31. This vapor plasma flux is further confined into the converging magnetic half-cusp field near back-side section 500 of the deflecting section 44a of the plasma guide chamber 31, which deflects it toward the coating chamber where substrates to be coated are installed on substrate holder 6. Focusing conductors 82, 84 and 92, 94 installed at the exit of the plasma-guide focus the vapor plasma toward the substrates to be coated. The dividing anode 122 repels metal ions, effectively diverting the ion trajectories toward the coating chamber. Macroparticles and neutral vapor atoms are trapped by baffles 124, installed at the dividing anode plate 120. When the auxiliary arc discharge is activated between the cathode target 12 of the vacuum arc source 510 and magnetron anodes 150, the ionization rate increases in the vicinity of the magnetron targets 32. That increases the productivity of magnetron sputtering, as well as allows for operating the magnetron discharge at a lower operating pressure. This reduced operating pressure in turn results in higher conductance of the ionized vapor plasma out of cathode chamber 90 through plasma duct to coating chamber 10 due to a reduced frequency of collisions between ions and other atomic particles. This results in a higher ion flux at the entry to coating chamber 10, and thus higher productivity of the filtered magnetron sputtering process.

In exemplary operation of this embodiment in filtered cathodic arc evaporation mode, switch 440 is opened to disconnect the magnetron power supply 430, and instead switch 445 connecting the arc power supply 47 to cathode target plate 32 is closed. When arc power supply 47 is turned on, arc igniter 48 will ignite the cathodic arc discharge at the evaporation surface of cathode target plate 32. Optionally, a reactive gas is supplied to cathode chamber 90 for deposition cermet coatings. Magnetron magnets 402, 403 are moved away from target plate 32 area by shaft 410 supporting magnet holding plate 401. Cathodic arc spots are magnetically steered by magnetic conductors 82, 84 and 92, 94 that are parallel to the long side of the targets 32 and, independently of the set of permanent magnets 402, 403, create an arch-shaped magnetic field in front of cathode target 32. This provides the maximum target utilization rate and arc spot confinement to the wide erosion corridor area on the evaporation surface of the target plate 32. At the same time, steering/focusing conductors 82, 84 and 92, 94 focus the arc vapor plasma toward the magnetic half-cusp area created by deflecting conductors 86, 96. The deflected plasma flow are further focused, by focusing conductors 82, 84 and 92, 94 installed at the exit of the plasma-guide chamber, toward substrates installed on substrate holder 6, which are to be coated. An auxiliary anode 130 may be used to improve the ionization and activation rate of the gaseous component of the vapor-gaseous flow.

In reference to FIG. 3L, cathode ionizer 510 includes vacuum arc cathode target 12 with steering coil 13 providing magnetically steering vacuum arc spots on an evaporating and electron emitting surface of the target 12. The vacuum arc discharge is ignited by mechanical igniter 14. The primary vacuum arc on cathode target 12 is powered by a primary cathodic arc power supply 470. The cathode target assembly is enclosed in a cathode ionizer chamber 15 which is separated from coating chamber 10 by a shield 17a. Shield 17a has chevron baffles that are impermeable for heavy particles (metal atoms, ions and macroparticles), but allow electrons freely flow to coating chamber 10. The remote arc discharge is established between cathode target 12 in cathode ionizer's chamber 15 and magnetron anodes 150 in cathode chambers 90. The remote discharge is powered by remote arc power supplies 450a and 450b when switches 460a and 460b are closed. In one embodiment, magnetron grid-anodes 603 are installed in front of magnetron sputtering targets 32 as illustrated in FIG. 3m. Grid anodes 603 include a set of thin wires 603a and 603b that are attached to the wire anode holders 601 and form an array of wire anodic electrodes, parallel to the surface of the magnetron targets 32, in which the distance between the neighbor wire electrodes exceeds the anodic plasma sheath formed around the wire electrode when a positive potential is applied to each of wire electrodes 603a and 603b. Both anodic DC and DC pulse remote arc discharge can be conducted between cathode target 12 in cathode ionizer chamber 15 and wire anodes 603a and 603b powered by DC arc power supplies 450c, 450d and unipolar DC pulse power supplies 531a and 531b. In this embodiment of the invention, the grid magnetron anode holders 601a, b, with attached array of anodic wire electrodes 603a and 603b, are charged positively in reference to the primary cathode 12 in the cathode ionizer chamber 15 by connecting grid anodes 603a and 603b to the positive terminals of the DC power supplies 450c and 450d when (a) switches 460c and 460d are closed, but (b) switches 543a and 543b connecting the magnetron grid-anodes 603a and 603b to the unipolar switching positive DC pulse power supplies 531a and 531b are opened. In this mode, a remote DC arc discharge is generated between the array of wire-anodes 603 and cathode target 12. Magnetron grid-anodes 603a and 603b may be powered by unipolar high positive pulse voltage via unipolar switching pulse DC generators 531a and 531b when (a) switches 460c and 460d are opened, (b) power supplies 450c and 450d are turned off, (c) and switches 543a and 543b are closed to conduct high voltage positive pulses generated by unipolar switching pulse DC generators 531a and 531b to magnetron grid-anodes 603a and 603b in a cathode chambers 90. In this mode, a remote DC pulse arc discharge is generated between the array of wire-anodes 603 and cathode target 12. Alternatively, this design also allows for providing high voltage positive pulses from unipolar DC pulse high voltage switching generators 531a and 531b while at the same time providing a DC positive voltage from DC power supplies 450c and 450d, when all switches 460c, 460d, 543a and 543b are closed and power supplies 450c and 45d are turned ON. In this case, the power supplies are protected by diodes 470a, 470d, 547a and 547b. The positive poles of the DC power supplies 450c and 450d and unipolar switching DC pulse power supplies 531a and 531b are connected to respective magnetron grid-anodes 601a and 601b, while their negative poles are connected to electron emitting cathode target 12 or are grounded. In this mode, the high voltage positive DC pulses are superimposed over positive anodic DC voltage continuously applied to the magnetron grid-anodes 601. Each unipolar switching pulse DC power supply 531a and 531b may, as shown schematically as an example in FIG. 3m, include a transformer 801, a rectifier 803, a capacitor 805, and a high voltage ignitron trigger-switch 807. When switch 543 is closed, trigger-switch 807 discharges capacitor 805, generating the unipolar positive voltage DC pulses applied to magnetron grid-anodes 603a and 603*b* while the pulse arc current is conducted via remote arc discharge between the array of anodic wires 603 and primary cathode target 12.

During the stationary remote arc discharge mode, the plasma potential within the cathode chambers 90 in the vicinity of the magnetron targets 32 is defined by the positive voltage applied to grid-anodes 601 by DC power supplies 450, which is typically ranging from 30 to 500 volts. When the high voltage positive pulses are applied to the wire-electrodes 603*a* and 603*b* of the magnetron grid-anodes 603, the plasma potential in front of magnetron target 32 may increase by orders of magnitude, thereby increasing the ionization rate of the magnetron sputtering metal atom flow in the cathode chamber 90. The voltage amplitude of the positive high voltage pulses generated by switching DC pulse power supply 531 typically ranges from 0.1 kV to 1 MV. Pulse voltage amplitude below 0.1 kV does not produce ions with sufficiently high energy. It is impractical to produce unipolar pulses with voltage amplitude exceeding 1 MV due to the associated complexity of switching DC pulse power generator 531 and insulation of the magnetron's components. In one embodiment, as shown in FIG. 3*m*, the remote arc discharge may, when the switches 460*a* and 460*b* are closed, be ignited between magnetron anodes 150 and cathode target 12 in parallel with ignition of the remote arc discharge between cathode target 12 and magnetron grid-anodes 601, with wire electrodes 603 providing dense plasma in the area of magnetron sputtering discharge adjacent to magnetron target 32. The current of the remote arc discharge is typically in the range from 50 A to 500 A, but may be increased up to 10 kA. When the high voltage positive pulses are applied to wire electrodes 603 immersed in the continuous remote arc discharge plasma, plasma sheaths are created around each of the wire electrodes. The value of the plasma potential within the plasma sheath areas surrounding wire electrodes 603*a* and 603*b* is almost equal to the high voltage potential applied to the wire electrode by pulse power supply 531. When the distance between the neighboring wire electrodes 603*a* and 603*b* in a wire anode electrode array 603 is comparable to the plasma sheath thickness, the plasma sheath areas surrounding the wire electrodes 603 overlap. This overlap results in a continuous uniform distribution of the high positive plasma potential within the wire electrode array zone adjacent to the magnetron target 32, thus providing high ionization rate of the metal sputtering atoms generating by magnetron sputtering of magnetron target 32.

The diameter of wire electrodes 603 is typically in the range from 0.01 mm to 1 mm. A wire electrode 603 diameter less than 0.01 mm may not be practical due to insufficient mechanical strength, whilst wire electrodes 603 having diameters greater than 1 mm may capture high fluxes of electrons influencing plasma properties in the wire electrodes array zone near the magnetron target 32. The distance $d_w$ between neighboring wire electrodes 603 in the wire electrode array is typically in the range from 0.1 mm to 5 cm, while the operating pressure of the remote arc discharge plasma is in the range from 0.001 mTorr to 100 Torr. An operating pressure less than 0.001 mTorr is insufficient to ignite the remote arc discharge. An operating pressure above 100 Torr constricts the remote arc and results in the formation of narrow channels or filaments which produce non-uniform plasma distribution not suitable for assistance of the magnetron sputtering ionization process. Distances between the wire electrodes less than 0.1 mm are not practical and will inflict large ion losses due to collisions of high energy ions with wire electrodes. Distances between the neighboring wire electrodes exceeding 5 cm may require applying more than 1 MV voltage for overlapping the plasma sheaths between the neighboring wire electrodes, which, in most cases, will be impractical. The preferable range of the distances between the wire electrodes 603 is from 1 mm to 1 cm. Keeping such distances between the neighboring wire electrodes 603 facilitates overlapping the plasma sheath areas between the wire electrodes 603 at high voltage DC pulse discharge mode to provide uniform distribution of high positive plasma potential within the area occupied by wire electrode array 603. At the same time, distances between neighboring wire electrodes 603 exceeding 0.1 mm are greater than the plasma sheath length surrounding the positively charged wire electrodes 603 during the low voltage continuous remote arc discharge mode. This allows the remote arc discharge plasma to expand from cathode target 12, in chamber of cathode ionizer 510, along deflecting section 44*a* of the plasma duct 31 toward the magnetron grid-anode 601 to provide uniform distribution of the high plasma density across the magnetron discharge area adjacent to magnetron sputtering target 32 during the period of time between high voltage impulses generated by high voltage power supply 531 when magnetron grid-anode 601 serves as a remote anode for the remote arc discharge with target 12, in the chamber of cathode ionizer 510, as electron emitting cathode. When this high plasma potential is established within the area occupied by the array of wire anodes 603, the positive ions from the high voltage zone are accelerated downstream of grid-anode 601 along cathode chamber 90 toward deflecting section 44*a* of the plasma duct 31 and, at the same time, upstream toward magnetron target 32, enhancing magnetron sputtering process, while energetic electrons generated within the plasma sheath area surrounding wire electrodes 603 contribute to an increase of the ionization rate of the magnetron sputtering metal atoms flow.

FIG. 3*n* illustrates one exemplary planar cathodic vacuum arc source 330 which is an embodiment of primary vapor sources 34*a*, 34*b* shown in FIGS. 3L and 3*m*. The magnetic steering system of planar cathodic vacuum arc source 330 improves the target utilization rate and, at the same time, is compatible with electromagnetic focusing and deflection of the metal vapor plasma flow. Planar cathodic vacuum arc source 330 utilizes a plurality of rectangular steering coils 37, 38 and 39 positioned behind cathode target 32 for moving the arc erosion corridor from the periphery toward the center of the target 32. An arch-shaped magnetic field formation 43 above cathode target 32 may be moved toward the target border and back toward target center by smoothly switching the current in steering coils 37, 38 and 39 using the steering coils control system. The cathodic arc spot 35, the source of cathodic vacuum arc vapor plasma 136, is positioned under the top point of the magnetic arch lines 600 (shown by the arrow 606 perpendicular to the target 32) where the steering magnetic field lines are generally parallel to the target 32 surface. When steering coils 37, 38 and 39, as controlled by the steering coils control system, moves the position of the top point of the steering magnetic field arch-shaped lines 600 toward the border of target 32 and back toward the center of target 32, the position of the cathodic arc spot 35 follows by keeping its location under the top point of magnetic arch 600. At the same time, the focusing coil 84 positioned in front of the cathode target 32 generates a focusing magnetic field 604 which focuses the metal vapor plasma generated by cathodic arc spot 35 toward the plasma duct of the filtered arc source (shown in FIGS. 3L and 3*m*). This approach allows widening the erosion racetrack on the surface of target 32, hence increasing the utilization of cathodic arc target 32.

Figure 4A:
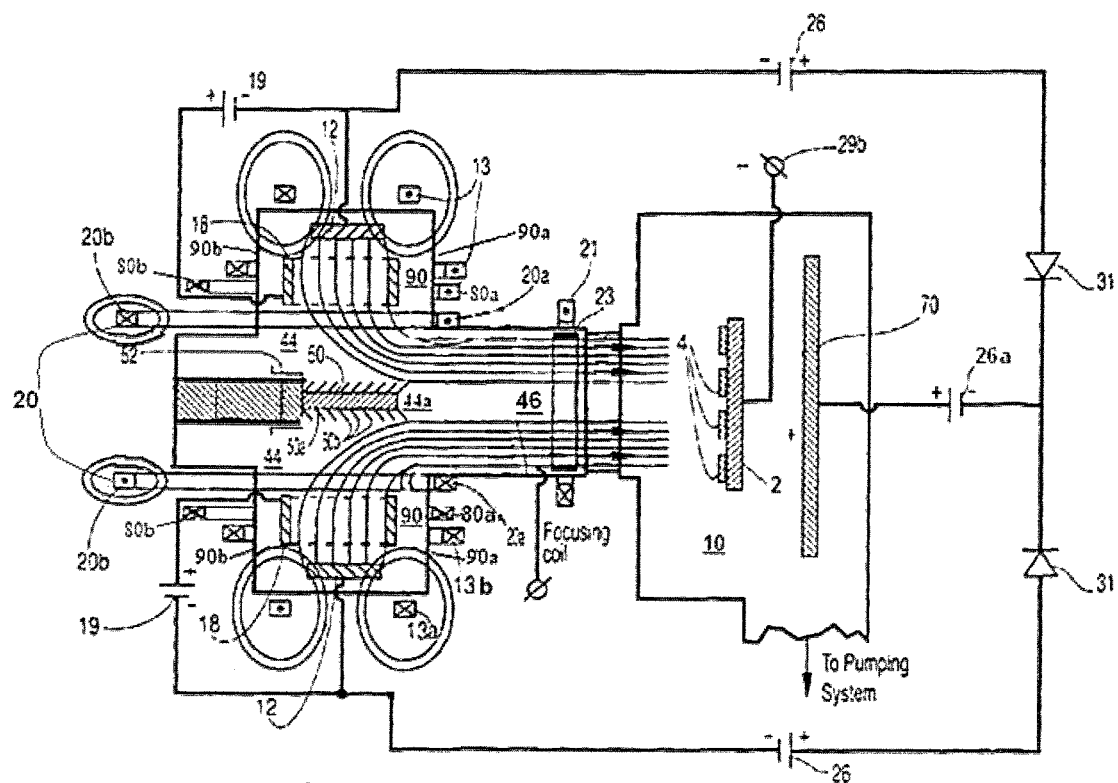
FIG. 4a is a schematic plan view of one filtered cathodic arc deposition apparatus providing a pair of deflection offset coils surrounding the cathode chambers downstream of a pair of focusing coils, in an embodiment.

FIG. 4a illustrates an embodiment of filtered cathodic arc deposition method and apparatus of present invention embodying a filtered cathodic arc source containing two primary cathodic arc sources with cathode targets 12 disposed in two opposite cathode chambers 90 in communication with a plasma duct 44, which has a form of parallelepiped. The cathode chambers 90 are surrounded by focusing and stabilizing coils 13. Anodes 18, optionally provided with baffles to trap macroparticles, may be disposed on planes of the cathode chambers 90 adjacent to the cathodes 12 and either connected to DC power source 19 or grounded, as in the prior art.

In the preferred embodiment the deflecting magnetic system comprises a pair of rectangular coils 20 surrounding opposite side walls along the edges of the deflection section 44a of the plasma duct 44, and a focusing coil 21 surrounding the focusing exit tunnel portion 46 of the plasma duct connected to the substrate chamber 10 downstream of the deflecting coil 20. As in the prior art the deflection portion of the plasma duct 44 is in communication with a substrate chamber 10 via its focusing exit tunnel portion 46. The substrate chamber 10 contains the substrate holder 2 with substrates to be coated 4, positioned off of the optical axis of the cathodes 12 of the primary cathodic arc sources positioned at the entrance of the cathode chambers 90 on both opposite sides of the deflection section of the plasma duct 44. The baffles to trap macroparticles are optionally provided on walls of the plasma duct 44 and its focusing exit tunnel portion 46 as in the prior art (as shown in FIG. 1). Dividing electrode 50, connected to the positive pole of the arc power supply, grounded or insulated from the plasma duct, having a positive in respect to plasma floating potential can be optionally provided along the plane of symmetry of the plasma duct separating its two sides with two opposite cathode chambers 90. The dividing electrode 50 is provided with baffle plates 50b to trap the macroparticles. If used, the dividing baffle 50 is installed in the deflection portion 44a of the plasma duct 44 between two cathode chambers 90.

According to the invention, the filtered cathodic arc apparatus is additionally provided with offset deflecting coils 80 installed around the exit portions of the cathode chambers 90 in an offset position with respect to the plasma duct. For example, in the embodiment shown in FIG. 4a the offset proximate front linear conductors 80a of offset deflecting coils 80 are positioned next to the walls of the cathode chambers 90 on the side of the substrate chamber 10, while their respective offset distal closing linear conductors 80b are positioned at a substantial distance behind the back walls of the cathode chambers 90 so as to have a lesser magnetic influence on the plasma stream within the cathode chamber 90 than their associated deflecting conductors 80a. For example, the distance between closing linear conductors 80b and the center of the cathode target 12 may be chosen to be between 1.25 and 10 times the distance between the center of the cathode target 12 and the back wall 90b of cathode chamber 90. If this distance is less than 1.25 times the distance from the center of the cathode target 12 and the back wall 90b of the cathode chamber 90 the asymmetry of the magnetic field is not enough to create a necessary high driving force for bending the plasma flow toward deflection portion 44a of the plasma duct 44. If this distance is more than 10 times the distance from the center of the cathode target 12 and the back wall 90b of cathode chamber 90 the influence of the distal offset conductor 80b on deflecting field in cathode chamber 90 becomes negligible. This creates a substantial increase of the magnetic field intensity near the side 90a of cathode chamber 90 nearest to the substrate chamber 10. The increase of the magnetic field on the side 90a of cathode chamber 90 nearest to the substrate chamber 10 results in deflecting the magnetic field streamlines generated by the deflecting coils 80 in a direction toward substrate chamber 10. In addition, this increases the magnetic pressure $p_B = B^2/8\pi$ on side 90a of the cathode chamber 90 nearest to the substrate chamber 10, which in turn leads to an increase of the electron pressure $p_e$ and accordingly the electron density in the plasma stream on side 90a of the cathode chamber 90 nearest to the substrate chamber 10 according to the well-known relationship:

$$p_e \propto B^2/8\pi \qquad (5)$$

This increase in electron density leads to increase in metal vapor ion density to satisfy the quasineutrality of the plasma. Both of these factors—deflecting the magnetic field streamlines toward substrate chamber and the increase in metal vapor ion density on side 90a of the cathode chamber 90 nearest to the substrate chamber 10—contribute to the earlier deflection of the metal vapor plasma flow toward the substrate chamber 10 because deflection of the plasma begins in the cathode chamber 90 prior to the plasma entering the plasma duct 44. This results in dramatic increase of the deflected metal ion flow which can be used in the coating deposition process as illustrated in FIG. 3a. To suppress the losses of vapor plasma by diffusion in transversal direction toward walls of the cathode chambers 90 the concave magnetic force lines should be maintained both on side 90a of the cathode chamber 90 nearest to the substrate chamber 10 and on side 90b of the cathode chamber 90 farthest from the substrate chamber 10. This can be accomplished by maintaining the position of the midpoint between the offset proximate front linear conductor 80a and offset distal closing linear conductor 80b of the offset deflecting coil 80 within the cathode chamber 90.

The offset deflecting coils 80 can also serve as focusing coils when the focusing coil 21 is turned OFF. In this case the deflection capability of the offset deflecting coils 80 alone is not enough to deflect the metal vapor plasma flow toward substrate chamber 10. Although the offset deflecting coils 80 can shift the plasma stream generated by the primary cathodic arc sources toward substrate chamber 10, most of the plasma flow will end on the opposite walls of the plasma duct 44 and its exit tunnel section 46. In this mode the power supplies 26 can be turned ON to establish an auxiliary arc discharge between the primary cathodic arc sources in the cathode chambers 90 and an auxiliary arc anode 70 in the substrate chamber 10. This discharge typically provides more than 3% ionized gaseous plasma assisting in ion cleaning, ion etching, ion implantation, ionitriding and low pressure CVD processes.

Figure 4:
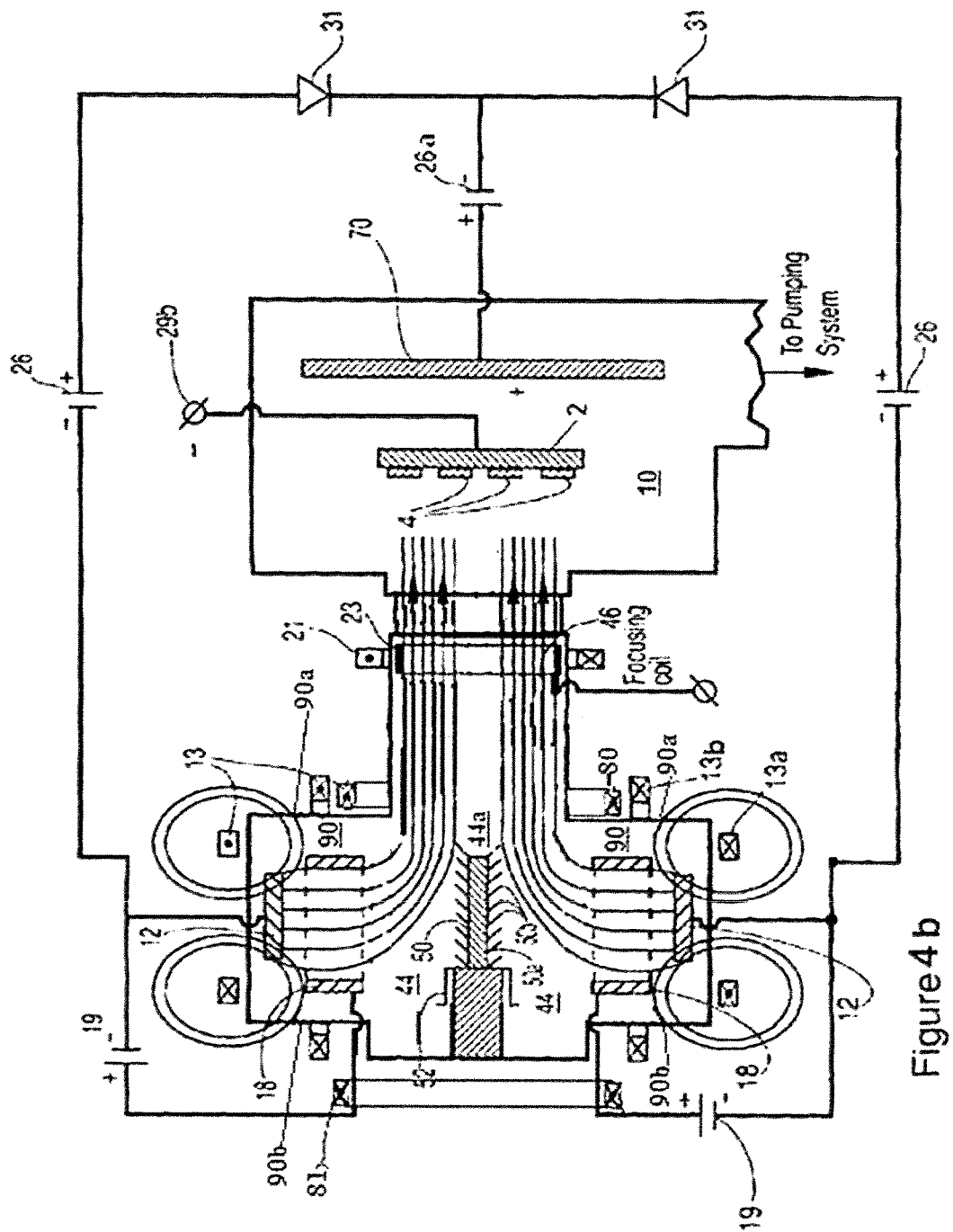
FIG. 4b is a schematic plan view of one filtered cathodic arc deposition apparatus providing a pair of deflection offset coils positioned in front of and behind the cathode chambers, in an embodiment.
FIG. 4c is a schematic plan view of one filtered cathodic arc deposition apparatus providing a pair of deflection offset coils surrounding the cathode chambers, in an embodiment.
FIG. 4d is a schematic plan view of one filtered cathodic arc deposition apparatus providing a pair of deflection offset coils surrounding the cathode chambers overlapping a pair of focusing coils, in an embodiment.
FIG. 4e is a schematic plan view of one filtered cathodic arc deposition apparatus providing various baffle arrangements, in an embodiment.
FIG. 4f is an schematic plan view of an exemplary filtered cathodic arc deposition apparatus having two unidirectional dual filtered cathodic arc sources in connection with a coating chamber.
FIG. 4g is a schematic view of one filtered cathodic arc deposition apparatus providing a single saddle-shaped deflecting coil, in an embodiment.
FIG. 4h is a schematic view of one filtered cathodic arc deposition apparatus providing a saddle-shaped deflecting double-coil arrangement, in an embodiment.
FIG. 4i is a schematic view of one filtered cathodic arc deposition apparatus providing a rectangular coil with offset deflecting conductors parallel to the focusing coil, in an embodiment.
FIG. 4j is a schematic plan view of one filtered cathodic arc deposition apparatus providing a deflection portion of a plasma duct having a triangular prism shape and a frustoconical primary cathode target, in an embodiment.
FIG. 4k is a schematic plan view of one filtered cathodic arc deposition apparatus utilizing two magnetrons installed at the exit of the plasma duct magnetically coupled to the filtered-arc source and array of stream baffles installed near the exit of the cathode chamber, in an embodiment.
FIG. 4L is schematic plan view of one filtered cathodic arc deposition apparatus utilizing two magnetrons installed at the exit of the plasma duct magnetically coupled to the filtered-arc source, wherein the magnetrons have rotating tubular targets, in an embodiment.
FIG. 4m is a schematic plan view of an exemplary hybrid rectangular filtered cathodic arc-magnetron sputtering deposition apparatus of a variation of the apparatus of FIG. 4f having two unidirectional dual rectangular filtered cathodic arc sources magnetically coupled with magnetrons in connection with a coating chamber.
Figure 4C:
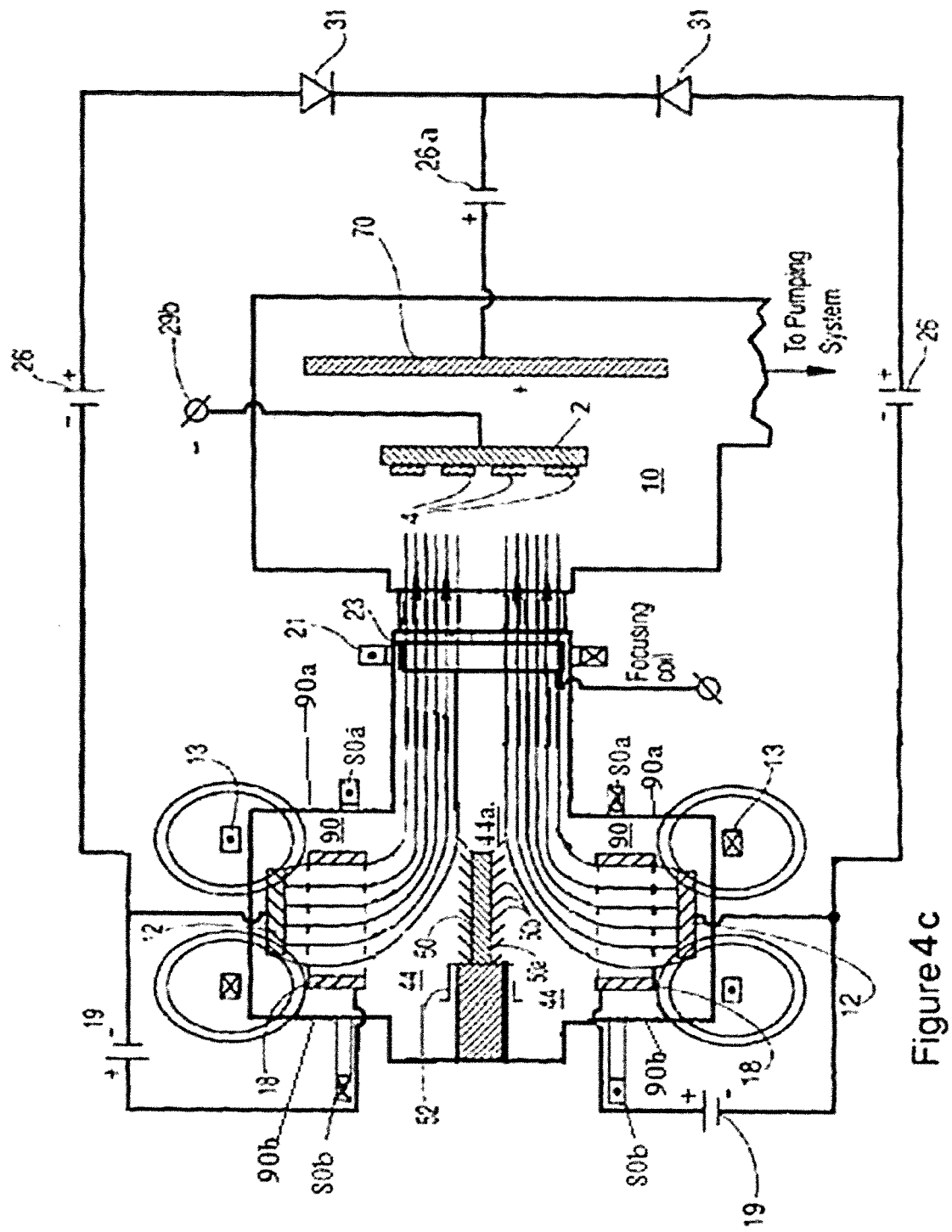

The offset deflecting coils 80 can be used as the only deflecting coils of the unidirectional dual filtered cathodic arc apparatus without deflecting coils 20 as illustrated in FIG. 4c. In this case the deflection field produced by offset deflecting coils 80 is coupled with the focusing field produced by focusing coil 21 surrounding the exit portion of the plasma duct tunnel 46. The distribution of the magnetic field lines in plasma duct in a case presented in FIG. 4c is similar to that shown in FIG. 3d. It can be seen that using the offset deflecting coils 80 surrounding the cathode chambers 90 instead of deflection coils 20 allows to move the turning point of the magnetic field streamlines upstream which results in a turning of the vapor plasma flow at earlier stage than in a prior art apparatus shown in FIG. 2.

In a further embodiment of the invention shown in FIG. 4b at least two offset deflecting coils 80 and 81 are installed around the cathode chambers 90. A proximal offset deflecting coil 80 is installed next to the cathode chambers 90 on the side 90a nearest to the substrate chamber 10. The proximal offset deflecting conductors of the proximal offset deflecting coil 80 are positioned between the focusing coils 13b and the entrance to the plasma duct 44. A distal offset deflecting coil 81 is positioned behind the plasma duct 44, at a larger distance from the back side of the cathode chambers 90, which distance exceeds the distance between the coil 80 and the side 90a of the cathode chambers 90 nearest to the substrate chamber 10. The polarity of the proximal offset deflecting coil 80 is the same as that of the focusing coil 21, while the polarity of the distal offset deflecting coil 81 is opposite to the coil 80.

In the operation of these embodiments, the substrates 4 are mounted on the substrate holder 2 in the substrate chamber 10. The apparatus is evacuated to the desired pressure using conventional techniques and vacuum pumping apparatus well known to those skilled in the art. The primary current source 19 is activated, creating an arc discharge between the cathode 12 and anodes 18 which begins to evaporate the cathodic material into the cathode chamber 90. At the same time, or after a selected time interval as desired, the auxiliary current source (not shown) is energized to bias the optional focusing electrode 23, creating a focusing electric field in the exit tunnel portion 46 of the plasma duct 44. The substrates 4 to be coated are connected to the negative terminal 29b of the bias power supply (not shown), while the positive pole of the bias power supply is either grounded or connected to the cathode target 12 of the primary cathodic arc source installed in the cathode chamber 90. In a magnetized filtered arc metal vapor plasma propagating along magnetic force lines of the deflecting and focusing magnetic fields of the filtered cathodic arc apparatus of the present invention, the potential of the substrates 4 to be coated is typically defined by reference to the primary cathode targets 12 emitting the electrons and generating a metal vapor plasma stream.

One of the problems that appear during deposition of coating in dense strongly ionized plasma is micro-arcing on substrates 4. When the substrate bias voltage exceeds the voltage drop associated with the vacuum arc discharge, arc breakdown can result in creating arc spots that damage the surface of the substrates 4 to be coated. To eliminate this problem, the direction of the current conveyed by the plasma environment to the substrate surface may be reversed with repetition frequency exceeding the characteristic frequency of vacuum arc breakdown. To perform this bi-pulse bias operation a DC bias power supply having positive and negative poles (not shown) can be connected to the substrate holder 2 via a switching arrangement utilizing fast switching solid state elements such as IGBTs or the like. The switching cycle is controlled by a low voltage control device (not shown). This connects the substrate holder 2 alternately to the positive and negative poles of the bias power supply while a primary cathode target remains as a permanent reference electrode.

Cathodic evaporate is ejected from cathode 12 in an ionized plasma containing both ionized coating particles and neutral contaminate or macroparticles. The plasma is focused by the magnetic focusing coils 13 and flows past the anodes 18. The plasma stream, with entrained macroparticles vaporized from the evaporation surface of the cathode 12, is thus ejected toward the optional deflecting electrode 50. The pair of offset deflecting coils 80 (or proximate offset deflecting coil 80 and distal offset deflecting 81 in FIG. 4b) generates a concave deflecting magnetic field already within the cathode chamber 90 which directs the plasma stream along with ions of coating material suspended therein through the exit portion of the cathode chamber 90 following by the deflecting portion 44a of the plasma duct 44 and the tunneling exit section 46 of the plasma duct 44 toward the substrate chamber 10, as shown by the arrows in FIGS. 4a to 4d. Neutral macroparticles remain unaffected by the deflecting magnetic field and the electric fields generated around deflecting electrode 50 are trapped by the sets of baffles 50a, 50b which may be installed along the deflecting electrode 50, or the baffles which may be installed along the walls of cathode chambers 90 and plasma duct 44 (as shown in FIG. 1). Neutral particles continue their movement in a path generally along the optical axis of the cathode 12, striking the deflecting electrode 50 and walls of the cathode chambers and plasma duct and either adhering to the electrode 50 and the walls and baffles or falling to the bottom of the apparatus.

In the embodiment of FIG. 4b, which illustrates a variation of an embodiment of filtered cathodic arc deposition method and apparatus shown in FIG. 4a, since the polarity of the proximate offset deflecting coil 80 is the same as that of the focusing coil 21, while the polarity of the distal offset deflecting coil 81 is opposite to the proximate offset deflecting coil 80, a bidirectional magnetic cusp configuration is created with an upstream cusp directed away from the substrate chamber 10 and a downstream cusp directed toward the substrate chamber 10. The upstream cusp covers the part of the exit portion of the cathode chamber 90 farthest from the substrate chamber 10, while the downstream cusp covers the part of the exit portion of the cathode chamber 90 nearest to the substrate chamber 10. The proximate offset deflecting coil 80 creates the concave deflecting magnetic field within the part of the exit portion of the cathode chamber 90 nearest to the substrate chamber 10, while the distal offset deflecting coil 81 creates the concave deflecting magnetic field within the part of the exit portion of cathode chamber 90 farthest from the substrate chamber 10. The metal vapor plasma flow generated by cathodes 12 is deflected toward the substrate chamber 10 starting from the area within the cathode chambers 90 where the deflection of the magnetic streamlines toward substrate chamber 10 starts, followed by the deflection section 44a of the plasma duct 44 and continuing into the exit tunnel section 46 of the plasma duct 44. The currents of the offset deflecting coils 80 and 81 should be adjusted to keep concave shape of the deflecting magnetic force lines on both sides of the cathode chamber 90: on the side 90a nearest to the substrate chamber 10 and on opposite side 90b farthest from the substrate chamber 10. If the total currents in the offset coils 80 and 81 are equal to each other, the coils are parallel to each other and perpendicular to the plane of symmetry of the plasma duct 44 and the distance between their offset deflecting linear conductors and the plane of symmetry of the plasma duct 44 are also equal, then the midpoints between their respective deflecting conductors should be disposed within the corresponding cathode chambers 90. This condition will secure the concave shape of the deflecting magnetic field within the cathode chambers 90. During the process stages which do not require metal vapor deposition process such as ion cleaning, ionitriding, ion implantation and low pressure plasma assisted CVD, the offset deflecting coils 80, 81 are not activated while the stabilizing and focusing coils are turned ON, supporting the continued operation of the primary cathodic arc sources respectively associated with cathode targets 12. The power supplies 26 are turned ON and an auxiliary arc discharge is established between the cathode targets 12 of the primary cathodic arc sources and the auxiliary anode 70 positioned in the substrate chamber 10. In this case the highly ionized (more than 3% ionization rate) gaseous plasma fills the substrate chamber 10 to support all plasma immersion surface treatment processes excluding filtered arc metal vapor deposition.

Figure 4D:
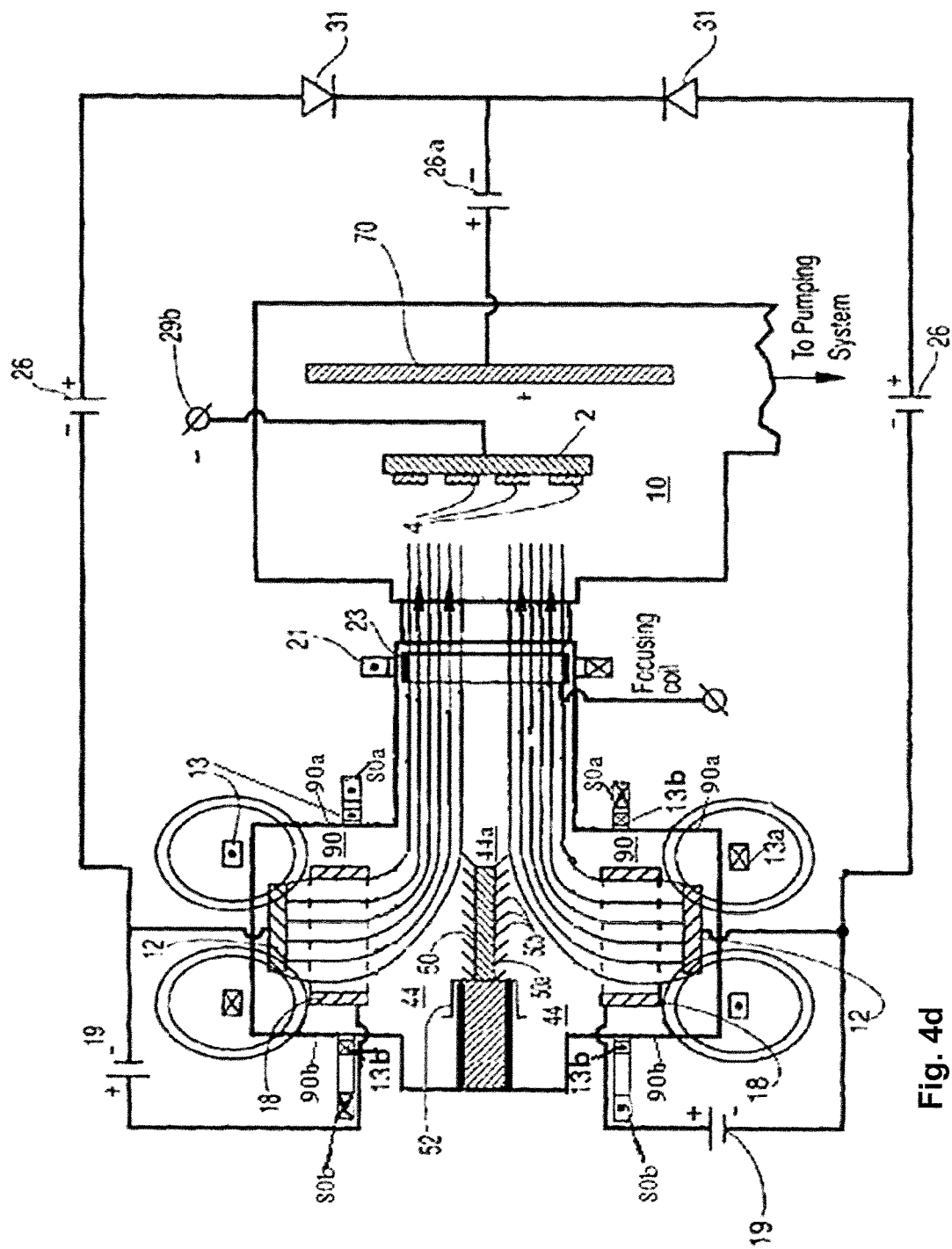

In the further embodiment of the filtered cathodic arc deposition method and apparatus of present invention shown in FIG. 4*d* a pair of offset deflecting coils 80 overlap the focusing coils 13*b*. The deflecting conductors 80*a* of the offset deflecting coils 80 are positioned over top of the conductors of the focusing coils 13*b* on a side 90*a* of the cathode chamber 90 nearest to the substrate chamber 10. In this embodiment the focusing coils 13*b* can be activated independently from the deflection coils 80 to support the primary cathodic arcs generated by the cathodes 12 in a cathode chambers 90 during a plasma immersion process stages which do not involve filtered cathodic arc coating deposition, such as ion cleaning, ionitriding, ion implantation and low pressure plasma assisted CVD. When the coils 80 are turned ON, with or without focusing coils 13*b*, but with plasma duct tunnel focusing coil 21 ON, the filtered cathodic arc coating deposition process will start and a large amount of metal vapor plasma generated by the primary cathodic arc targets 12 will be deflected toward the substrate chamber 10.

Figure 4E:
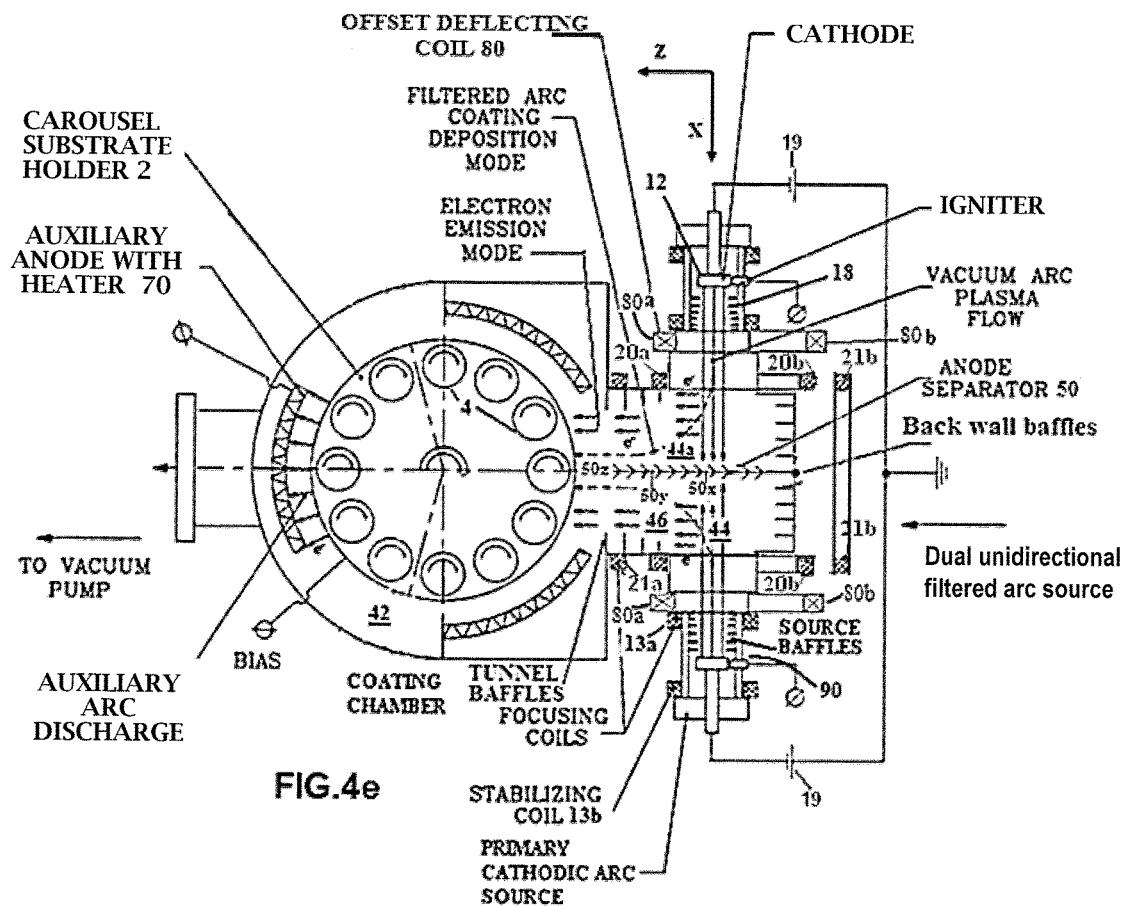

FIG. 4*e* illustrates an embodiment of filtered cathodic arc deposition method and apparatus of present invention which shows the batch coating system layout utilizing a vacuum plasma processing chamber 42, equipped with a unidirectional dual filtered cathodic arc plasma source 1 of present invention. The rotatable substrate turntable 2, is installed in the center of the coating chamber 42 and allows for single or double rotation of the substrates 4 to be coated. The coating chamber 42 is equipped with an array of radiant heaters and with diagnostic equipment including optical pyrometers and thermocouples to measure substrate temperature (not shown). The unidirectional dual filtered cathodic arc plasma source 1 consists of the plasma duct chamber 44 with baffles installed along its walls and the exit tunnel 46. A pair of deflecting coils 20 is located on the opposite walls of the plasma duct chamber along the edges of the plasma duct. A pair of offset deflecting coils 80 is located around the cathode chambers 90 along the opposite walls of the plasma duct chamber 44 in off-set position in relation to the plasma duct chamber 44. The midpoint of the distance between the offset proximal deflecting linear conductors and offset distal closing deflecting conductors of the offset deflecting coils 80 should be positioned with the cathode chamber 90 to maintain the concave saddle-shape magnetic field within both parts of the cathode chamber 90: the part nearest to the coating chamber 42 and the opposite part, farthest from the coating chamber 42. A focusing coil 21 is surrounding the exit tunnel portion 46 of the plasma duct while the additional deflecting coil 21*b* is positioned around the back wall of the plasma duct chamber. The primary direct cathodic arc deposition sources, consisting of the cathode target 12, surrounded by tubular anodes 18 with steering and focusing coils 13*a*,13*b*, are positioned on top of the cathode chambers 90 attached to opposite walls of the plasma duct chamber 44 adjacent to the exit tunnel portion 46. In addition, two vertical rastering coils (shown in FIG. 9*a*) can be optionally positioned on the top and bottom flanges of the plasma duct chamber for rastering the filtered arc flow (not shown). This provides high uniformity of the coating thickness distribution over large deposition areas.

In operation, when the deflecting coils 20, offset deflecting coils 80 and focusing coil 21 of the filter chamber are turned on, the vapor plasma generated by the primary cathodic arc sources flows into the plasma duct chamber from opposite directions and turns around the corner of the plasma duct exit tunnel 46 toward the coating chamber 42. The optional deflecting coil 21*b* can be also activated to tune the direction of the metal vapor plasma flow. When the deflecting coils 20 and focusing coil 21 of the filter chamber are turned off, an auxiliary arc discharge can be established between the primary arc cathodes 12 of the cathode arc source and the auxiliary arc anode 70 located in a coating chamber behind the turntable 2 as illustrated in FIG. 4*e*. This discharge provides ionization and activation of the gaseous atmosphere in the main chamber, producing highly ionized gaseous plasma during such technological stages as plasma immersion ion cleaning/etching, gaseous ion implantation, ionitriding/oxynitriding/carburizing and low pressure plasma assisted CVD.

The deflecting electrode-baffle 50 dividing two opposite vapor plasma flow generating by the primary cathodic arc sources respectively associated with cathode targets 12 can optionally be installed into the plasma duct 44 to separate the two vapor plasma flows generated by the two primary cathodic arc sources. The deflecting electrode 50 can be either connected to the positive end of the arc power supply, or grounded, or set up at floating potential which would be also positive with respect to the arc cathodes due to the higher mobility of the positive ions across the magnetized plasma confined in a longitudinal magnetic field. Three types of baffle 50 with different lengths can be used depending on processing requirements: a short baffle 50*x*, a medium length baffle 50*y* and a long baffle 50*z*. The short baffle 50*x* can be installed between the back wall of the plasma duct chamber and a point between the center of plasma duct 44 and the entrance of the tunnel section. The medium length baffle 50*y* ends within the tunnel section of the plasma duct chamber. The long baffle 50*z* ends flush with the exit window of the tunnel portion 46 of the filtered cathodic arc source 1. A separation of the opposite vapor plasma flows generated by the two primary cathodic arc sources of the unidirectional dual filtered cathodic arc plasma source allows the production of nanolaminated coatings by exposing the rotating substrates 4 in turn to the plasma flows generated by opposite primary cathodic arc sources equipped with different targets 12 (e.g. Ti and Cr, Ti and Al etc.). When the dividing baffles 50 are removed, the two opposite plasma flows generated by the primary DCAD sources with cathode targets of the same or different composition are mixed in the exit tunnel area, forming a uniform unidirectional plasma stream for deposition of a wide variety of single component or multi-elemental nanocomposite coatings.

The embodiment of FIG. 4*e*, which provides the unidirectional dual filtered cathodic arc source 1 installed at the coating chamber 42, thus provides a chain of anodes: proximal anodes 18 local to the cathodes 12; medial anodes such as anode separators 50*x*, 50*y*, or 50*z*; a focusing electrode 23 (shown in FIGS. 4*a*-4*d*) contained within the exit tunnel portion 46 of the plasma duct; and distal anodes such as the anode 70, which may be disposed anywhere within the coating chamber 42. These anodes combine to create a desired dispersion of electrons and a uniform plasma cloud in the vicinity of the substrates 4. The anodes could be connected to independent power supplies; however this would result in high power consumption. The chain of anodes can alternatively be connected to the same power supply and rastered. Ionization of the plasma is maximized in the vicinity of an active anode, and rastering through the chain of anodes in this fashion allows for considerable conservation of power while maintaining a high plasma ionization level and mixing the plasma throughout the apparatus to create uniform plasma immersed environment.

In filtered cathodic arc apparatus shown in FIG. 4e the pair of rectangular deflecting coils 20 are mounted on opposite sides of the rectangular plasma duct, each of the coils 20 is positioned in front of the cathode chambers 90, while the focusing coil 21a surrounds the exit portion of the plasma duct adjacent to the coating chamber 42. Optionally additional deflecting coil 21b is mounted behind the plasma duct. The current conductors of the deflecting coils 20 are aligned along the edges of the rectangular plasma duct. It can be seen that the pair of offset deflecting coils 80 are installed around the cathode chambers 90 in off-set position in relation to the plasma duct chamber 44. The deflecting magnetic field created by offset deflecting conductors 80 is coupled with the deflecting magnetic field created by the deflecting coils 20 and focusing magnetic field created by focusing coil 21a surrounding the exit tunnel portion 46 of the plasma duct chamber, which can advantageously work together to deflect the metal vapor plasma flow from the primary cathode targets 12 toward substrates 4 to be coated installed on carousel substrate holder 2 in a coating chamber 42 with minimal vapor plasma transport losses. The additional deflecting coil 21b can be also used to tune the deflecting magnetic field lines and increase the outcome of the vapor plasma flow toward substrates to be coated 4 installed in a coating chamber 42.

Figure 4F:
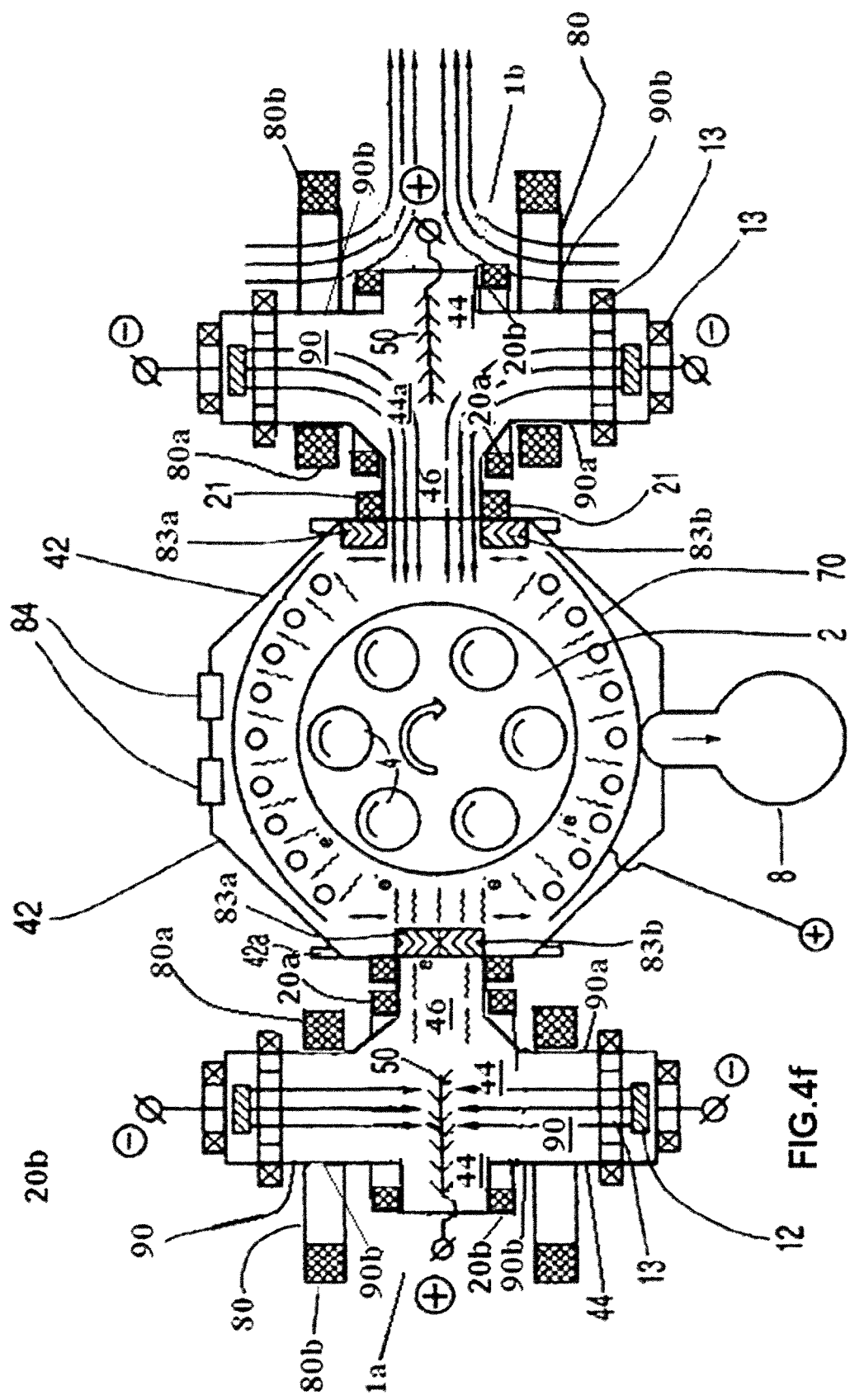

FIG. 4f illustrates a variation of the embodiment of FIG. 4e, in which two filtered cathodic arc sources 1a and 1b, each containing a pair of cathodes 12, positioned at the entrance of the opposite cathode chambers 90, are provided on both sides of the coating chamber 42. This embodiment can be used for plasma immersed treatment of substrates 4, by selectively deactivating the deflecting coils 20, the offset deflecting coils 80, and focusing coil 21 of the filtered cathodic arc source 1a on one side of the coating chamber 42. When all plasma sources respectively associated with cathodes 12 are active, plasma streams are generated in both filtered cathodic arc sources 1a and 1b. However, while the vapor plasma stream generated on the side of active coils 80, 20, and 21 of filtered cathodic arc source 1b is directed into the coating chamber 42 by the deflecting and focusing magnetic fields generated by the deflecting coils 20, offset deflecting coils 80, and focusing coils 21, the particulate (metal vapor plasma) component of the plasma stream on the side of the inactive deflective coils 20, offset deflecting and focusing coils 80, 21 of filtered cathodic arc source 1a remains largely confined within the cathode chambers 90 optionally using load lock shutters 83 to close off filtered cathodic arc source 1a from the coating chamber 42, there being no magnetic driving influence for metal vapor plasma on that side of the coating chamber 42. The load lock shutters can be provided with openings which are impermeable for the heavy particles such as ions and neutrals to enter into plasma coating chamber 42, but permit electrons to flow into coating chamber 42. The cathodes 12 on the side of the inactive coils 20, 80, and 21 thus serve as powerful electron emitters, improving ionization of the gaseous component of the plasma flowing past shutter 83 and into the coating chamber 42, and significantly improving the properties of the resulting coating. The offset positions of the offset deflecting coils 80 of the filtered cathodic arc source 1 allow for minimization of the plasma transport losses and securing the maximum deposition rates of the filtered cathodic arc coating deposition process.

Figure 4H:
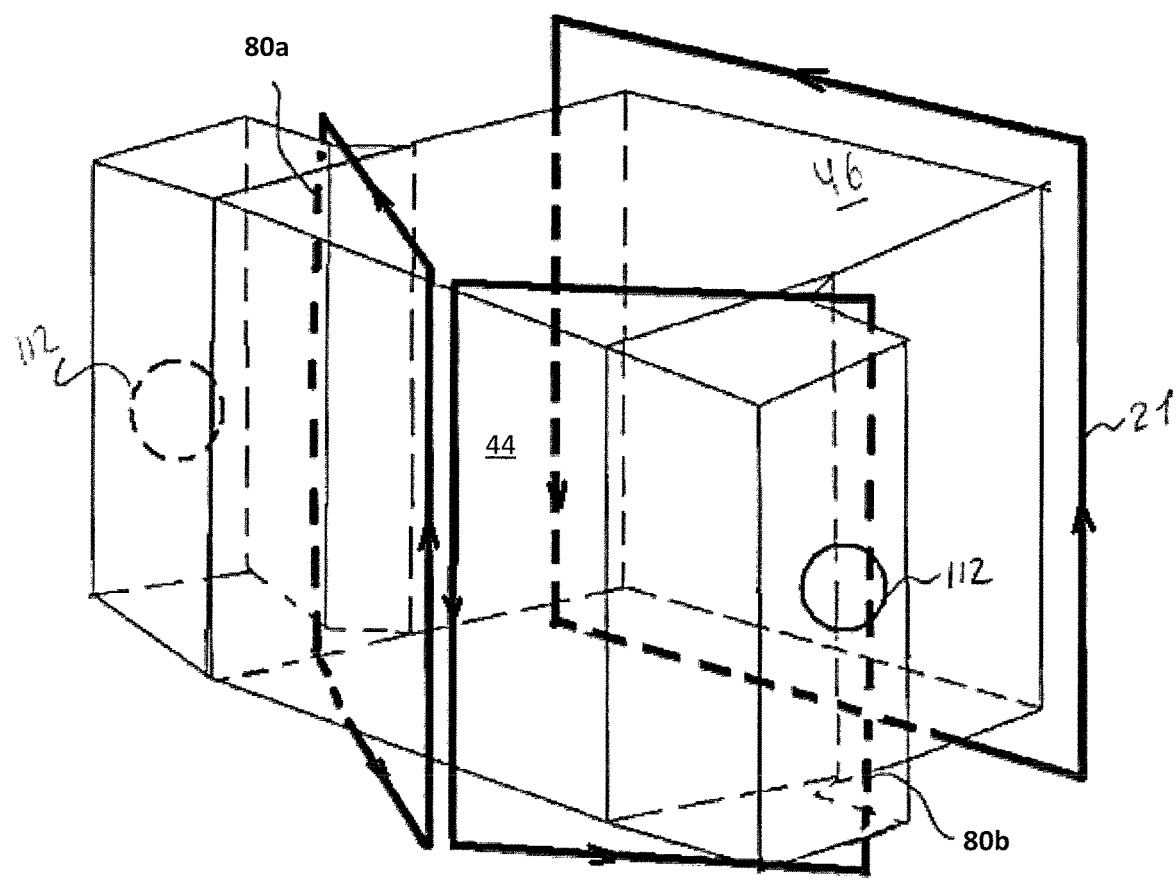
Figure 4I:
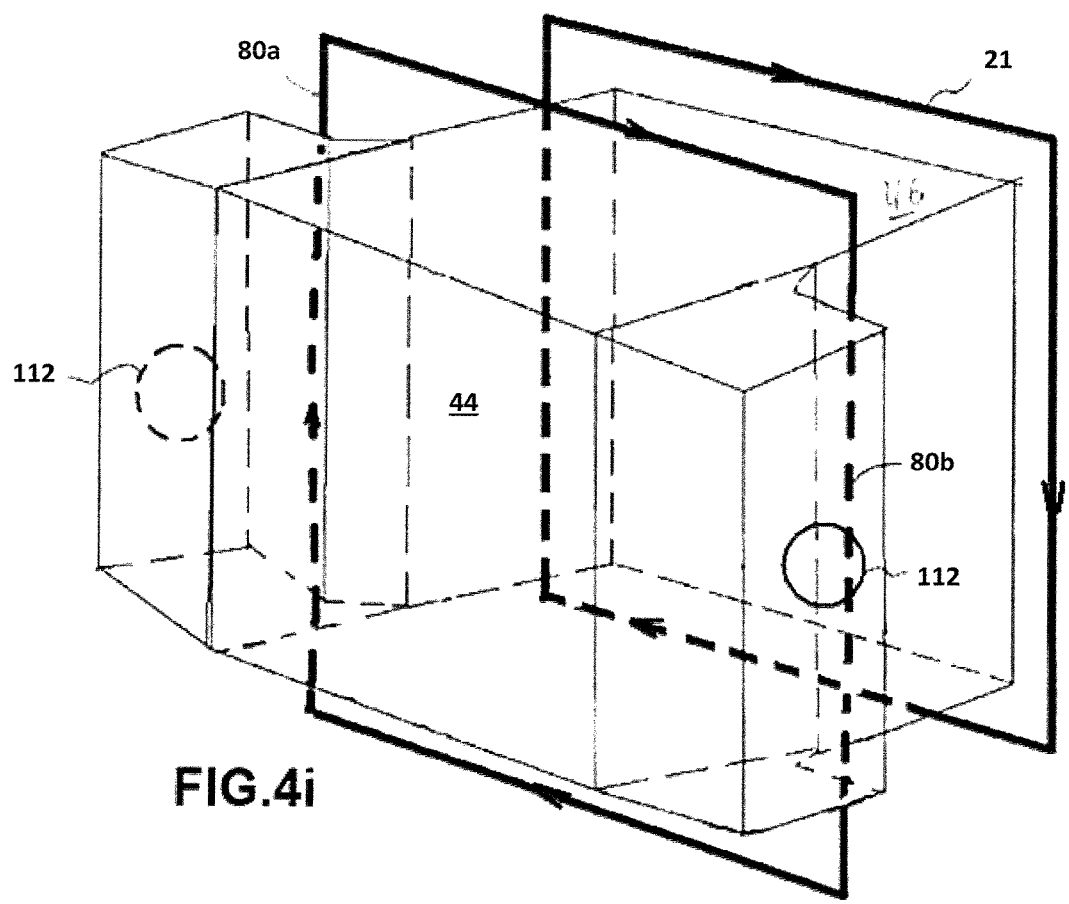

FIG. 4g illustrates another variation of the embodiment of filtered cathodic arc deposition method and apparatus of present invention shown in FIG. 4e, utilizing a single 3D saddle-shaped deflecting coil 80 embracing the deflecting section of the plasma duct 44 of the filtered cathodic arc source assembly, generally having a shape of symmetrical rectangular prism, having two opposite sides, a back side farthest from the substrate chamber and a front side nearest to the substrate chamber, a top and a bottom sides parallel to the plane of rotation of the plasma flow, the exit tunnel section 46 being rectangular and attached to the front side of the plasma duct along a plane of symmetry of the plasma duct, and at least one cathode chamber 90 being attached to one of the opposite sides of the plasma duct 44. In this case the deflecting conductors 80a and 80b are parallel to the edges of the deflecting section of the plasma duct 44 adjacent to the cathode chambers 90 and the exit tunnel section 46 of the plasma duct 44. In one variation of the embodiment of the invention shown in FIG. 4g, the deflecting conductors 80a and 80b are align along the front walls of the cathode chambers 90 facing the deposition chamber (not shown) adjacent to the cathode sources flanges 112 where the cathode arc sources are attached (not shown) in off-set position relative to the plasma duct chamber 44. Alternatively, the deflecting conductors 80a and 80b can be aligned generally along the edges of the deflecting section of the plasma duct 44 adjacent to the cathode chambers 90 and the exit tunnel section 46 of the plasma duct 44. The closing conductors 80c and 80d are align generally parallel to the top and the bottom flanges of the deflection section of the plasma duct 44 which are parallel to the plane of rotation of the plasma flow generating in cathode chambers 90. The saddle-shape deflecting coil, similar to one which was previously described in (former) Soviet Union invention SU1240325 issued Nov. 30, 1984 to Gorokhovsky et al., which is incorporated herein by reference, generate both a toroidal and a poloidal deflecting magnetic fields which can further reduce the diffusional plasma losses in the direction transversal to the direction of the plasma flow and increase the efficiency of plasma transport toward substrates to be coated in a substrate chamber (not shown). The toroidal magnetic field is generating by the deflecting conductors 80a and 80b to direct the plasma flow from the cathode chambers 90 into the plasma duct 44 whilst the closing conductors 80c and 80d are generating the poloidal magnetic field to suppress the diffusional plasma losses in the direction transversal to the plane of rotation of the plasma flow. The focusing coil 21 is positioned around the tunnel portion 46 facing the substrate chamber (not shown). The preferable directions of electric current in the offset saddle-shaped deflecting coil 80 and the focusing coil 21 are shown by the arrows in FIG. 4g. FIG. 4h illustrates a variation of the embodiment shown in FIG. 4g in which the 3D saddle-shape offset deflection magnetic system is formed by a double-coil arrangement 80 comprising the proximate deflecting linear conductors 80a aligned in off-set position along the front walls of the cathode chambers 90 facing the substrate chamber (not shown). The offset distal closing linear conductors 80b of the offset deflecting coils 80 are disposed behind the plasma duct chamber 44 close to each other so that the magnetic fields generating by the linear conductors 80b are annihilating and the topology of the resulting deflecting magnetic field generating by the pair of the offset deflecting coils 80 in the filtered cathodic arc source of FIG. 4*h* is almost identical to the deflecting field generating by the single 3D offset deflecting coil of FIG. 3*g*. FIG. 4*i* illustrates another variation of the embodiment of filtered cathodic arc deposition method and apparatus of present invention shown in FIG. 4*g* comprising of rectangular proximate offset deflecting coil 80 disposed in front of the cathode chambers 90 parallel to the focusing coil 21. In this arrangement the proximate deflecting linear conductors 80*a* and 80*b* are aligned in off-set position in relation to the plasma duct 44 along the front walls of the cathode chambers 90 facing the substrate chamber (not shown). Optionally, a distal offset deflecting coil (not shown) can be provided behind the plasma duct 44 parallel to the proximate deflecting coil 80. The distal deflecting coil should be disposed at a larger distance from the back side of the cathode chambers 90, which distance exceeds the distance between the coil 80 and the side 90*a* of the cathode chambers 90 nearest to the substrate chamber 10. The polarity of the proximal offset deflecting coil 80 is the same as that of the focusing coil 21, while the polarity of the distal offset deflecting coil is opposite to the coil 80.

Figure 4J:
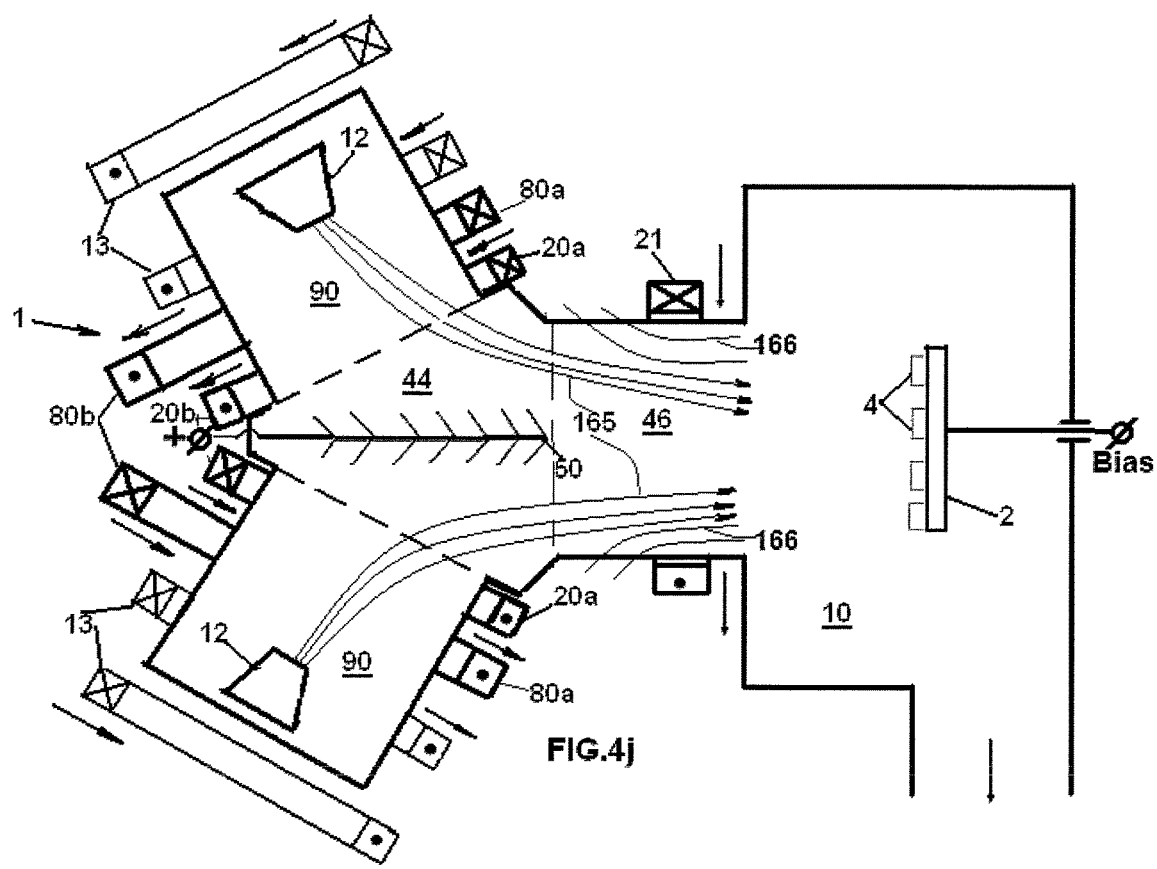

In the further preferred embodiment of the filtered cathodic arc deposition method and apparatus of present invention shown in FIG. 4*j* the deflection portion 44*a* of the plasma duct 44 may have a shape of a symmetrical rectangular prism. FIG. 4*j* illustrates a variation of the embodiment shown in FIG. 4*h* comprising a pair of deflecting coils 20 which linear conductors are aligned along the ribs of the prism-shaped deflection portion 44*a* of the plasma duct 44 forming a 3D saddle-shape deflecting magnetic system generally geometrically similar to the form of the prism-shaped deflection portion of the plasma duct 44*a*. In addition, there is a pair of offset deflecting coils 80 surrounding the exit portions of the cathode chambers 90, with a proximate deflecting linear conductors 80*a* adjacent to the side of the cathode chamber 90 nearest to the substrate chamber (not shown) and the distal closing deflecting conductors 80*b* adjacent to the side of the cathode chamber 90 farthest from the substrate chamber (not shown), which allow to start bending the vapor plasma flow generating by the cathodes 12 within the cathode chambers 90 yet contributing to suppressing the diffusional plasma losses in a transversal direction to the plasma flow toward walls of the cathode chambers 90 and plasma duct 44. The proximate deflecting linear conductors 80*a* are aligned in off-set position along the front walls of the cathode chambers facing the substrate chamber 10, parallel to the deflecting conductors 20*a* and to the focusing coil 21, while their respective offset distal closing linear conductors 80*b* are positioned at a substantial distance behind the back walls of the cathode chambers 90 farthest from the substrate chamber 10 so as to have a lesser magnetic influence on the plasma stream within the cathode chamber 90 than their associated deflecting conductors 80*a*. To maximize the suppression of the transversal diffusional losses of plasma the distance between the offset proximate deflecting conductor 80*a* and offset distal closing deflecting conductor 80*b* should be chosen from the condition that the midpoint between linear conductors 80*a* and 80*b* is disposed within the cathode chamber 90. In this case a saddle-shaped concave magnetic field will be generated both in the downstream portion of the cathode chamber 90 nearest to the substrate chamber 10 and in the upstream portion of the cathode chamber 90 farthest from the substrate chamber 10. The frustoconical targets 12 are surrounded by magnetic steering and focusing coils 13. The deflection section 44*a* having a triangular prism shape is positioned between the dashed lines within the plasma duct 44. In this embodiment the cathode chambers 90 are attached to the side walls of the deflecting section 44*a* of the plasma duct 44; the axes of the cathode chambers 90 are forming an acute angle with the plane of symmetry of the plasma duct 44. The said angle is typically ranging from 20 to 90 deg, but most likely from 30 to 90 deg and even more precisely from 45 to 90 deg. When the angle between axes of the cathode chambers 90 and the plane of symmetry of the plasma duct 44 is reducing the closing conductors 20*b* and 80*b* are becoming close to each other which results in a reduction of the closing deflecting magnetic field generating by the distal closing linear conductors 20*b* and 80*b*.

In the embodiments of the invention utilizing the rectangular filtered cathodic arc source, the deflecting portion 44*a* of the plasma duct 44 has a shape of a rectangular prism. The prism can be of rectangular cross-section as a parallelepiped or having a trapezoidal cross-section. The deflecting portion 44*a* of the plasma duct with prismatic geometry may have different cross-sections, but they should be symmetrical in relation to the plane of symmetry of the plasma duct. The deflection coils 20 have their linear conductors aligned generally parallel to the edges of the prism-shaped volume of the deflecting section 44*a* of the plasma duct 44 surrounding the deflection portion of the plasma duct 44*a* creating a 3D frame generally geometrically similar to the shape of the prism-shape deflection portion of the plasma duct 44*a* while the focusing coil 21 is surrounding the exit tunnel portion 46 of the plasma duct adjacent to the substrate chamber 10 produces the focusing magnetic field 166. The linear current conductors of the deflecting coils 20 are forming a 3D saddle-shape frame with a shape of a rectangular prism or a prism having different cross-sections geometrically similar to the shape of a prism-shaped deflection portion 44*a* of the plasma duct 44, retaining a mutual plane of symmetry with the plasma duct 44. Therefore, the prism-shape 3D frame defined by the linear current conductors of deflecting coils 20 is generally geometrically similar to the shape of the deflecting portion 44 of the plasma duct. Up to 50% deviation of the geometrical similarity between the 3D frame shape formed by the linear conductors of the deflecting coils 20 and the shape formed by the edges of the deflecting portion 44*a* of the plasma duct 44 is still acceptable, but it is preferable that this deviation does not exceed 30%. The proximate linear deflecting conductors 80*a* of the saddle-shape deflecting coil are adjacent to the front side of the cathode chambers 90 facing the substrate chamber or they are adjacent to the cathode chamber 90 and plasma duct 44, whilst the distal linear deflecting conductors 80*b* are aligned either adjacent to the back sides of the cathode chambers farthest from the substrate chamber or adjacent to the back side of the plasma duct. The distance between the distal linear deflecting conductors 80*b* and the back sides of the cathode chambers 90 or the back side of the plasma duct 44 is greater than the distance from the proximate deflecting conductors 80*a* and the front side of the cathode chamber 90.

Figure 4K:
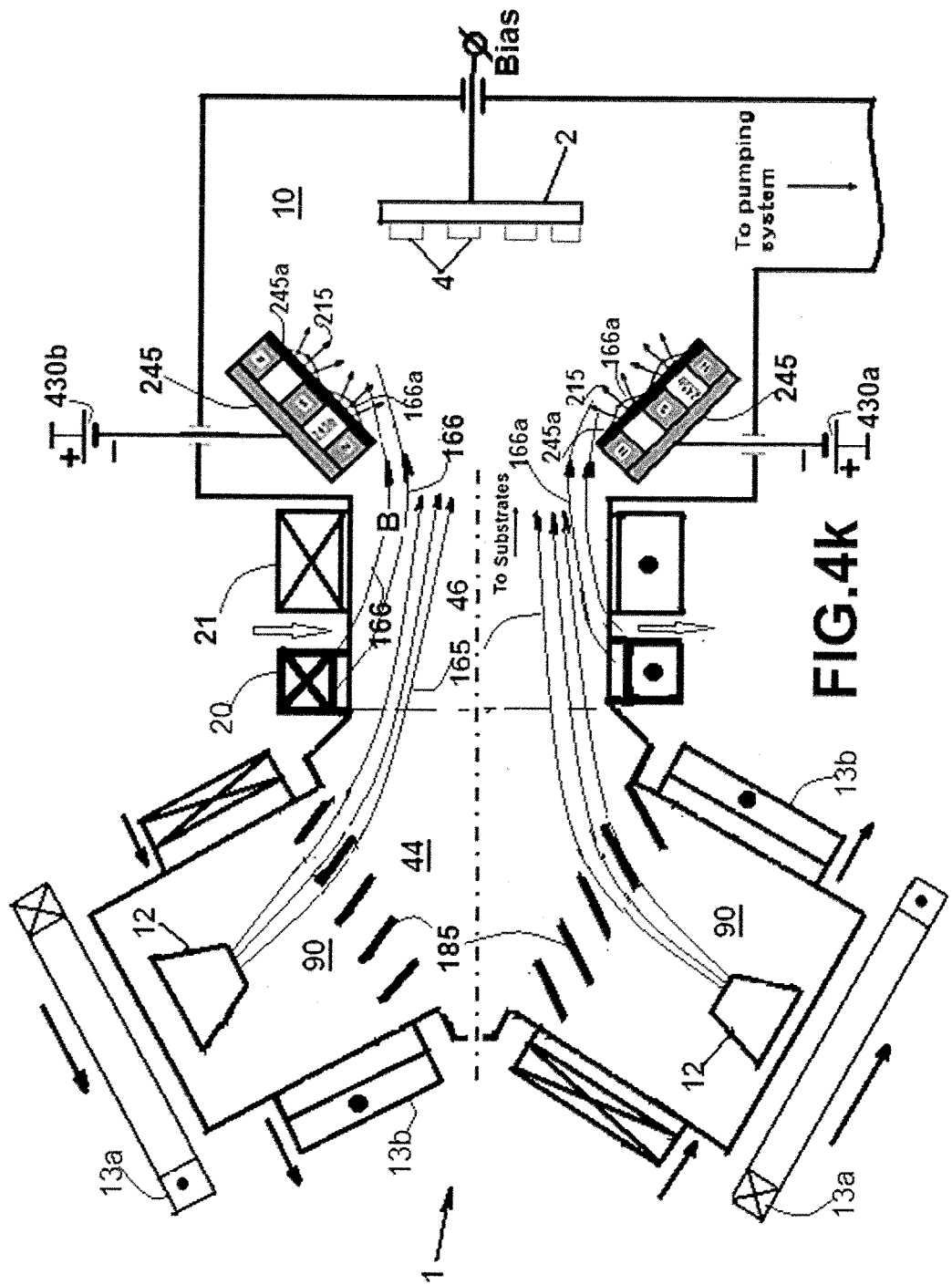

FIG. 4*k* illustrates one exemplary hybrid coincided filtered arc-magnetron sputtering deposition apparatus 340 that is a further variation of the embodiment of the system shown in FIGS. 4*j*. In deposition apparatus 340, the primary metal vapor plasma sources in dual filtered cathodic arc plasma source 1 are cathodic arc sources with cathode targets 12 installed in two opposite cathode chambers 90. Deposition apparatus 340 further includes magnetron sputtering sources 245 that are magnetically coupled with dual filtered cathodic arc source 1 and are positioned by the exit of tunnel portion 46 of plasma duct 44 in substrate chamber 10 such that magnetron sputtering flow 215 is focused to the same spot on substrate holder 2 as vapor plasma flow 165. Metal vapor plasma 165 generated by filtered arc source 1 is focused by focusing coil 21, resulting in coincided deposition of a mixture of 100% (or nearly 100%) ionized metal vapor plasma flow 165 together with generally neutral metal atomic magnetron sputtering flow 215. In deposition apparatus 340, the steering of cathodic arc spots at the surface of the frustoconical cathode target 12 is provided by a pair of steering and focusing coils 13 consisting of one steering coil 13a upstream of the target 12 and one focusing coil 13b downstream of the target 12. Without departing from the scope hereof, deposition apparatus 340 may include additional coils to steer and/or focus the cathodic arc spots. A deflecting coil 20 is installed adjacent to cathode chamber 90 and plasma duct deflecting section 44 to deflect metal vapor plasma flow 165 within deflection section 44 from the cathode chamber 90 toward tunneling exit section 46 where it is focused by focusing coil 21 toward substrates 4 on substrate holder 2 in coating chamber 10. Focusing coil 21 is installed adjacent to coating chamber 10 and exit tunnel section 46. The directions of currents in magnetic coils 13a, 13b, 20, and 21 are indicated by arrows.

Sputtering cathode targets 245a of the magnetrons 245 face substrates 4 in such a manner that metal sputtering flow 215 generated by the magnetrons 245 is directed toward substrates 4 effectively overlapping the metal vapor plasma flow 165 generated by dual filtered cathodic arc source 1. Accordingly, deposition of metal sputtering flow 215 and metal vapor plasma flow 165 onto substrates 4 may coincide both spatially and temporally. The focusing magnetic field force lines 166, generated by the focusing coil 21, overlap a portion of magnetron magnetic field 166a nearest to focusing coil 21. Focusing magnetic field lines 166 and magnetron magnetic field lines 166a overlap and are co-directional. Vapor plasma flow 165 overlaps sputtering metal atomic flow 215 of the magnetron sputtering sources 245 to enabling coinciding deposition of (a) a fully ionized metal vapor plasma generated by filtered arc source 1 and (b) generally neutral metal sputtering flow generated by magnetron sources 245, with controlled ionization of the resulting hybrid filtered arc-magnetron sputtering flow at the surface of substrates 4. The controlled ion-to-(ion+atom) ratio may range from 0 to 100% by independently controlling the ion flux of metal vapor plasma 165 generated by filtered cathodic arc source 1 and metal atomic sputtering flux 215 generated by magnetrons 245. The ionization rate of the metal sputtering atoms in conventional DC magnetron sputtering flow is very low, generally below 0.1% of the sputtering atoms. The hybrid filtered cathodic arc-magnetron sputtering flow generated by deposition apparatus 340 overcomes this drawback of the conventional magnetron sputtering by providing a controllable ionization rate of metal vapor plasma ranging from 0% to 100%. Deposition apparatus 340 may accomplish this controllable ionization rate by adjusting vapor plasma flow 165 and/or sputtering metal atomic flow 215. Deposition apparatus 340 may adjust vapor plasma flow 165 by balancing the ion current output of the filtered cathodic arc source 1 by changing the cathodic arc currents or by operating the deflecting system of filtered cathodic arc source 1 in a pulse mode (magnetic shutter mode) with duty cycle ranging from 0% to 100%. Deposition apparatus 340 may adjust sputtering metal atomic flow 215 by varying the power applied to magnetron source 245 to control the output of the generally neutral sputtering metal atomic flow 215. Alternatively, or in combination therewith, deposition apparatus 340 may adjust sputtering metal atomic flow 215 through use of optional mechanical shutters (not shown) to periodically close off sputtering targets 245a. These mechanical shutters (not shown) may also function to protect magnetron target 245a from coatings deposited from vapor plasma flow 165 when cathode targets 12 and targets of magnetrons 245 are made of different materials. The ionized metal vapor flow is known to be beneficial for the coating quality by increasing the density of the coatings, improving adhesion of the coatings to the substrates, reducing the roughness of the coatings and reducing the density of the coating defects via intense ion bombardment of the substrate surface during coating deposition process.

In one embodiment, schematically shown in FIG. 4k, filtered vapor plasma source 1 additionally includes an array of stream baffles 185 positioned at the exit of the cathode chamber 90 adjacent to the entrance of the deflecting section of the plasma duct 44 where the metal vapor plasma flow 165 is deflected toward coating chamber 10. Stream baffles 185 trap macroparticles to further improve the macroparticles trapping capability of deposition apparatus 340, especially for trapping charged nanoparticles electromagnetically confined within filtered vapor plasma flow and not trapped by walls baffles. Although not shown in FIG. 4k, the apparatus of FIG. 4k may include wall baffles such as those shown in FIGS. 1a, 3h-j, and 4e, without departing from the scope hereof. In another embodiment, deposition apparatus 340 includes separating anode 50 (as shown in FIG. 4j) for trapping macroparticles. In yet another embodiment, deposition apparatus includes both stream baffles 185 and separating anode 50. Without departing from the scope hereof, each of the embodiments shown in FIGS. 4j, 4k, 4L may include stream baffles 185, wall baffles 55, and/or separating anode 50.

Figure 4L:
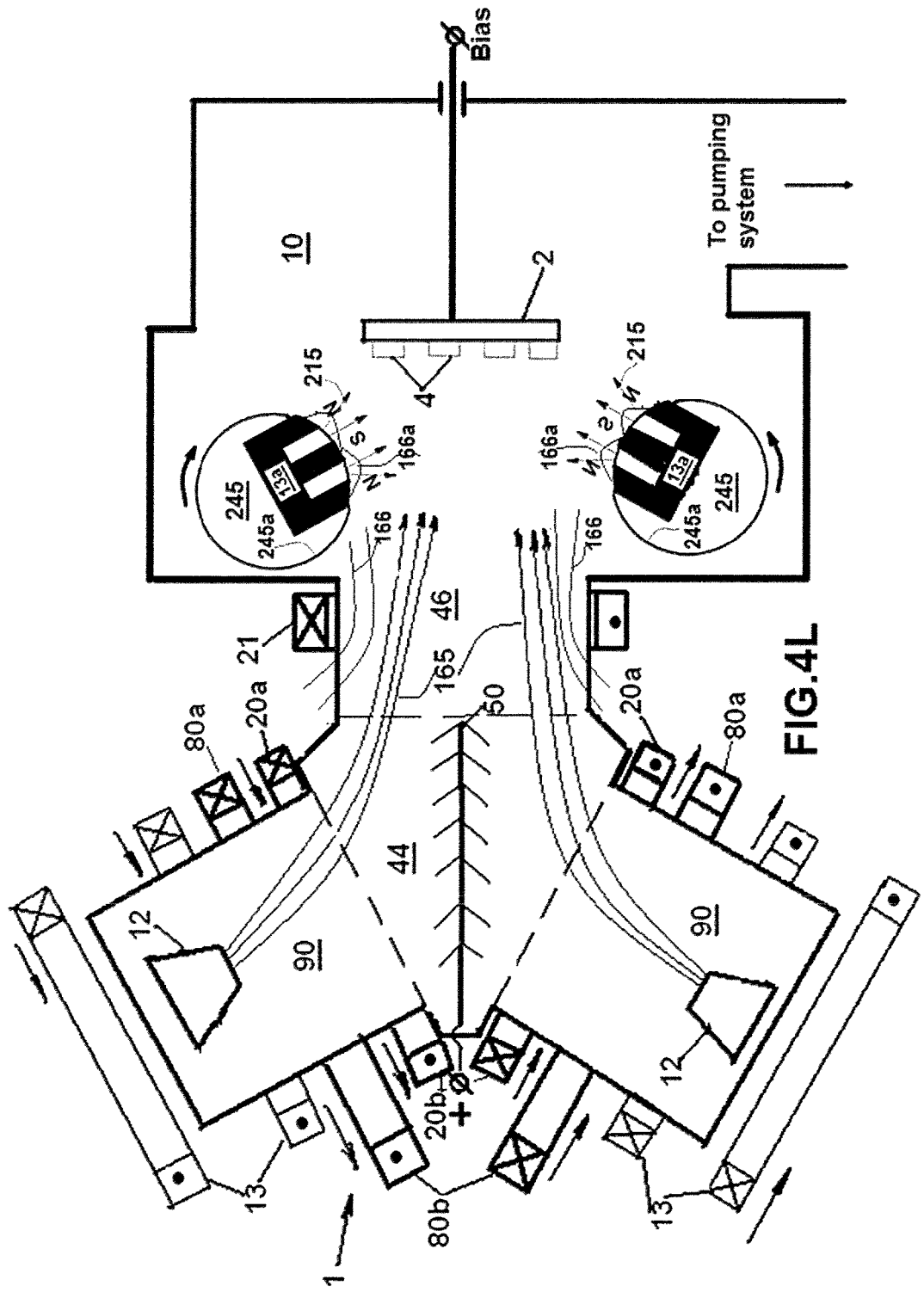

FIG. 4L illustrates, in schematic plan view, one exemplary hybrid coincided filtered arc-magnetron sputtering deposition apparatus 350 that utilizes rotating tubular magnetron targets. Deposition apparatus 350 is an embodiment of deposition apparatus 340. Deposition apparatus 350 implements each magnetron sources 245 with a stationary magnetic yoke 13a and rotating tubular targets 245a that are magnetically coupled to the filtered arc source 1. In deposition apparatus 350, rotating cylindrical magnetron targets 245a envelop stationary magnetic yoke 13a oriented toward substrates 4. The direction of rotation of cylindrical targets 245a is shown by arrows. Such tubular magnetrons with rotating cylindrical targets have substantially greater utilization rate than that of the planar magnetron targets. The direction of the sputtering metal atomic flow 215 generated by the tubular magnetrons 245 of deposition apparatus 350 coincides with the direction of metal vapor plasma flow 165 generated by dual filtered cathodic arc source 1.

Figure 4M:
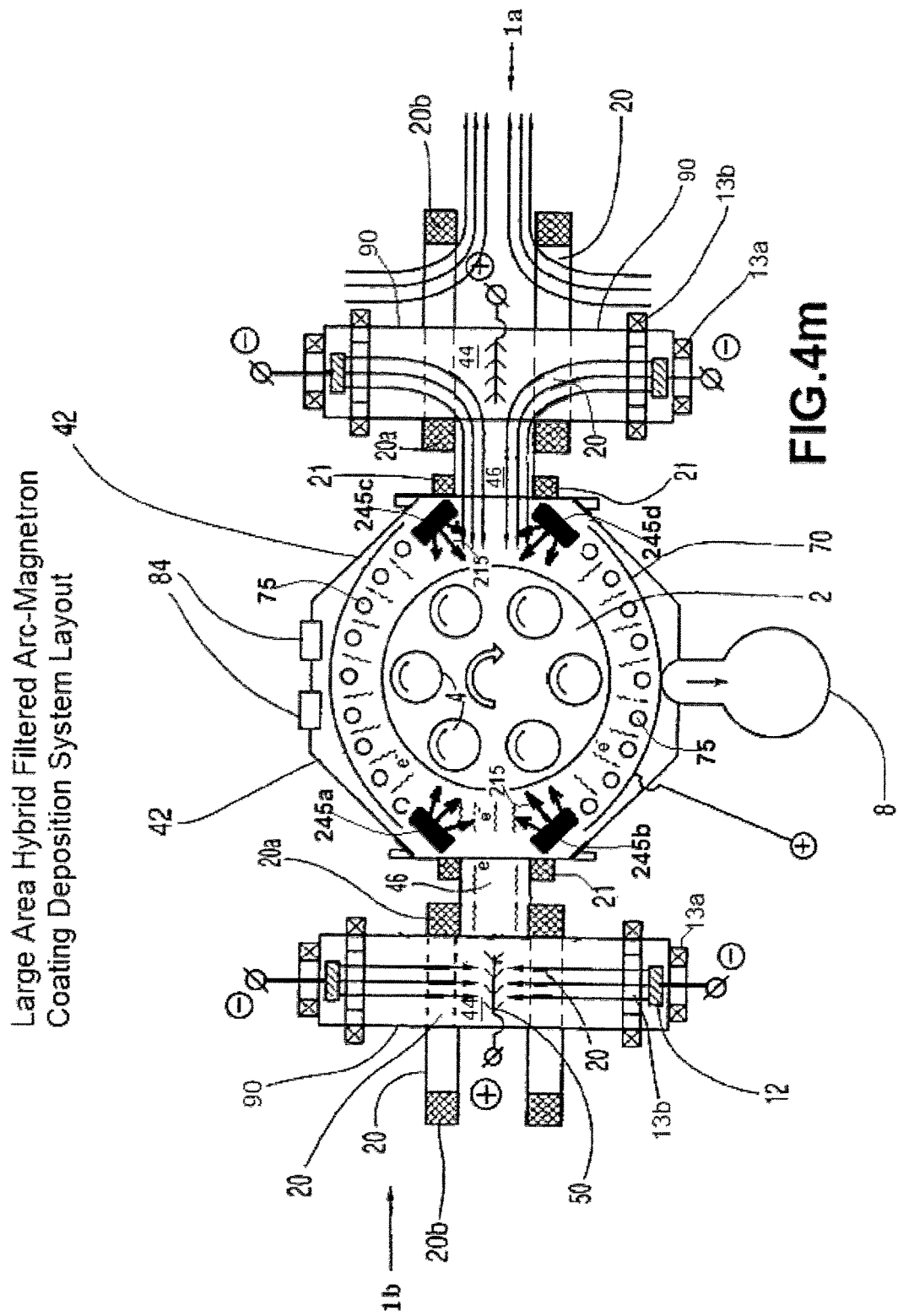

FIG. 4m illustrates one exemplary hybrid coincided filtered arc-magnetron sputtering deposition apparatus 360 that is a variation of the embodiment of FIG. 4f further including magnetrons in coating chamber 42. In deposition apparatus 360, two filtered cathodic arc sources, 1a and 1b, are provided on opposite sides of coating chamber 42. Each filtered arc source contains (a) a pair of cathode targets 12, positioned by the entrance of opposite cathode chambers 90, (b) magnetic steering coils 13a located upstream of cathode target 12, (c) focusing coil 13b located downstream of the cathode target 12, (d) deflecting coil 20 located at the entrance of plasma duct deflection section 44, (e) and focusing coil 21 surrounding exit tunnel section 46 of the plasma duct. Deflecting coil 20 includes (a) linear deflecting conductor 20a adjacent to cathode chamber 90 and to plasma duct 44 proximate to the wall of cathode chamber 90 that faces coating chamber 42 and (b) closing conductor 20b positioned distant from the wall of the cathode chamber 90 that faces away from the coating chamber 42.

Deposition apparatus 360 may be used for plasma immersed treatment of substrates 4, by selectively deactivating deflecting coils 20 and focusing coil 21 of filtered cathodic arc source 1b on one side of the coating chamber 42. When all plasma sources associated with cathode targets 12 are active, metal vapor plasma streams are generated in both filtered cathodic arc sources 1a and 1b. However, while the metal vapor plasma stream generated on the side of active coils 20 and 21 of the filtered cathodic arc source 1a is directed toward the coating chamber 42 by deflecting and focusing magnetic fields generated by deflecting coils 20 and focusing coils 21, the metal vapor plasma component of the plasma stream on the side of the inactive deflective coil 20 and focusing coil 21 of the other filtered cathodic arc source 1b remains largely confined within the cathode chambers 90. This selective deactivation of deflecting coils 20 an focusing coil 21 of filtered cathodic arc source 1b represents a magnetic shutter mode that cuts off the metal vapor plasma output of the filtered cathodic arc source 1b from the coating chamber 42 since there is no magnetic driving influence for metal vapor plasma on that side of coating chamber 42. The cathodes 12 on the side of the inactive coils 20 and 21 thus serve as powerful electron emitters for remote arc discharges between cathode targets 12 and remote anode 70 in coating chamber 42. This remote arc discharge improves ionization of the gaseous component of the plasma flowing past the exit tunnel section 46 and into coating chamber 42, and significantly improves the properties of the resulting coating.

Coating chamber 42 includes radiation heater 75. An electrostatic probe for measuring plasma density and IR pyrometer for measuring substrate temperature during coating deposition process are installed to flanges 85 at coating chamber 42. Substrates 4 are installed at the satellites of the rotational substrate holding turntable connected to the bias power supply (not shown) for negatively biasing substrates to be coated during coating deposition process.

Deposition apparatus 360 includes two pairs of magnetron sputtering sources 245 installed in coating chamber 42 at the exit of tunnel portion 46 of each opposite dual filtered cathodic arc sources 1a and 1b. Each magnetron source 245 is magnetically coupled with the focusing magnetic field generating by the focusing coil 21 at the exit of the tunnel portion of the filtered arc source. The pair of magnetron sources 245c and 245d is magnetically coupled with dual filtered cathodic arc source 1a while the pair of magnetron sources 245e and 245f is magnetically coupled with rectangular dual filtered cathodic arc source 1b. As shown in FIG. 4m, the metal atomic sputtering flows 215 generated by the pair of magnetron sources 245c and 245d coincides with the metal vapor plasma flow generating by the adjacent dual filtered cathodic arc source 1a having its deflected magnetic coils activated (when the magnetic shutter is open). At the opposite side of the chamber 42 the metal atomic sputtering flows 215 generating by the pair of magnetron sources 245e and 245f coincides with the electron current of the remote arc discharge generating by the adjacent dual filtered cathodic arc source 1b having its deflected magnetic coils not activated (when the magnetic shutter is closed). In both cases the magnetron sputtering deposition process is enhanced either by metal ion flux or by electron flow resulting in improved density and other functional properties of the coatings.

Figure 5:
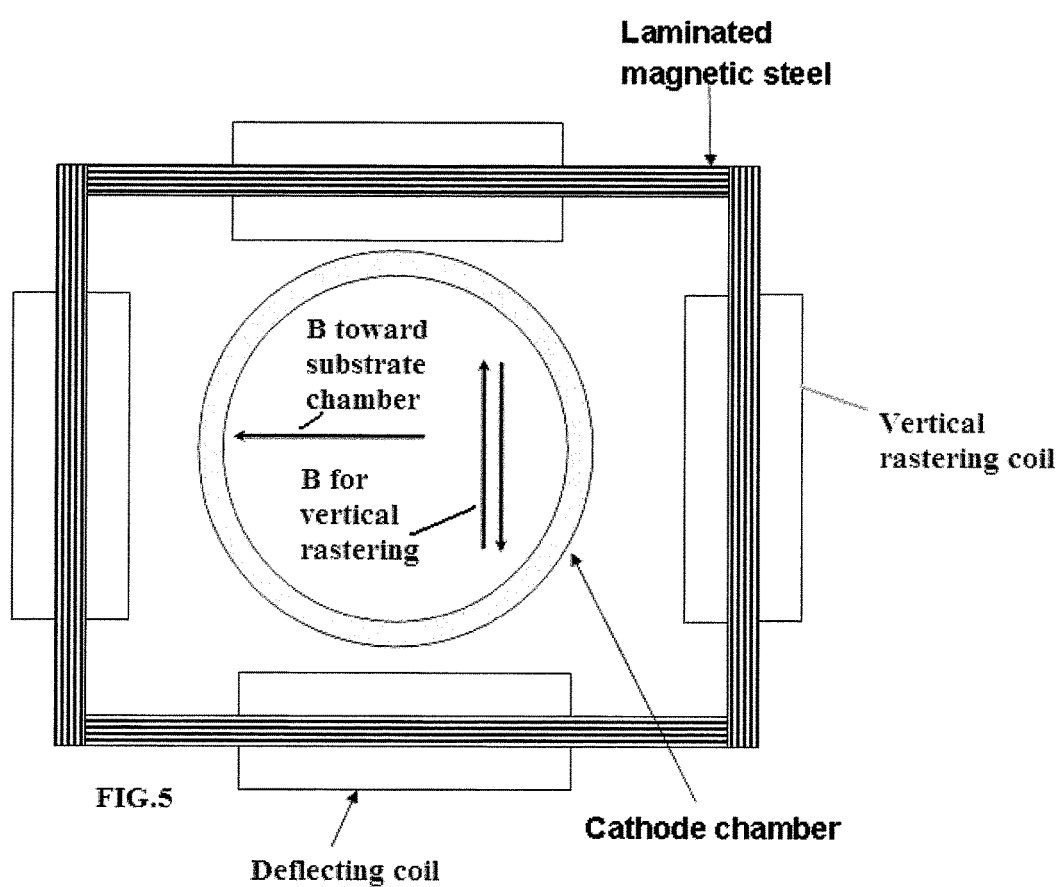
FIG. 5 is an exemplary schematic plan view of an electromagnet suitable for deflection of the magnetic field lines in a cathode chamber.

The deflection of the magnetic force lines inside of the cathode chamber 90 can be also achieved, for example, by using the offset deflecting electromagnet shown in FIG. 5 as an offset deflecting coil 80 (or 81). In this case the ferromagnetic core made of laminated magnetic steel surrounds the tubular cathode chamber 90 downstream of the cathode 12. The magnetic coils 80 (or 80 and 81) provide a magnetic field directed toward the substrate chamber 10 inside of the cathode chamber 90. This magnetic field, together with the focusing magnetic field generating by the focusing coil 13b of the primary cathodic arc source, provide a resultant magnetic field which directs the metal vapor plasma stream toward substrate chamber 10 even before it leaves the cathode chamber 90. In addition, this electromagnet surrounding the exit portion of the cathode chamber can provide magnetic rastering of the filtered arc vapor plasma flow by superimposing an alternating magnetic field transversal to the deflecting magnetic field. This can be accomplished by applying an alternating current to the rastering magnetic coils as shown in FIG. 5.

Figure 6C:
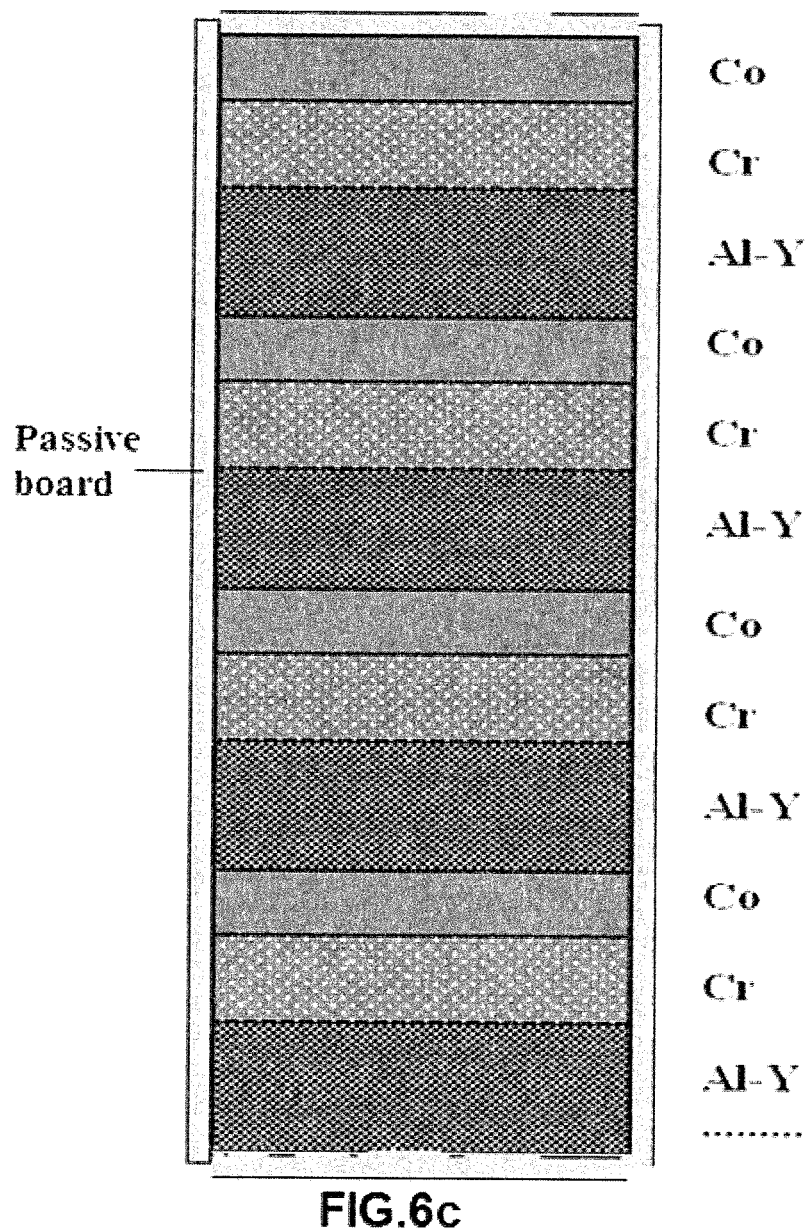
FIG. 6c is an exemplary schematic plan view of a segmented planar primary cathode target.

The group of FIGS. 6a-f illustrate different designs of the cathodic arc sources which may be installed as a primary metal vapor sources in the cathode chambers of the unidirectional dual filtered cathodic arc source shown in the group of FIGS. 4a-m. The primary cathodic arc source installed in the cathode chamber 90 may be similar to the plasma source described in U.S. Pat. No. 3,793,179 issued Feb. 19, 1974 to Sablev, which is incorporated herein by reference. This plasma source utilizes a circular cylinder or frustoconical target 12. To cover a large area coating zone, several cathodic arc chambers 90 which are enveloping cylindrical or conical targets 12 may be installed in opposing walls of the plasma duct 44 as shown schematically in FIG. 9a. In a preferable embodiment of this design, the primary cathodic arc source target 12, powered by the primary arc power supply 19, is frustoconical as illustrated in FIG. 6a. In reference to FIG. 6a, the stabilizing or steering coil 13a is installed surrounding the conical cathode target 12 and has the same polarity as the focusing coil 13b positioned downstream of a cathode target 12 and the optional offset deflecting coil 80 surrounding the cathode chamber 90 downstream of the focusing coil 13b near the exit section of the cathode chamber 90 where the cathode chamber 90 is connected to the plasma duct 44 (shown in FIGS. 4a through 4f). The magnetic field streamlines 158 in the vicinity of the cathode target 12 have an acute angle relative to the side surface of the primary cathode target 12, which results in a moving of cathodic arc spots along helical trajectories from the back side of the frustoconical target 12, where an igniter 12a is striking the cathode target 12 to ignite the arc creating arc spots toward the front evaporation surface of the target 12. The metal vapor plasma stream 160 generated at the evaporating butt-end surface of the conical target 12 is deflecting toward plasma duct 44 (shown in FIG. 3a) by the magnetic field streamlines 160a generated by the deflecting linear conductor 20a of the deflecting magnetic coil 20 of the plasma duct 44 and optionally by the deflecting conductor 80a of the offset deflecting coil 80 around the corner 90a of the cathode chamber 90 facing the coating chamber (shown in FIG. 3a) followed by further propagating throughout the deflecting section 44a of the plasma duct toward the coating chamber.

Figure 9A:
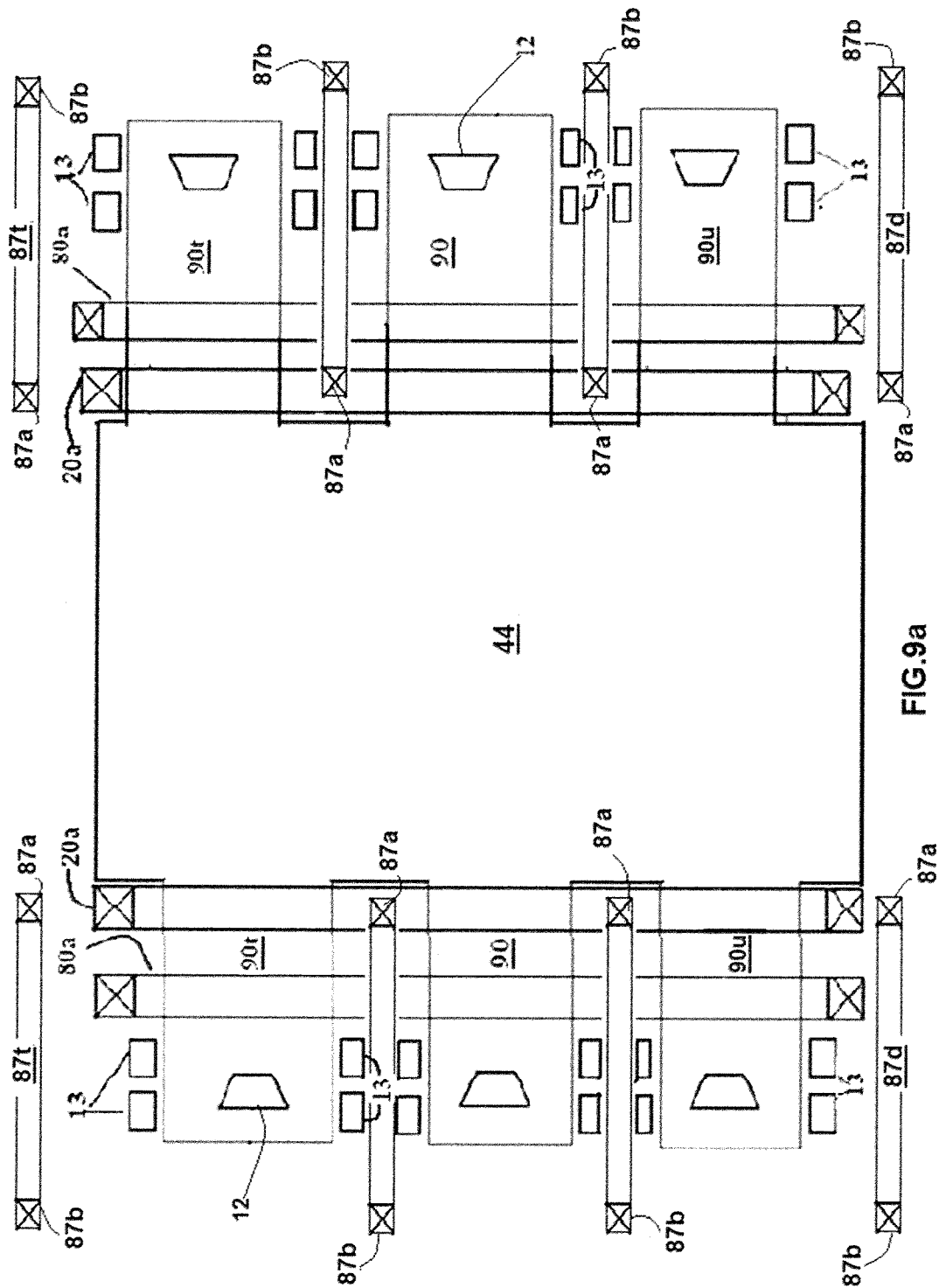
FIG. 9a is a schematic cross-section of the filtered cathodic arc source shown in FIG. 3a having three cathode chambers disposed at each of the opposite walls of the deflection section of the plasma duct, in an embodiment.
Figure 9B:
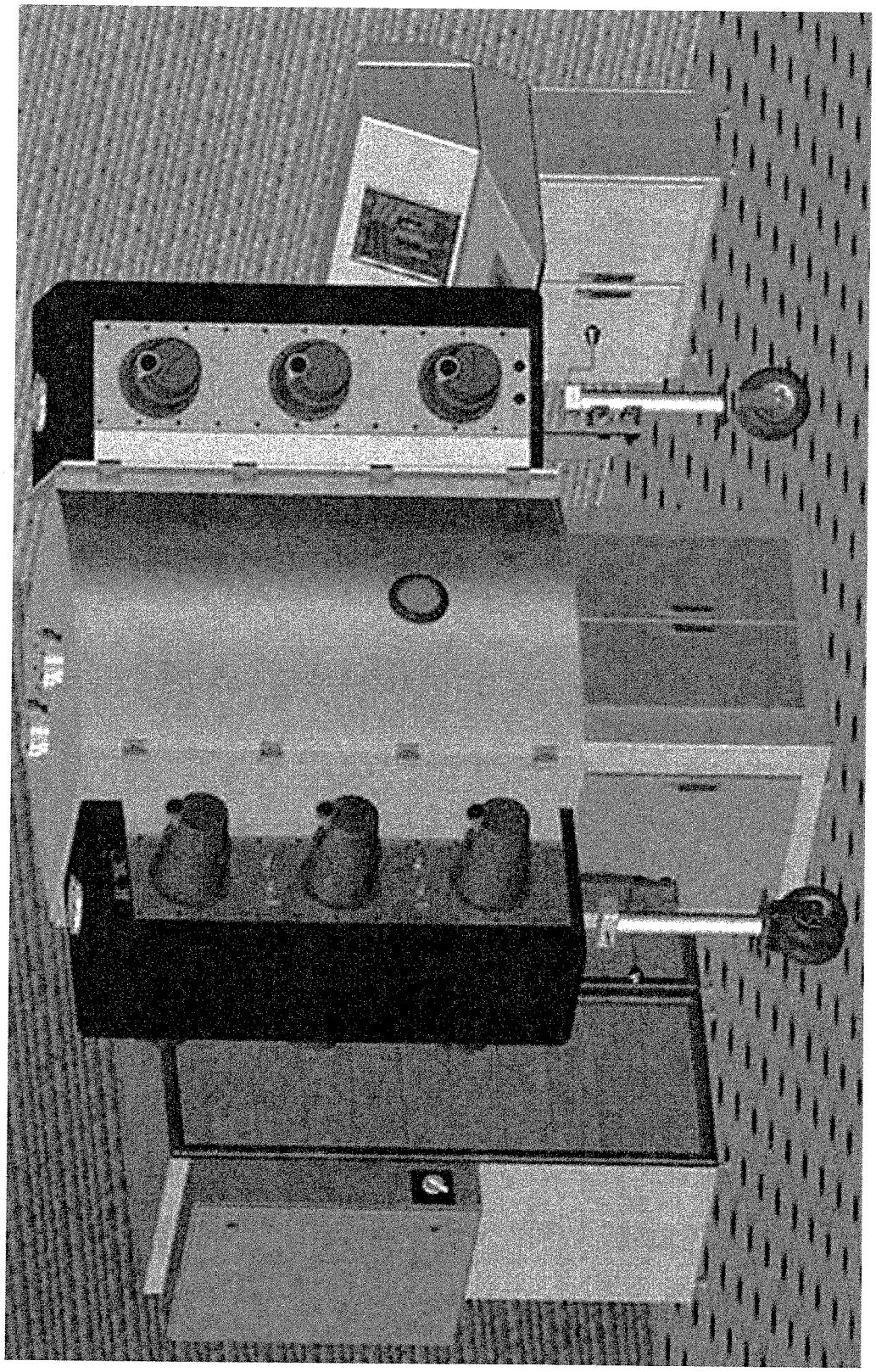
FIG. 9b is a perspective view of a coating apparatus utilizing two unidirectional rectangular dual filtered cathodic arc sources having three cathode chambers with attached primary cathodic arc sources disposed at each of two opposing walls of the deflection section of the plasma duct, in an embodiment.

FIG. 9a illustrates a perspective view of embodiment of filtered cathodic arc deposition method and apparatus of present invention utilizing several pairs of primary cathodic arc sources with cylindrical or conical cathode targets 12 and steering and focusing coils 13, which are installed in the several cathode chambers 90 in the opposing side walls of the deflecting portion of the plasma duct chamber 44. The deflecting portion 44a of the plasma duct chamber 44 may have a shape of parallelepiped, rectangular or triangular prism or a prism of a different cross-section, symmetrical in relation to the plane of symmetry of the plasma duct 44. A pair of offset deflection coils 80 adjacent to the cathode chambers 90 along or in combination with deflection coils 20 surrounding the deflection portion of the plasma duct 44 (not shown) can be used for deflecting the metal vapor plasma flow generated by multiple primary cathodic arc cathodes 12 surrounded by steering and focusing coils 13. The resulting plasma flow will be deflected in a deflecting portion 44a of the plasma duct 44 and continue flow toward substrate chamber (not shown) throughout exit tunnel section 46 (shown in FIG. 3a), where it will focus toward substrates to be coated (shown in FIG. 3a) by the focusing coil 21 (shown in FIG. 3a). The positions of the cathode targets 12 disposed at the opposite walls of the deflection section 44a of the plasma guide 44 can be displaced to each other by the distance between the center of the corresponding cathode targets 12 ranging from 50 mm to 200 mm in the direction transversal to the plane of rotation of the plasma flow in deflection section 44a of the plasma duct 44 to compensate for the centrifugal drift of the vacuum arc plasma jets in a curvilinear magnetic field. The optional rastering coils can be also attached to each of the cathode chamber 90 to raster a vapor plasma flow in a direction transversal to the plane of rotation of the vapor plasma flow, which allows to improve the uniformity of plasma distribution across the plasma duct 44 when plurality of cathode chambers with relatively small frustoconical or disc-shaped cathode targets 12 are used as a primary sources of metal vapor plasma. The electromagnetic rastering coils similar to one shown in FIG. 5 can be installed near the end of the cathode chambers 90 for rastering the vapor plasma flow. Alternatively, a chain of rastering coils 87 can be installed, which include a top rastering coil 87t disposed above the top cathode chamber 90t and a bottom rastering coil 87d disposed under the bottom cathode chamber 90u as well as a number of intermediate coils 87 positioned between the neighbor cathode chambers 90 parallel to the plane of rotation of the plasma flow, wherein the front rastering conductors 87a are positioned near the end of the cathode chamber 90 adjacent to the plasma duct and the closing conductors 87b are positioned away from the plasma duct, and preferably behind the cathode target 12, such that the magnetic field generated by closing conductor 87b will not disrupt the magnetic steering of the cathodic arc spots on evaporating surface of the cathode targets 12, as shown schematically in FIG. 9a. When the coils 87 are activated in sequence, one after another, a neighbor one, the rastering magnetic field directed transversal to the plane of rotation of the metal vapor plasma flows will be created in cathode chambers 90 for rastering the multi-jet plasma flows in the plasma duct 44. The global view of the large area coating deposition system which incorporates the design of embodiment of filtered cathodic arc deposition method and apparatus of present invention shown in FIG. 9a is presented illustratively as an example in FIG. 9b.

Referring again to the group of FIGS. 6a-f, the primary cathodic arc source can be of rectangular design, as was described in U.S. Pat. No. 4,724,058 issued Feb. 9, 1988 to Morrison, which is incorporated herein by reference. In reference to FIG. 6b, the cathode target 12 can be rectangular plate or disc covering the coating zone, in part or entirely. A stabilizing coil 13a is positioned upstream of the cathode target plate 12, while a focusing coil 13b is positioned downstream of the cathode target plate 12 spaced from the surface of the target 12. The polarity of the stabilizing coil 13a is opposite to the polarity of the focusing coil 13b which is the same as the polarity of the optional offset deflecting coil 80 surrounding the cathode chamber 90 downstream of the focusing coil 13b and deflecting coil 20 adjacent to the cathode chamber 90 and deflecting section 44a of the plasma duct 44 (shown in FIG. 3a). The steering coil 13a creates arch-shape magnetic field 158a above the target 12, while the focusing coil 13b creates focusing magnetic force lines 158b forming a focusing magnetic cusp directed downstream of the cathode target 12 toward exit of the cathode chamber 90. Under the influence of the steering magnetic field which has streamlines 158a forming an acute angle at the periphery of the target plate 12, the cathodic arc spots move from the periphery of the target plate 12 toward its central area while at the same time moving along the border of the plate due to retrograde movement effect of the cathodic arc spots in a cross j×B field, where current density j has a direction of the vacuum arc current, which is perpendicular to the surface of the target 12. The vapor plasma stream 160 generated at the evaporating surface of the planar target 12 is further deflected by the magnetic field streamlines 160a generated by the deflecting coil 20 of the plasma duct (shown in FIG. 3a). It is turning metal vapor plasma toward coating chamber (shown in FIG. 3a) around the corner 90a of the cathode chamber 90 facing the coating chamber (shown in FIG. 3a) along the curvilinear magnetic field generated by linear deflecting conductor 20a facing the coating chamber (shown in FIG. 3a). Optionally, the metal vapor plasma starts turning toward coating chamber already within the cathode chamber 90 by the magnetic field produced by the linear conductor 80a of the offset deflecting coil 80 toward exit tunnel section of the plasma duct (shown in FIG. 3a). Optionally, a plurality of a generally coaxial stabilizing and steering coils 13a can be installed upstream of the planar cathode target 12 as illustrated schematically in FIG. 3n (coils 37,38,39), each of these coils is activated in turn providing a sweeping move of an arch-like steering and stabilizing magnetic field 158a at the evaporating surface of the cathode target 12 widening the erosion corridor and increasing the cathode target utilization rate. The planar cathode targets 12 used in rectangular primary cathodic arc sources can be of segmented design utilizing a bar segments of different elemental metals and/or alloys as shown schematically in FIG. 6c. The passive board may be used to restrict the area of magnetically steered cathodic arc spot movement. This design allows for a flow of multi-elemental metal vapor plasma created from a set of segments made from many different elemental metals or from alloys having a fewer number of elemental metals. The multi-elemental metal vapor plasma produced by evaporation of segmented multielemental targets will enter the plasma duct 44 turning into its exit tunnel portion 46 along the curvilinear magnetic force lines and will be mixed at the exit of exit tunnel section 46 forming a uniform multi-elemental metal vapor plasma flow at the entrance into the coating chamber 10 (shown in FIG. 3a).

In reference to FIG. 6a, cathode target 12 is installed in an offset position in relation to the exit portion of the cathode chamber 90, shifted away from the coating chamber (shown in FIG. 3a). This positioning is beneficial for achieving a higher output of the metal vapor ion flow 160 after the metal ions are passing the offset deflection coil 80 along the deflecting magnetic force lines 160a turning around the deflecting conductor 80a proximate to the coating chamber (shown in FIG. 3a) in the direction downstream of the cathode chamber 90, around its corner 90a facing coating chamber toward the exit tunnel section 46 of the plasma duct 44. In this setup, metal vapor plasma flow 160 starts turning toward the coating chamber already in cathode chamber 90 which is illustrated by the distribution of the metal vapor plasma flow lines 160. The offset position of cathode target 12 helps improve transport of metal vapor plasma flow 160 around the corner from cathode chamber 90 into plasma duct 44 in the direction toward the coating chamber.

Figure 6D:
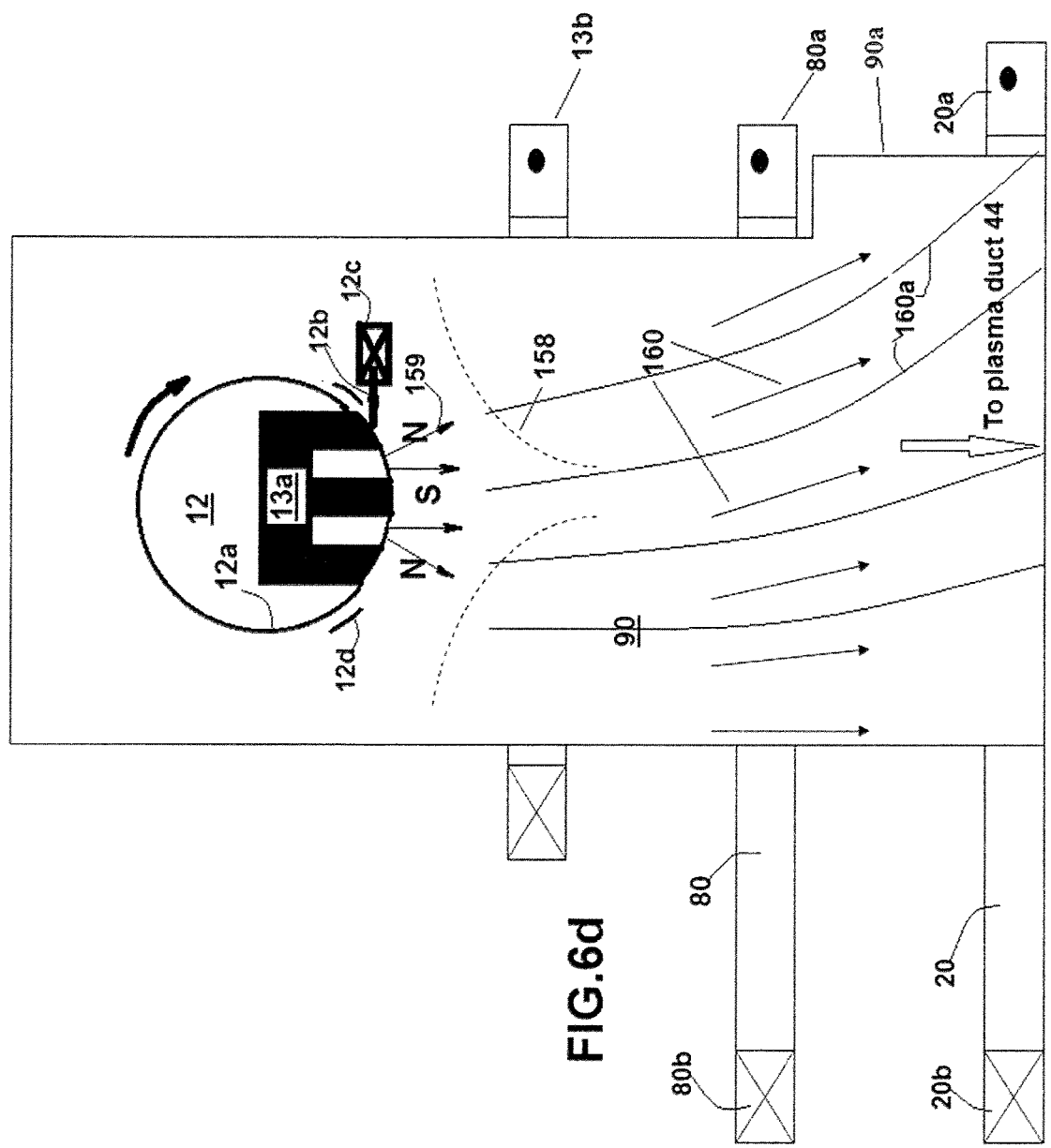
FIG. 6d is a schematic plan view of a variation of the apparatus of FIG. 6b utilizing the primary cathodic arc source with rotating tubular target, in an embodiment.

FIG. 6d illustrates a variation of the FIG. 6b embodiment, wherein the primary cathodic arc source utilizes a rotating cylindrical target 12. Magnetic steering system 13a, implemented as a magnetic yoke, is enveloped within an evaporating cylindrical target tube 12x. In this embodiment, evaporating tubular cylindrical target 12x is positioned in the cathode chamber 90 upstream of the focusing coil 13b, while stationary magnetic steering system 13a is positioned immediately behind the evaporation area of cathode target 12x where metal vapor plasma stream 159 is generated by the vacuum cathodic arc process. The evaporating target-tube 12 is rotating around its axis as shown by the arrow in FIG. 6d. The cathodic arc discharge may be ignited by means of mechanical striker 12b driven by a spring coil 12c or, alternatively, by a laser igniter (shown in FIG. 3a). Shields 12s may be optionally provided to protect against arc spots escape from the evaporating area in front of the magnetic yoke 13a. This design has an advantage of increased target utilization rate.

Figure 6E:
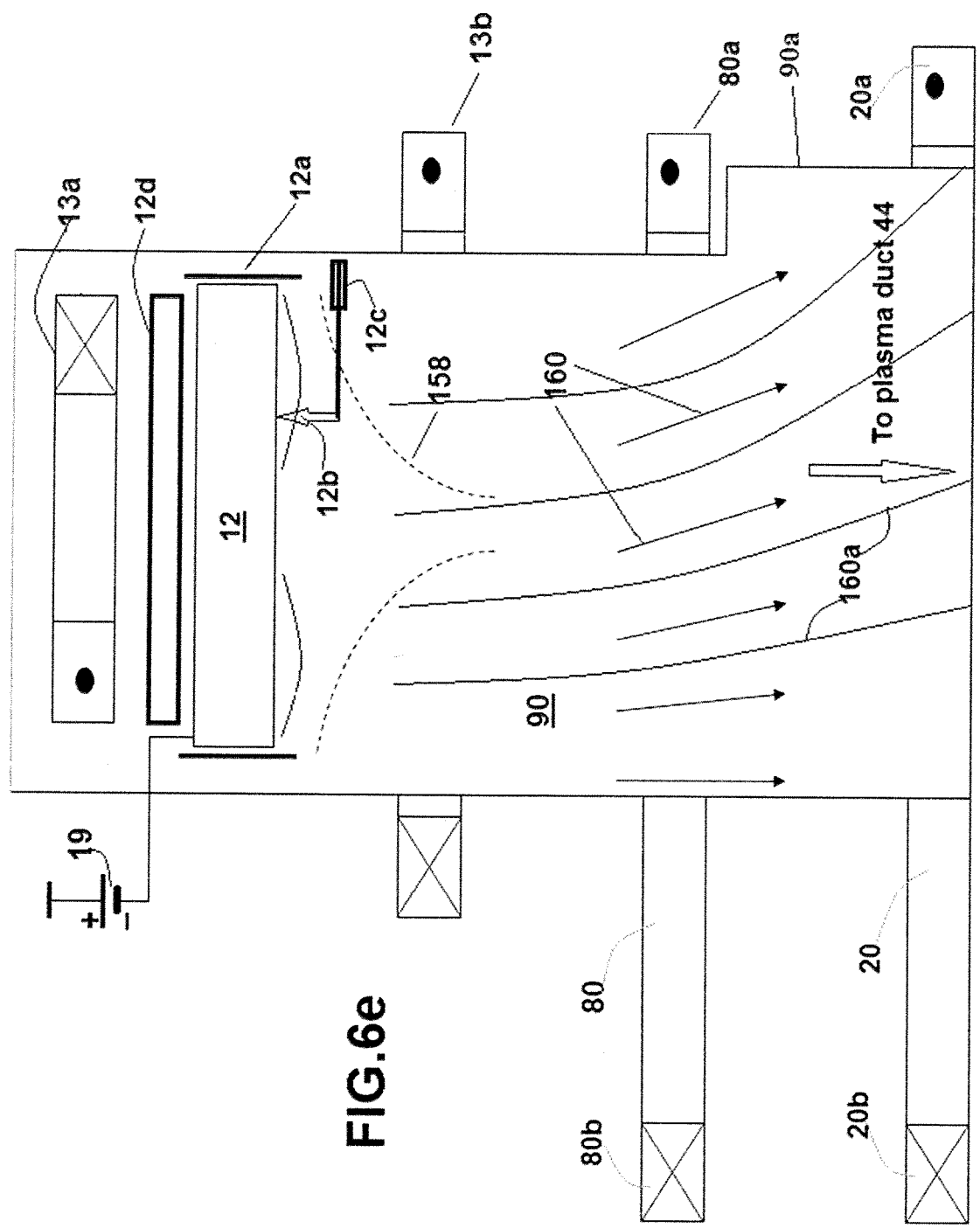
FIG. 6e is a schematic plan view of another variation of the apparatus of FIG. 6b utilizing the primary cathodic arc source with heated target, in an embodiment.

FIG. 6e illustrates another variation of the FIG. 6b embodiment, wherein the cathode target 12 is provided with a heater 12h which allows heating the cathode target up to 1000° C. Such heating of cathode targets is beneficial when the cathode target material has high resistance at low temperature, but the resistance is decreasing when target temperature is increasing. Examples of such cathode target materials include boron and silicon and other materials having electrical conductivity near the level of the metallic conductivity necessary for running the vacuum arc discharge when their temperature exceeds 900° C. Cathode heater 12h is positioned immediately behind the cathode target 12 between cathode target 12 and steering coil 13a. The cathodic arc discharge may be ignited by striking the evaporating surface of the cathode target 12 by means of mechanical striker 12b driven by spring coil 12c or, alternatively, by a laser igniter (shown in FIG. 3a). An optional cathode shield 12f may be also provided as a barrier to prevent the cathodic arc spots from escaping the evaporating surface of cathode target 12. In one embodiment, cathode heater 12h is smaller than cathode target 12, thus providing a heated evaporating area smaller front surface area of target 12. In this embodiment, the peripheral area of target 12 where the temperature is lower has much higher electrical resistance and therefore serves as a barrier confining the cathodic arc spots within the hot evaporating area of cathode target 12.

Figure 6F:
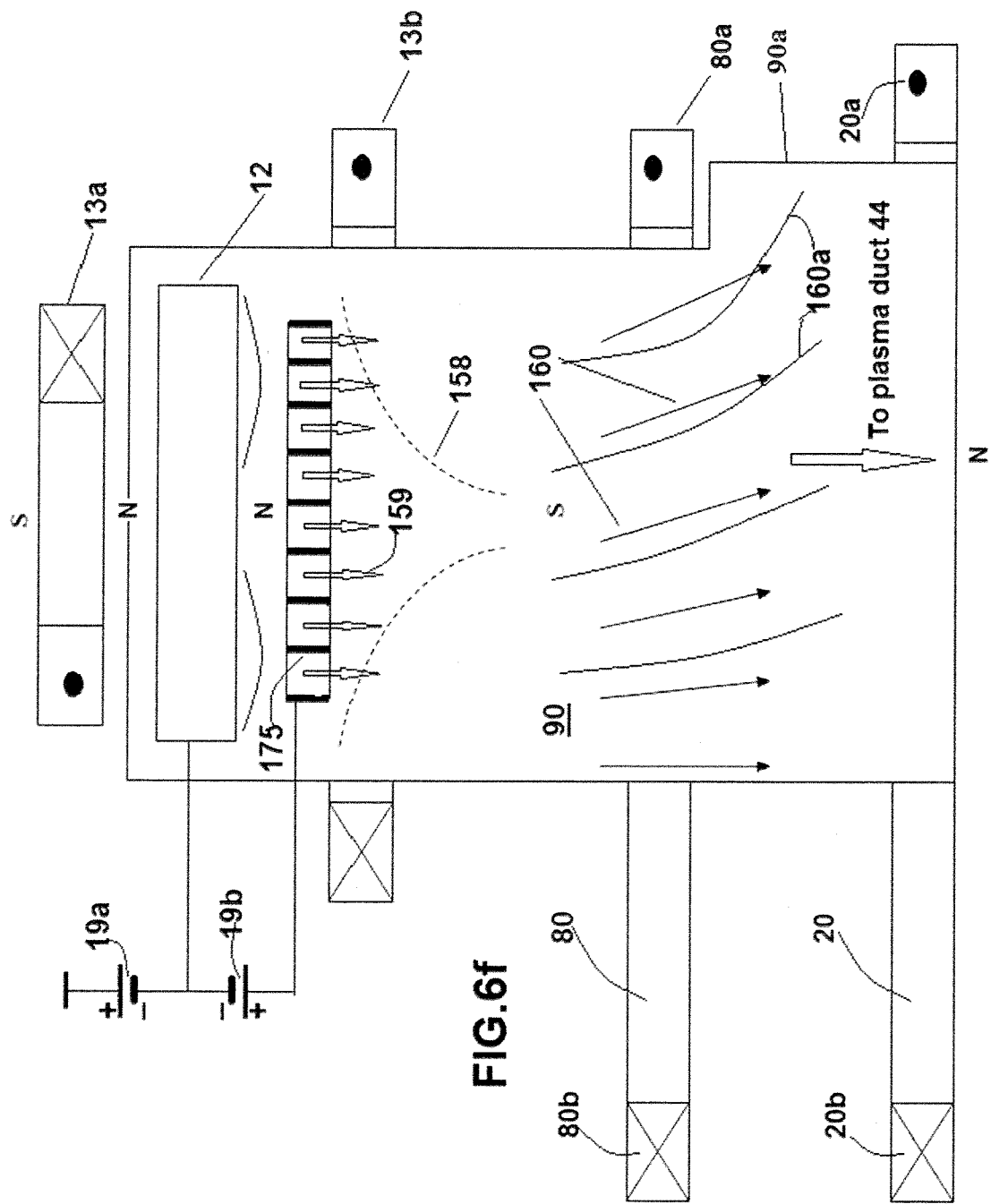
FIG. 6f is a schematic plan view of a variation of the apparatus of FIG. 6b utilizing stream baffles adjacent to the cathode target.

FIG. 6f illustrates another variation of the FIG. 6b embodiment wherein the primary cathodic arc source includes stream baffles. In FIG. 6f, cathode chamber 90 houses the primary cathodic arc source having cathode target 12 powered by a primary arc power supply 19a. Arc steering coil 13a is positioned upstream of a cathode chamber 90 (behind cathode target 12), and focusing coil 13b is positioned downstream of a target 12. In this embodiment, cathode chamber 90 further includes an array of stream baffles 175 positioned across at least a portion of cathode chamber 90 downstream of cathode target 12. The metal vapor plasma stream 159 generated at cathode target 12 (a) propagates between the baffles 175, (b) is focused by a focusing field 158 created by focusing coil 13b toward the deflection section of the exit of cathode chamber 90, and (c) is further focused toward deflection section 44a of plasma duct 44 (shown in FIG. 3a) by deflecting magnetic force lines 160a, while macroparticles and neutral metal atoms are trapped by the baffles 175. The off-set deflecting coil 80 is optionally positioned downstream of focusing coil 13b, which allows beginning deflection of the metal vapor plasma stream 160, generated by cathode target 12, toward plasma duct 44 of the filtered arc source (shown in FIG. 9d) already within the cathode chamber 90. Offset coil 80 includes deflecting linear conductor 80a positioned near the front wall 90a of the cathode chamber 90 facing the coating chamber 10 (shown in FIG. 3a), proximate to the front wall 90a of the cathode chamber 90, while its closing linear conductor 80b is positioned distant from the back wall of the cathode chamber 90 facing away from the coating chamber 10 (shown in FIG. 3a). Offset coil 80 deflects metal vapor plasma stream 160 generated by cathode target 12 along cathode chamber 90 toward its exit around the corner where front wall 90a connects to deflection section 44a of the plasma duct 44 (shown in FIG. 3a).

Generally, stream baffles 175 may be positioned anywhere between the cathode 12 in a cathode chamber 90 and the exit of the tunnel portion 46 of the plasma duct 44 (shown in FIG. 3a). In one example, stream baffles 175 are installed in front of cathode target 12 in cathode chamber 90, as illustrated in FIG. 6f, typically spaced from the cathode target surface by a distance of 1 cm to 10 cm. Stream baffles 175 installed downstream of a cathode target 12 may have a positive potential in reference to the cathode 12 or be insulated and have a floating potential. When installed in front of cathode target 12, as shown in FIG. 6f, stream baffles 175 may be floated or serve as additional anode, powered by a power supply 19b, to improve the stability of cathodic arc spots on cathode target 12 and therefore reduce the probability of extinguishing the vacuum arc discharge. Installation of stream baffles 175 too close to the cathode target 12 surface (e.g., less than 1 cm) may cause extinguishing of the arc spots and/or overheating of the stream baffles 175. When stream baffles 175 are installed at the distance greater than 10 cm from the cathode target 12 surface, their influence on arc spot steering and sustainability of the vacuum arc process is found to be negligible. The metal vapor plasma 159 generated by cathode target 12 is propagating generally parallel to the axis of cathode chamber 90 at distances close to the surface of cathode target 12 and freely penetrates the array of stream baffles 175 along the gaps between the stream baffles 175. Next, metal vapor plasma 159 is focused toward the exit of the cathode chamber 90 along magnetic force lines 158, created by focusing coil 13b, and optionally deflected by offset coil 80 around the corner where front wall 90a connects to deflection section 44a of the plasma duct 44 (shown in FIG. 3a).

Figure 7A:
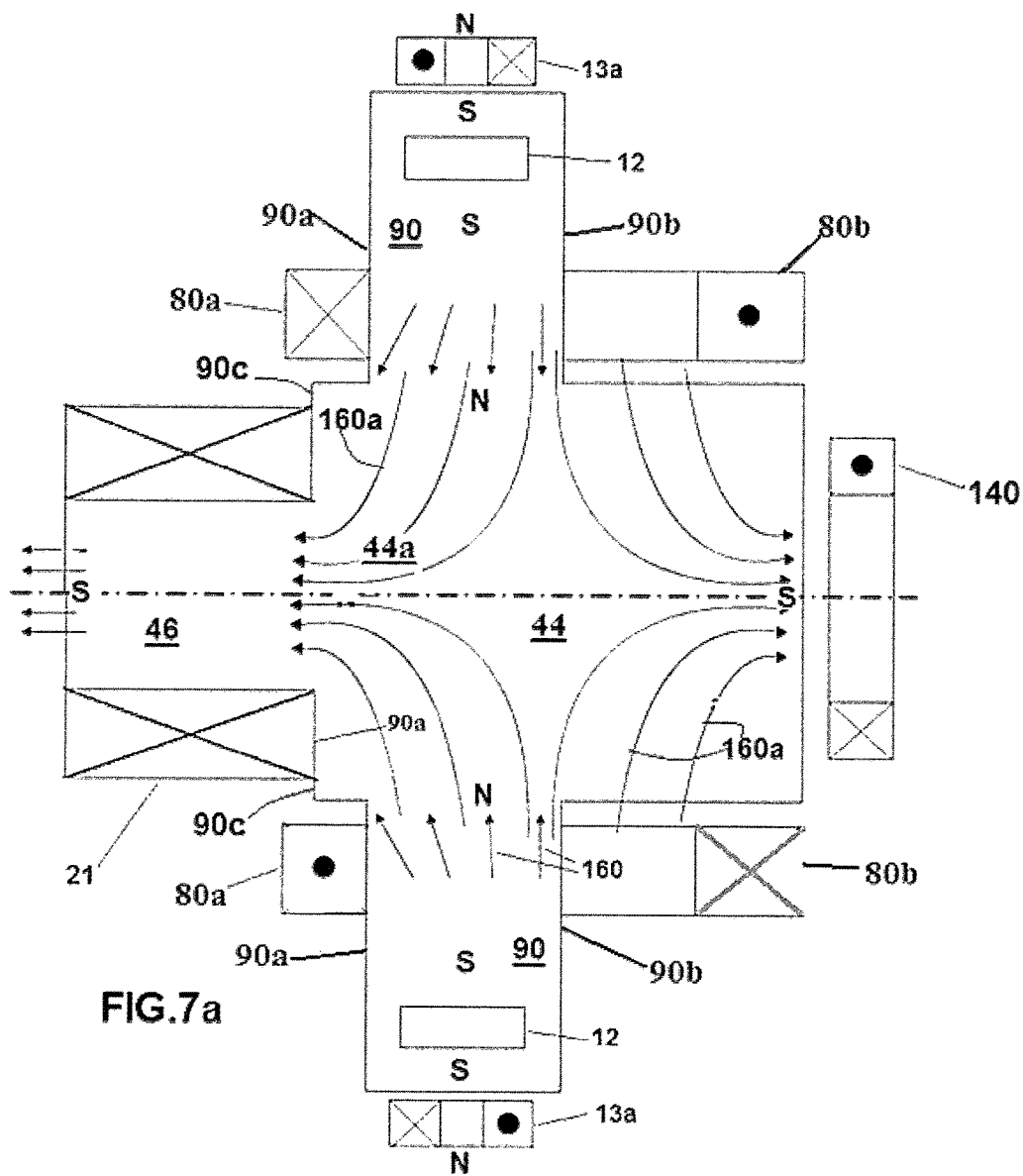
FIG. 7a is a schematic plan view of one tubular filtered multi-cathode arc source utilizing deflecting magnetic coils surrounding each cathode chamber, in an embodiment.
Figure 7B:
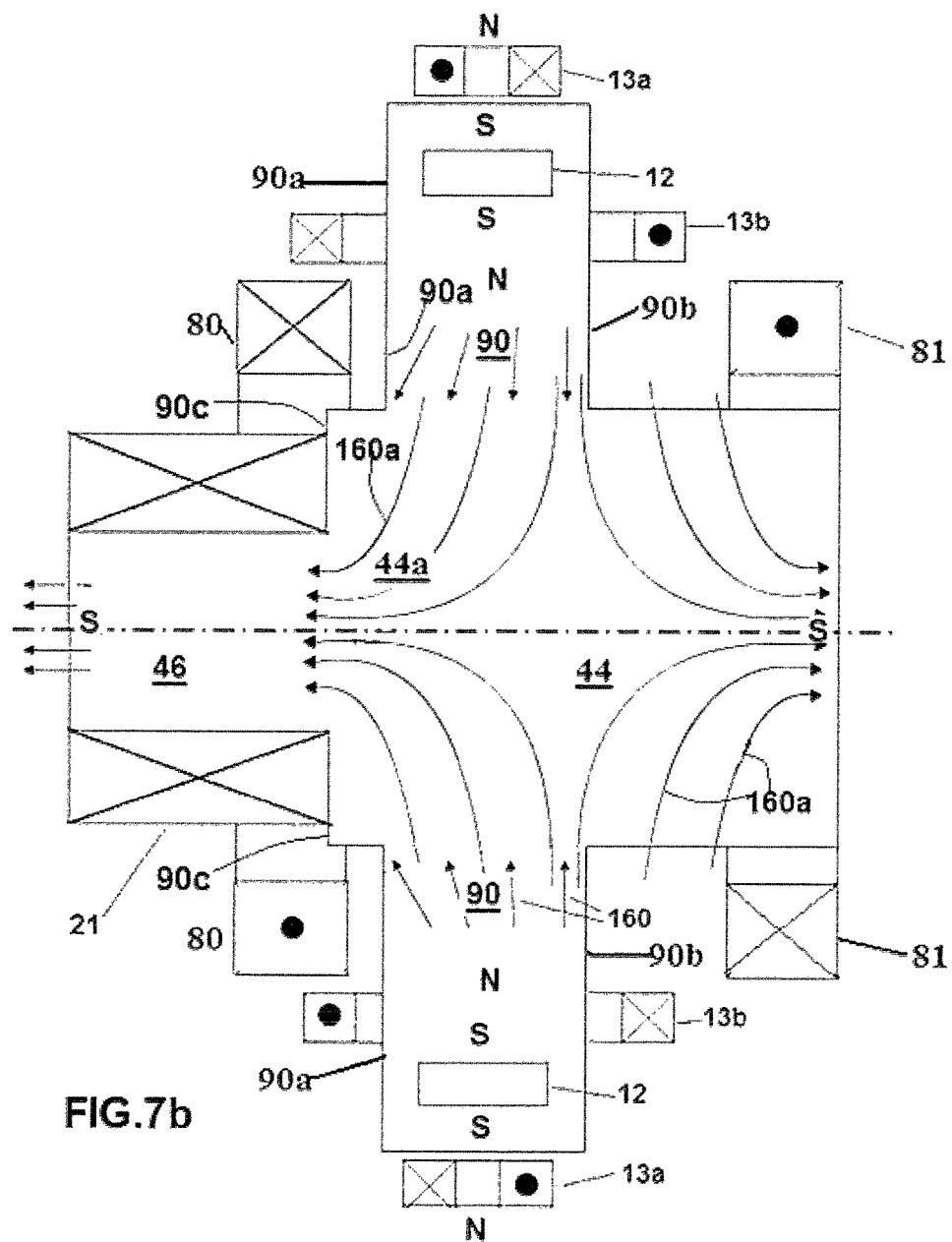
FIG. 7b is a schematic plan view of another tubular filtered multi-cathode arc source utilizing a pair of deflecting coils surrounding each cathode chamber, in an embodiment.
Figure 7C:
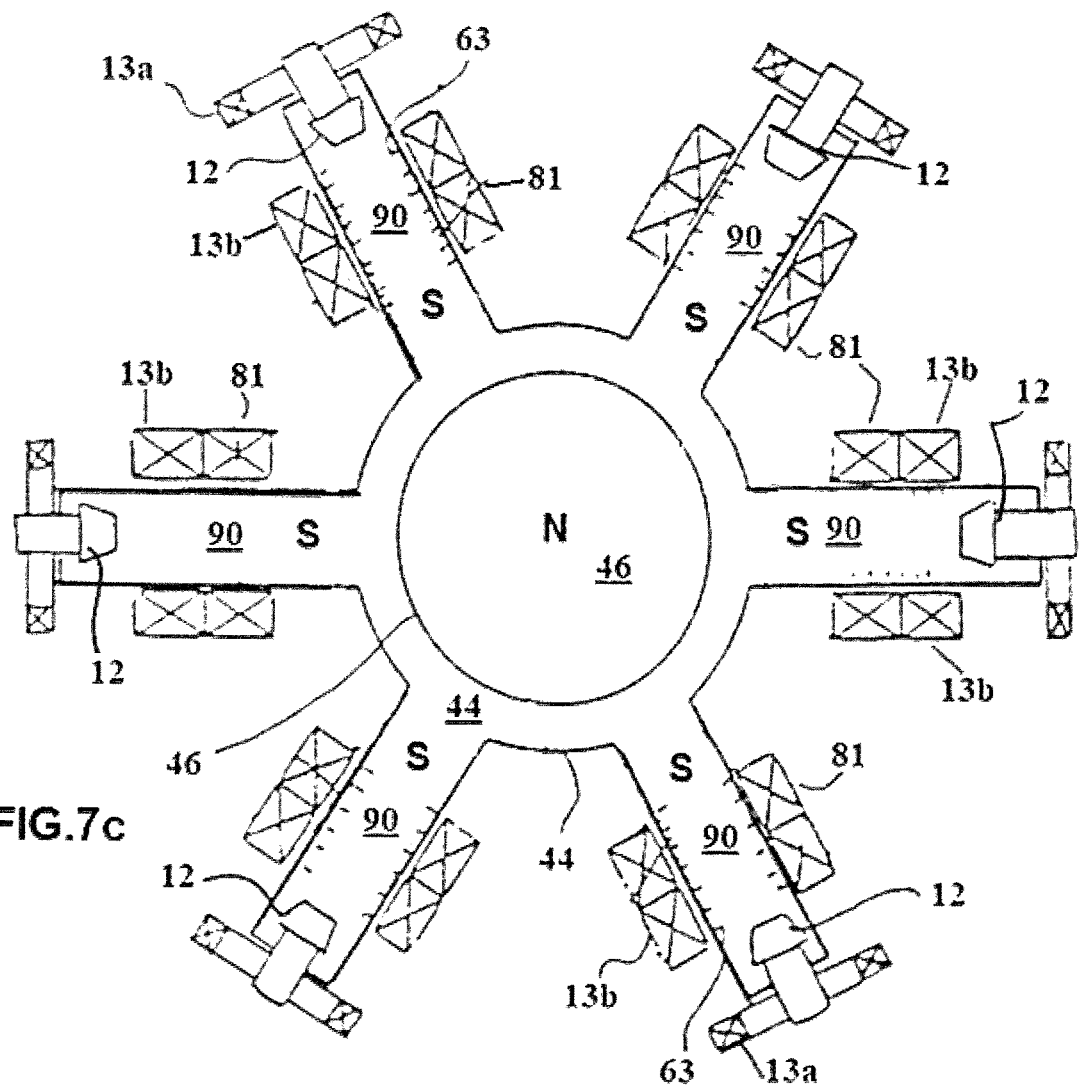
FIG. 7c is a transverse cross-section of one tubular filtered multi-cathode arc source utilizing deflecting magnetic coils surrounding each cathode chamber, in an embodiment.

In a further embodiment of the filtered cathodic arc deposition method and apparatus of present invention illustrated in FIG. 7a, the plasma duct chamber 44 is tubular. It comprises a plasma deflection portion 44a of the plasma duct chamber 44 and a focusing tunnel section 46 with primary cathode chambers 90 attached radially around the periphery of the deflection portion 44a of the plasma duct 44. The tunnel section 46 preferably has a smaller diameter than that of the plasma deflection section 44a by a step 90c of the corner of the deflection section 44a adjacent to the cathode chamber 90 and facing the coating chamber (shown in FIG. 3a). A focusing coil 21 surrounds the exit tunnel section 46 of the plasma duct chamber 44 to focus the deflected plasma stream 160 toward substrate chamber (shown in FIG. 3a)). The offset deflecting coils 80 surround the exit portion of each of the cathode chambers 90. The offset deflecting coils 80 have the same polarity as the focusing coil 21 creating a magnetically confined plasma corridor all the way from the target 12 throughout the cathode chamber 90 and the deflecting portion 44a of the plasma guide 44, and further along the tunnel focusing portion 46 of the plasma guide 44 toward substrates to be coated in a substrate chamber (not shown); the direction of the magnetic field streamlines 160a are on the same of side of the plasma guide facing the substrate chamber with a downstream portion of a bidirectional magnetic cusp directed toward the substrate chamber. An additional correctional coil 140 having opposite polarity to the focusing coil 21 may be optionally installed behind the plasma duct chamber 44, to deflect the magnetic streamlines directed toward substrate chamber. Baffles to trap macroparticles (shown in FIG. 8d) can be optionally installed both along the walls of the cathode chambers 90 downstream of the cathode targets 12 and along the walls of the plasma duct chamber 44. FIG. 7b illustrates a still further variation of the embodiment of filtered cathodic arc deposition method and apparatus of present invention shown in FIG. 7a in which the metal vapor plasma deflection system comprises a pair of offset deflecting coils 80 and 81 surrounding the deflection portion 44a of the plasma duct chamber 44 on opposite sides of all cathode chambers 90. The proximal offset deflecting coil 80 is attached to the side 90a of the cathode chambers 90 facing the substrate chamber (shown in FIG. 3a)), while the distal offset deflecting coil 81 is positioned behind the cathode chambers 90 distant from the cathode chamberback wall 90b facing away from the coating chamber The bidirectional cusp created by the coils 80 and 81 has a downstream portion directed toward the substrate chamber and upstream portion directed away from the substrate chamber. The distance between the distal offset deflecting coil 81 and the cathode chambers 90 is chosen to have a plane of symmetry of the cusp parallel to the axes of the cathode chambers 90 positioned within the cathode chambers 90 preferably within the portion of the cathode chamber 90 adjacent to the back wall 90b farthest from the substrate chamber (shown in FIG. 3a). The preferred variation of the embodiment of the present invention shown in FIG. 7a utilizes a multiple channel cylindrical filtered cathodic arc source design as illustrated in a plan view of embodiment of filtered cathodic arc deposition method and apparatus of present invention shown in FIG. 7c. It is appreciated that filtered cathodic arc plasma sources shown in FIGS. 7a and 7b can be of rectangular design with primary cathode chambers 90 attached to the opposite walls of the deflection portion 44a of the plasma duct chamber 44 and focusing coil 21 surrounding the entire exit tunnel portion 46 of the plasma duct chamber 44 (shown in FIG. 3a). In this case the axes of the axial symmetry of the tubular plasma duct will be replaced with the plane of symmetry dividing two opposite sides of the plasma duct chamber 44 (shown in FIG. 3a).

Figure 7D:
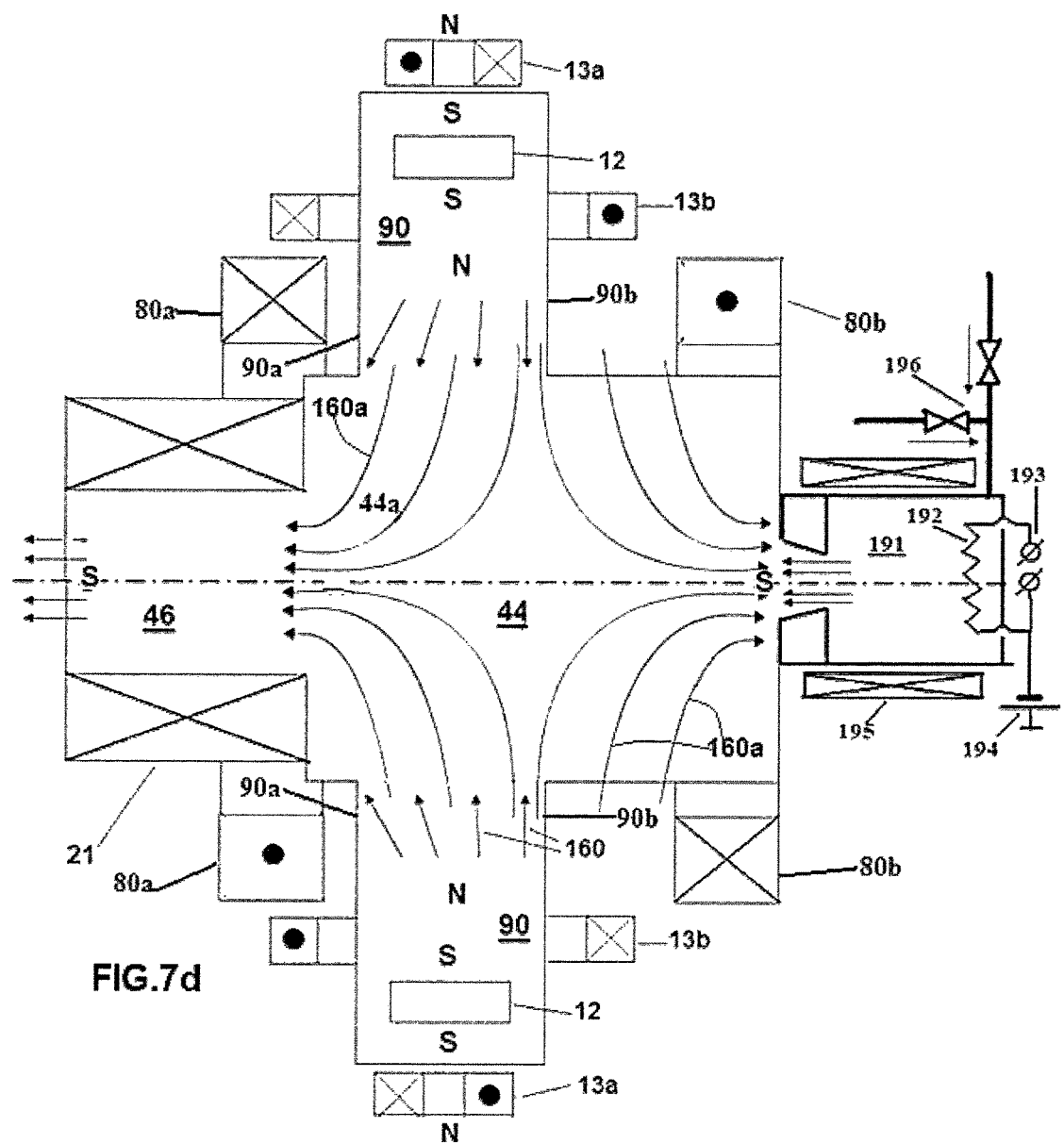
FIG. 7d is a schematic plan view of a tubular filtered multi-cathode tubular arc source utilizing an additional coaxial gaseous plasma source, in an embodiment.

The unidirectional dual or multicathode filtered arc source can also serve as a powerful generator of reactive gaseous plasma used in a low pressure plasma assisted CVD (LP-PACVD) process. One way to accomplish this process stage is to use the primary cathodes 12 as electron emitters when the main and offset deflecting coils 20, 80, 81 are turned off and an auxiliary arc discharge is established between the primary cathode targets 12 and distant auxiliary anodes 70 as shown schematically in an embodiment of filtered cathodic arc deposition method and apparatus of present invention in FIG. 4f. Optionally the mechanically shutters (not shown) can be used to periodically close off the openings of the cathode chambers 90 interfacing the plasma duct 44. The shutters can be provided with openings which permit electrons to flow from the cathode chamber 90 into plasma duct 44, while completely blocking the heavy atomic particles such as ions, atoms, and other neutral particles from entering the plasma duct 44. Alternatively, additional gaseous plasma source can be attached to the back wall of the multi-cathode filtered arc source generally coaxial with the plasma duct 44 as shown in FIG. 7d. This gaseous plasma source has a discharge chamber 191 surrounded by coil 197 with thermionic cathode (or, alternatively, the hollow cathode) 192 heated by the heating power supply 193. The power supply 194 provides a negative potential of the cathode 192 in a reference to the ground which allows an arc discharge to be established in a chamber 191. A plasma carrier gas such as argon and a precursor metal-organic or halides reactive gases are supplied via gas supply lines 196. The stream of strongly ionized reactive gaseous plasma prepared in a chamber 191 enters the plasma duct 44 along its axes and merges the filtered vapor plasma incoming from the cathode chambers 90. This design provides a hybrid PVD+CVD deposition of multi-elemental multiphase coatings from the vapor flow consisting of metal vapor plasma in addition to reactive gaseous plasma. Instead of additional gaseous plasma source the hollow cathode or a set of hot cathodic filaments for generation of thermionic discharge can be positioned at the back side of the plasma duct chamber 44. It is appreciated that the vacuum arc cathode same as cathode 12 can be also used as an electron emitting source in the discharge chamber 191. The vacuum arc cathode can operate in almost any reactive gas atmosphere without degradation in a wide range of electron emitting arc currents from approximately 40 amperes up to 500 amperes. The cathodic arc source utilizing vacuum arc evaporating cathode can operate for a long time until the evaporating cathode target is consumed. The exit openings of the discharge chamber 191 can be also provided with mechanical shutter similar to that shown in FIG. 4f. This mechanical shutter (shown in FIG. 4f) should be impermeable for heavy particles such as ions and neutral particles generating by the electron emitting vacuum arc plasma source, but it should have openings, which permit electrons to flow via plasma duct 44 toward at least one distal anode 70 (shown in FIG. 4f) installed anywhere within the substrate chamber 42 (shown in FIG. 4f). To energize this remote arc discharge, the negative pole of the at least one power supply (not shown) should be connected to the cathode in the discharge chamber 191, while its positive pole is connected to the at least one distal anode 70 (shown in FIG. 4f) installed in the substrate chamber 42 (shown in FIG. 4f).

Figure 7E:
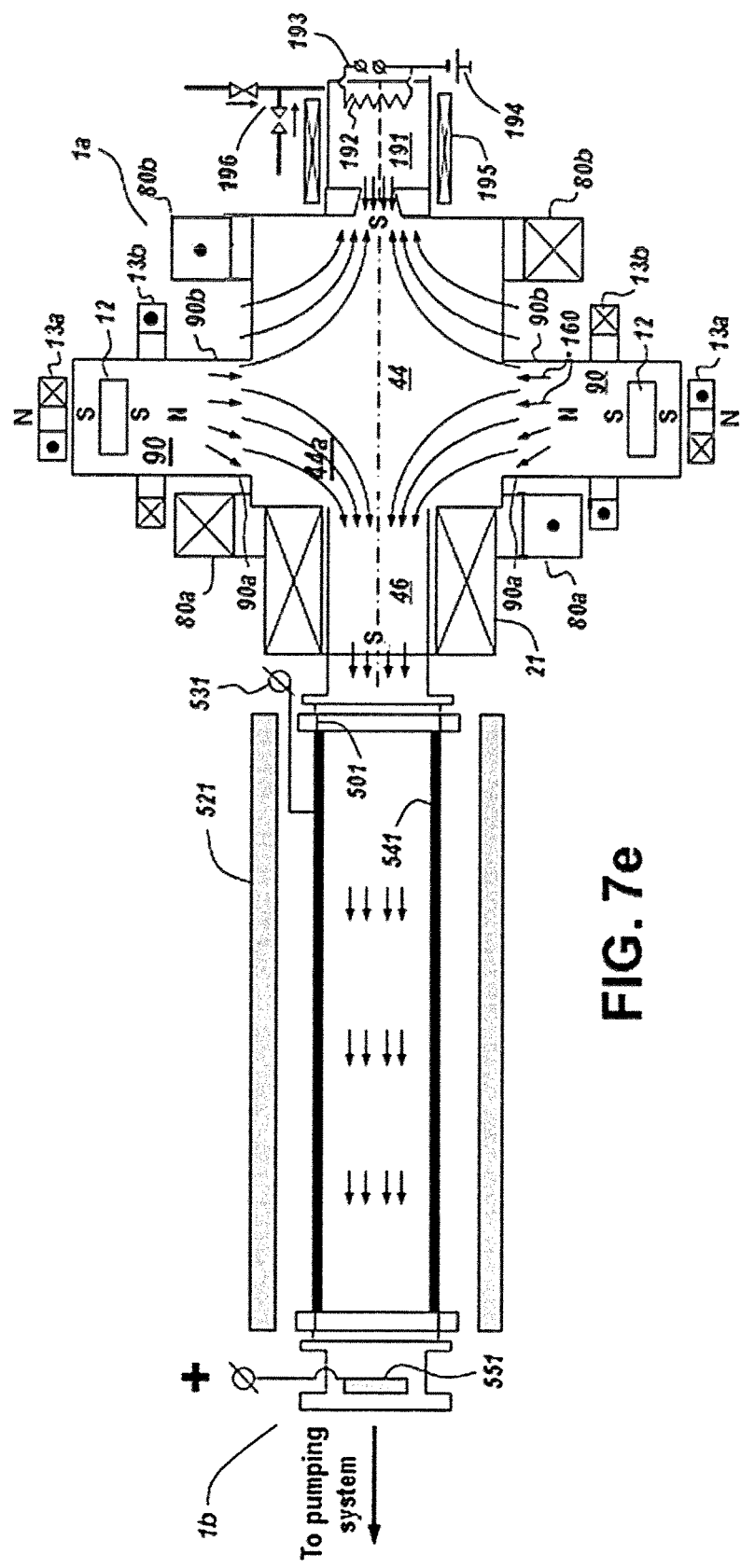
FIGS. 7e, 7f and 7g are schematic plan views of further embodiments of filtered cathodic arc apparatuses for coating and plasma treatment of internal surfaces of long tubular objects.

A still further variation of the embodiment of the filtered cathodic arc deposition method and apparatus of present invention dedicated for coating of internal surface of long tubular objects such as long metal tubes is shown in FIG. 7e. In this embodiment the substrate such as a long metal tube 541 is installed between (a) a tubular plasma generator 104, such as the one shown in FIG. 7d comprising one or more vacuum arc cathodes 12 in cathode chamber 90 or thermionic filament cathodes (or hollow cathodes) 192 installed in tubular plasma generator 104, on one side of tube 541, and (b) distal anode 551 installed in an anode chamber 106 on the other side of tube 541. Tubular plasma generator 104 includes one or more vacuum arc cathodes 12 in respective cathode chambers 90, and/or one or more thermionic filament cathodes (or hollow cathodes) 192. Tubular plasma generator 104 may be similar to the one shown in FIG. 7d, or be a variation of any one of the filtered cathodic arc sources shown in FIGS. 6a, 6b, 7a. Tube 541 is separated from tubular plasma generator 104 and anode chamber 106 by insulation spacers 501. The tubular solenoid 521 is optionally provided to generate a longitudinal magnetic field along the tube 541. The high negative voltage, in reference to the primary cathodes in the cathode chambers 90 and/or the cathode chamber associated with cathode 192, is provided to the tube 541 via terminal 531 connected to the negative pole of the high voltage power supply (not shown). In operation of the system shown in FIG. 7e the arc plasma is generated along the tube 541 between the cathodes installed in tubular plasma generator 104 and the anode 551 installed in anode chamber 106. The reactive gas such as methane, acetylene, silane, borazine, trimethylboron (TMB), trimethylsilane (TMS) metalorganic precursors or the mixture of reactive gases with argon is provided into the tube and high voltage pulses are applied to the tube via negative pole 531. The longitudinal magnetic field can be applied by solenoid 521 to increase the density and activity of the arc plasma environment inside the tube 541. The amplitude of high voltage pulses are ranging from 100 volts to 100,000 volts. Alternatively the pulse arc discharge can be used to generate pulse arc plasma inside of the tube while negative high DC voltage is applied to the tube via terminal 531. In both cases the reactive species are decomposed and ionized in arc discharge plasma followed by deposition of different coatings such as diamond like carbon (DLC) coatings. Silicon coatings or ceramic coatings such as for example nitrides, oxides or carbides depending on reactive gas composition can be deposited on electrically biased internal surface of the tube.

Figure 7F:
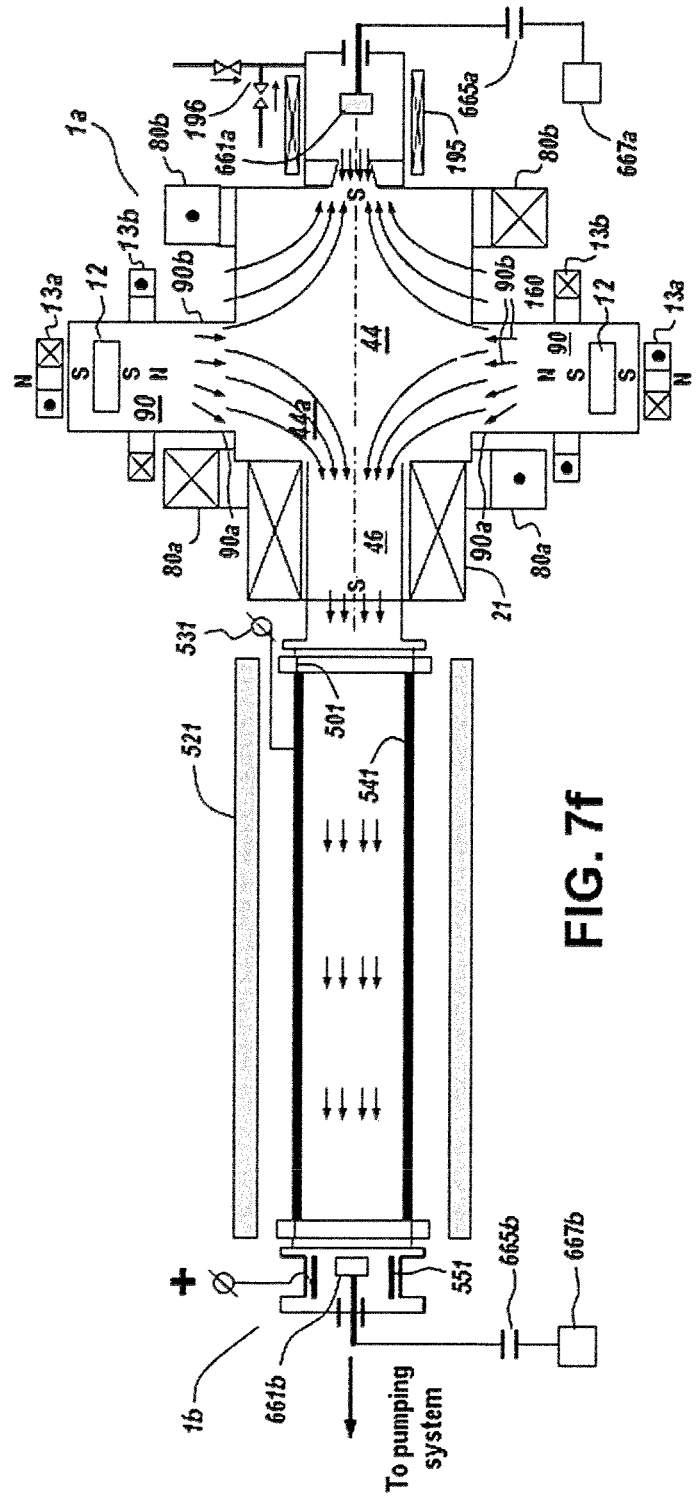
Figure 7G:
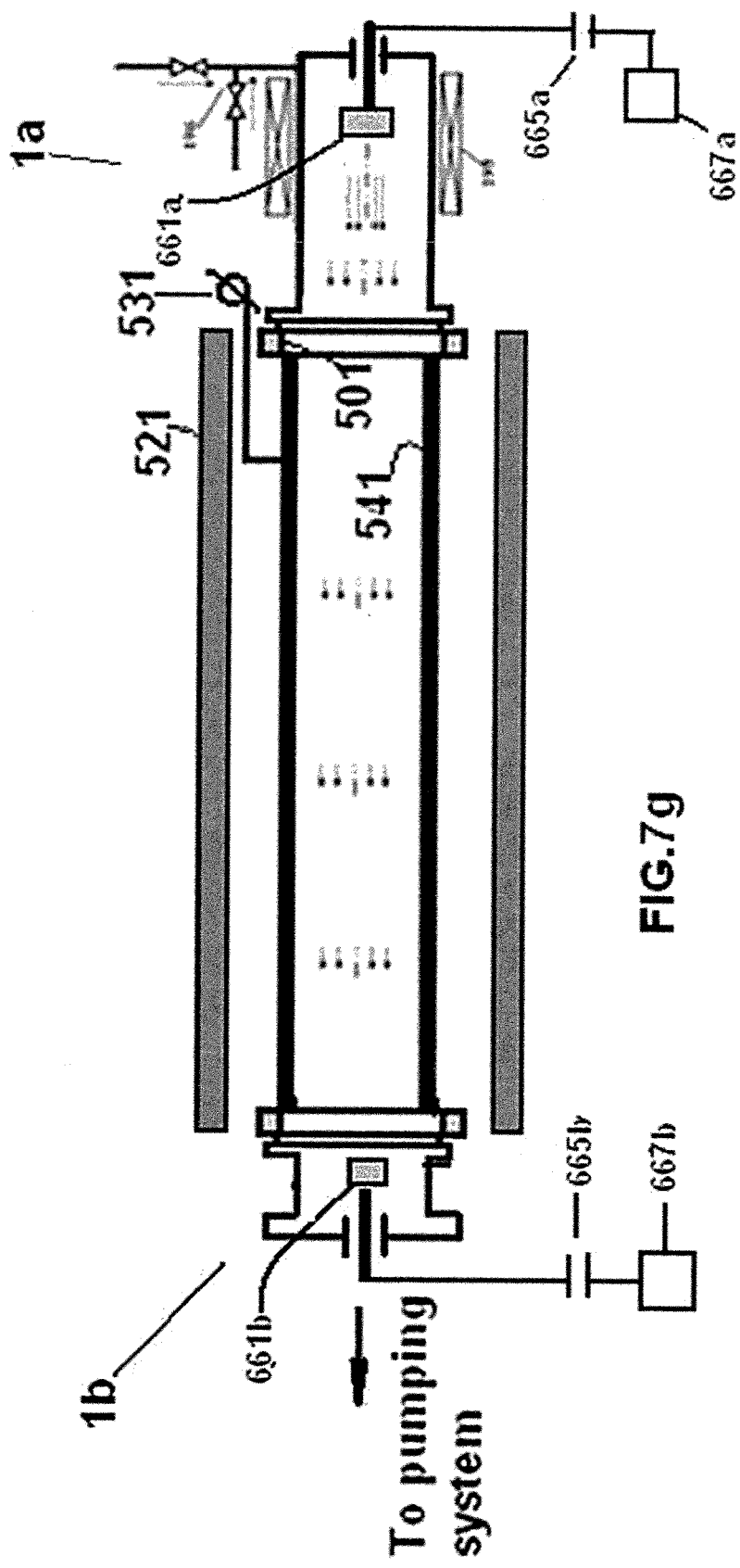

FIG. 7f illustrates a variation of the embodiment of filtered cathodic arc deposition method and apparatus of present invention shown in FIG. 7e in which the arc plasma generator is replaced with high frequency (HF) plasma generator. Two HF electrodes 661a and 661b are installed at two ends of the tubular object 541 which internal surface is subjected to the coating deposition process. The HF electrodes are connected to HF generators 667 via dividing capacitors 665. In this embodiment of the invention the filtered cathodic arc plasma generator including a tubular plasma generator 104 on one side of the tube and the anode 551 installed in a plasma generator chamber 106 on the other side of the tube are used to generate an arc plasma column inside of the tube. The pulsed HF discharge with frequency ranging from 100 kHz to 10 GHz and preferably from 1 MHz to 3 GHz, is used for enhancing the plasma density inside the long tube 541. The HF generators 667 can be synchronized by using a common modulator which allows controlling the pulses of HF power generated by the generators 667 from 1 µs to 10 ms. The HF generators can generate a plasma column inside the long tube even without arc plasma discharge as illustrated in FIG. 7g. The high voltage bias pulses are applied to the tube 541 via negative pole 531. In refinement the positive pulses can be also applied to the tube 541 via terminal 531 for electron bombardment of the internal surface of the tube 541.

In operation of the embodiment of filtered cathodic arc deposition method and apparatus of present invention shown in FIG. 7g for deposition of diamond-like carbon (DLC) coating, during the first, ion cleaning step, the argon as a plasma creating gas is injected along the tube to reach the operating pressure ranging from 0.1 mtorr to 100 mtorr. The high voltage high frequency pulses generated by the HF generators 667 are applied to HF electrodes 661 to generate the plasma column along the tube 541. The DC voltage ranging from 100 volts to 5000 volts is applied to the tube 541 by DC bias power supply (not shown), to accelerate argon ions and provide ion sputtering cleaning and conditioning of the internal surface the tube 541. This stage can last from 10 minutes to 2 hrs. During the second step the silane $SiH_4$ reactive gas-precursor is added to the argon with the partial pressure ranging from 0.001 to 0.5 of the total gas pressure. Silicon bondcoat is depositing on internal surface of the tube by attracting ionized fragments of silane molecules to the surface with ion energy ranging from 100 volts to 5000 volts. At the end of this stage the methane $CH_4$ gas-precursor can be added to the silane to for a gradient silicon carbide coating which is favorable to improve adhesion of the DLC topcoat layer. During the third step the mixture of argon with methane is used as a reactive gas atmosphere for deposition of DLC coating on internal surface of the tube 541.

Figure 7H:
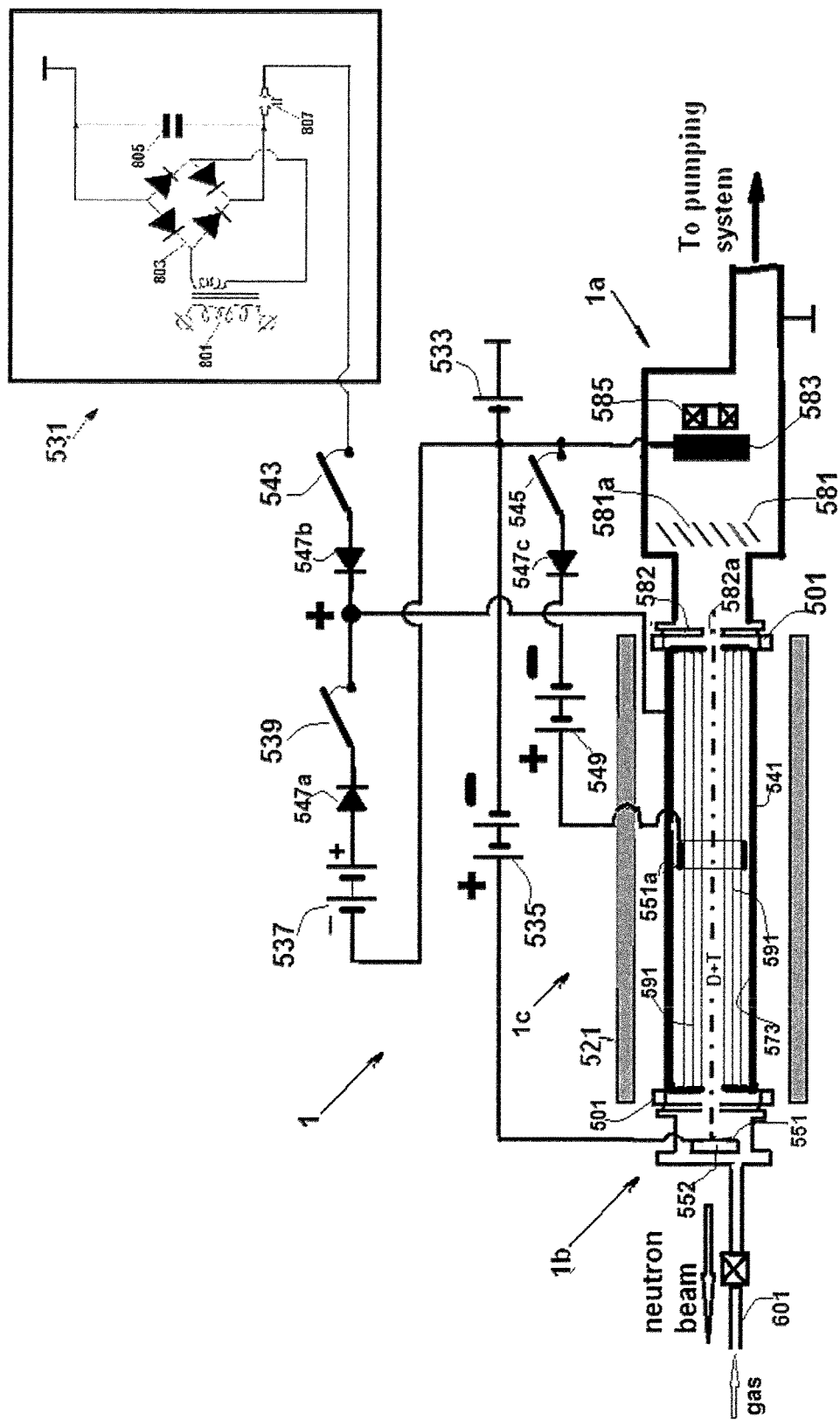
FIG. 7h is schematic plan view of one filtered cathodic arc apparatus for generation of energetic particles, utilizing an array of wire electrodes, in an embodiment.

FIG. 7h illustrates a variation of the embodiments of filtered cathodic arc method and apparatus of present invention shown in of FIGS. 7e-7g dedicated for generation of energetic particles with energies ranging from 100 eV to 10 MeV. In reference to FIG. 7h, a tubular plasma generator 100 comprises a cathode chamber 108 with attached pumping system, a remote anode chamber 106 and a tubular plasma duct 1c, surrounded by magnetic solenoid 521. The shielded cathodic arc source is installed within the cathode chamber 108 which can also serve as a primary anode to sustain the primary arc discharge between the cathode 583 and the walls of the cathode chamber 108 serving as a primary anode. It is appreciated that the primary anode can be installed within the cathode chamber 108 isolated from the walls of the cathode chamber 108. The primary anode can be grounded or connected to the positive pole of the primary arc power supply 533. The cathodic arc source positioned in cathode chamber 108 comprises a cathode target 583 and a steering coil 585 disposed immediately behind the target 583 for steering the cathodic arc spots on the front side of the target 583. It is appreciated that the primary cathodic arc source in the cathode chamber can be also chosen from thermionic cathode source, hollow cathode source or other high current low voltage cathodic arc sources. The shield 581 is optionally installed in front of the cathode 583 to isolate the cathode from the plasma duct 1c. The shield 581 in front of the cathode 583 should be impermeable for heavy particles such as ions and neutral particles, generated from the cathodic arc spots on the front evaporating surface of the cathode target 583, but it has openings 581a, which permit electrons, emitted from the cathodic arc spots to flow into the tubular plasma duct 1c and continue its way further toward distal anode 551 installed within the anode chamber 106 which is vacuum sealed by the flange 552a to sustain the remote arc discharge along the tubular plasma duct 1c. The shield 581 in a cathode chamber 108 can have a shape of chevron or simply have an array of holes about 1 mm to 5 cm in diameter as shown illustratively in FIG. 10c. An optional separating wall 582, with at least one small opening 582a having diameter ranging from 1 mm to 5 cm, allows maintaining a pressure difference between plasma duct 1c and cathode chamber 108. The gas pressure in tubular or rectangular plasma duct 1c may range from 300 mTorr to 100 Torr (and, in pulse mode, up to atmospheric pressure), while the pressure in cathode chamber 108 may be less than 200 mTorr to allow operation of the primary vacuum cathodic arc source. In this case, the electron current of the remote arc discharge is conducting from the low pressure area in the cathode chamber 108 toward the high pressure area in the plasma duct 1c via bottleneck orifice 582a against gas flow directed from the anode chamber 106 toward cathode chamber 108. The voltage of the primary arc discharge in cathode chamber 108 is typically ranging from 20 to 50 volts, while primary arc current is ranging from 50 amperes to 500 amperes. The primary cathodic arc discharge is unstable when its voltage is less than 20 volts and typically does not exceed 50 V. The primary arc is typically getting unstable when the arc current is less than 50 amperes, while primary arc current exceeding 500 amperes will require unnecessary high consuming rate of the target which is not necessary for sustaining the primary cathodic arc discharge. It is appreciated that instead of the cathodic arc discharge with metal evaporating target the thermionic or hollow cathode arc discharge can be used. The remote arc discharge in the tubular plasma duct 1c is sustained by the electron current emitted from the primary arc discharge in the cathode chamber similar to one shown above in FIGS. 4e,f and 7e. The remote arc current and voltage are typically ranging from 50 to 10,000 amperes and from 30 to 500 volts respectively. The remote arc discharge current less than 50 amperes is not producing dense enough plasma for generating energetic particles while remote arc current exceeding 10000 amperes may trigger formation of anode spots within the plasma duct 1c, anode chamber 106 and cathode chamber 108 which will result in damage of reactor's components and extinguishing the discharge. The remote arc discharge is unstable when the discharge voltage is outside of the range within 30V<V (remote arc discharge)<500V.

The tubular plasma duct 1c comprises the discharge tube 541 surrounded by magnetic solenoid 521. The discharge tube 541 is electrically insulated both from the cathode chamber 108 and from the anode chamber 106 by the insulators 501. In this embodiment of the invention, the discharge tube 541 is charged positively in reference to the primary cathode 583 in the cathode chamber 108 by connecting discharge tube 541 either to the positive terminal of the DC power supply 537 or to the unipolar pulse power supply 531 or both, while the negative terminals of the DC power supplies 537 and the pulse power supply 531 are connected to the primary cathode 583 in the cathode chamber 108. The unipolar pulse power supply 531, which is shown schematically in FIG. 7h, has an example, comprises the transformer 801, the rectifier 803 and the capacitor 805. When the switch 543 is closed the trigger 807 discharges the capacitor 805, generating the unipolar positive voltage pulses applied to the discharge tube 541 and the pulse arc current is conducting via remote arc discharge between the discharge tube 541 and the primary cathode 583. In a DC arc discharge mode, when the switch 543 is open and switch 539 is closed the secondary arc discharge is powered by the DC power supply 537 between the discharge tube 541 as a secondary anode and the primary cathode 583 in the cathode chamber 108.

Optionally, at least an additional intermediate anode 551a may be installed within the discharge tube 541 of the tubular plasma duct 1c, which may help extend the remote arc discharge in longer embodiments of tubular plasma duct 1c by effectively increasing the length of the remote arc discharge along the discharge tube 541 between the cathode 583 in the cathode chamber 108 and the remote anode 551 in the anode chamber 106. In a refinement, the igniting RF electrodes (not shown) may be also provided along the discharge tube 541 for triggering the remote arc discharge within long discharge tube 541. The blocking diodes 547 prevent the interference between power supplies 537, 531 and 549 in the discharge mode when all of these power supplies are operating simultaneously and switches 539, 543 and 545 are closed.

In a refinement, an array of thin wire anodes 591 is installed along the discharge tube 541 of the tubular plasma duct 1c. The wire anodes 591 can be a straight wires parallel to the axes of the plasma duct 1c or have different shape such as helical or mesh cylinder coaxial to the plasma duct 1c. The wire anode array 591 can be connected to the discharge tube 541 as shown in FIG. 7h or, optionally, to the positive terminal of additional power supply. The wire anode array may be also connected to the unipolar pulse power supply 531 as illustrated in FIG. 7h. As shown illustratively in the cross-sectional view in FIG. 7i, the wire anode array 591 is disposed within the area 595 adjacent to the wall of the discharge tube 541 coaxially to the discharge tube 541 between the inner circle of the diameter d and the discharge tube of the diameter D, leaving the inner area 597 of the diameter d surrounding the axes of the discharge tube 541 unoccupied.

In operation, the primary arc discharge is established within the cathode chamber 108 between the primary cathode 583 and the grounded walls of the cathode chamber 108 powered by the primary arc power supply 533. Then the remote arc discharge is ignited along the discharge tube 541 of the tubular plasma duct 1c between the primary cathode 583 in the cathode chamber 108 and the remote anode 551 in the anode chamber 106, powered by the remote arc power supply 535. Initially, the switch 543 is opened, the switch 539 is closed and the walls of the discharge tube 541 together with attached array of the wire electrodes 591 are energized by the DC power supply 537 serving as intermediate remote anode. Optionally, the additional intermediate remote anode 551a is also energized by the additional DC power supply 549, when the switch 545 is closed. During this stationary remote arc discharge mode the plasma potential within the discharge tube is defined by the positive voltage applied to the discharge tube by the DC power supply 535, typically ranging from 30 to 500 volts. When the switch 543 is closed and high positive voltage pulses are applied to the discharge tube 541 together with the array of wire anodes 591, the plasma potential within the area 595, occupied by the array of the wire anodes 591, increases up to the amplitude of the positive pulses supplied by the pulse power supply 531. At the same time, within the inner zone 597, the plasma potential remains low as defined by the remote arc plasma column. This distribution of the plasma potential across the discharge tube 541 is illustrated graphically in FIG. 7j. In the example shown in FIG. 7j the plasma potential within the high voltage zone 595 reaches 1.5 kV as applied by the pulse power supply 531, while the plasma potential within the low voltage inner zone 597 remains approximately +100 V as defined by the plasma potential of the remote arc discharge plasma. The voltage amplitude of the positive high voltage pulses generated by the pulse power supply 531 typically ranges from 0.1 kV to 10 MV. The pulse voltage amplitude below 0.1 kV does not produce ions with necessary high energy while producing unipolar pulses with voltage amplitude exceeding 10 MV is impractical due to complexity of pulse power generator and insulation of the reactor's components. In a refinement the remote arc low voltage high current potential can be applied to the discharge tube 541 only while the high voltage pulses are applied to both discharge tube 541 and wire electrodes array 591 which may protect the wire electrodes against overheating during the remote arc discharge mode. The current of the remote arc discharge is typically ranging from 50 A to 500 A, but may be increased up to 10 kA.

Figure 7I:
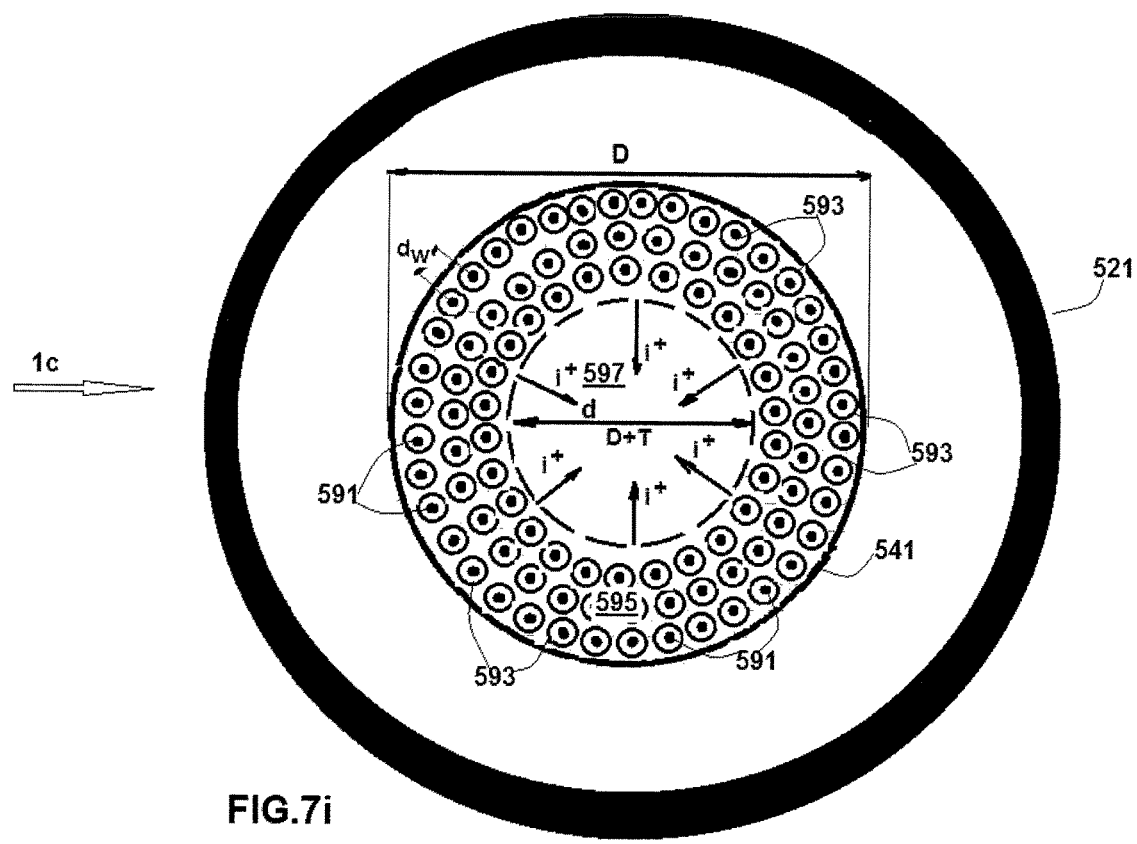
FIGS. 7i and 7j show cross sectional view of the apparatus of FIG. 7h and distribution of plasma potential across the discharge tube.
Figure 7J:
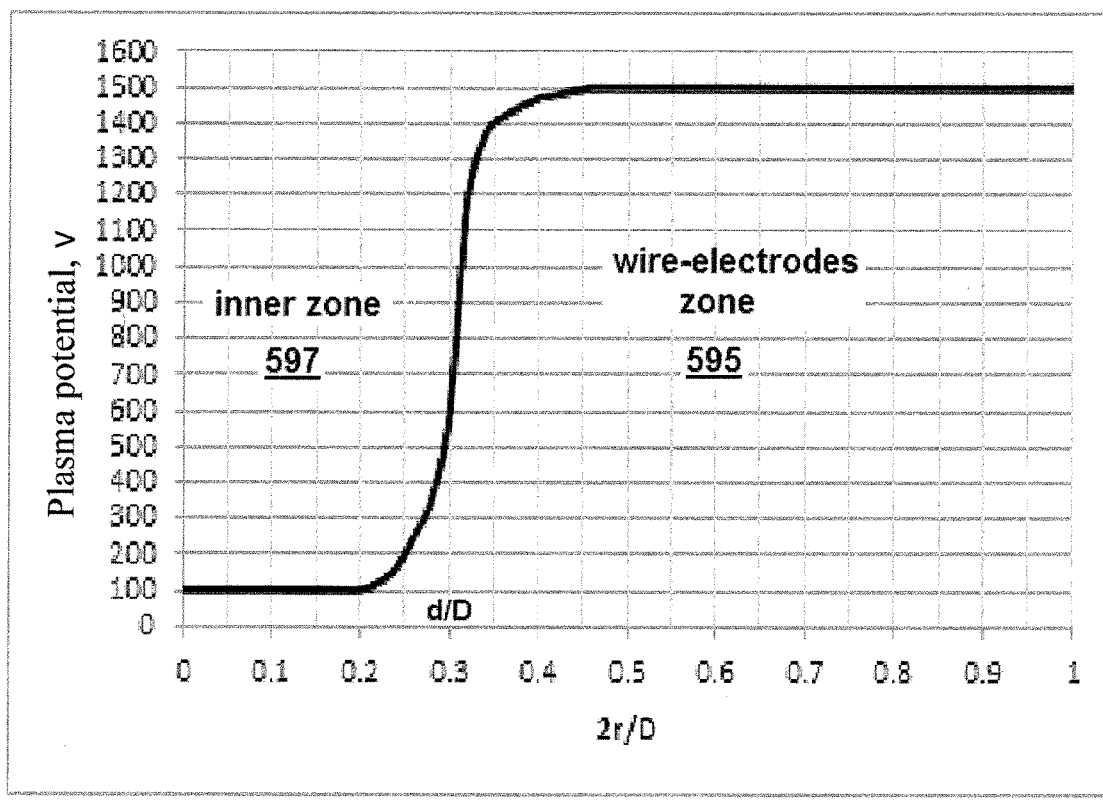

When the high voltage positive pulses are applied to the wire electrodes 591 immersed in the remote arc plasma, the plasma sheaths are created around each of the wire electrodes as illustrated by the circles surrounding the wire electrodes 591 in FIG. 7i. The value of the plasma potential within the plasma sheath areas surrounding the wire electrodes 591 is almost equal to the high voltage potential applied to the wire electrode by the pulse power supply 531. When the distance between neighboring wire electrodes 591 in a wire electrode array is decreasing to the length comparable to the plasma sheath thickness, the plasma sheath areas surrounding the wire electrodes 591 overlap providing continuous uniform distribution of the high positive plasma potential within high voltage zone 595 adjacent to the discharge tube 541 as illustrated graphically in FIG. 7j. The diameter of the wire electrodes 591 is typically ranging from 0.01 mm to 1 mm. A wire electrode 591 diameter less than 0.01 mm may not be practical due to mechanical strength, whilst the wire electrodes 591 having diameters greater than 1 mm may capture high fluxes of electrons influencing plasma properties in the wire electrodes array zone 595. The distance $d_w$ between the neighboring wire electrodes 591 in the wire electrode array is typically ranging from 0.1 mm to 5 cm while the operating pressures of the remote arc discharge plasma are ranging from 0.001 mtorr to 100 torr. Distances between the wire electrodes less than 0.1 mm are not practical and will inflict large ion losses due to collisions of high energy ions with wire electrodes. When the distances between the neighboring wire electrodes exceed 5 cm it will require to apply more than 1 MV voltage for overlapping the plasma sheaths between the neighboring wire electrodes, which in most cases will be impractical. The preferable range of the distances between the wire electrodes 591 is from 1 mm to 1 cm. Keeping such distances between the neighboring wire electrodes 591 allows overlapping the plasma sheath areas between the wire electrodes 591 overlap at high voltage discharge mode providing uniform distribution of high positive plasma potential in the area 595 occupied by the wire electrode array 591. At the same time, distances between the neighboring wire electrodes 591 exceeding 0.1 mm are greater than the plasma sheath length surrounding the positively charged wire electrodes 591 during the remote arc discharge plasma mode. This allows the remote arc discharge plasma to expand from the central area 597 toward the walls of the discharge tube 541 providing uniform distribution of the plasma density across the discharge tube 541 during the period of time between high voltage impulses generating by the high voltage power supply 531 when the discharge tube 541 and wire electrodes 591 serve as an intermediate anode for the remote arc discharge. When the high plasma potential is established within the area occupied by the array of wire anodes 591, the positive ions from the high voltage zone 595 are accelerating toward the low voltage inner zone 597 surrounding the axes of the discharge tube 541, reaching the high kinetic energy at the level of the plasma potential within the high voltage zone 595, defined by the high positive voltage pulses generating by the pulse power supply 531. High energy ions are colliding within the low potential inner zone 597 releasing their kinetic energy in the collisions.

When the discharge gas is deuterium (D) or deuterium-tritium (D-T) mixture the fusion reactions occur by collisions of energetic ions within the inner zone 597 of the discharge tube 541, generating the high flux of energetic neutrons. 14.1 MeV neutrons are generating by D-T fusion reactions. In this case the plasma generator of this invention can serve as a thermonuclear fusion reactor to produce energy.

The gas pressure within plasma discharge tube 541 in operation is typically ranging from 0.001 mtorr to 100 torr, but more preferably within the range from 0.01 mtorr to 30 torr. When the pressure is less than 0.001 mtorr the process is ineffective due to low density of the reactive species in the reactor. When the pressure exceeds 100 torr it creates too high energy losses of high energy ions by collisions of high energy ions generated within high voltage zone 595 with gas molecules, which reduces the energies of high energy ions reaching the central zone 597 of the reactor. To improve confinement of the remote arc plasma and accelerated ions, the external longitudinal magnetic field generated by the solenoid 521 is applied along the axes of the discharge tube 541, the magnitude of said magnetic field can be chosen to satisfy the following condition: $r_{ge} < d_w < r_{gi}$, where $r_{ge}$ and $r_{gi}$ are gyroradiuses of electrons and ions respectively. The plasma confining magnetic field is typically ranging from 0.01 T to 20 T. Magnetic field less than 0.01 T is inefficient for plasma confinement while magnetic field exceeding 20 T is impractical due to complexity of magnetic system and weight of the coil 521.

In a FIG. 7h the plasma generator is configured as a neutron generator proving the neutron reflecting cladding covering the inner side of the plasma discharge tube 541 walls 573 and the hollow remote anode 551 with the opening 552 for release of the neutron beam. The neutron reflecting cladding can be made of light materials such as graphite or beryllium or, alternatively, from heavy materials such as tungsten. The plasma generator shown in FIG. 7h can be also used as an ion laser discharge tube as illustrated in FIG. 7y. In this case the laser mirrors 652a and 652b are installed at the opposite ends of the plasma duct 1c along the axes of the cascade discharge tube 541. The powerful laser beam may be generated in Ar or Kr plasma utilizing the energy of ion collisions within low potential central discharge zone 597 (shown in FIG. 7i). In this case the cathode chamber 108 with attached pumping system is installed to the side wall of the discharge tube perpendicular to the axes of the plasma duct 1c to prevent obstruction to alignment of laser optics Other applications of this plasma generator can be in the field of plasma chemical synthesis of nanomaterials and in aerospace propulsion. In this case the high energy particles generator shown in FIG. 7h can be used as plasma thruster utilizing heavy ions such as Kr or Xe accelerated to high speed within the central core area 597 and escaping throughout the hole or, optionally a nozzle-like structure replacing the vacuum seal flange 552a at the end of the anode chamber 106. It is appreciated that other primary plasma sources can be used to provide a primary plasma environment within discharge tube 541 prior to applying high voltage positive pulses the tube's wall 541 and to the wire electrodes 591. For instance, Electron Cyclotron Resonance (ECR) source, inductively coupled plasma (ICP) source or helicon wave source can be also used instead of arc plasma source in the cathode chamber 108.

Figure 7K:
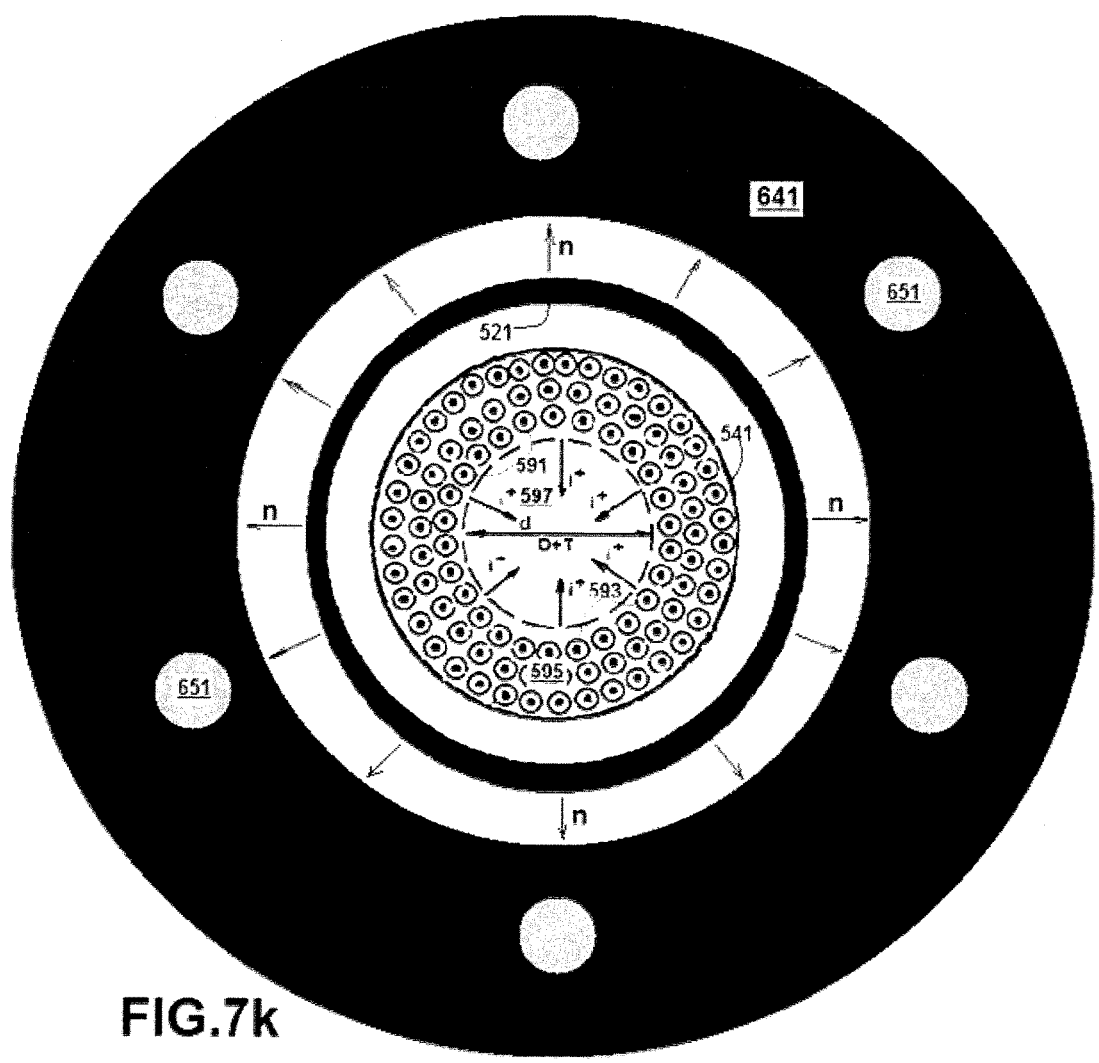
FIG. 7k shows cross-sectional view of an apparatus for generation of energetic particles for the hybrid fusion-fission reactor, in an embodiment.

FIG. 7k illustrates, in cross-sectional view, one exemplary hybrid reactor utilizing a cylindrical neutron generator that may be used as a source of neutrons for hybrid fusion-fission reactors to improve nuclear fuel cycles of such hybrid fusion-fission reactors. The hybrid reactor of FIG. 7k is another preferred embodiment of the neutron generator of FIG. 7h. The neutron generator of FIG. 7k includes vacuum-sealed plasma duct 1c (shown in FIG. 7h), a graphite block 641, and optionally coaxial magnetic confinement coil 521 positioned within graphite block 641. Graphite block 641 serves as a neutron moderator with fission nuclear fuel rods, containing, for example $U^{235}O_2$, inserted within nuclear fuel channels 651. The neutrons generated by the neutron generator are propagating from the central area 597 of the fusion neutron generator toward the graphite block 641 (shown by radial arrows in FIG. 7k) where their speed is slowing down to the thermal neutron energy level required for activating the fission nuclear fuel.

Figure 7L:
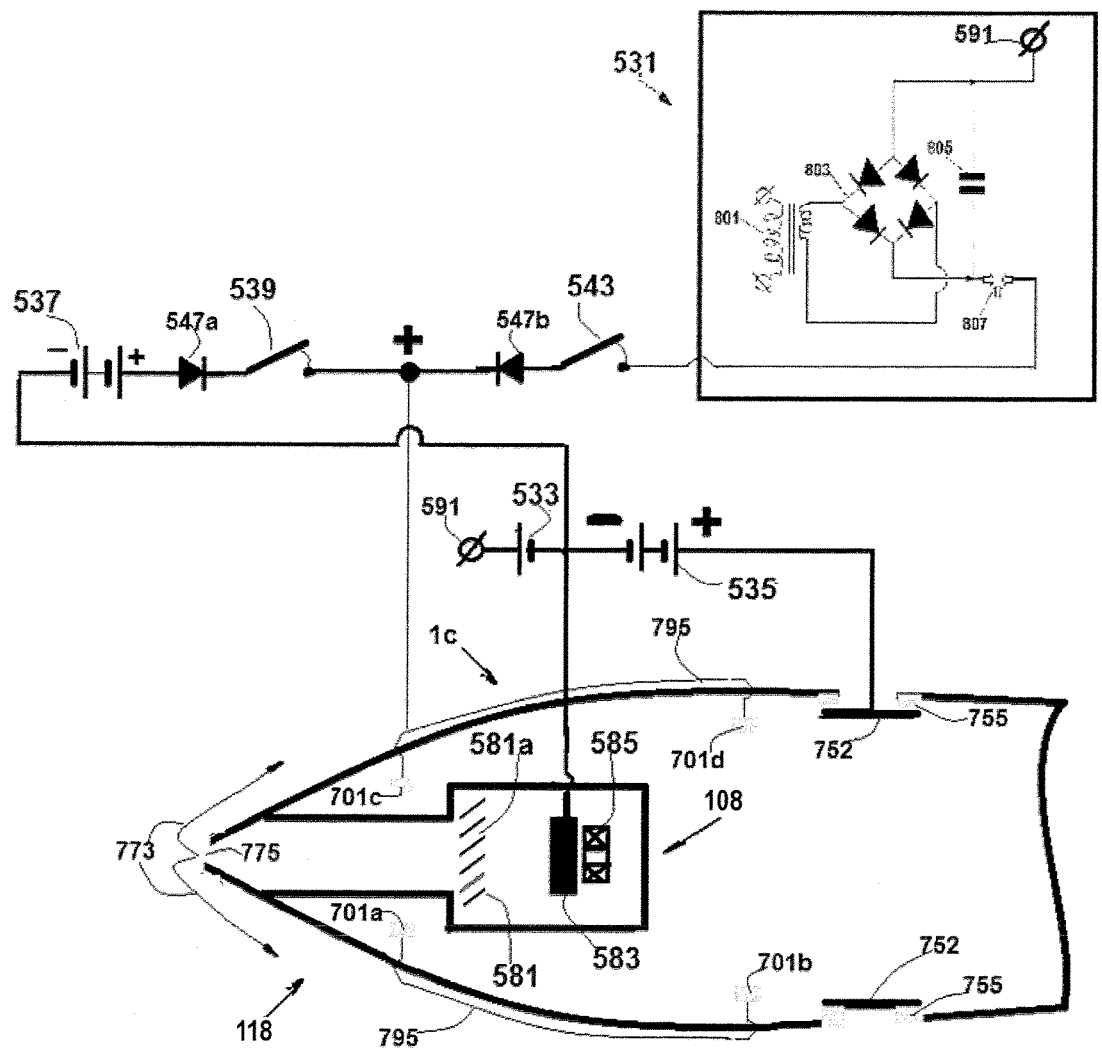
FIG. 7L shows cross-sectional view of an apparatus for generation of energetic particles for drug reduction of hypersonic vehicle, in an embodiment.

Another application of the remote arc discharge plasma as shown by example in FIG. 7h includes generation of plasma cloud surrounding outer surfaces of aerospace vehicles, wherein the plasma generator operates as plasma actuator to control airflow around the vehicle. FIG. 7L shows, in cross-sectional view, one exemplary embodiment of filtered cathodic arc method and apparatus of present invention for application of the process of generation of energetic particles for drag reduction of a hypersonic vehicle 118. In reference to FIG. 7L, cathode chamber 108 is positioned immediately behind an opening 775 in the stagnation area at the front end of the body of a hypersonic vehicle. The cathode chamber 108 is optionally provided with a pumping system as shown in FIG. 7h, which allows for maintaining low pressure (for example below 200 mTorr) in cathode chamber 108, while the pressure in the outside air flow around the vehicle may range from 1 Torr to 1 atm. A remote arc plasma 773 is generated between cathode 583, in cathode chamber 108, and a remote anode 752 installed downstream of opening 775. Remote anode 752 is insulated from the vehicle body by insulation spacers 755. Remote arc discharge plasma stream 773 propagates from cathode 583 in cathode chamber 108 to remote anode 752 via small opening 775, optionally provided with a nozzle. Thus, remote arc discharge plasma stream 773 effectively envelopes the front portion of the body of vehicle 118 resulting in drag reduction of hypersonic vehicle flying in an environment where the atmospheric pressure may range from 1 torr to 1 atm. The plasma cloud formed by remote arc discharge plasma stream 773 and surrounding at least a portion of the body of the vehicle may also reduce the radar cross-section of the vehicle. In case of a high altitude spacecraft, the remote plasma cloud generated by remote arc discharge 773 may be used to control charging and suppression of arcing on the outer surface of the high altitude spacecraft by neutralizing the surface charge. To enhance this effect, an array of wire anodes 795 may be positioned between opening 775 and remote anode 752. Wire anodes 795 are isolated from the spacecraft body by isolation spacers 701 and may be also used to generate high energetic particles for neutralizing the charge of the spacecraft body.

Figure 7M:
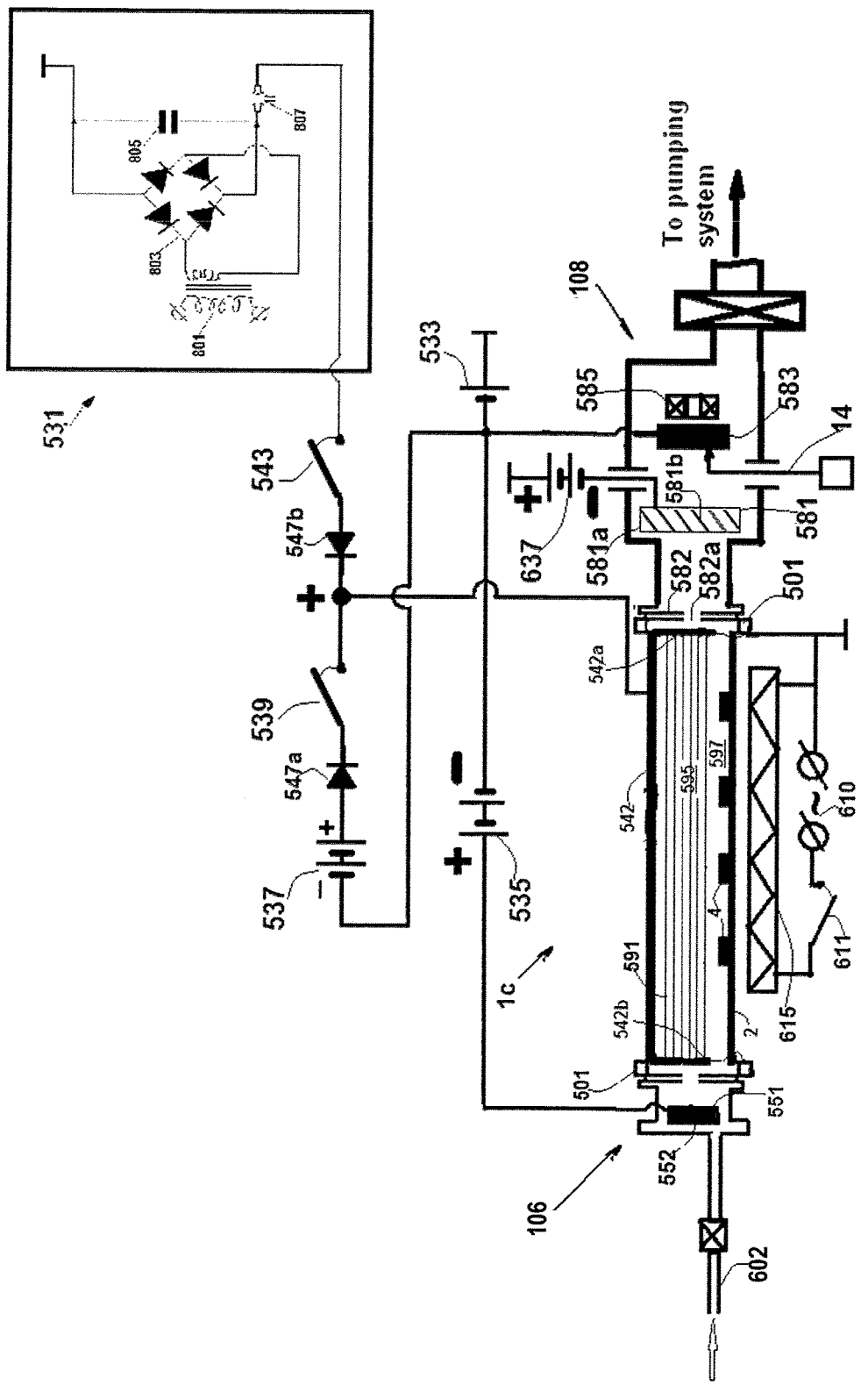
FIG. 7m shows cross-sectional view of an apparatus for generation of energetic particles in coating deposition reactor, utilizing an array of wire electrodes in the reactor chamber, in an embodiment.

The process of generating high energy particles, as discussed above in reference to FIGS. 7h-7j, may be applied for deposition of various coatings and production of nanopowder by means of plasma-chemical synthesis activated by the energetic particles. FIG. 7m shows cross-sectional view of one embodiment of filtered cathodic arc method and apparatus for generation of energetic particles in coating deposition reactor for deposition of diamond coatings, as an improvement of the arc assisted CVD coating method and apparatus taught by U.S. Pat. Nos. 5,478,608 and 5,587,207 to Gorokhovsky, which are incorporated by reference. In reference to FIG. 7m, the plasma-chemical reactor 1c comprises the rectangular substrate chamber with substrates 4 to be coated positioned at the grounded bottom wall 2 of the reactor chamber 1c while the top wall 542 is connected to the secondary arc power supply 537 and the unipolar pulse power supply 531. The array of wire anodes 591 is installed along the reactor chamber connected to the top wall 542 by the side walls 542a, on side of the cathode chamber 108, and 542b on side of the remote anode chamber 106. The array of wire anodes 591 occupies the high voltage upper area 595 of the reactor chamber adjacent to the top wall 542, while the remote arc discharge is established within the low voltage area 597 between the array of the wire anodes 591 and the bottom wall 2 of the reactor 1c. For the synthesis of diamond coatings from the argon-methane-hydrogen reactive gas mixture, the bottom wall 2 of the reactor 1c may be heated by the heater 615. Heater 615 is powered by AC current connected via terminals 610, when the switch 611 is closed, to maintain a necessary temperature for synthesis of diamond coatings, which is typically ranging from 300 to 1050 deg C. When the substrate temperature Ts<300 deg C., the non-diamond phase will be predominantly nucleating. Substrate temperatures exceeding 1050 deg C. overheat and destroy both the substrate and the diamond coating. Ion bombardment of the substrates 4 to be coated by the energetic ions generated in the high plasma potential area 595 during the process of synthesis of the diamond coating may improve coating structure and morphology and allow deposition of nanocrystalline films at reduced reaction pressures and substrate temperatures.

The reactive gas is supplied via gas supply line 602 connected to anode chamber 106, while the pumping port is connected to cathode chamber 108. Cathode chamber 108 is separated from the plasma duct-reactor chamber 1c by baffle (separating wall) 582 with small orifice 582a, which allows maintaining large pressure drop between reactor chamber 1c and cathode chamber 108. The pressure within cathode chamber 108 is typically less than 200 mTorr and preferably less than 100 mTorr as required for operation of the vacuum arc discharge, while the pressure within reactor chamber 1c is typically greater than 300 mTorr and preferable greater than 0.5 Torr for deposition of polycrystalline diamond CVD coatings. The diameter of orifice 582a is typically in the range from 1 mm to 5 cm. When the diameter of the orifice 582a is less than 1 mm it can disconnect the electron current emitted by the cathode target 583, hence extinguish the remote arc, whilst a diameter of the orifice 582a greater than 5 cm requires too high flow rate of process gas to maintain a necessary higher pressure within the plasma duct-reactor chamber 1c. When the remote arc discharge is transmitted through small orifice 582a, the current density within the orifice 582a increases by orders of magnitude resulting in increase of electron density and electron temperature followed by increase of decomposition, ionization and excitation of reaction species, such as nascent hydrogen, excited molecular hydrogen and hydro-carbon radicals. This increases the coating deposition rate and improves the coating microstructure and morphology. In this design, the electron current of the remote arc discharge emitted by cathode target 583 in cathode chamber 108 is directed from the lower pressure environment of cathode chamber 108 toward the higher pressure environment of coating chamber 1c via small orifice 582a. The electron current density across the orifice 582a is typically in the range from 1 A/cm$^2$ to 1E6 A/cm$^2$. A current density below 1 A/cm$^2$ is too small for substantially increasing the pressure gradient across the opening 582a by the friction of electrons against gas flow, while a current density exceeding 1E6 A/cm$^2$ may overheat and melt the nozzle. On the other hand, the electron current density of the remote arc discharge across the plasma duct is typically in the range from 1 mA/cm$^2$ to 1000 A/cm$^2$. A current density of the remote arc across the plasma duct below 1 mA/cm$^2$ is too small for activation, dissociation and ionization of the reactive gases in coating deposition process, while a current density exceeding 1000 A/cm² may create plasma instabilities which will be detrimental to the uniformity of plasma density distribution across the plasma duct resulting in non-uniformity of coating distribution for substrates 2 to be coated positioned at different locations across the substrate holder 4 within the plasma duct.

Figure 7N:
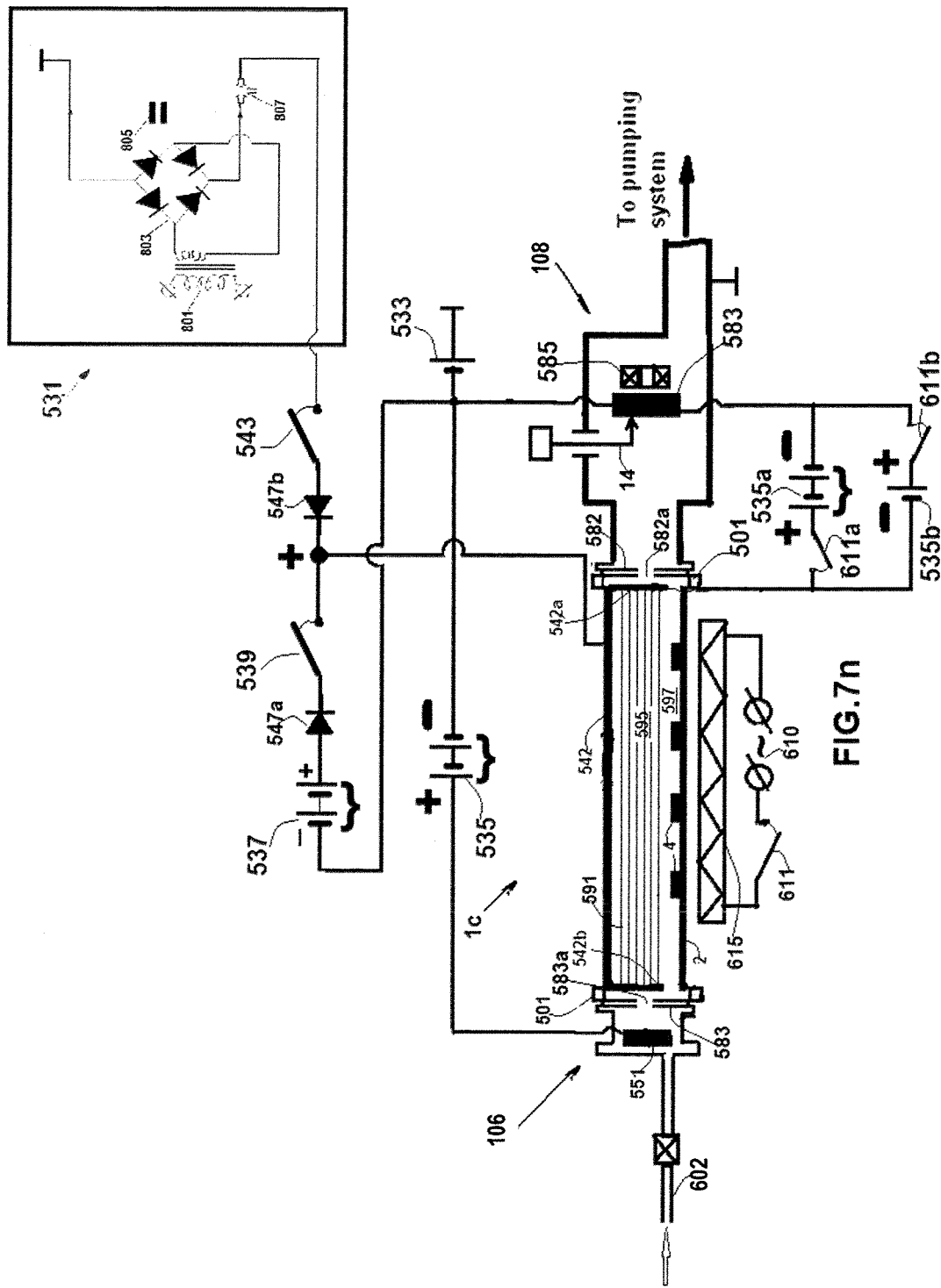
FIG. 7n shows a variation of cross-sectional view of the apparatus for generation of energetic particles in coating deposition reactor of FIG. 7m, utilizing electrically biased substrate holder, in an embodiment.

Optionally, substrate holder 2 with substrates to be coated 4 is positively or negatively biased in reference to cathode 583 in cathode chamber 108 as illustrated in FIG. 7n. In this design, the positive pole of a remote anode arc power supply 535a is connected to substrate holder 2 via a switch 611a, while its negative pole is connected to cathode 583 in cathode chamber 108. In a parallel circuit, the negative pole of a bias power supply 535b is connected to substrate holder 2 via a switch 611b, while its positive pole is connected to cathode 583 or grounded. The primary vacuum arc discharge is initiated on the evaporation surface of cathode target 583 by electro-mechanical igniter 14. During diamond coating deposition process, substrate holder 2 may be consequently biased either positively or negatively resulting in laminating multilayer morphology and microstructure of the depositing coatings.

Figure 7O:
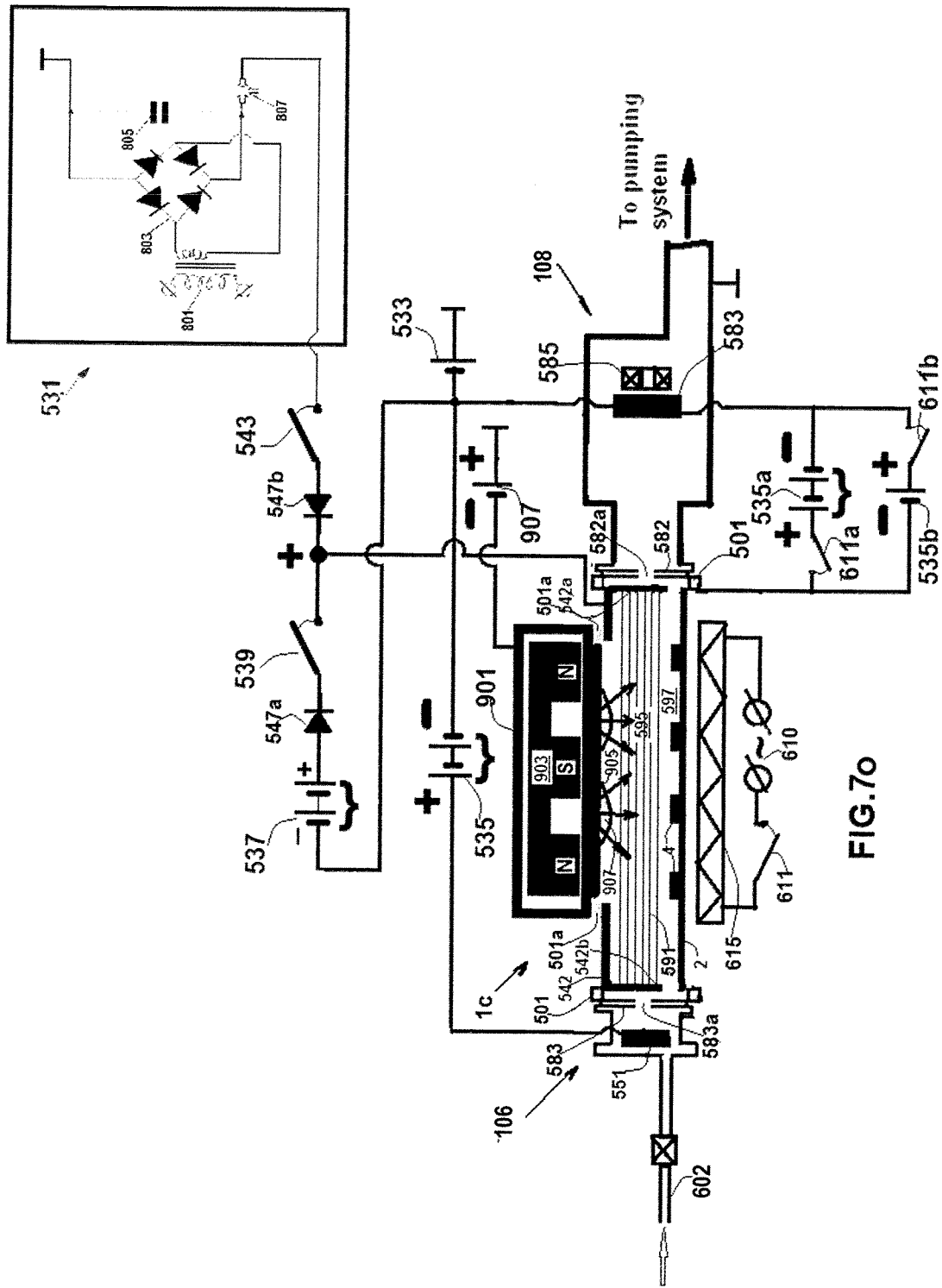
FIG. 7o shows a variation of cross-sectional view of the apparatus for generation of energetic particles in coating deposition reactor of FIG. 7n, utilizing magnetron sputtering source, in an embodiment.

FIG. 7o illustrates one exemplary filtered cathodic arc apparatus for deposition of diamond coatings or other metal-ceramic coatings, which is a variation of the apparatus of FIGS. 7m, 7n further including a magnetron sputtering source 901 on wall 542 of either rectangular or circular tubular plasma duct 1c opposite to the wall occupied by substrate holder 2 with substrates to be coated 4. The magnetron sputtering source 901 includes a magnetic yoke 903 with a set of permanent magnets to create the arch-shaped magnetic field configuration that confines a magnetron discharge area 907 above the sputtering surface of a magnetron target 905 sitting on top of the magnetic poles and facing substrates to be coated 4. The magnetron sputtering occurs within high density plasma discharge area 907 in between the magnetic poles immediately above a magnetron sputtering target 905. Magnetron sputtering source 901 is electrically isolated from plasma duct 1c by ceramic insulators 501a. In operation, when switch 539 is closed and switch 543 is open, the array of anodic wire electrodes 591 serve as a stationary auxiliary anode in reference to cathode 583 in cathode chamber 108, thereby supporting a stationary auxiliary arc discharge between electrode array 591 and cathode 583. This stationary auxiliary arc discharge results in an increase of plasma density and plasma potential in the magnetron sputtering discharge area near magnetron target 905 and thus increases ionization and activation of metal sputtering flow generated by target 905. When switch 539 is opened and switch 543 is closed, the large positive pulse bias is applied to the array of wire electrodes 591, further increasing ionization and activation of metal sputtering flow generated at target 905. When both switches 539 and 543 are closed, the stationary remote anode potential, generated by power supply 537 in combination with high positive pulses generating by pulse power generator 531, are applied to the anode grid formed by the array of anode wires 591, creating dense plasma contiguous upon sputtering target 905.

Figure 7P:
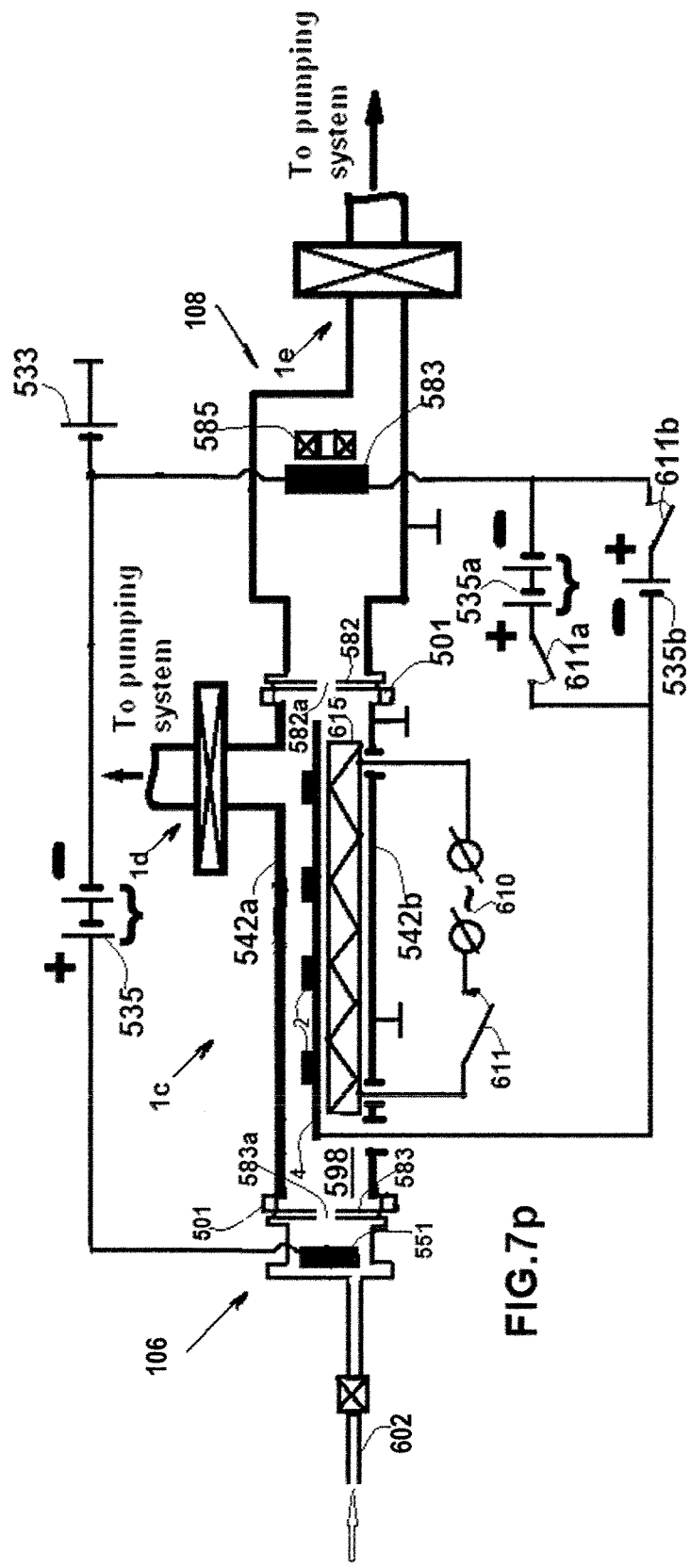
FIG. 7p shows a variation cross-sectional view of the apparatus for generation of energetic particles in coating deposition reactor of FIG. 7n with additional pumping port connected to the coating chamber, in an embodiment.

FIG. 7p illustrates another variation of the design of remote arc plasma enhanced diamond coating CVD reactor of FIG. 7n or 7m, wherein wire electrodes 591 are removed and plasma duct 542a is grounded while the substrate holder 2 with substrates to be coated 4 is biased either positively or negatively in reference to cathode 583 in cathode chamber 108. Biasing of substrate holder 2 is achieved by the parallel circuit connecting the substrate holder 2 to cathode 583 in cathode chamber 108. Substrate holder 2 is biased negatively when the negative pole of the power supply 535b is connected to substrate holder 2 via closed switch 611b, while its positive pole is connected to cathode 583 or grounded. In this case the switch 611a is open. Substrate holder 2 is biased positively when the positive pole of power supply 535a is connected to substrate holder 2 via closed switch 611a, while its negative pole is connected to cathode 583 in cathode chamber 108. In this case, switch 611b is opened. As shown in FIGS. 7n, 7o and 7p, cathode chamber 108 with primary arc cathode 583 is separated from plasma duct 542 by separating baffle 582 with small orifice 582a which is impermeable for heavy particles (neutral atoms, ions and macroparticles) but allows electron current of the remote arc discharge emitted from the cathode 583 to be transmitted from the lower pressure cathode chamber 108 to the plasma duct and coating chamber 1c via small orifice 582a and further to the anode chamber 106. An unexpectedly large pressure gradient across the small opening 582a in the separating baffle 582 is created between the plasma duct 542 and the cathode chamber 108 with pressure in the plasma duct 542 more than an order of magnitude greater than the pressure in the cathode chamber 108 when the gas flow is directed toward the cathode chamber 108 from the plasma duct 542 through the small opening 582a, while the electron current of the remote arc discharge is directed in opposite direction from the cathode 583 toward the remote anode 551. High gas pressure in the plasma duct 542 is favorable both for high deposition rate of different PACVD coatings and for high rate of generation of energetic particles, while low pressure in the cathode chamber 108 is favorable for sustainable generation of the electron current by cathodic arc process. The pressure difference between the coating chamber 1c (high pressure) and the cathode chamber 108 is due initially to the hydraulic resistance of the small orifice 582a and increases dramatically after igniting of the remote arc discharge between the cathode 583 and remote anode 551 due, at least in part, to electrophoresis effect partially due to the friction between electron current flow directed from the cathode 583 toward the remote anode 551 through small orifice or nozzle 582a and opposite the gas flow directed from the coating chamber 1c toward cathode chamber 108. The friction forces between the electron flow and gas flow imposes the additional pressure difference between the coating chamber 1c and the cathode chamber 108 which is mostly located across the orifice 582a. The pressure difference due to remote arc discharge increases when the remote arc discharge current increases. By virtue of large plasma density in remote arc plasma assisted CVD process, the reactors of FIGS. 7m, 7m and 7p can be used for deposition of different type of coatings, specifically the coatings selected from the group of metastable materials, such as alfa-alumina, cubic BN (cBN) and diamond coatings of different morphologies, microstructures and architectures. For deposition of diamond and cBN coatings, the remote arc plasma creating gas flowing through plasma duct 542 includes reactive gas and, optionally, a carrier gas. The carrier gas is one or more noble gases and the reactive gas may be selected from the group consisting of (a) a first gas mixture including hydrogen and carbon as, for example, hydrogen and methane ($CH_4$) for depositing a diamond coating onto the substrates and (b) a second gas mixture including boron, hydrogen and nitrogen as, for example, hydrogen, borane ($BH_3$) and ammonia ($NH_3$) for depositing a cubic boron nitride coating onto the substrates.

The plasma creating gas is supplied to the anode chamber 106 or, alternatively directly to plasma duct 1c, while the pumping system is connected to cathode chamber 108. In this case, the process pressure within the plasma duct is defined by the gas flow rate, the pumping speed of the pumping system and the size of the opening 582a in separating wall 582. This design allows for maintaining a relatively low pressure in cathode chamber 108 (typically below 200 mtorr) which is necessary for operation of vacuum arc, while the pressure in the plasma duct may be controlled in the range from 0.3 torr to 100 torr and, in pulsed remote anode mode, up to 1000 Torr depending on injecting gas flow rate and the area of opening 582a. In a refinement, the plasma duct is also provided with an optional pumping system 1d as illustrated in FIG. 7p.

Figure 7R:
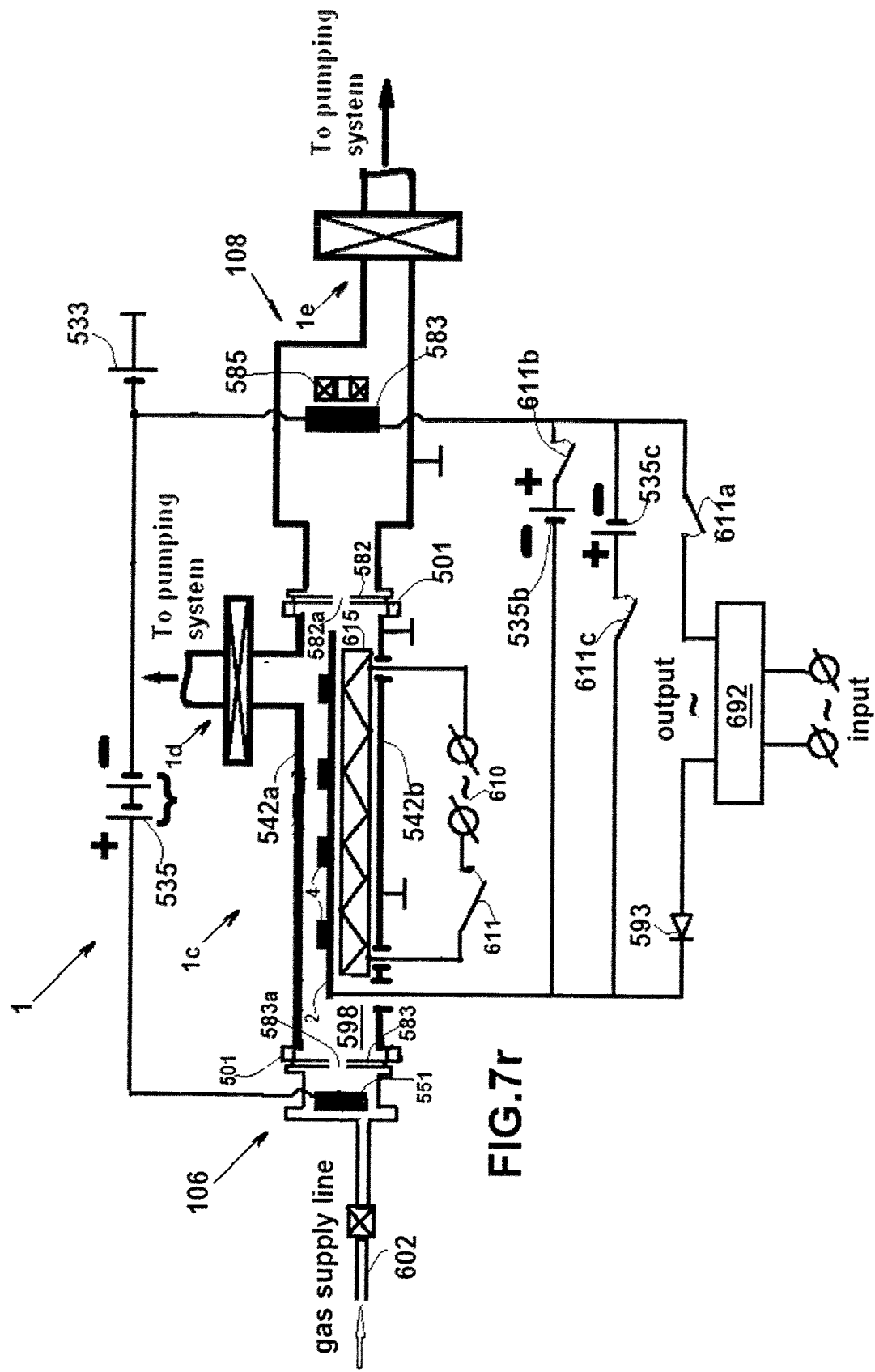
FIG. 7r is a variation of a schematic plan view of coating deposition reactor of FIG. 7p, utilizing single phase transformer providing AC power to the substrate holder, in an embodiment.

In variation of this embodiment, an AC power supply such as single phase variable transformer may be used as remote arc power supply. In reference to FIG. 7r, a single phase variable transformer with electrically isolated output (or, alternatively, a pair of coupled variable transformer and step-up transformer) is used instead of DC power supply 535b (also shown in FIG. 7r as an option) to provide the power to substrate holder 2. To secure that only positive (anodic) voltage will be supplied to substrate holder 2 by transformer 692, a diode 593 is installed between the one output terminal of transformer 692 and substrate holder 2 while another output terminal of transformer 692 is connected to cathode target 583 via switch 611a. In operation, when variable transformer 692 is turned on and switch 611a is closed (while switch 611b is opened) the positive voltage pulses with the frequency corresponding to the frequency of the input power of the transformer 692 will be supplied to substrate holder 2. It is appreciated that unipolar DC pulse generator (shown in FIG. 7n) also may be used as a power supply to provide high current positive voltage pulses to substrate holder 2.

Optionally, the positive pole of DC power supply 535c is connected to the substrate holder 4 via switch 611c, while the negative pole of DC power supply 535c is connected to cathode 583. In operation, when sinusoidal voltage potential is applied to substrates 2, the plasma rectifying effect will produce the pulse plasma discharge only during positive half-period leaving substrate without plasma assistance during the negative half-period of the applied voltage potential. Each substrate 2 may be a silicon wafer or WC-6% Co carbide inserts. Each substrate 2 may be heated to a temperature in the range from 600° C. to 900° C. The polycrystalline diamond coating is deposited on substrates 2 during the half-period when the plasma is interfacing with substrates 2. During the half-period when the plasma is not present, the pyrolytic graphite phases are deposited. This alternation produces a mix of diamond with non-diamond carbon phases in carbon coating deposited on substrates 2 subjected to rectified sinusoidal bias potential applied by variac 692. This coating can serve as an interlayer in multilayer polycrystalline diamond coating architecture, in which the pure polycrystalline diamond layer is applied during the period of time when positive bias potential is applied to the substrate holder by DC power supply 535c when the switch 611c is closed while switches 611a and 611b are opened. This polycrystalline diamond layer is followed by mixed diamond-non-diamond carbon interlayer deposited when the bias potential to substrate holder 4 is applied by the variac 692 when switch 611a is closed while switches 611b and 611c are opened.

Figure 7S:
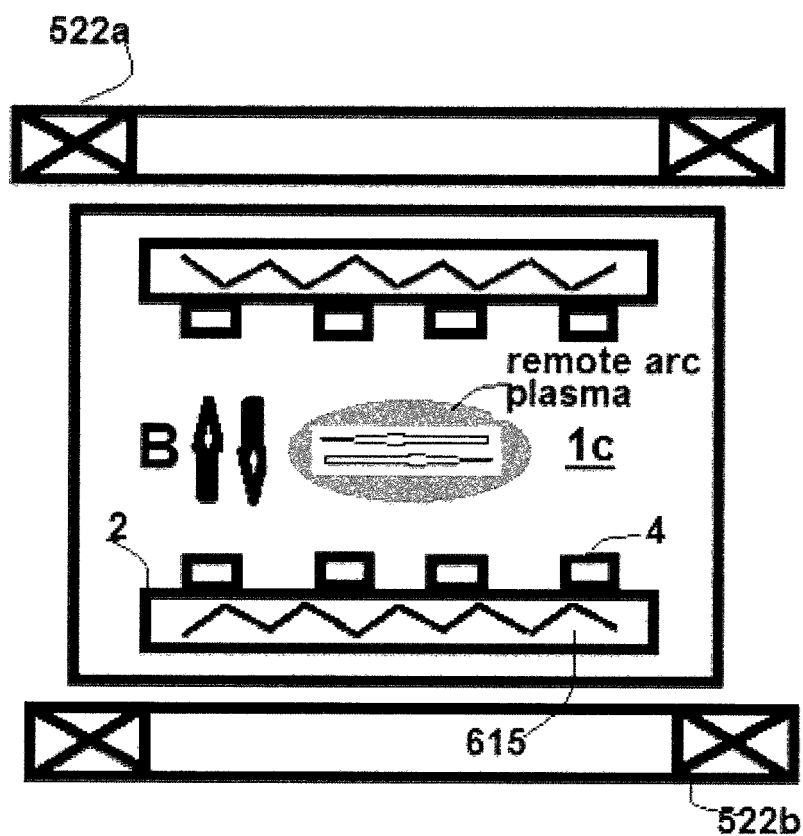
FIG. 7s shows a cross-section view of a variation rectangular coating deposition reactor of FIG. 7r utilizing magnetic steering of remote arc plasma column in rectangular plasma duct, in embodiment.
Figure 7T:
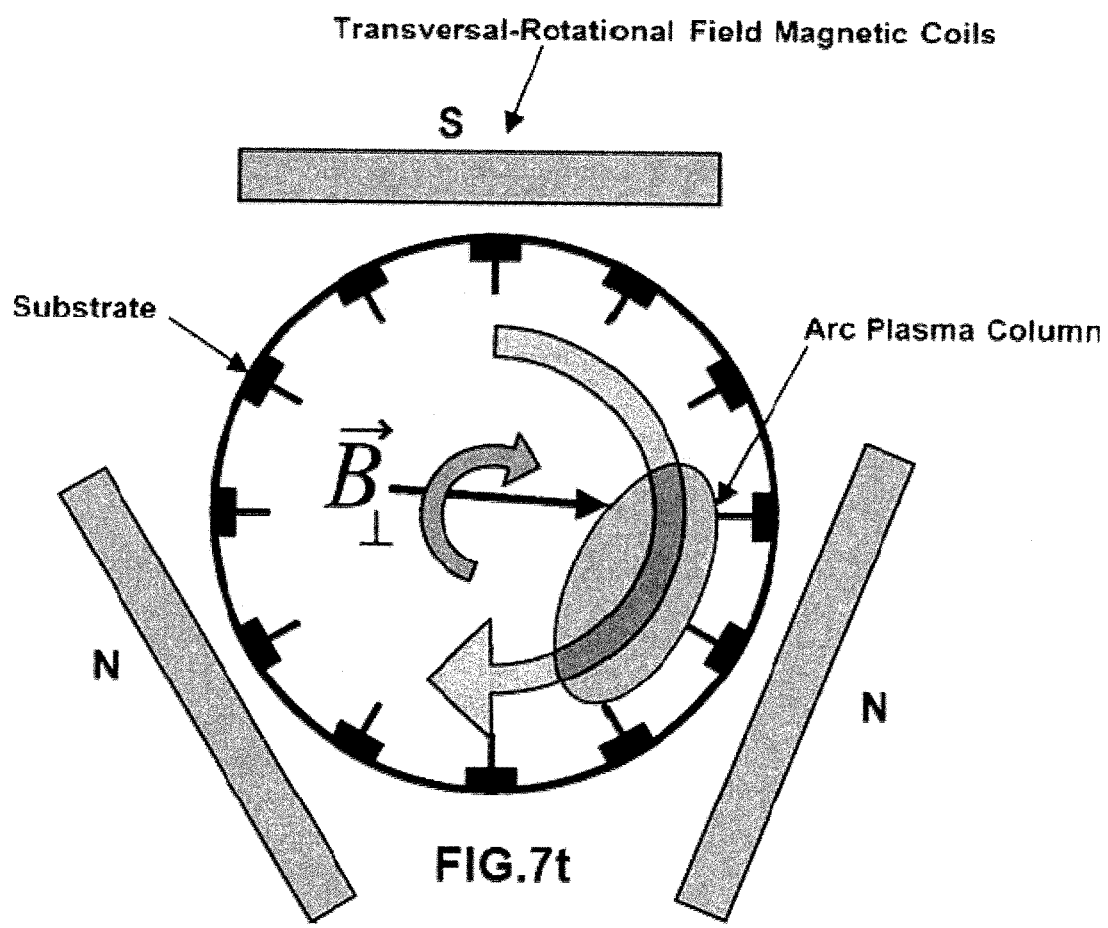
FIG. 7t shows a cross-section view of a variation tubular coating deposition reactor of FIG. 7r utilizing magnetic steering of remote arc plasma column in tubular cylindrical plasma duct, in embodiment.

In the case of rectangular coating reactor, as shown in FIG. 7s, the remote arc column may be magnetically steered by a magnetic field perpendicular to the arc column. This magnetic field may be generated by a pair of magnetic coils 522a and 522b connected to the AC power supply (not shown) positioned in opposite sides of the reactor chamber 1c. In case of a tubular cylindrical reactor, as illustrated in FIG. 7t, three electromagnetic coils connected to 3-phase AC power supply (not shown) are positioned symmetrically around the reactor axis for generation of a rotating magnetic field for magnetic steering of remote arc column.

Figure 7U:
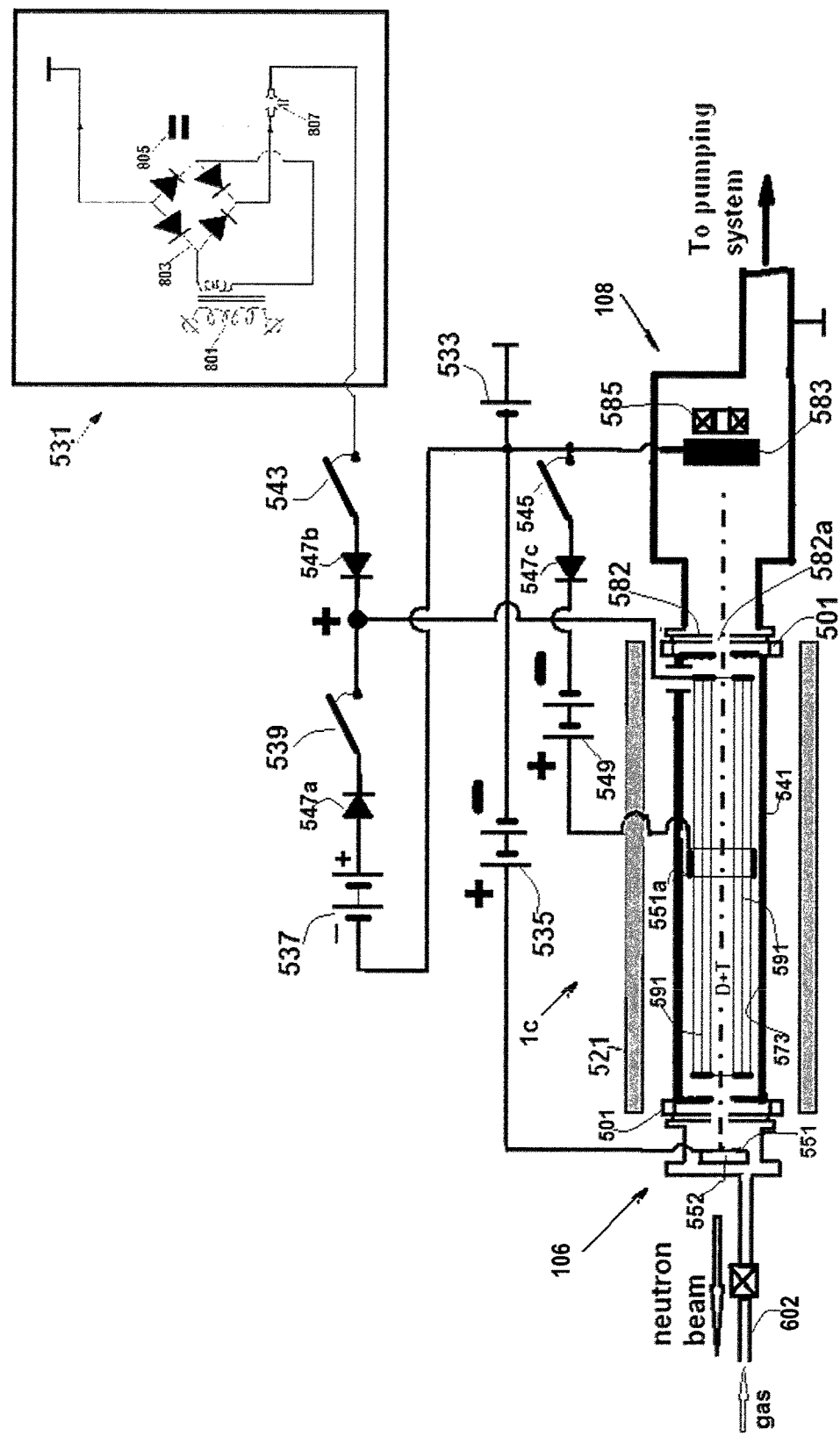
FIG. 7u shows a variation of filtered cathodic arc apparatus for generation of energetic particles of FIG. 7h, utilizing an array of wire electrodes independently connected to remote anode power supplies and plasma duct housing made of dielectric ceramic, in an embodiment.
Figure 7W:
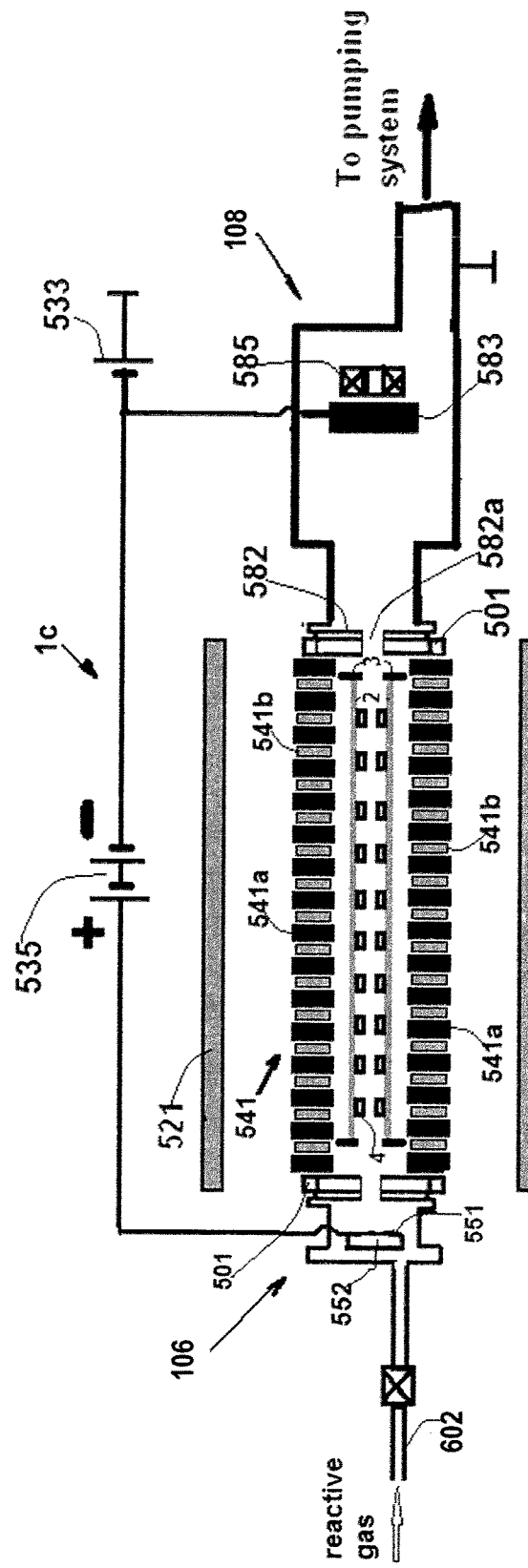
FIG. 7w is a variation of a schematic plan view of coating deposition reactor of FIG. 7u, utilizing cascade channel of the plasma duct, in an embodiment.

The voltage drop along the remote arc column increases with pressure. At higher pressures, the voltage drop along the remote arc column within the plasma duct 1c may exceed the voltage drop along the discharge tube 541, which may lead to the short circuiting of the arc via discharge tube 541 such that the remote arc current runs via discharge tube 541. To avoid the possibility of short circuiting of the remote arc discharge via discharge tube 541 in both energetic particles generator and coating deposition reactor operating at high pressure, wire electrodes 591 may be independently connected to the DC and/or DC pulse power supplies while discharge tube 541, or at least a part of discharge tube 541, is made of dielectric such as quartz or alumina (which may also serve as substrate holder in coating deposition reactor). Alternatively the interior surface of the discharge tube 541 may be, at least partially, covered by a dielectric material preventing it from becoming an electrode in the remote arc plasma discharge. The dielectric material may be arranged as a dielectric liner attached to the interior surface of the plasma duct chamber 541. FIG. 7u shows one such embodiment. In this embodiment, to avoid remote arc shortening via wire electrodes, the diameter of wire electrodes 591 is both (a) small enough, typically from 10 to 100 µm and (b) made of metal alloy with high specific resistance such as Nichrome or Kanthal alloy. Alternatively, discharge tube 541 may be sectioned with alternating metal sections and dielectric ceramic sections that break the path of arc shortening current. FIG. 7w shows one such embodiment, wherein plasma duct housing 541 is built of a set of metal sections 541a separated by dielectric ceramic sections 541b, while the substrates to be coated 4 are positioned along the dielectric ceramic substrate holder 2 supported by end-flanges 3b. In operation, the remote arc plasma is conducted from the low pressure cathode chamber 108 via small orifice 582a in the separating baffle 582 along coating chamber 1c essentially within the ceramic substrate holder 2 with substrates to be coated 4 toward remote anode 551 in remote anode chamber 106. Optionally, substrates to be coated 4 are heated by external heaters (shown in FIG. 7p) in addition to the heating by remote arc discharge plasma. The reactive gas is supplied via remote anode chamber 106 while the pumping system is connected to cathode chamber 108 to maintain high pressure in coating chamber 1c while cathode chamber 108 remains under low pressure necessary for operating the vacuum arc discharge on cathode target 583.

Figure 7X:
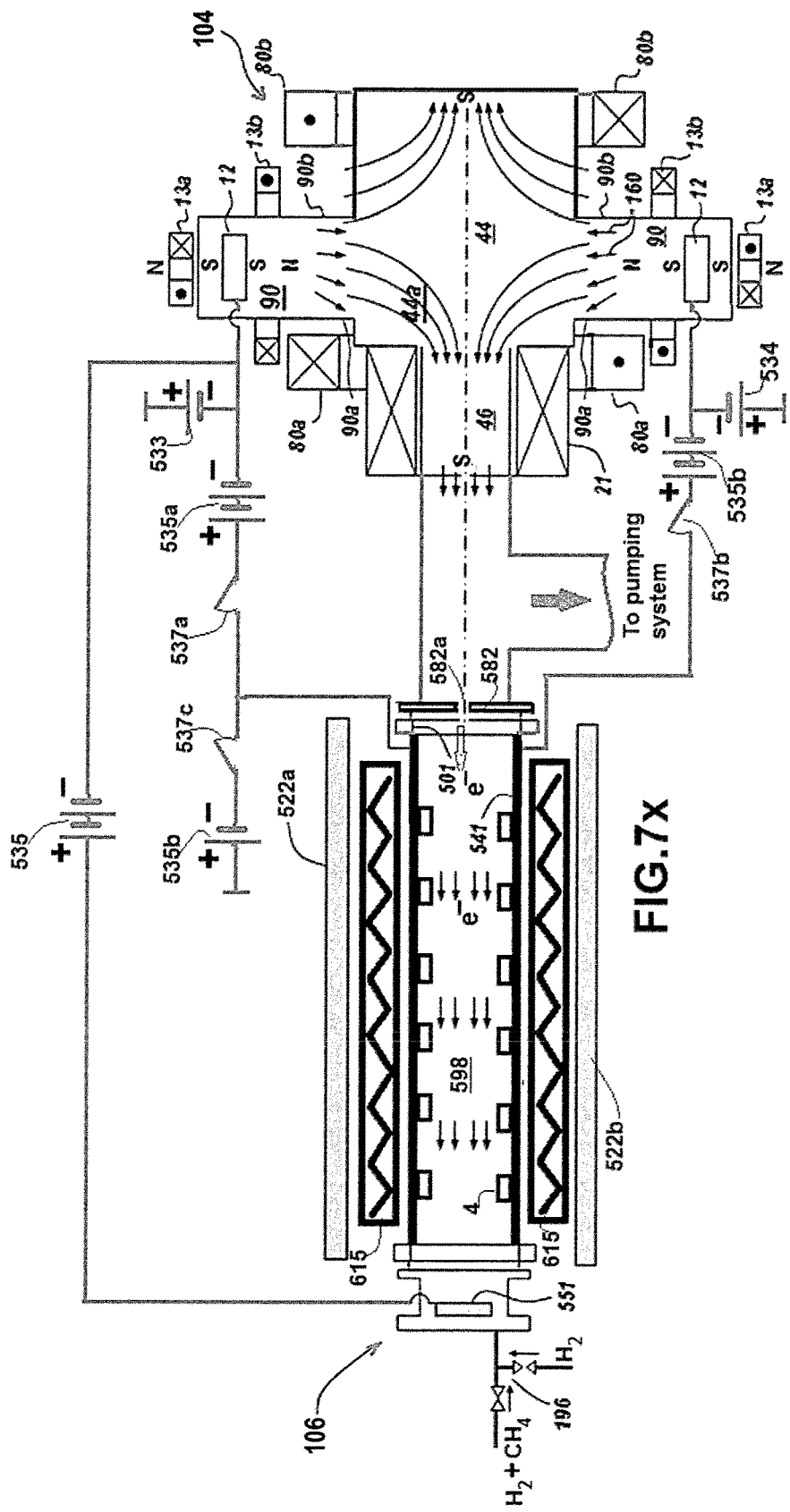
FIG. 7x is a variation of a schematic plan view of coating deposition reactor of FIG. 7p, utilizing multi-cathode primary arc source, in an embodiment.
Figure 7Y:
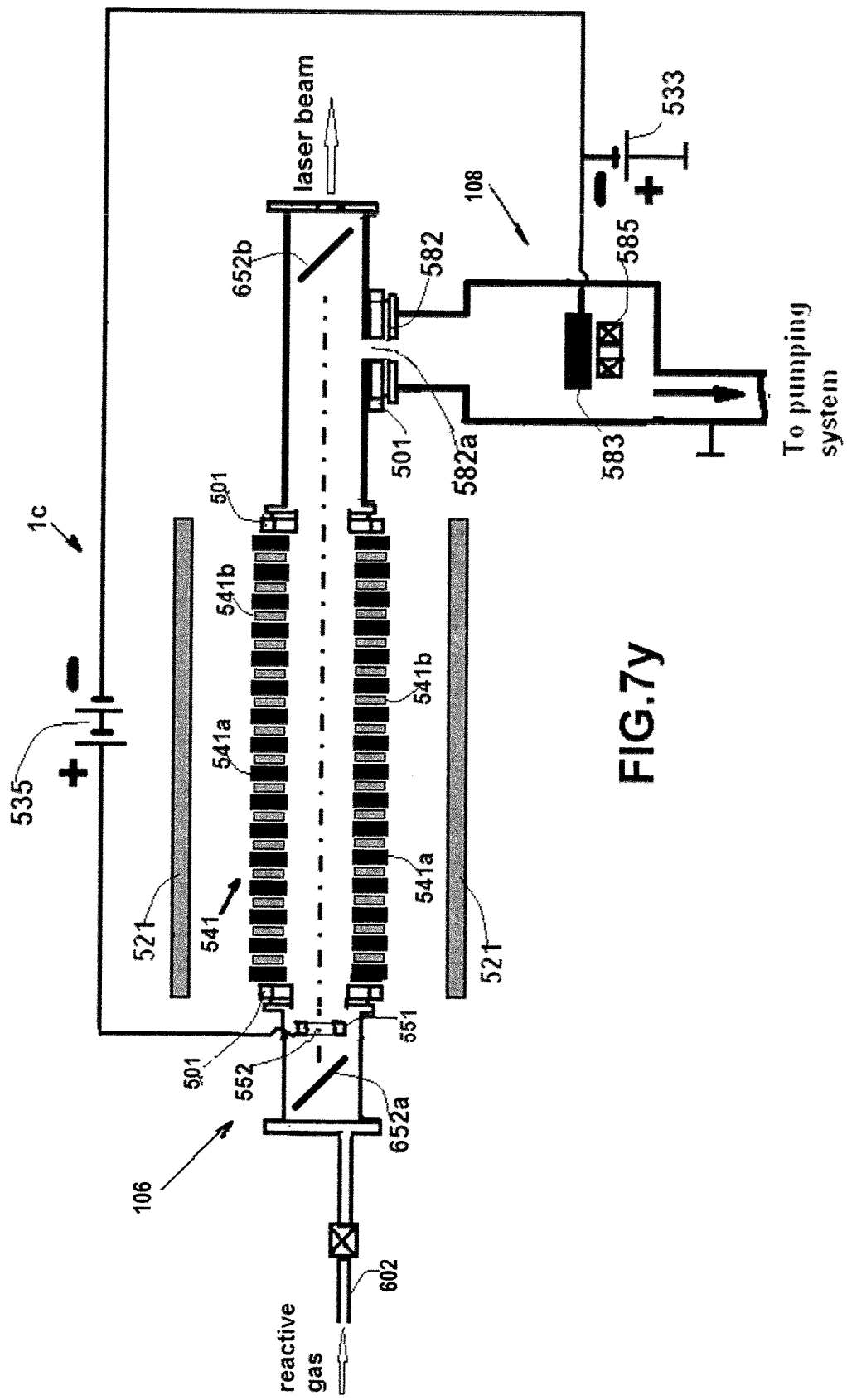
FIG. 7y is a variation of filtered cathodic arc apparatus for generation of energetic particles of FIG. 7w adapted to function as an ion laser tube, in an embodiment.

In a refinement, multiple primary cathodic arc sources are installed in cathode chamber 108 as illustrated in FIG. 7x. In this embodiment, several primary cathodic sources are attached to plasma duct 44 of the primary cathode chamber 108 similar to the design shown in FIG. 7b. This embodiment allows for using a set of primary cathodic arc sources for generation of remote arc discharge plasma in coating chamber area 598.

Figure 9C:
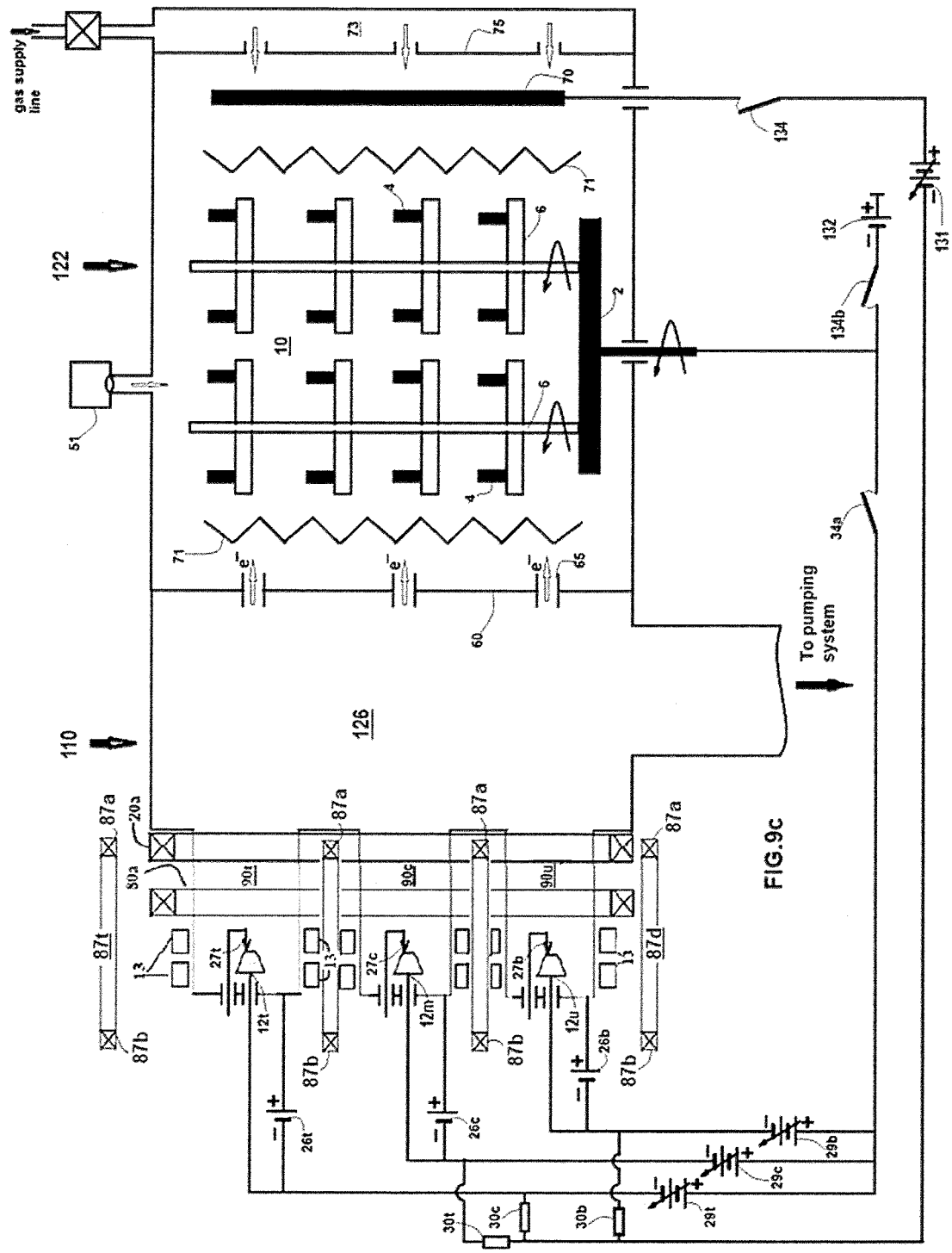
FIG. 9c is a variation of schematic diagrams of FIG. 9a utilizing shielded cathode chambers for generating primary arc plasma in low pressure compartment and heated substrate holder in high pressure compartment of the coating chamber.

In another advanced embodiment of the filtered cathodic arc method and apparatus for generation of energetic particles in coating deposition reactor for deposition of diamond coatings of FIG. 7p, FIG. 9c illustrates the industrial-scale remote arc plasma assisted CVD reactor suitable for deposition of diamond coatings. The reactor of FIG. 9c includes cathode chamber 110 which, in this embodiment, includes a primary cathode arc plasma duct chamber 126 with three attached primary cathodic arc sources (without departing from the scope hereof, primary cathode arc plasma duct chamber 126 may include two, four or more primary cathodic arc sources). These three primary cathodic arc sources include top, central and bottom cathode chambers 90t, 90c and 90u, respective cathode targets 12t, 12m and 12u with respective mechanical igniters 27t, 27c and 27b. Each of these primary cathodic arc sources further includes steering and focusing coils 13 for stabilizing arc spots at the evaporating surface of the targets 12. In an embodiment, targets 12 are frustoconical. Optionally, the reactor of FIG. 9c further includes a set of vertical scanning coils 87 and a deflection coil 20 for manipulation with primary arc plasma plumes generated by vacuum arc cathode targets 12. The three primary arc discharges are powered by primary arc power supplies 26t, 26c and 26b, respectively. Substrates to be coated 4 are installed on substrate holders 6 connected to the shafts of the rotary substrate table 2. In the reactor of FIG. 9c, coating chamber 10 of reactor chamber 122 includes remote anode 70 powered by the remote arc anode power supply 131 via switch 134c. Without departing from the scope hereof, remote anode 70 may be installed elsewhere within the coating chamber 10 than shown in FIG. 9c. The substrate holding rotary table 2 may serve as remote anode powered by remote arc power supplies 29t, 29c and 29b having their positive terminals connected to the substrate holding rotary table 2 via switch 134a. The negative bias power supply 132 is connected to rotary table 2 via switch 134b. When switch 134b is open and both switches 134a and 134c are closed both rotary table 2 with substrates to be coated 4 and remote anode 70 are powered as remote anodes in reference to the primary cathode targets 12. Ballast resistors 30t, 30c and 30b are optionally installed between primary cathode targets 12 and remote anode 70 to limit the remote anode arc current of remote anode 70.

Figure 9D:
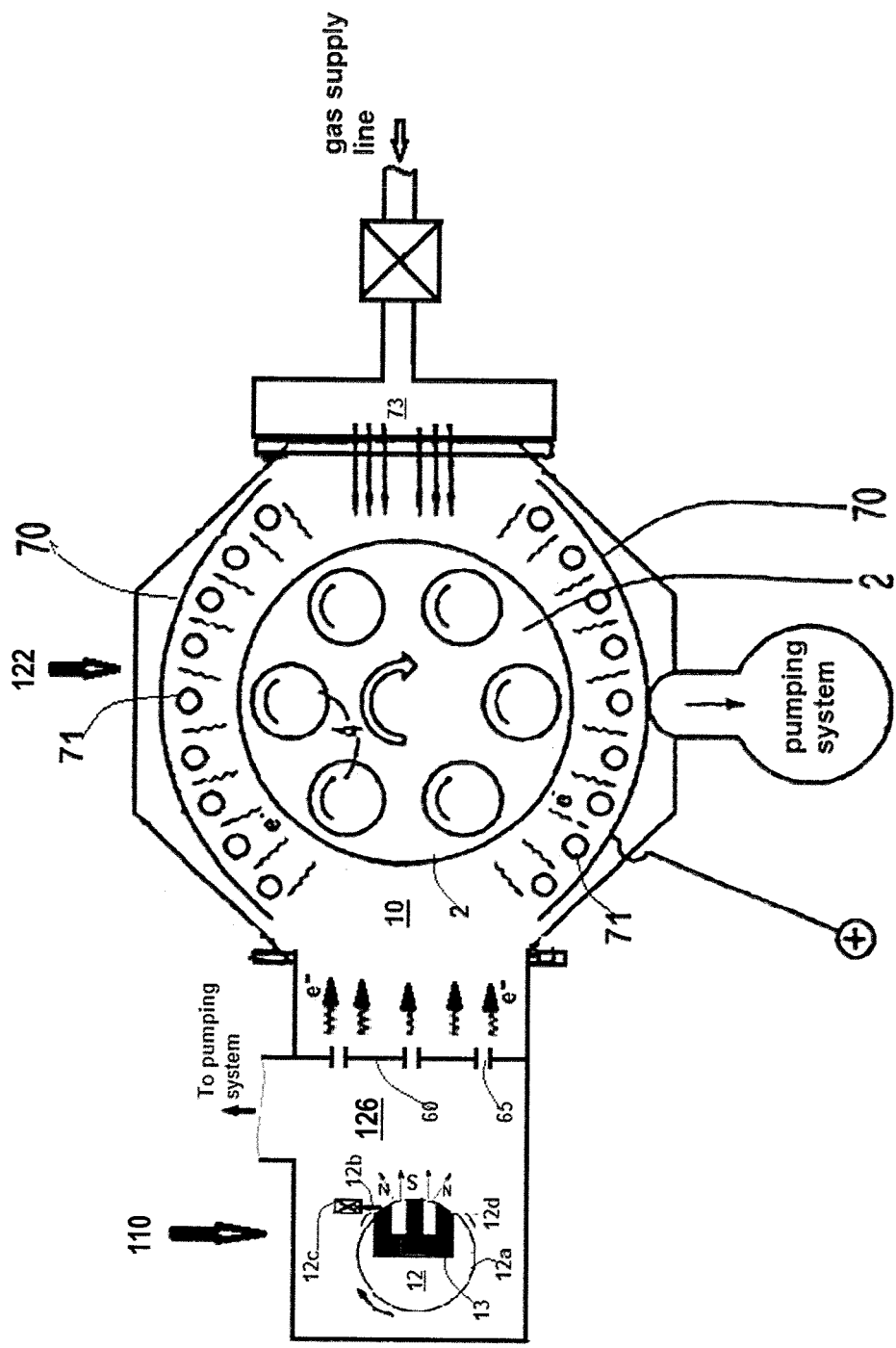
FIG. 9d is a variation of schematic diagram of FIG. 9c utilizing tubular primary cathodic arc source in a shielded low pressure compartment provided with attached pumping system.

The gas supply line is connected to coating chamber 10 via a gas distribution compartment 73 separated from the chamber 10 by a wall 75b with gas supply openings. A conventional radiation heater 71 is installed in coating chamber 10 to provide heating of substrates 4 in addition to the remote anode arc plasma heating. Radiation heater 71 allows for controlling substrate temperature within the range from 100 to 1100° C. depending on coating deposition process. The substrate temperature may be measured by an optional pyrometer 51. For ionitriding applications, the substrate temperature is typically established with the range 400-600° C. For diamond coatings remote arc plasma assisted CVD deposition process the substrate temperature is typically in the range from 650 to 950° C. The cathode plasma duct 126 (an embodiment of plasma duct 1c) is provided with a pumping system to allow pumping cathode chamber 110 to lower pressures than reactor chamber 122, typically providing at least 5 times greater pressure in the coating chamber 10 than in the cathode chamber 110. Plasma duct 126 is separated from coating chamber 10 by a baffle 60 with small openings 65 impermeable for heavy particles (macroparticles, metal ions and metal atoms), while fully (or at least partly) transparent for conducting electron current of the remote arc discharge emitted by the cathode targets 12 toward remote anode 70 and/or rotary table 2. Optionally, opening 65 is provided with cylindrical shielding which may improve the stability of the remote arc discharge by the hollow cathode effect. In a refinement, each opening 65 is shielded by a disk-shape shield spaced from opening 65 and installed at either side of baffle 60 to block direct line-in-sight connection between the cathode targets 12 and coating chamber 10. Openings 65 may have a nozzle-like shape (shown in FIG. 9e), may be built in inserts made of refractory metals such as tungsten inserted into baffle 60, and may be provided with water cooling to prevent their overheating and degradation at high remote anode arc currents, which otherwise may generate large heat flux into the walls of openings 65. Openings 65 to enable keeping the pressure in coating chamber 10 relatively high (for example above 1 Torr) to achieve a high deposition rate of diamond coatings, while holding the pressure in the cathode chamber 110 relatively low (typically below 200 mTorr) to achieve stable operation of the vacuum cathodic arc sources. Alternatively, nozzles 65 and the baffle 60 can be made of tungsten, and/or one or more other refractory metals such as molybdenum and tantalum or from high-temperature ceramics such as alumina, and not water-cooled leaving thermal radiation losses as the only channel of cooling. In this case, in operation, when the remote arc current exceeds 100 Amperes, the temperature of the baffle 60 with openings 65 can exceed 1500 C resulting in production of large flux of nascent hydrogen in the reactor chamber 122, which increases the deposition rate of diamond coating in $H_2$—$CH_4$ reaction gas environment. A variation of the embodiment of PACVD reactor of FIG. 9c shown in FIG. 9d provides the primary cathodic arc source with a cylindrical rotational target 12 having high utilization rate. This cylindrical rotational target 12 is similar to the one shown in FIG. 6d.

In a refinement, a cascade remote arc discharge can be used which allows further increasing the process pressure in coating deposition chamber 10. In reference to FIG. 9g, the intermediate remote arc discharge chamber 126 (an embodiment of plasma duct 1c) is installed axisymmetrically along the axes of reactor chamber 122. Primary cathodic arc chamber 116, which is attached to a pumping system, is connected to intermediate chamber 126 via small orifice 582a in the separating baffle 582 at one end of intermediate chamber 126 while remote anode 551 is positioned at the other end of intermediate chamber 126. The longitudinal magnetic field, generally parallel to the axis of reactor chamber 122, can be applied by the pair of magnetic coils 521: a top coil 521t is positioned around the top flange of chamber 10 and a bottom coil 521b is positioned around the bottom flange of chamber 10. In operation a first (intermediate) stage of the remote arc discharge is ignited between cathode 583 of the primary cathodic arc source in cathode chamber 116 and remote anode 551 in the intermediate discharge chamber 126. A second stage of the remote arc discharge extends the first stage from the intermediate chamber through nozzle-openings 65 in baffle 60 toward remote anode 70 and/or substrate holders 2 in coating chamber 10. In a variation of this design, shown in FIG. 9h, the intermediate remote arc discharge is free burning between primary cathode 583 and intermediate remote anode 551 along the axis of reactor chamber 122. FIG. 9i shows a remote arc plasma assisted CVD reactor, suitable for deposition of diamond coatings, which is another variation of the design shown in FIG. 9g. In the variation shown in FIG. 9i, a primary cathodic arc chamber 114 with attached pumping system is positioned along the axis of reactor chamber 122. The cylindrical primary cathodic arc target 583, utilizing rotating magnetic yoke 585 is positioned along the cathode chamber 114. The electron emission arc steering area is rotating following rotation of the magnetic yoke 585 which generates an arch-shape steering magnetic field at the evaporation surface of cylindrical cathode target 583.

Figure 9E:
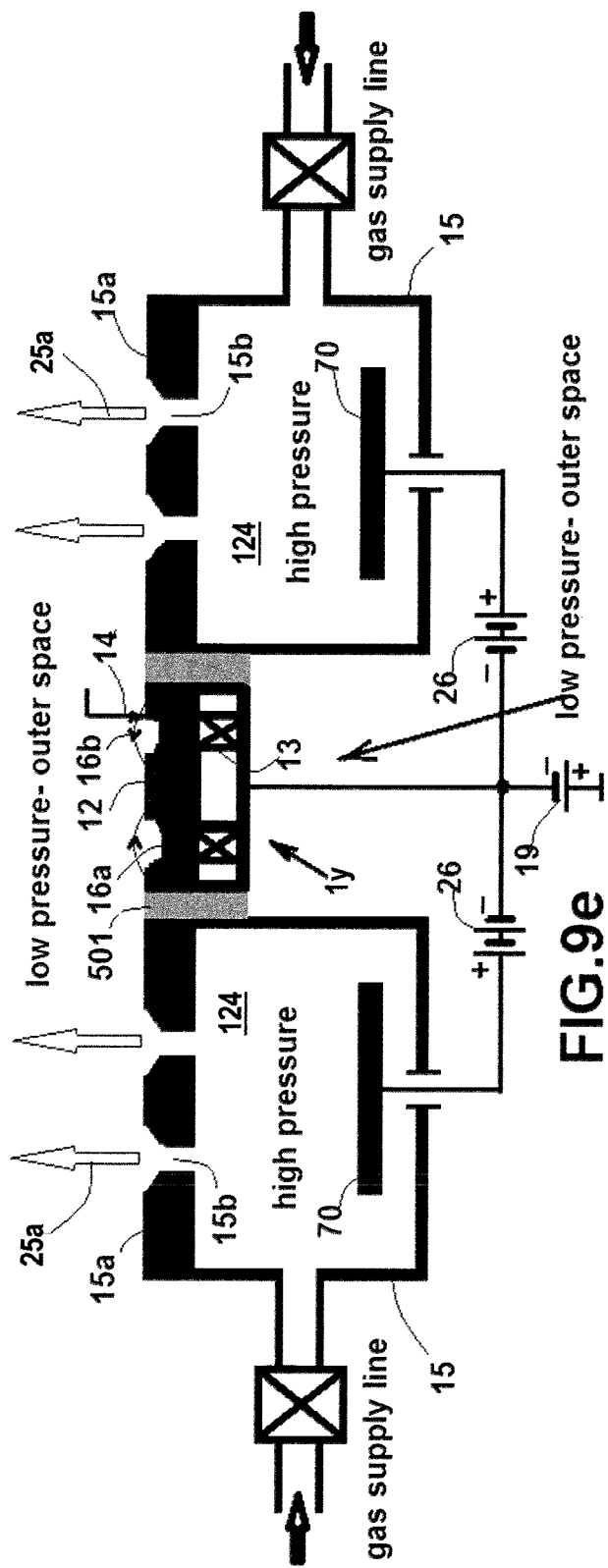
FIG. 9e is a perspective view of remote arc plasma thruster utilizing high pressure remote anode chamber with multichannel output.

FIG. 9e shows another variation of the embodiment of FIG. 9c, wherein the remote arc discharge comprises the primary cathodic arc, operating in a low pressure environment, and the anodic arc column extended into the high pressure remote arc compartment via small-diameter nozzle-like openings. This embodiment can be used as a plasma thruster for a spacecraft and also in place of tubular shielding of the openings 65 of the separating wall 60 of cathodic arc plasma duct 126 of PACVD reactors shown in FIGS. 9c,d. In reference to FIG. 9e, a primary cathodic arc source 1y includes cathode target 12 and magnetic steering coil 13 installed behind target 12. Target 12 is open to the low pressure or vacuum outer space. The vacuum cathodic arc is powered by a primary power supply 19 and ignited by the mechanical igniter 14 on cathode target 12. The vacuum cathodic arc spots are confined under the arch-shaped magnetic force lines 16b provided by steering coil 13 within the arc erosion corridor area 16a on front evaporating surface of the target 12. Primary cathodic arc source 1y is attached to the arc plasma propulsion chambers 124 via ceramic insulator 501. Remote anodes 70 are installed within the plasma propulsion chambers 124 and are powered by remote arc power supplies 26. A remote arc plasma propellant 25a generated within plasma propulsion chambers 124 flows through small nozzle-shaped openings 15b in a front wall 15a of the plasma propulsion chambers 15, thus generating the driving momentum for the spacecraft.

Figure 9F:
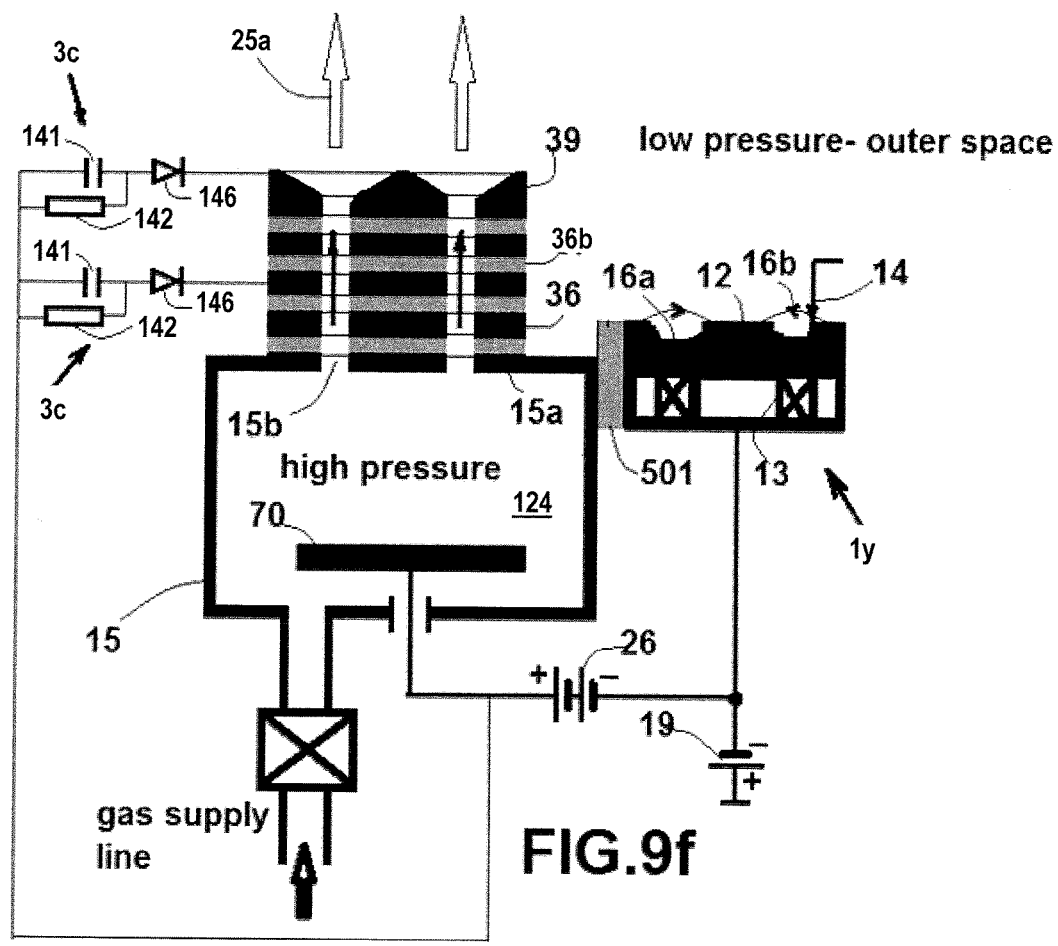
FIG. 9f is a variation of schematic diagrams of FIG. 9e utilizing cascade arc nozzle output.
Figure 9G:
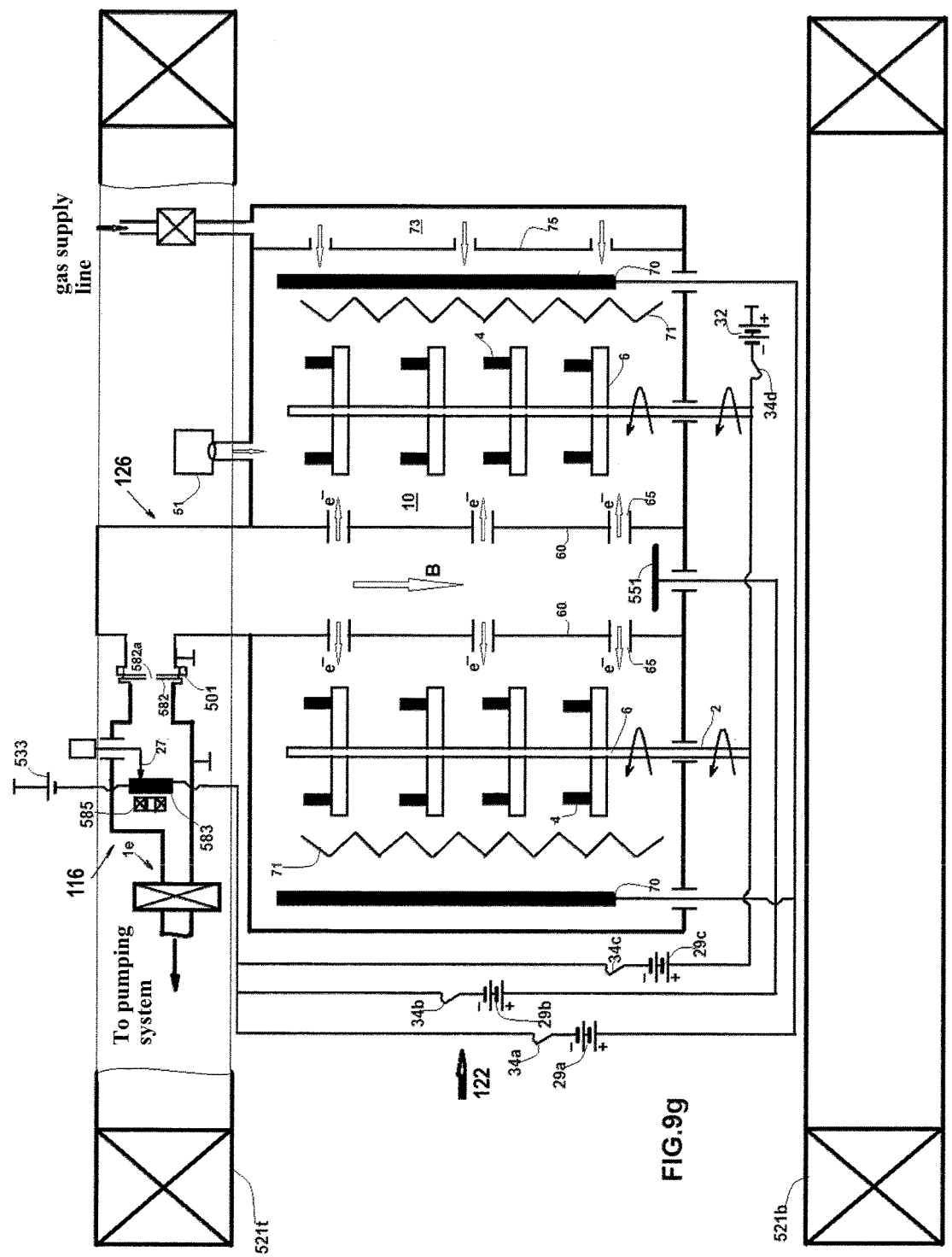
FIGS. 9g and 9h are variations of the schematic diagram of FIG. 9c utilizing a cascade remote arc with coaxial first stage remote arc discharge, in embodiments.
Figure 9H:
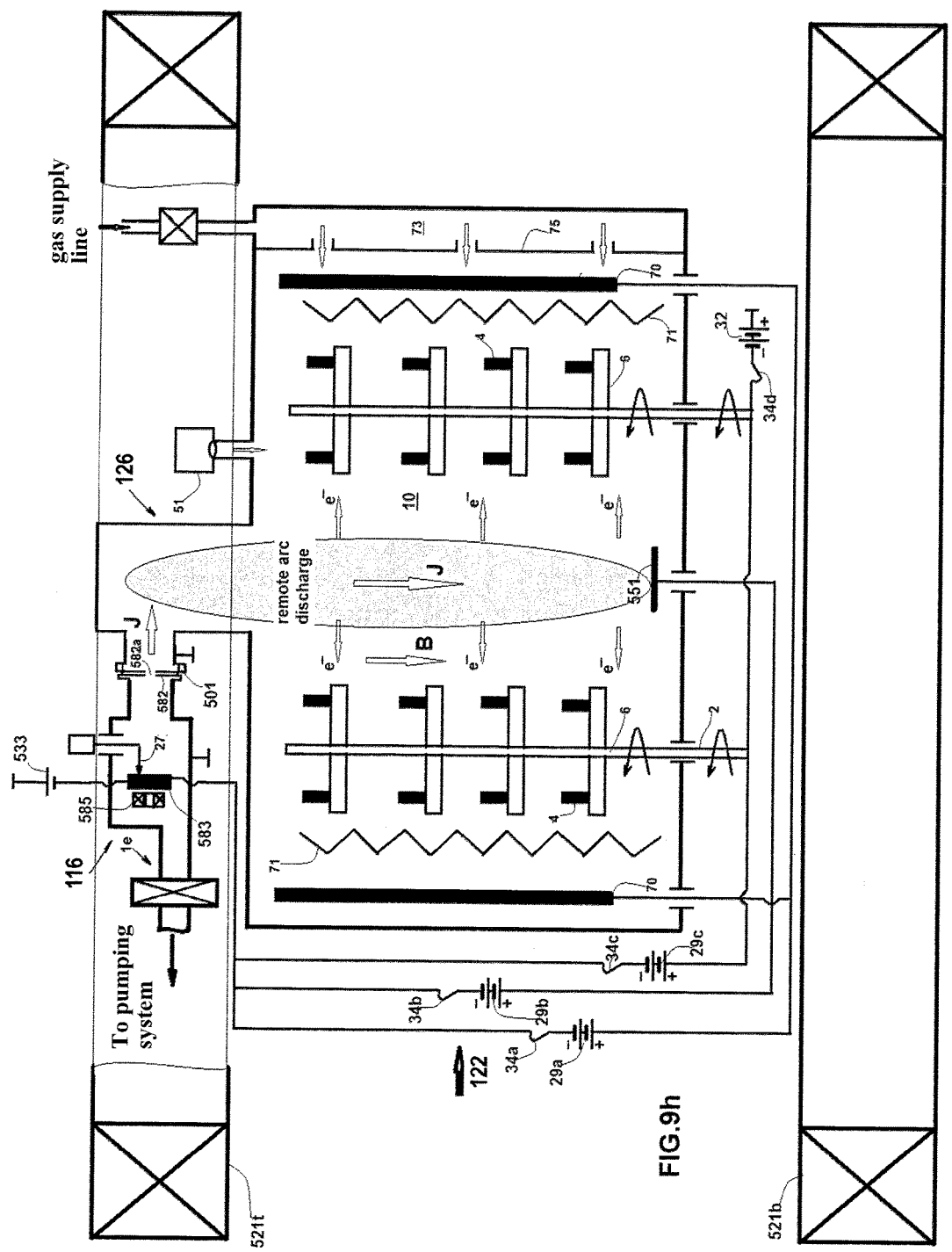
Figure 9I:
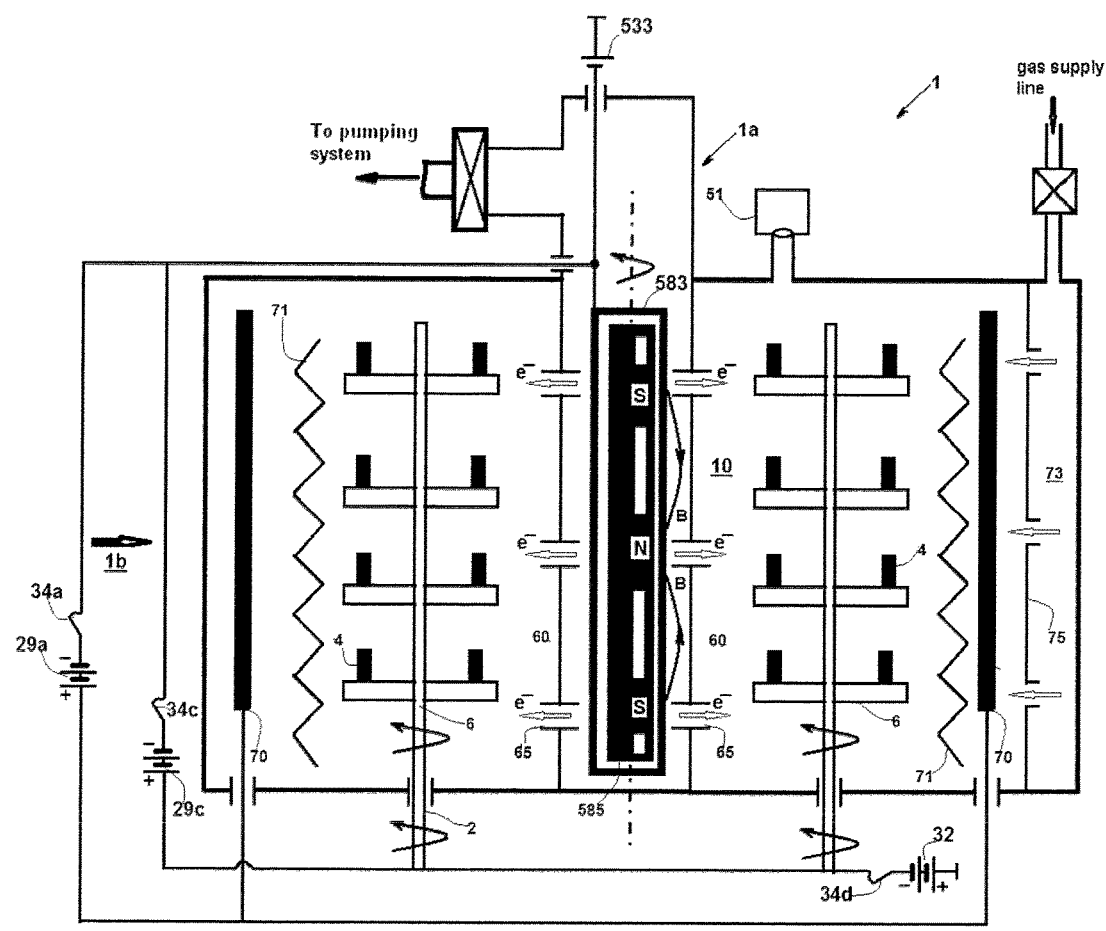
FIG. 9i is a further variation of the schematic diagram of FIG. 9g utilizing a cylindrical cathodic arc source positioned in the coaxial cathode chamber, in an embodiment.

The cascade arc nozzles may be utilized both as nozzles 15b in remote arc plasma thruster of FIG. 9e and in place of tubular shielding of the openings 65 of the separating wall 60 of cathodic arc plasma duct 126 of PACVD reactors shown in FIGS. 9c,d as illustrated in FIG. 9f. In this design, the remote arc plasma is conducted from primary cathode target 12 toward remote anode 70 through cascade arc channel 15b, wherein the cascade arc channel 15b includes a set of metal washer-sections 36 insulated by ceramic washer sections 36b. Optionally, the igniting circuit 3c includes a capacitor 141 and a bypass resistor 142 connected to selected metal sections 36 via a diode 146. In operation, capacitors 141 are discharged in turn when the arc plasma conductivity zone is moving along the cascade channel 15b allowing igniting arc along the narrow long cascade arc channel. The Ohmic heating of the remote arc plasma column within the narrow cascade arc channels 15b by the high density arc current provides higher plasma density and higher electron temperature both for coating deposition and plasma propulsion applications.

The fact that macroparticles follow straight trajectories after being emitted from the target surface while the vapor plasma is deflected toward the turning direction of the deflecting and focusing magnetic force lines allows for the use of a "stream baffles" which can be installed in the plasma duct 44 across the vapor plasma flow to further enhance the filtration of macroparticles. As illustrated in an embodiment of filtered cathodic arc deposition method and apparatus of present invention shown in FIG. 8a, a preferred embodiment of the invention provides a vacuum chamber generally designated to house all components in a vacuum environment having a cathodic arc source with a steering coil 15c disposed upstream of a cathode chamber 90, a plasma duct 44, and a substrate holder 2 bearing substrates 4 to be coated mounted in a main chamber 10 downstream of the plasma duct 44. The cathode chamber 90 is surrounded by a focusing electromagnet 21a while the plasma duct chamber 22 is surrounding by a focusing electromagnet 21b. Optionally, focusing electromagnet 21b may be used for focusing plasma flow at the exit of the plasma duct 44.

The plasma duct 44 and cathode chamber 90 are provided with a series of wall baffles 30. The wall baffles 30 may be mounted on any walls not occupied by a cathodic arc sources, and are disposed along the periphery of the plasma stream. The cathodic arc plasma source includes a cathode 12 which is connected to the negative pole of the current source (not shown), while positive pole of the arc power supply is grounded making the chamber walls with the baffles 30 positive in relation to the plasma potential. This helps to attract and effectively remove the macroparticles from the vapor plasma stream since they are generally charged negative due to more than 1000 times larger mobility of the negative light particles, the electrons, comparing to the heavy positive ions in a metal vapor plasma stream. When baffles have a positive potential in relation to the metal vapor plasma it is repelling the positively charged metal ions effectively reducing the losses of metal ions and increasing the metal ion transport efficiency of the filter resulting in higher deposition rates.

Figure 8A:
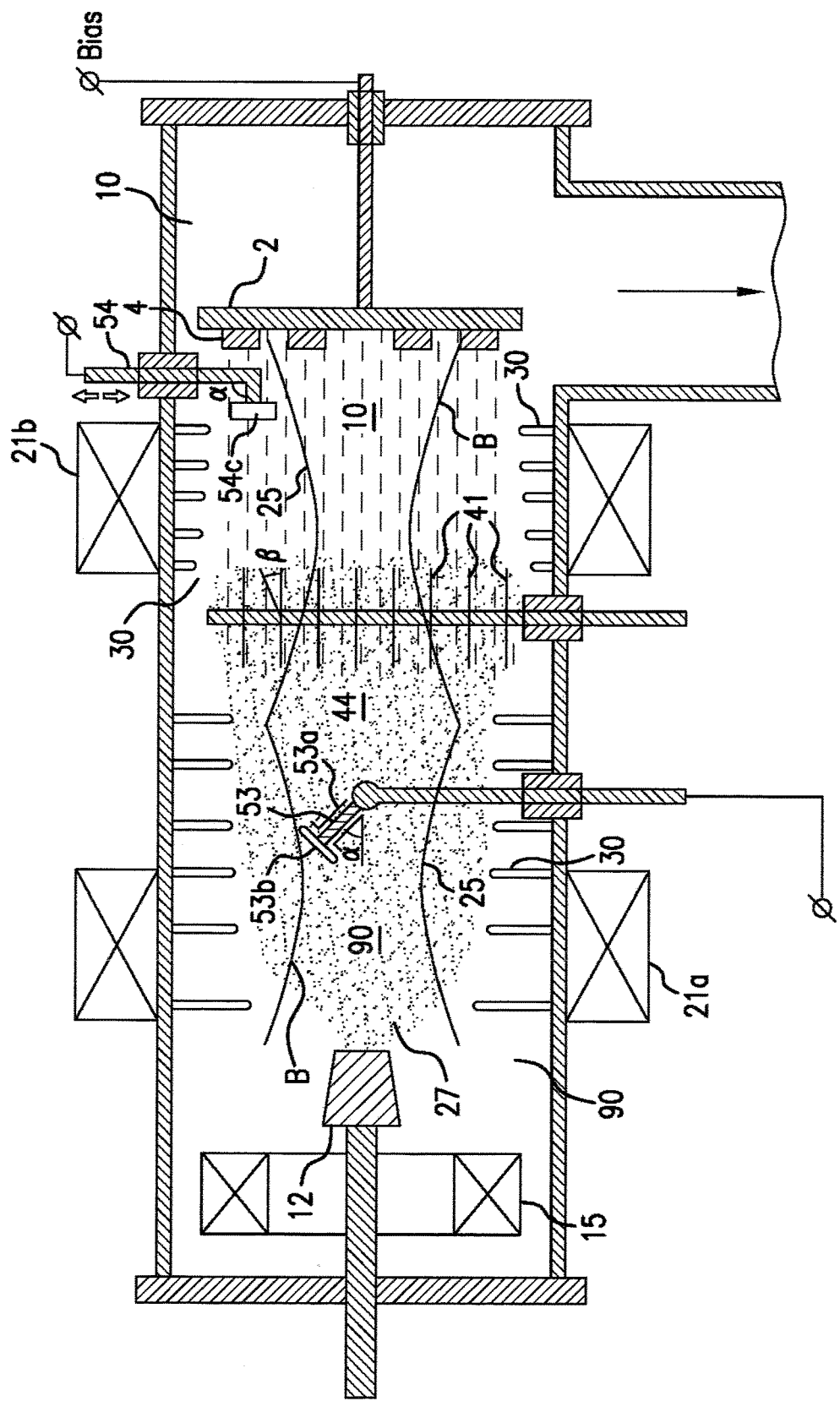
FIG. 8a is a schematic view of one filtered cathodic arc apparatus having a cathode and substrate holder in optical alignment, providing a Langmuir probe, a quartz microbalance mass flux probe and a set of stream baffles disposed in the plasma stream, in an embodiment.
Figure 8B:
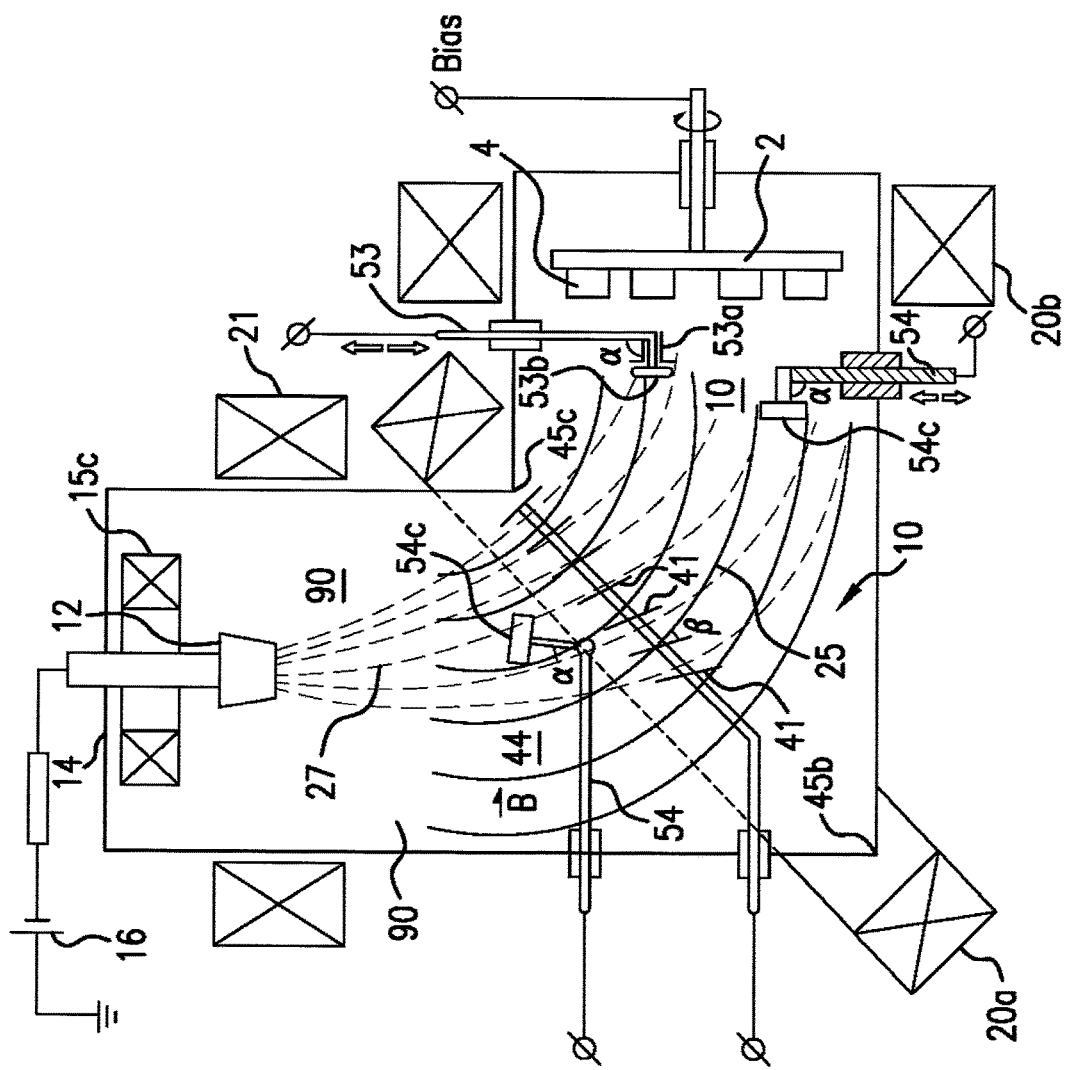
FIG. 8b is a schematic view of a variation of the filtered cathodic arc apparatus of FIG. 8a in which the substrate holder is offset from the optical axis of the cathodic arc source, in an embodiment.

FIG. 8b illustrates a variation of the embodiment of filtered cathodic arc deposition method and apparatus of present invention shown in FIG. 8a in which the substrate holder 2 is mounted in the main chamber 10 offset from the optical axis of the cathodic arc source, so that the substrates 4 and the cathode target 12 of the arc source are not in optical alignment. The arc source consists of the target 12 connected to the negative pole of the arc power supply 16, a steering coil 15c and focusing coil 21. A deflecting magnetic system, which forces the plasma stream toward the substrates 4, is made up of linear conductors arranged in a coil 20a along the line of intersection 44a-44b of the cathode chamber 90 and the plasma duct 44 coupled with the focusing coil 20b surrounding the exit portion of the plasma duct 44.

According to the further embodiment of the invention shown in FIG. 8b, a series of stream baffles 41 may be disposed generally transverse to a plane parallel to the direction of plasma flow as represented by plasma stream lines 27 (and therefore also generally transverse to the magnetic force lines 25) within the plasma duct 44. In one embodiment each stream baffle 41 is formed from a thin conductive (for example metal) strip to which is applied a potential which has to be generally positive in relation to the plasma potential. The macroparticles are mostly charged negative by absorbing a larger number of negatively charged electrons, which have much greater mobility than positively charged heavy metal ions. The faces of each of the stream baffle 41 are oriented to lie between the plane which is tangential to the magnetic field lines 25 (shown in solid lines in FIG. 8b) and a plane which is tangential to the plasma stream lines 27 (shown in phantom lines in FIG. 8b).

The radius of deflection of vacuum arc plasma ions in a curvilinear magnetic field is always slightly greater than the radius of curvature of the magnetic force lines 25. The degree to which deflection of particles and ions in the plasma stream "lag" behind the curvature of the magnetic force lines 25 is dependent upon the strength of the magnetic field, and the mass and charge of the ion or particle. The radius of deflection decreases as the strength of the deflecting magnetic field increases, and increases in direct proportion to the ion mass/charge ratio of the ion or particle. Thus, in a constant magnetic field, for ions having the same charge less massive ions will follow the curvature of the magnetic force lines 25 more closely, and for ions having the same mass, those with a higher charge will follow the curvature of the magnetic force lines 25 more closely. The present invention takes advantage of this effect, by a technique termed herein "plasma optical filtering", to separate macroparticles and unwanted ions from the plasma stream 27, and even to separate isotopes.

In the embodiment shown in the FIG. 8b, with the magnetic field strength constant the degree of ion deflection at any particular point in the plasma stream is determined by the direction of the magnetic force lines 25 at that given point and the mass/charge ratio of the ion. It can be seen from the FIG. 8b that the radius of curvature of the magnetic force lines 25 is smallest adjacent to the inside corner 45a of the plasma duct 44 and steadily increases toward the outside corner 45b of the plasma duct 44. Thus, the radius of deflection of any particular ion will depend in part upon where it is disposed in the plasma stream 27. The stream baffles 41 are accordingly preferably individually adjustable, so that each can be rotated such that its faces lie in a plane tangential to the direction of motion of the target ions at that point in the plasma duct 44. It can thus be seen that the stream baffles 41 closest to the inside corner 44a are oriented more obliquely relative to the optical axis of the cathode 14a than the baffles 41 which are closer to the outer corner 44b.

The target ions pass through the spaces between the stream baffles 41, because their trajectory is such that only the thin edge of the stream baffles 41 is in the path of travel of the target ions and presents a very low probability of being struck by the target ions. Heavier and lighter ions, and those having a different charge than the target ions, have a different trajectory which follows a path obliquely into the faces of the baffles 41, and as such most are physically blocked by the baffles.

The stream baffles 41 serve the purpose of optically isolating the substrates 4 from macroparticles and neutral atoms and molecules as well as unwanted ions entrained in the plasma stream 27. The number and width of the stream baffles 41 should therefore be sufficient to optically isolate the substrates 4 from the operating surface of the arc cathode 12 for the vast majority of macroparticle trajectories in the plasma stream, as is schematically illustrated in FIGS. 8a and 8b. In FIG. 8a the stream baffles are disposed near the exit of the plasma duct 44 where vapor plasma streamlines converge following the focusing magnetic field lines created by the focusing coil 20b. In FIG. 8b the stream baffles 41 are disposed across the entrance to the plasma duct 44, at a point where the plasma stream 27 has just begun to deflect under the influence of the deflecting magnetic field. Stream baffles 41 can be employed in any apparatus in which a plasma is being deflected, however starting the deflection of the plasma stream at earlier stage (for example in a cathode chamber rather than in plasma duct as in the above embodiments) can enhance effectiveness of the stream baffles 41 and allow stream baffles 41 to be disposed in a cathode chamber 90 or at the intersection between the cathode chamber 90 and the plasma duct 44.

In general, the potential of the stream baffles 41 should be maintained positive in relation to the plasma potential, while the potential between the stream baffles and the cathode 12 in cathode chamber 90 may range from −150V to +150V. The baffle potential less than −150V may result in intense sputtering and contaminate the plasma flow. The baffle potential above +150V may overheat and melt the baffles. The positively charged stream baffles are better suited to attract and remove the negatively charged macroparticles from the vapor plasma stream while at the same time repelling the positively charge ions and reducing a metal vapor plasma losses effectively improving metal ion transport efficiency of the filter.

In the embodiment of FIG. 8a, in which the substrates 4 are in optical alignment with the cathodic arc source, the stream baffles 41 must be disposed across the plasma stream 27 as it is dispersing toward the walls of the plasma duct 44. This is an "inertial plasma filter", which relies entirely on the inertia of particles in the plasma stream 27, which in the dispersive phase (near the cathode 12) determines the trajectory of ions and other particles; macroparticles typically disperse from the cathode at an average angle of about 70° from the optical axis of the plasma stream lines 27 or 20° to the evaporating surface of cathode target 12, while a small portion of charged nanosized clusters and macroparticles can have trajectories nearly coaxial to the filtered arc metal vapor plasma flow. In contrast, the apparatus of FIG. 8b is an "optical plasma filter" system because the substrates 4 are offset from the optical axis of the plasma stream 27 and the plasma stream must therefore be deflected, by the deflecting magnetic coil 20a, toward the substrates 4.

The maximum ion current density for the target ions downstream of the stream baffles 41 is reached when the angle between the stream baffles 41 and the axis of the plasma duct 44 is approximately equal to the angle between the plasma stream 27 and axis of the plasma duct 44 at any given point of its cross-section. If the stream baffles 41 are disposed across the transverse cross-section of the plasma duct 44, as shown in FIG. 8a, the optimum inclination of each baffle 41 to the magnetic force lines 25 is the direction of the dispersing plasma flow.

To find the optimum orientation of the stream baffles 41 at any particular point within the arc plasma stream one need to determine the direction of the plasma flow at the given point of the plasma stream where the baffle 41 is disposed.

As shown in FIG. 8a, a planar disc-shaped Langmuir probe 53 can be placed at the selected point. The ion collecting Langmuir probe is charged negatively in reference to the nearby plasma potential to collect ions from the plasma stream. The probe 53 consists of the disc-electrode 53b which serves as ion collector. The ions from the plasma stream are collecting by the front ion collecting surface of the disc 53b, while the rest of the probe is shielded by insulated shield 53a to exclude ion collection by other sides of the probe than its front ion collecting surface 53b. The maximum ion saturation current will be collected when the axis of the probe 53 is parallel to the path of the arc plasma ion flow 27 or, the plane of the ion collecting disc surface 53b is perpendicular to the arc plasma ion flow 27. Alternatively, the mass flow collector such as quartz crystal microbalance (QCM) based probe as for example Inficon XTC/C thin film deposition controller, can be used to measure the mass flow of metal vapor ions within arc plasma ion flow 27. The QCM probe 54 is shown schematically in FIGS. 8a and 8b. In this design the probe position can be adjusted both by reciprocal movement and by rotation which allows changing the angular position of the quartz crystal in relation to the ion flow streamlines. The maximum metal ion flux will be collected by the QCM sensor when the quartz crystal plane 54c is oriented perpendicular to the arc plasma ion flow 27.

Orienting the stream baffle 41 to the direction generally perpendicular to the plane of the ion collecting area measuring maximum ion flux value, i.e. to minimize an angle between the plasma stream lines 27 and the faces of the baffles 41, will minimize target ion losses on the stream baffles 41, maximize the total ion current downstream of the stream baffles 41, and consequently the rate of deposition, will be at its maximum. Each stream baffle 41 may thus be provided with an adjusting means such as a knob or lever (not shown), to independently orient each stream baffle 41 tangentially relative to the plasma stream lines 27 traversing the stream baffle 41 at that point. Each stream baffle 41 can optionally also be provided with a means for the measurement the ion current collected by the baffle 41. In this case, via a feedback system the stream baffle's positioning drive will orient the baffles 41 in a way to minimize the ion current collecting by the baffle therefore minimizing the metal vapor plasma losses. Alternatively, the stream baffle orientation can be optimized by measuring the total ion current collecting by the substrate holder 2. The optimal orientation of the stream baffles 41 will be achieved when this output ion current reaches its maximum value.

It will thus be apparent that the stream baffles 41 can also be disposed across a portion of the plasma stream 27 which does not curve, in which case they are still working fairly effective for filtering macroparticles out of the plasma stream 27. Since ions in the arc plasma have (in general) trajectories that are parallel to the magnetic force lines 25 within the plasma duct 44, so long as the stream baffles 41 are oriented at a tangent to the magnetic force lines 25 a large portion of macroparticles entrained in the plasma stream 27 will be filtered out, while most ions of the selected charge will traverse the stream baffles 41 without difficulty. FIG. 8a illustrates an example of this embodiment, in which rough filtration of macroparticles takes place before the plasma stream 27 starts to deflect. In this case a single adjusting means can be used to adjust all baffles 41 simultaneously, since in the straight portion of the plasma stream all stream lines 27 are roughly parallel to one another. This preliminary macroparticle filtration allows a reduction both in the distance between the deflecting region of the plasma stream 27 and the substrates 4 and in the degree of curvature of the plasma duct 44, and results in an increase in productivity. Additional stream baffles 41 may be disposed across the deflecting portion of the plasma stream 27 for more precise filtration. In general a set of stream baffles 41 can be disposed across the plasma vapor stream in any place between the cathode target and the exit flange of the exit tunnel portion 46 of the plasma duct, preferably aligned along the direction of the local magnetic field lines on site of their position, in which the baffles are oriented generally tangential to magnetic field force lines at the point of each of the respective locations of the baffles.

It will also be apparent that the stream baffles 41 can be used for both element and isotope separation. Ideally the stream baffles 41 are disposed where the arc plasma stream 27 has the smallest radius of deflection in the magnetic field, where ions with different ion mass/charge ratios have significantly different trajectories. In this case if the gaps or channels formed between adjacent stream baffles 41 are parallel to the trajectory of one given kind of ion with a specific mass/charge ratio, the stream baffles 41 will be virtually transparent to the selected ions. Other ions with different mass/charge ratios will have different trajectories and will largely run into the faces of the baffles 41 and be trapped, an effect which may be called "inertial plasma-optical separation." In comparison with a conventional mass spectrometer, which separates ion flows in a single path, the inertial plasma-optical separator separates ions in a high current plasma flow, which results in much greater productivity.

Figure 8D:
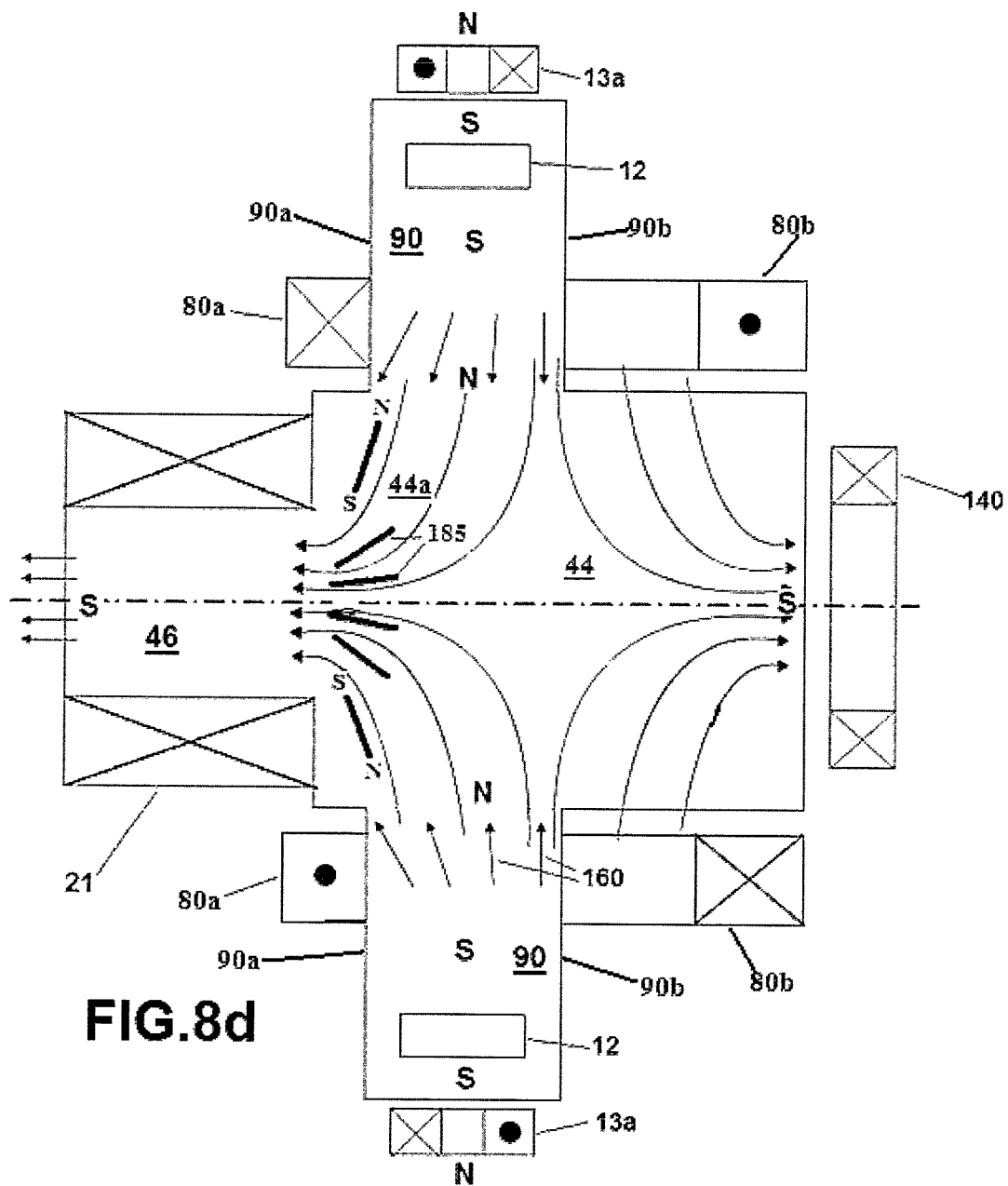
FIG. 8d is a schematic view of a further embodiment of the filtered multi-cathode arc source shown in FIG. 7a utilizing a set of stream baffles installed at the entrance into the tunnel portion of the plasma duct chamber, in an embodiment.

The axes of the stream baffles 41 can be aligned either parallel or transversal to the direction of the plasma flow, but the surface of the stream baffles 41 has to be aligned as close as possible to the direction parallel (tangential) to the direction of the plasma flow at the site of location of the stream baffles 41 so that the plasma flow streamlines will not cross the surface of the stream baffles 41. The best orientation of the stream baffles is tangential to the direction of the plasma flow at the location of the stream baffles 41. The closest approximation to this ideal orientation is to align the steam baffles 41 parallel (tangential) to the external magnetic deflecting and/or focusing force lines at the location of the stream baffles 41. In this case the axes of the stream baffles can be aligned either parallel or perpendicular to the external deflecting and/or focusing magnetic force lines. The easiest way to setup the orientation of the stream baffles 41 is to align them parallel (tangential) to the direction of the magnetic force lines 25 at the location of the stream baffles 41, in which the baffles 41 are oriented generally tangential to magnetic field force lines 25 at the point of each of the respective locations of the baffles 41. If stream baffles 41 made of metal strips are parallel (tangential) to the direction of the magnetic force lines 25 and electrically isolated, they will be charged positively due to the much larger mobility of heavy ions across the magnetic force lines 25 compared to magnetized electrons. The orientation of the stream baffles 41 in a direction tangential to the magnetic force lines 25 can be achieved by individual control of the position of each stream baffle 41 by suitable mechanical means. Alternatively, the stream baffles 41 or at least a portion of them can be made of magnetic materials which will result in their orientation along the magnetic force lines 25 automatically as illustrated in FIGS. 8c and 8d. In this embodiment of the invention stream baffles 185 are positioned at the exit of the cathode chamber 90 and made of ferromagnetic alloy such as iron or Sm—Co which make them capable of automatically adjusting their orientation along the magnetic force lines 160a providing maximum transparency for the metal vapor plasma stream 160. The baffles made of magnetic material can be magnetized providing that the direction of the magnetic force lines between the neighbor baffles coincides with the direction of the external deflection and/or focusing magnetic field at the location of the given pair of the neighbor baffles. It is appreciated that only top and/or bottom of the baffles 185 are made of magnetic materials while the main portion of the baffles 185 can be made of stainless steel, titanium or other non-magnetic metal alloy or non-metal materials such as ceramics or glass.

Generally, the stream baffles 41 can be positioned anywhere between the cathode 12 in a cathode chamber 90 and the exit of the tunnel portion 46 of the plasma duct 44. For instance, the stream baffles 41 can be installed in front of the cathode 12 in cathode chamber 90, as illustrated in FIG. 8a, typically spaced from the cathode target surface at the distance of 1 cm to 10 cm where they can also serve as additional anode to improve the stability of cathodic arc spots on cathode target 12 and therefore reduce the probability of extinguishing the vacuum arc discharge. The baffles 41 installed in front of the cathode target 12 may have a positive potential in reference to the cathode 12 or be insulated and have a floating potential. When the baffles are installed too close to the cathode target 12 surface (e.g. less than 1 cm) it can result in extinguishing of the arc spots and overheating the baffles. When the baffles are installed at the distance greater than 10 cm from the cathode target 12 surface, their influence on arc spot steering and sustainability of the vacuum arc process is found to be negligible. The preferable position of the stream baffles will be in locations where the magnetic field force lines are bending. In this case the stream baffles will be declined in relation to the axes and walls of the cathode chamber 90 and/or plasma duct 44 and will trap the macroparticles, neutral particles and heavy ions more effectively. For instance the stream baffles 41 can be positioned at the entrance of the plasma duct 44 adjacent to the cathode chamber 90 and the declining portion 44a of the plasma duct 44. Alternatively, the stream baffles 185 can be positioned at the entrance of the tunnel portion 46 of the plasma duct 44 as shown in an embodiment of filtered cathodic arc deposition method and apparatus of present invention shown in FIG. 8d. In this embodiment of the invention the stream baffles 185 made of magnetic alloy are positioned across the entrance of the tunnel portion 46 of the plasma duct 44. The stream baffles 185 are aligned along the magnetic force lines 25 providing optimized conditions for metal ion transport through the series of stream baffles 185 while at the same time dramatically increasing the efficiency of removing the macroparticles from the metal vapor plasma stream. Wall baffles (not shown) may also be installed on all walls not occupied by arc sources both in cathode chamber 90 and in plasma duct chamber 44.

Figure 8E:
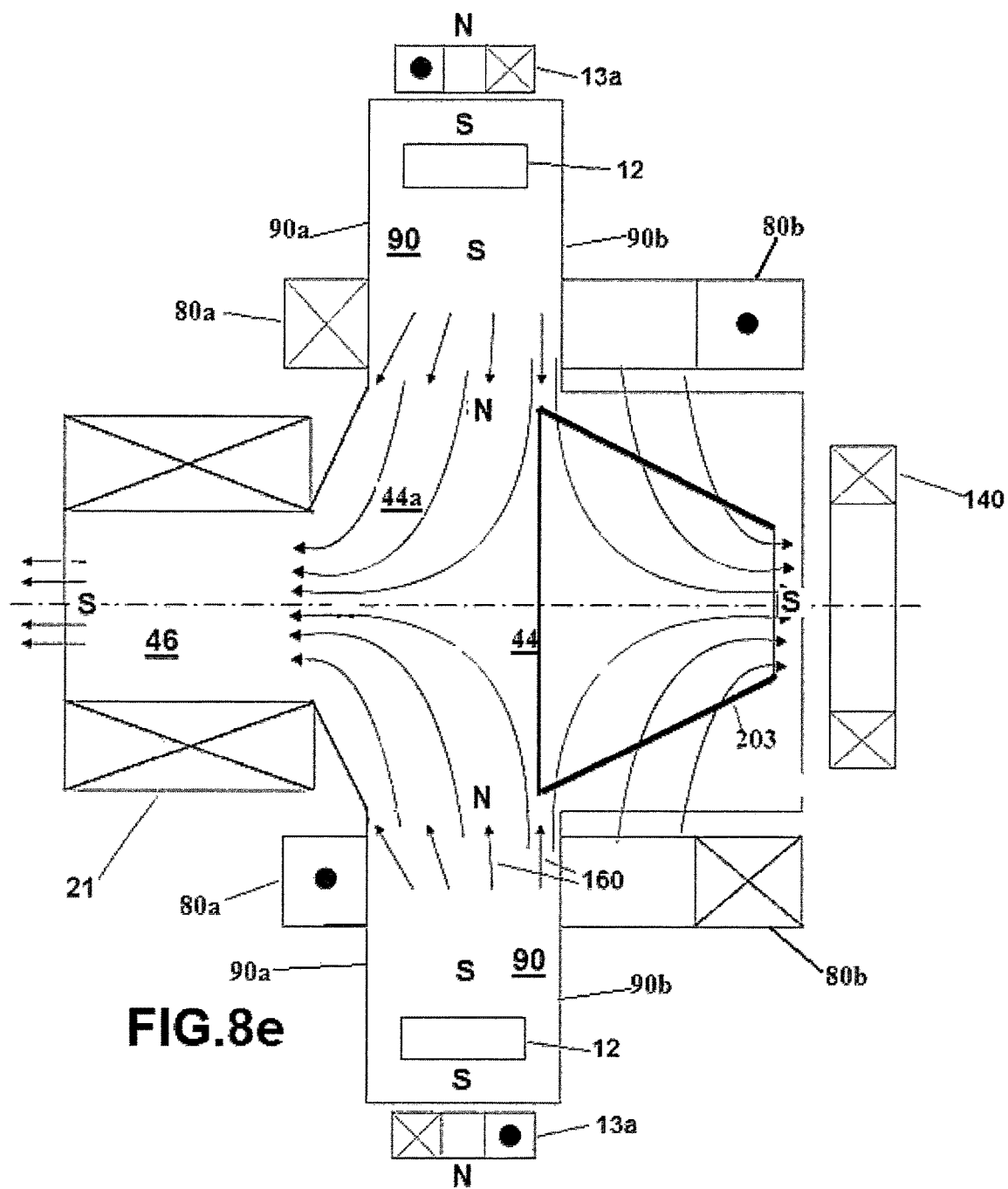
FIG. 8e is a schematic view of a further embodiment of the filtered multi-cathode arc source shown in FIG. 7a utilizing a cone macroparticle trap attached to the back wall of the deflecting portion of the plasma duct, in an embodiment.
Figure 8F:
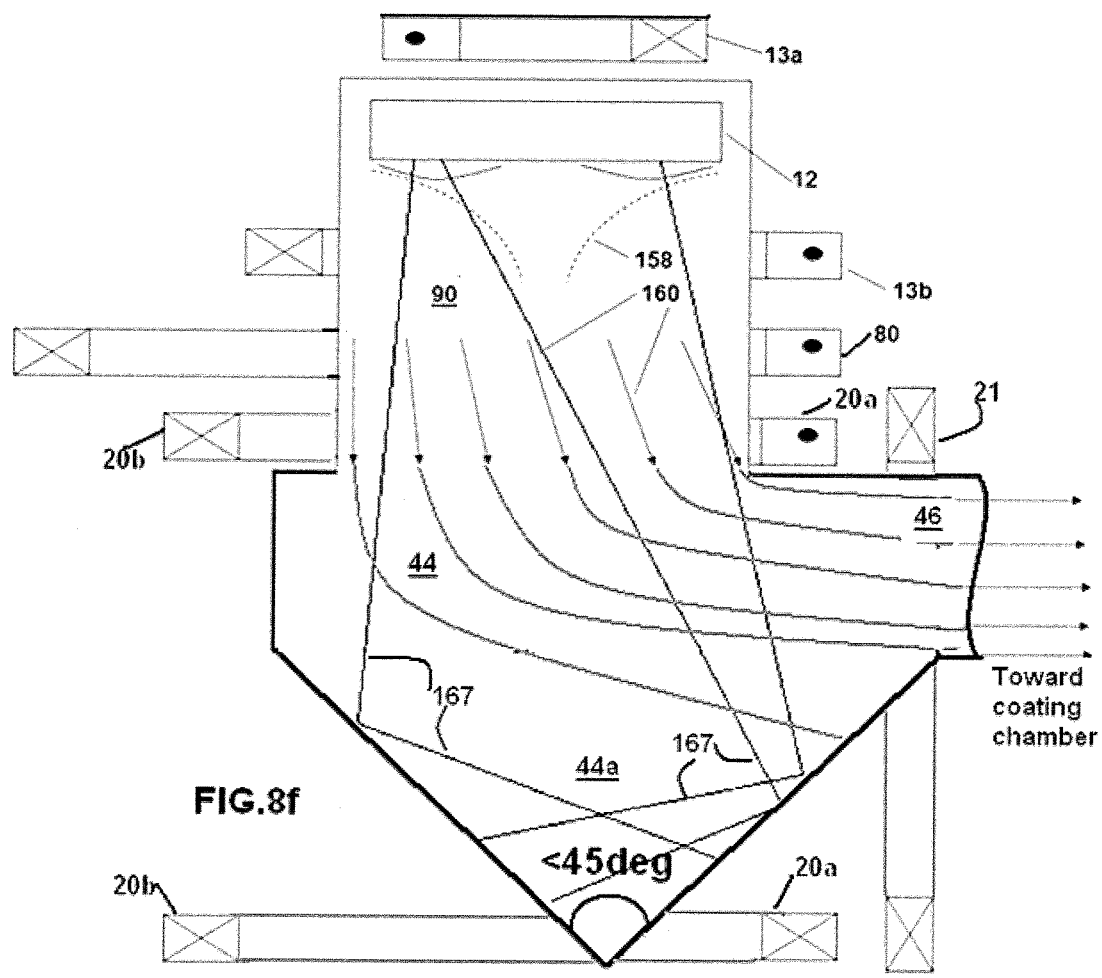
FIG. 8f is a schematic view of a further embodiment of the unidirectional filtered cathodic arc source shown in FIG. 8e utilizing a cone macroparticle trap attached to the wall of the deflecting portion of the plasma duct opposite to the cathode chamber, in an embodiment.

Additionally, a cone macroparticle trap 203 can be installed at the back side of the plasma duct 44 as illustrated in an embodiment of filtered cathodic arc deposition method and apparatus of present invention shown in FIG. 8e. In the case of a circular plasma duct 44 this conical trap 203 can be made as a cone with cone angle preferably less than 45° which will allow effective trapping of any macroparticles that can impact the internal surface of the trap 203. In the case of a rectangular plasma duct 44 a back trap can be formed from two metal sheets declined to each other creating an opening as a planar angle of preferably less than 45° as illustrated in FIG. 8f. In this case the metal vapor plasma will be transported through the deflecting portion 44 of the plasma duct by a pair of offset declining coil 80 and (optionally) a pair of declining coils 20 followed by focusing at the exit tunnel portion 46 of the plasma duct 44 by the focusing coil 21, while the macroparticles will be effectively trapped inside of the flat angle trapping portion 44a of the plasma duct 44.

Figure 8G:
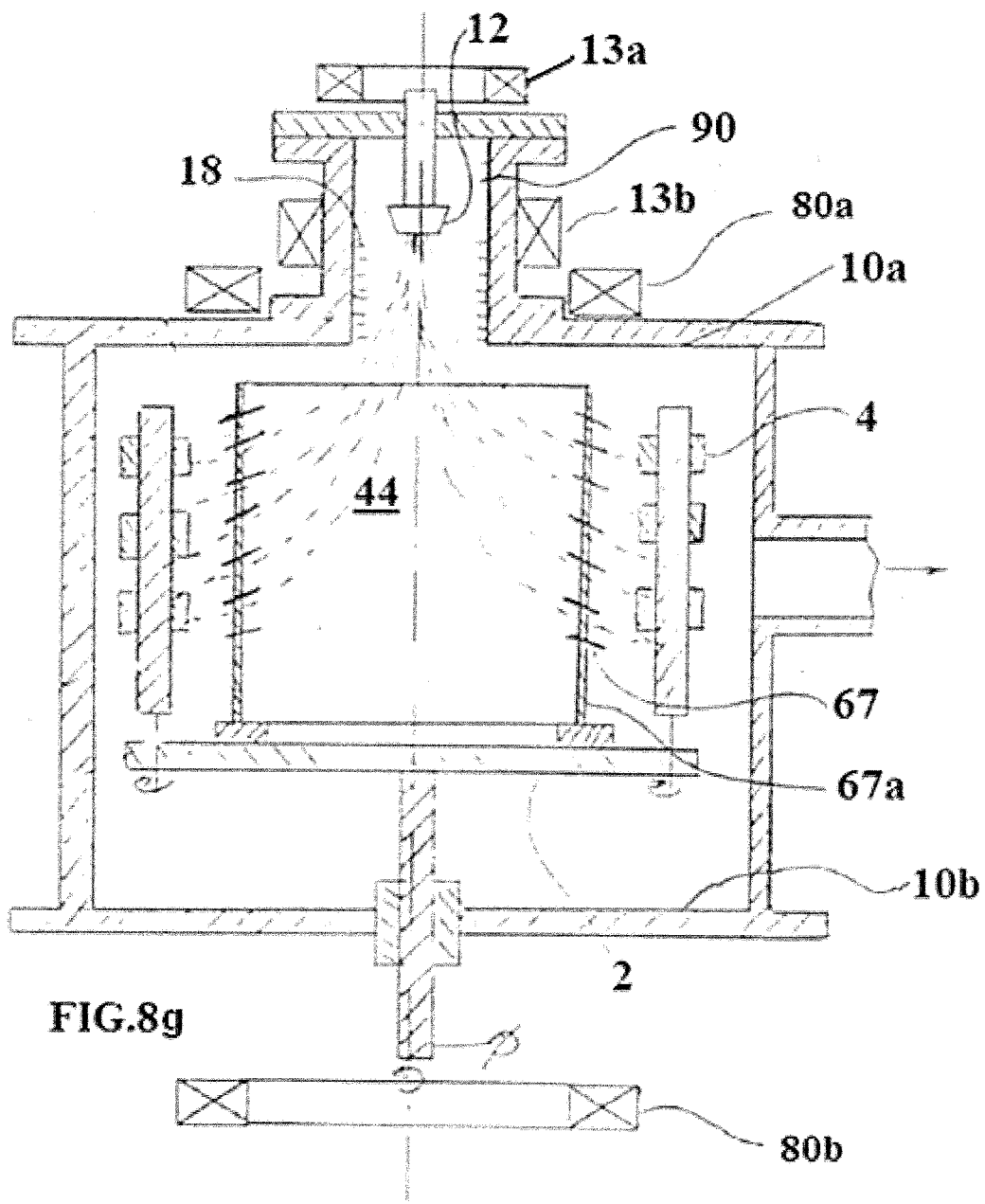
FIG. 8g is a cross-sectional plan view of a further embodiment of the apparatus of FIG. 8a utilizing a stream baffles with a main chamber acting as a plasma duct, in an embodiment.
Figure 8H:
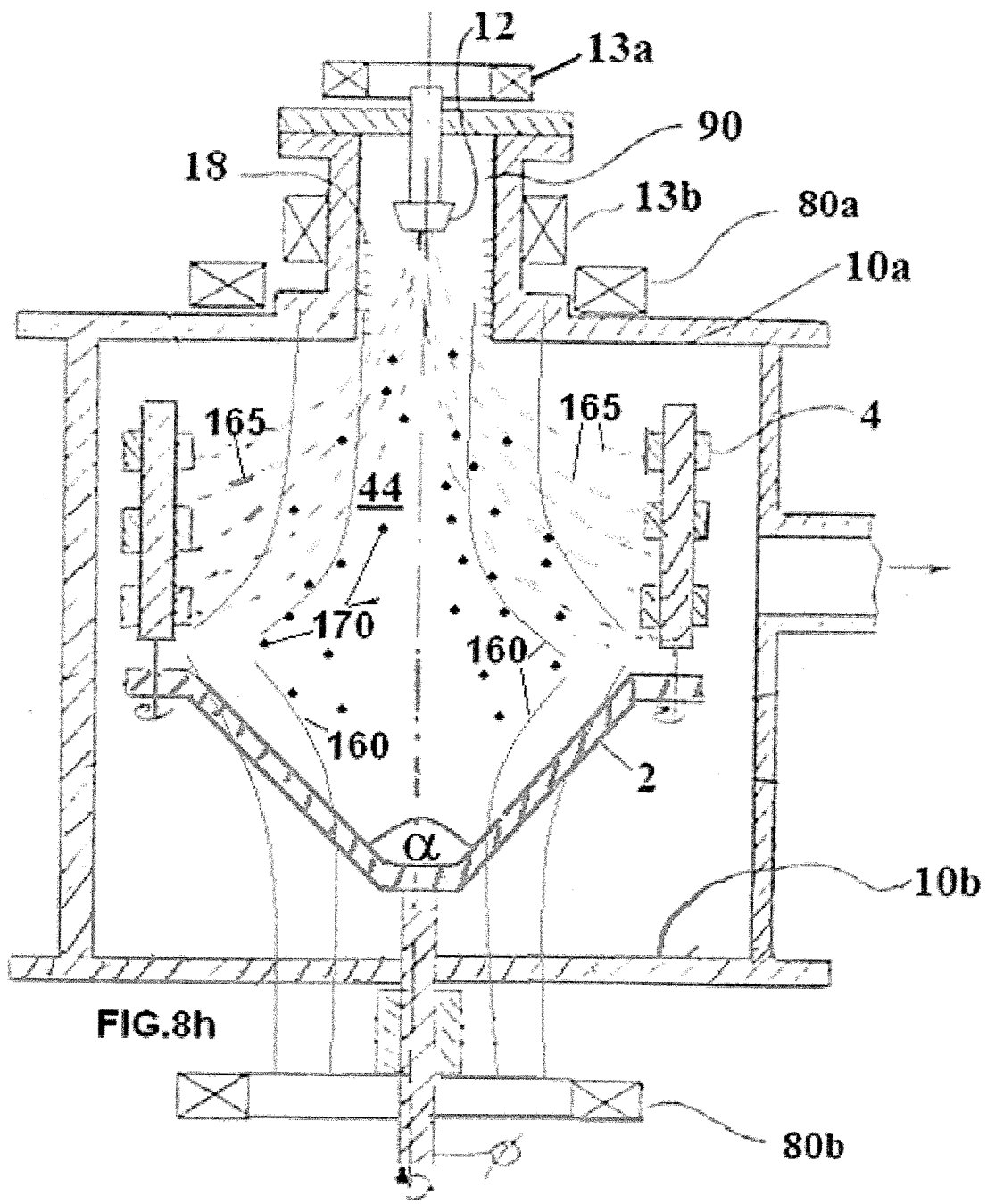
FIG. 8h is a cross-sectional plan view of a further embodiment of the apparatus of FIG. 8g utilizing a cone macroparticle trap opposite to the cathode chamber, in an embodiment.

In a further variation of this embodiment, illustrated in FIG. 8g, the plasma stream radiates outwardly from the center and contacts all substrates 4 simultaneously. In this case a pair of coaxial deflecting coils 80 surrounds the main chamber 10. One coil 80b is positioned underneath the bottom flange 10b of the main chamber 10 and other 80a above the carousel substrate turntable 2. The cathode chamber 90 is connected to the top flange 10a of the main chamber 10. The cathode chamber 90 has a cathode assembly 12 with steering and focusing coils 13 and preferably wall baffles 18. The plasma duct 44 is effectively created by the substrates 4, the substrate turntable 2 and the wall 10a of the main chamber 10 adjacent to the plasma source. Stream baffles 67 may be installed on baffle holders 67a in front of the substrates 4, which makes this filtered cathodic arc source fully integrated into the main chamber 10 layout. Alternatively, the conical macroparticle trap with cone angle preferably less than 45°, integrated within the substrate holding platform 2, can be installed opposite to the cathode target 12 as illustrated in FIG. 8h.

Figure 10A:
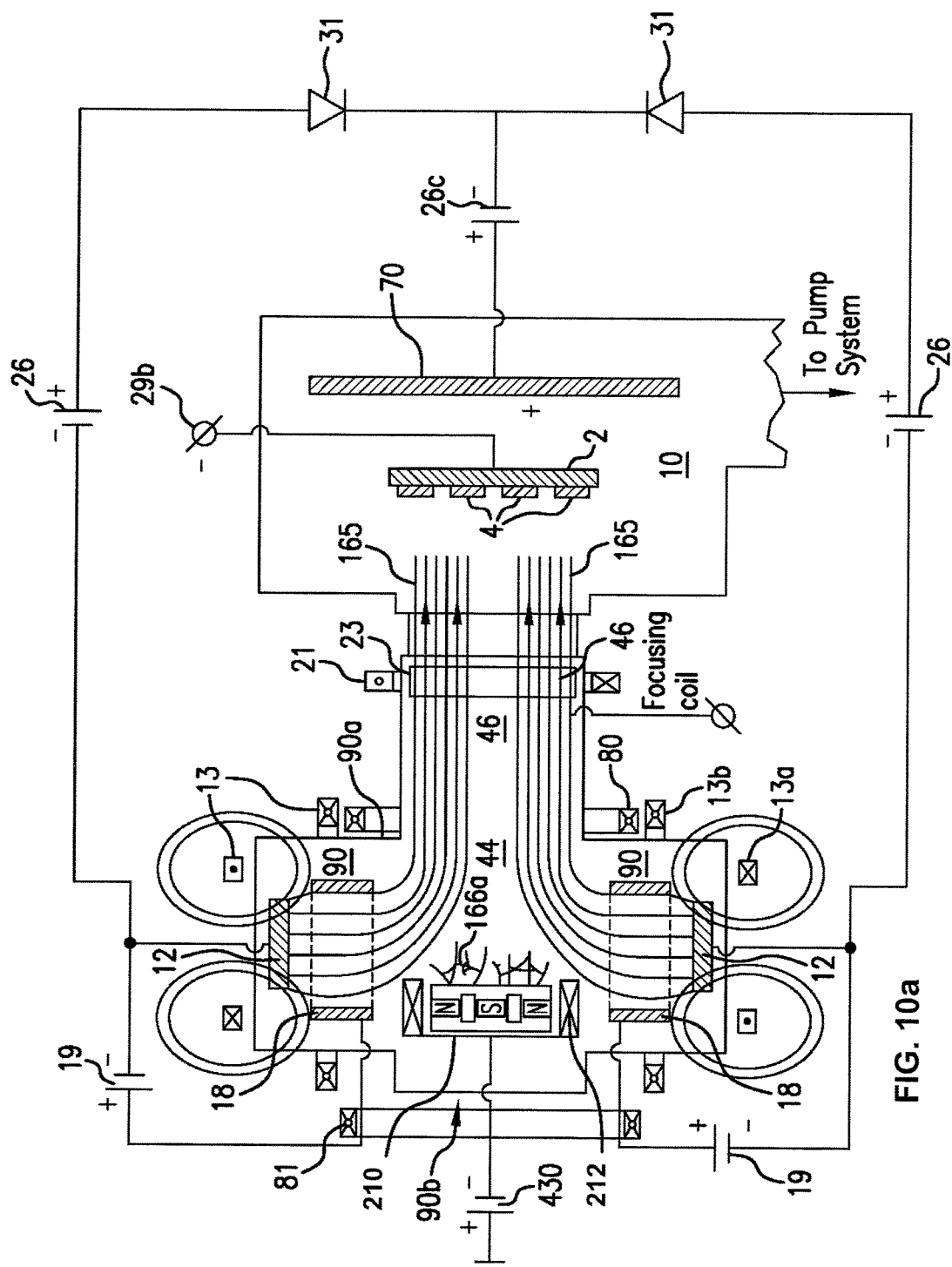
FIGS. 10a, 10b and 10c are schematic plan view embodiments of filtered cathodic arc deposition apparatus providing a hybrid layout of the filtered cathodic arc source shown FIG. 4b in combination with the magnetron sputtering source installed in the plasma duct chamber.

Embodiments of the filtered cathodic arc coating deposition method and apparatus of present invention provide a hybrid layout of the filtered cathodic arc source coupled with magnetron sputtering sources or gaseous plasma sources to increase mass flow rate and ionization of the metal-gaseous vapor plasma. Such embodiments are shown schematically in FIGS. 10a, b, c, d and e. FIG. 10a illustrates an apparatus embodying a preferred embodiment of the invention utilizing a filtered cathodic arc source containing two primary cathodic arc sources with cathode targets 12 disposed in two opposite cathode chambers 90 in communication with a plasma duct 44 and having a magnetron sputtering source 210 disposed (generally symmetrical in relation to the plane of symmetry of the rectangular plasma duct 44 or coaxial to the tubular plasma duct 44), magnetically coupled with filtered cathodic arc source. The magnetron 210 is installed in the plasma duct 44 along the plane of symmetry of the plasma duct 44. An optional coil 212 creates a magnetic field which overlaps the magnetron magnetic field in front of the magnetron target and has the same direction both as magnetron magnetic field in front of the magnetron target and the deflecting magnetic field produced by offset deflecting coils 80 and 81. The earlier deflection of the magnetic force line by offset deflection coils 80 and 81 allows the cathodic arc vapor plasma stream to flow past the magnetron without substantial losses on surface of the magnetron. This advantageous feature of the present invention is also allows the magnetron to be positioned further from the back wall 44a of the plasma duct 44 and closer to the entrance into the exit tunnel portion 46 of the plasma duct 44, which effectively increases the deposition rate of the magnetron sputtering source while providing a concurrent filtered cathodic arc-magnetron hybrid deposition process. The magnetron 210 can be optionally provided with mechanical shutter (as shown in FIG. 4f) which can be used to protect the magnetron target for poisoning by coatings deposited from the filtered cathodic arc vapor plasma flow coming from the adjacent cathode chambers 90 when the cathode targets 12 and sputtering target of the magnetron 210 are made of different materials. Alternatively the exit openings of the cathode chambers 90 can be also provided with mechanical shutters similar to that shown in FIG. 4f. In this case the cathode chamber mechanical shutters should be impermeable for heavy particles such as ions and neutral particles, but they should have openings, which allow electrons freely passing throughout the shutters toward plasma duct 44 and continue its way further toward distal anode 70 installed within the substrate chamber 10. In this case the primary cathodic arc discharge will be extended from the cathode chamber 90 toward substrate chamber 10 by the power supply 26 in which the negative pole is connected to the cathode target 12 in cathode chamber 90 and the positive pole is connected to the distal anode 70 in the substrate chamber 10. This unidirectional hybrid filtered cathodic arc-magnetron vapor plasma source merges filtered cathodic arc plasma generated by the primary cathodic arc sources, respectively associated with cathode targets 12, of the filtered cathodic arc plasma source with a sputtering flow generated by the magnetron source 210 into one integrated vapor plasma stream having controlled concentration of metal ions directed toward the substrates 4 to be coated in the substrate chamber 10.

The cathodic arc targets 12 and the target of magnetron 210 can be made of the same material or different materials. In this design the magnetron can be a conventional DC, DC pulse or RF magnetron or a high pulse powered magnetron. This design allows for the simultaneous operation of all evaporation sources, providing a high sputtering rate of the planar magnetron source 210 concurrent with 100% ionized metal vapor flows coming from the cathode chamber 90 and overlapping the magnetron sputtering flow.

Figure 10B:
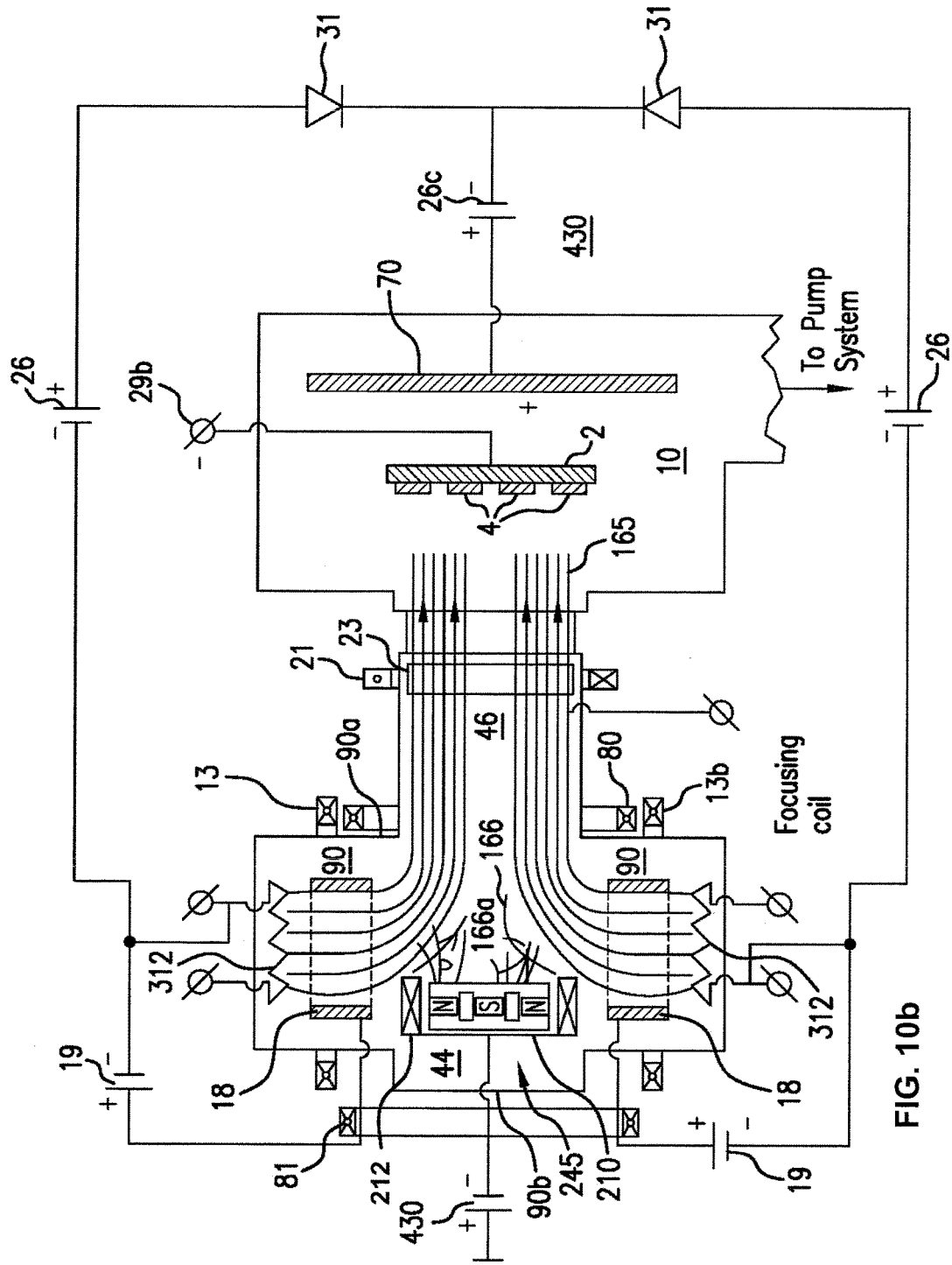

In the further variation of this embodiment illustrated schematically in FIG. 10b, the thermionic arc sources with thermionic filaments 312 and thermionic heating power supply (not shown) are be installed in a cathode chambers 90 instead of cathodic arc evaporators based on vacuum arc discharge. The thermionic filament 312 may be biased to the negative potential ranging from −10 volts to −25,000 volts by power supply 19. The filament bias less than −10V does not emit electrons with high enough energy for excitation and ionization of the plasma environment whilst filament bias exceeding −25,000 V may result in damage of filaments by intense sputtering and breakdowns. This primary plasma discharge may be extended from the cathode chamber 90 toward substrate chamber 10 by the power supply 26 in which the negative pole is connected to the filaments 312 and the positive pole is connected to the distal anode 70 in the substrate chamber 10. In this case, a powerful flow of energetic electrons will be generated toward the magnetron sputtering plasma discharge area, crossing the sputtering metal atomic flow generated by the magnetron. It will allow increasing the ionization rate of the metal sputtering flow generated by magnetron source by orders of magnitude due to ionizing collisions between electrons generated by thermionic filaments 312 and metal atoms sputtered by the magnetron 210. Alternatively, the hollow cathode or plasma cathode can be used in cathode chamber 90 instead of thermionic filament cathode. In this case the plasma generating high voltage glow discharge or low pressure gaseous arc discharge is established between the cathode in the cathode chamber 90 and the anode positioned downstream the cathode near the exit opening of the cathode chamber 90. The electrons may be extracted from this discharge and accelerated by additional positive electrodes. The resulting high energy electron beam may be directed toward magnetron plasma discharge area resulting in increase of ionization of the magnetron sputtering atoms. For instance an anode grid 18 can be installed between the thermionic cathode and the exit of the cathode chamber 90. The high positive voltage ranging from 50 volts to 10,000 volts can be applied to the anode grid for forming and focusing a powerful electron beam directed toward the magnetron sputtering plasma area. The anode grid bias less than +50V does not generate electron beam with high enough energy for excitation and ionization of the magnetron sputtering plasma environment whilst anode bias exceeding +10,000 V may result in damage of anode or insulators by overheating and breakdowns. Optional focusing electrodes (not shown) can be installed in downstream to the cathode in a cathode chamber 90 to further increase the density of electron beams emitted toward magnetron discharge plasma area. Increase of the ionization rate of the metal sputtering atoms results in densification and improvement of structure and morphology of deposited coatings. At the same time by keeping the thermionic cathode filaments 312 within the cathode chambers 90 allows avoiding contamination of the magnetron target and the coating by metal atoms evaporated from the thermionic filaments. The exit openings of the cathode chambers 90 can be also provided with mechanical shutters (not shown) having the openings, which prevent the heavy particles such as ions and neutral particles from penetrating into the plasma duct, while at the same time allow electrons freely passing throughout the shutters toward the plasma duct 44 and continue its way further toward distal anode 70 installed within the substrate chamber 10.

Figure 10C:
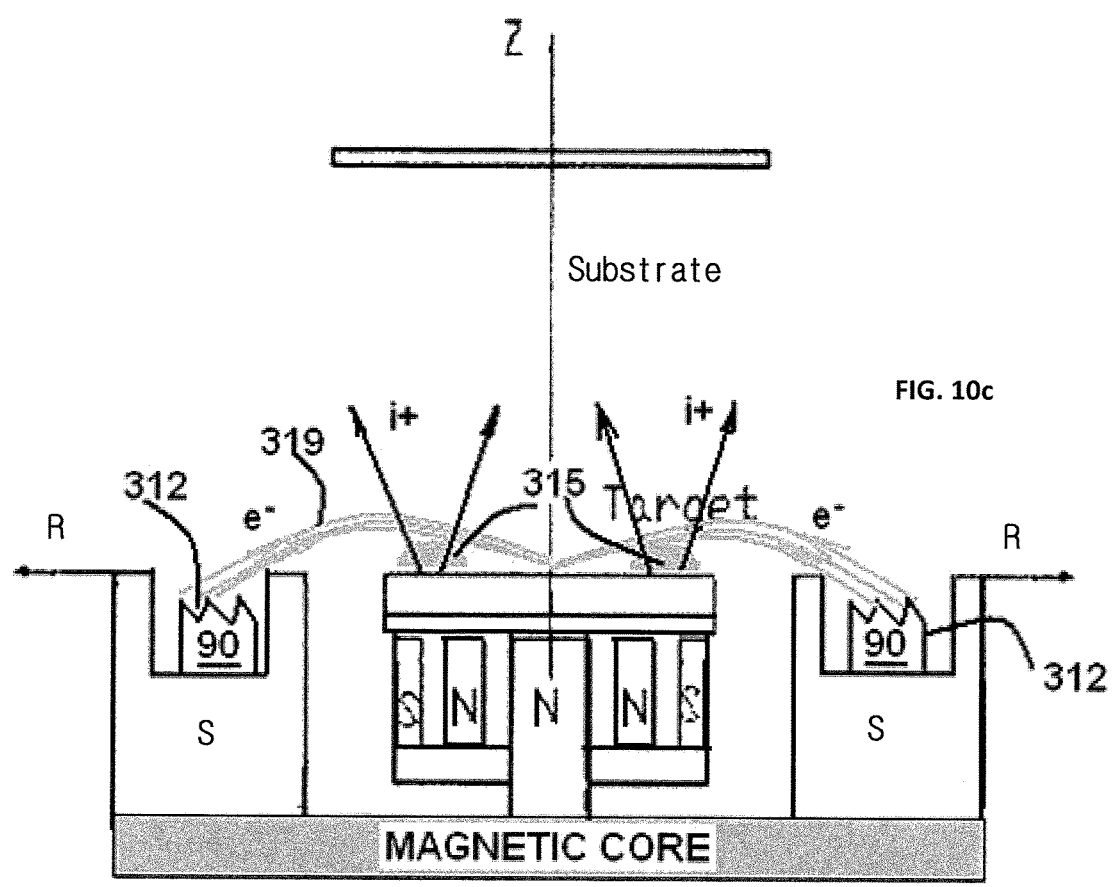

FIG. 10c illustrates a variation of the embodiment shown in FIG. 10b in which the thermionic arc filaments 312 are positioned within the cathode chambers 90 which are installed on the common magnetic core with the magnetron target. The electrons emitted by thermionic filaments 312 are propagating along the magnetic field lines 319 toward the center of the magnetron target overlapping the magnetron plasma discharge 315. The energy of the electron beams as determined by the negative bias voltage applied to the thermionic filaments in reference to the ground and/or to the distal anode 70 in the substrate chamber 10 ranges from −10 volts to −25000 volts. The filament bias less than −10V does not emit electrons with high enough energy for excitation and ionization of the plasma environment whilst filament bias exceeding −25,000 V may result in damage of filaments by intense sputtering and breakdowns. In this embodiment the thermionic filaments can be also replaced with an array of hollow cathodes.

Figure 10D:
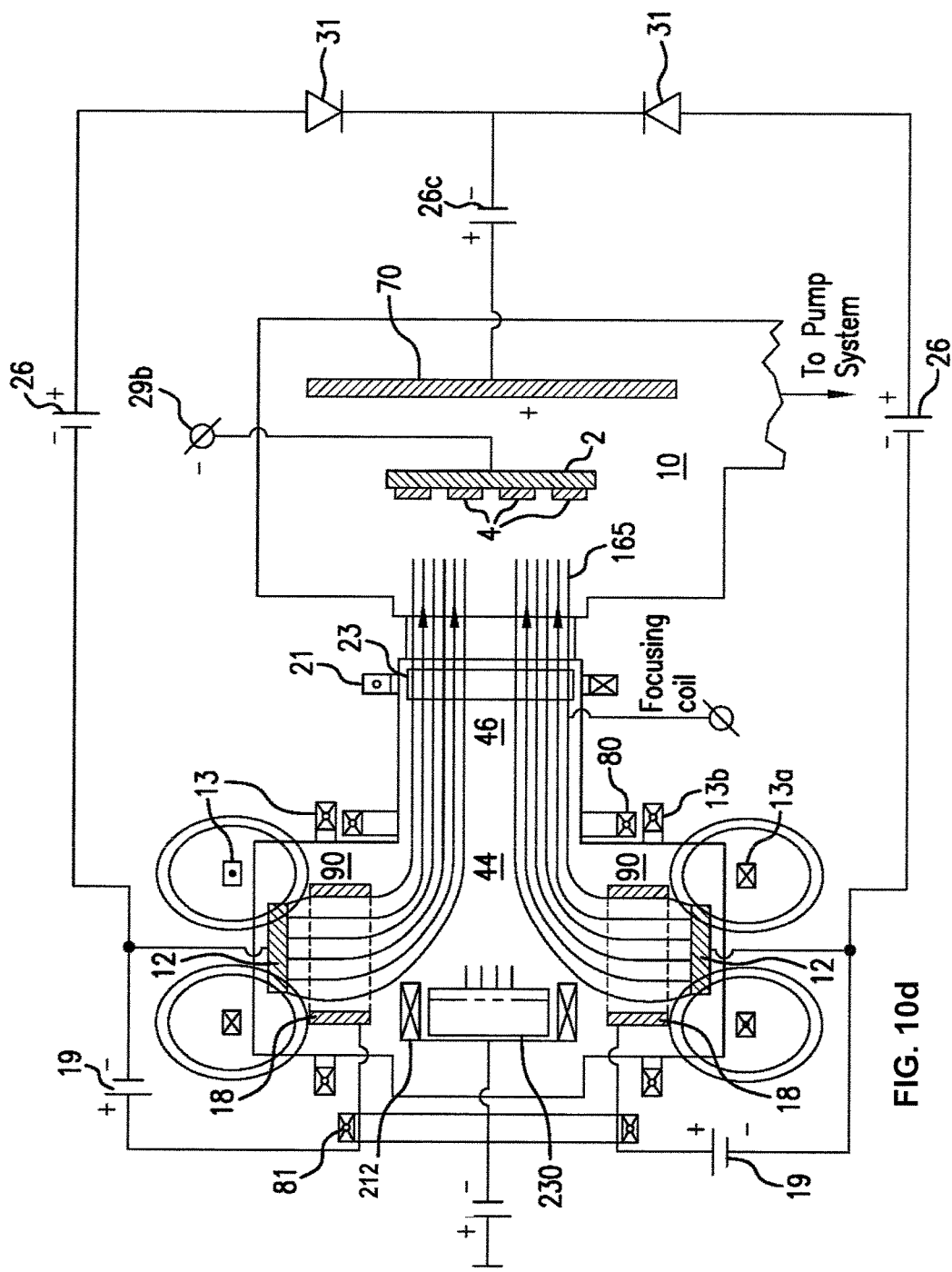
FIG. 10d is schematic plan view of one filtered cathodic arc deposition apparatus providing a hybrid layout of the filtered cathodic arc source shown FIG. 4b utilizing an ion source installed in the plasma duct chamber, in an embodiment.

The magnetron sputtering source 210 may be replaced with an ion beam source 230, either with an accelerating grid or griddles as illustrated in FIG. 10d. The ion beam source 230 is also disposed generally symmetrical in relation to the plane of symmetry of the rectangular plasma duct 44 or coaxial to the tubular plasma duct 44. In this embodiment of the invention the optional magnetic coil 212 can be installed surrounding the ion beam source 230 providing additional isolating magnetic field around the side surface and the front face of the ion beam source in the same direction as the deflecting field produced by the offset deflecting coils 80 and 81. This embodiment of the invention is capable of performing an ion beam-assisted filtered cathodic arc deposition process enable to deposit coatings with ultra-fine structure and superior functional properties such as TiSiNC nanocomposite coating. Alternatively, the shielded vacuum arc cathode source can be used as a source of ionizing electron current instead of ion beam source. In this variation the cathode chamber 90 has a shield similar to one shown in FIG. 4f, positioned in front of the cathode target 12, which is impermeable for the heavy particles such as ions and neutral particles, but has an openings, which permit electrons to flow along the plasma duct 44 toward the distal anode 70 in the substrate chamber 10, when a secondary arc power supply (not shown) is turned on and a secondary arc is established between the cathode 12 in a shielded cathode chamber and the distal anode 70. The shielded cathode chamber 90 can also serve as a primary anode to sustain a primary arc discharge in a shielded cathode chamber 90.

Figure 10E:
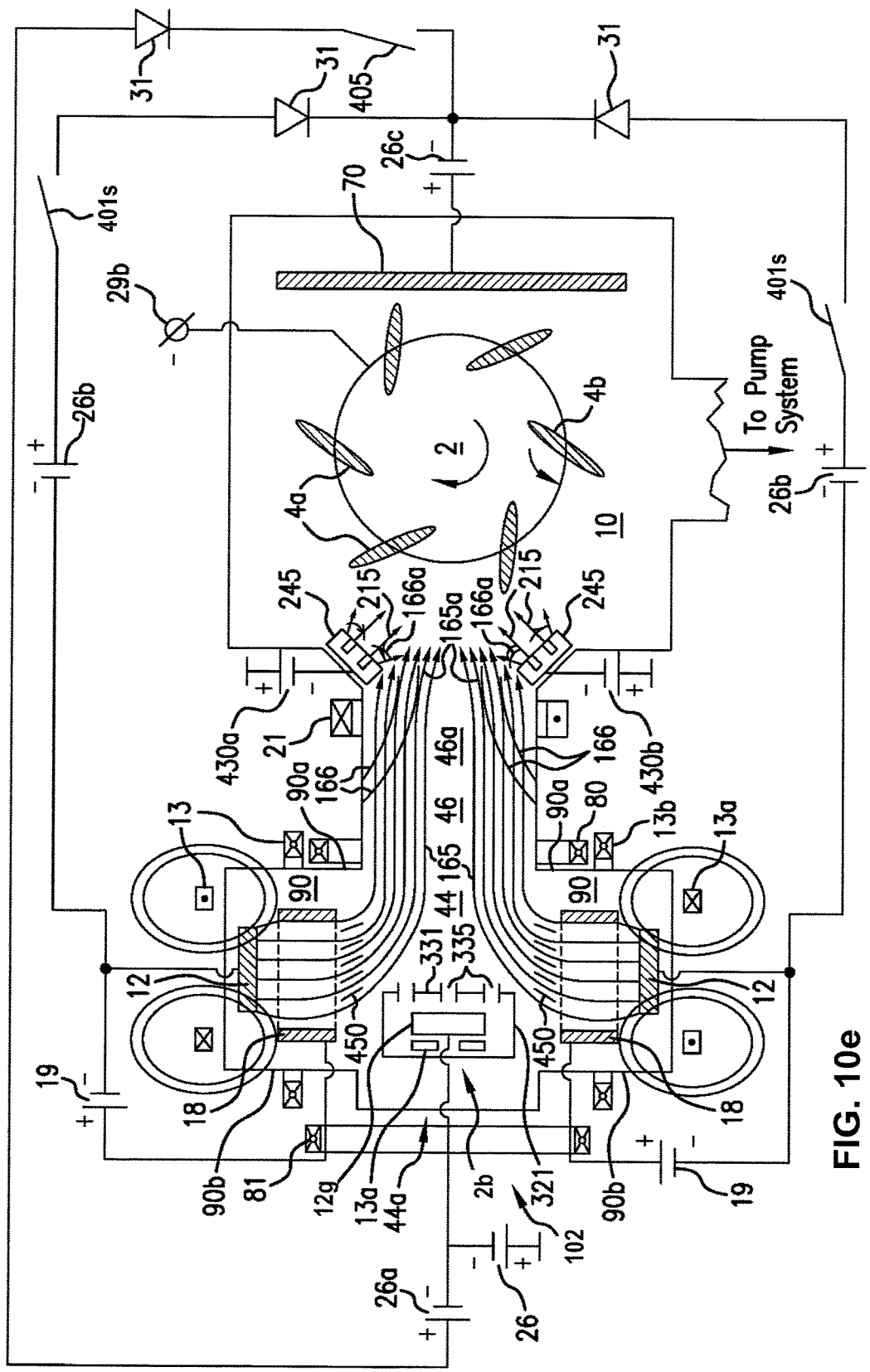
FIG. 10e is a variation of a hybrid of the filtered cathodic arc source shown in FIG. 10d utilizing a shielded cathodic arc source installed near the back wall of the plasma duct and two magnetron sputtering sources installed at the exit of the plasma duct magnetically coupled to the filtered-arc source, in an embodiment.

FIG. 10e illustrates a further preferred variation 102 of a hybrid filtered cathodic arc-magnetron source, utilizing a shielded cathodic arc source 2b disposed generally symmetrical in relation to the plane of symmetry of the rectangular plasma duct 44 or coaxial to the tubular plasma duct 44, near the back wall 44a of the plasma duct 44 and two magnetron sputtering sources 245 magnetically coupled with the dual filtered cathodic arc source 1. The design of this variation incorporates the advanced coating and surface treatment system described in D. G. Bhat, V. I. Gorokhovsky, R. Bhattacharya, R. Shivpuri, K. Kulkarni, "Development of a Coating for Wear and Cracking Prevention in Die-Casting Dies by the Filtered Cathodic Arc Process," in Transactions of the North American Die Casting Association, 20th International Die Casting Congress and Exposition, Cleveland, Ohio, November 1999, pp. 391-399, the entire disclosures of which are hereby incorporated by reference and method of controlling vapor plasma flow taught by U.S. Pat. Application No. 2011/0100800 to Gorokhovsky which is incorporated by reference. The shielded cathodic arc source 2b consists of the cathode chamber 321 which can also serve as a primary anode to sustain the primary arc discharge between the cathode 12y and the cathode chamber 321 as a primary anode. It is appreciated that the primary anode can be installed within the cathode chamber 321 isolated from the cathode chamber 321. The primary anode can be grounded or connected to the positive pole of the primary arc power supply (not shown). The shield 331 has to be installed in front of the cathode 12y to isolate the cathode from the plasma duct 44. The shield 331 in front of the cathode 12y should be impermeable for heavy particles such as ions and neutral particles, but it should have openings 335, which permit electrons to flow into the plasma duct 44 and continue its way further toward distal anode 70 installed within the substrate chamber 10. The power supplies 26a and 26c are installed (in series) between the distal anode 70 in a substrate chamber 10 and the cathode 12y in the shielded cathode chamber 321 to establish a remote arc discharge between the cathode 12y of the shielded cathodic arc source 2b positioned inside of the plasma duct 44 of the hybrid filtered cathodic arc-magnetron source 102 and the distal anode 70. Alternatively the shielded cathodic arc source 2b can be positioned elsewhere in the coating chamber 10 and distal anode 70 can be positioned within the plasma duct 44 of the hybrid filtered cathodic arc-magnetron source 102. In this case the secondary arc discharge can be established between the cathode 12y of the shielded cathodic arc source 2b disposed in the coating chamber 10 and the distal anode 70 positioned within the plasma duct 44 of the hybrid filtered cathodic arc-magnetron source 102, preferably adjacent to the back wall of the plasma duct 44. The secondary arc discharge improves ionization in the substrate chamber and is particularly useful for ion cleaning and plasma conditioning of the substrates prior to coating deposition process, for ion implantation, ionitriding and low pressure plasma assisted CVD coating deposition processes. The remote arc discharge can be also used to improve ionization of the magnetron sputtering plasma when magnetron sputtering sources 245, magnetically coupled with filtered cathodic arc source 1, are installed adjacent to the plasma duct 44 and the substrate chamber 10. In the variation of the invention illustrated in FIG. 10e the magnetron sources 245, magnetically coupled with filtered cathodic arc source 1, are positioned at the exit 46a of the tunnel portion 46 of the plasma duct 44 adjacent to the substrate chamber 10 and to the tunnel portion 46 of the plasma duct 44 facing the same spot at the substrate table 2 with substrates to be coated 4 as the exit tunnel 46 of the filtered arc source 1. The sputtering cathode targets of the magnetrons 245 are facing the substrates to be coated 4 such that the metal sputtering flow 215 generated by the magnetrons 245 is directed toward the substrates to be coated 4 in the substrate chamber 10. The focusing magnetic field force lines 166 generated by the focusing coil 21 at the exit 46a of the tunnel section 46 of the plasma duct 44 overlap a portion of the magnetron magnetic field 166a adjacent to the focusing coil 21 and directions of these force lines coincide. At the same time, the vapor plasma flow 165 generated by the cathodes 12 of the filtered cathodic arc source overlap the sputtering metal atomic flow 215 thereby providing a controlled ionization of the sputtering metal flow. The ionization rate of the metal sputtering atoms in the conventional DC magnetron sputtering flow is very low, generally below 0.1% of the sputtering atoms. The mixed filtered cathodic arc plasma/magnetron sputtering flow generated by the hybrid magnetron-filtered cathodic arc source shown in FIG. 10e overcomes this drawback of the conventional magnetron sputtering by providing a controllable ionization rate as the ion-to-(ion+ atoms) ratio ranging from 0% to 100%. This can be accomplished either by balancing the ion current output of the filtered cathodic arc source by changing the cathodic arc currents or by operating the deflecting system of the filtered cathodic arc source in a pulse mode with duty cycle ranging from 0% to 100%. At the same time the power applied to the magnetron source can be varied to control the output of the mostly neutral sputtering atoms flow. The same goal of controlling the magnetron sputtering rate can be achieved by optionally using mechanical shutters (not shown) to periodically close off the sputtering targets of the magnetrons 245. The target's mechanical shutters can be also used to protect the magnetron target from the coatings deposited from the filtered cathodic arc vapor plasma flow 165 when the cathodes 12 in the cathode chamber 90 and targets of the magnetron sources 245 are made of different materials. The ionized metal vapor flow is known to be beneficial for the coating quality by increasing the density of the coatings, adhesion of the coatings to the substrates, reducing the roughness of the coatings and reducing the density of the coating defects via intense ion bombardment of the substrate surface during coating deposition process. The unidirectional hybrid magnetron-filtered cathodic arc source of FIG. 10e is also provided with switches 401s and 405 in the electrical circuit connecting cathodes 12 in a cathode chamber 90 to the distal anode 70 or connecting the cathode 12y in the cathode chamber 321 to the distal anode 70. When switches 401s are closed and switch 405 is open the secondary arc discharge can be established between the cathodes 12 in the cathode chambers 90 and the distal anode 70. When switches 401s are open and switch 405 is closed the secondary arc discharge can be established between the cathode 12y in cathode chamber 321 and the distal anode 70. In refinement the stream baffles previously shown in FIG. 8d can be added to the hybrid magnetron-filtered cathodic arc source design of FIG. 10e. The design of the hybrid magnetron-filtered cathodic arc source including set of stream baffles 450 positioned near the exit of the cathode chamber 90 adjacent to the deflecting section 44 of the plasma duct. Stream baffles 450 allow improving macroparticle removal from the cathodic arc vapor plasma generated by cathodic arc targets 12, especially those macroparticles and neutrals which are not intercepting by the wall baffles.

The embodiment of filtered cathodic arc deposition method and apparatus of present invention shown in FIG. 11 illustrates a hybrid filtered cathodic arc-EBPVD source, utilizing the EBPVD evaporator integrated in the plasma duct of the unidirectional dual filtered cathodic arc source, providing a concurrent filtered cathodic arc assisted electron beam evaporation capability which combines the high evaporation rate of an EB-PVD process with the high ionization rate of filtered cathodic arc plasma. In this design the crucible 291 with evaporate is installed in the plasma duct on the side of the converging magnetic cusp directed toward the main chamber 10 with substrates to be coated (not shown). Two arc plasma streams 27 generated by primary cathodic arc sources (not shown) flow from the opposite direction forming a converging streamline following the deflecting magnetic force lines 25. Two electron beam guns 250 and 250a are installed on flanges of the plasma duct chamber adjacent to the cathode chambers (not shown). The electron beam guns 250 and 250a generate two electron beams 260 and 260a which enter the plasma duct area from opposite directions, crossing the deflecting magnetic field lines 25 and arc plasma streamlines 27. Under the influence of deflecting field magnetic force lines 25 the electron beams 260 and 260a shift toward the center of the plasma duct and at the same time toward back side of the plasma duct opposite to the main chamber, which ultimately move the electron beams 260 and 260a toward the surface of evaporate in the crucible 291. The crucible 291 can be connected to the positive pole of the arc power supply while the negative pole is connected to one or more primary arc cathodes installed in a cathode chambers. This effectively makes the crucible 291 serve as a second distant anode coupled with one or more primary arc cathodes. In this case a dense metal vapor plasma will be generated in the plasma duct by hot evaporated anode (HEA) having distributed diffused anode spot created on the surface of evaporate by e-beam heating combined with intense ionization as described in [R. L. Boxman, D. M. Sanders, and P. J. Martin, "Handbook of Vacuum Arc Science and Technology", Park Ridge, N.J.: Noyes Publications, 1995], which is incorporated herein by reference. The HEA plasma adds to ionization and activation ability of the filtered cathodic arc plasma stream.

Alternatively, the crucible 291 can be connected to the negative pole of additional arc power supply (not shown), while the positive pole can be grounded, which will make it serving as a cathode with distributed diffused cathode spots created in the area heated by electron beams 260. In this case a dense and strongly ionized metal vapor plasma will be generated in the plasma duct by hot evaporated cathode discharge (HEC), creating distributed diffused cathode spots on the surface of evaporate by e-beam heating combined with intense ionization, adding to ionization and activation ability of the filtered cathodic arc plasma stream as described in [R. L. Boxman, D. M. Sanders, and P. J. Martin, "Handbook of Vacuum Arc Science and Technology", Park Ridge, N.J.: Noyes Publications, 1995], which is incorporated herein by reference.

It will be appreciated that any type of PVD vapor plasma sources can be installed in a deflection area of the plasma duct 44 including, but not limited to, cathodic arc evaporator, magnetron sputtering sources, electron beam evaporator and thermal evaporator sources magnetically and/or electrically coupled with filtered cathodic arc source. This arrangement is useful for hybrid coating deposition processes comprising different types of vapor plasma sources installed in a deflection area of the plasma duct 44 facing the substrate holder 2 and generating the metal vapor plasma along the plasma duct in combination with filtered cathodic arc sources installed in a cathode chamber 90 off of the optical axis of the substrate holder 2, and generating the 100% ionized filtered cathodic arc vapor plasma stream concurrent with direct vapor generated by vapor sources installed in the deflection area of the plasma duct 44.

Figure 12A:
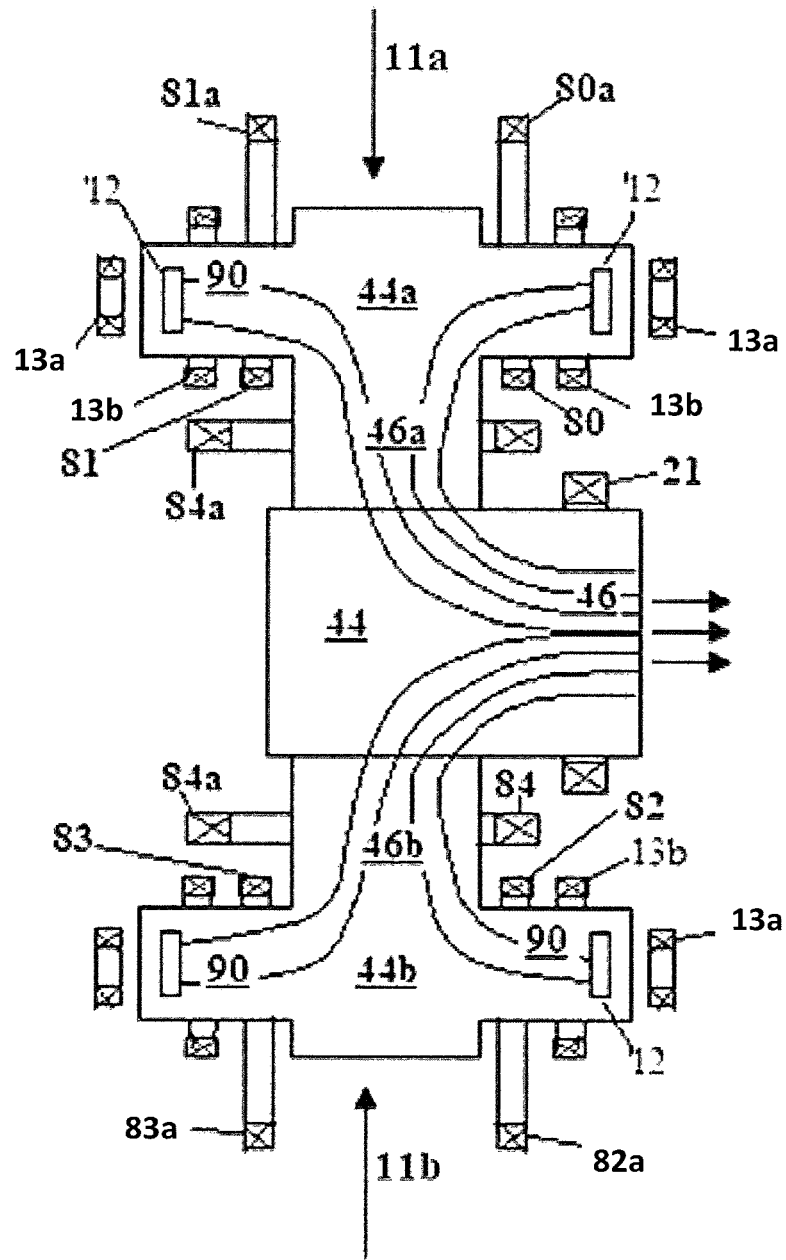
FIGS. 12a and 12b are schematic plan views of embodiments of a filtered cathodic arc coating apparatus utilizing filtered cathodic arc sources with an additional filtration stage.

FIG. 12a shows an embodiment of a filtered cathodic arc deposition method and apparatus of present invention, which utilizes a filtered cathodic arc source with an additional filtration stage. In this embodiment, two unidirectional dual filtered sources 11a and 11b are connected to the side walls of the plasma duct 44 of a third, a common plasma duct chamber. The cathodes 12 are disposed in cathode chambers 90 in communication with filtered plasma ducts 44a and 44b which are oriented substantially perpendicularly to the optical axes of the cathodes 12, and which in turn are oriented substantially perpendicularly to the main plasma duct 44. The dual filtered cathodic arc sources 11a and 11b serve the same role as cathode chambers 90 in a dual filtered cathodic arc source having one filtration stage, as was previously shown in FIGS. 3 and 4. The tunnel exit portions 46a and 46b are attached to the opposite side walls of the plasma duct portion 44 of the common plasma duct chamber. The offset deflecting coils 84 surrounds the exit portions of the exit tunnels 46a and 46b before they meet the walls of the plasma duct 44, which allows the filtered cathodic arc plasma to start deflecting before entering into the common plasma duct 44 resulting in substantial increase in vapor plasma transport efficiency in this dual filtration multi-target vapor plasma source design. This embodiment, by orienting the main plasma duct 44 off of the axes of tunnel exit portions 46a and 46b, provides the advantage of an additional filtration stage which can be useful in semiconductor and optical applications, where particularly clean plasma is required.

Figure 12B:
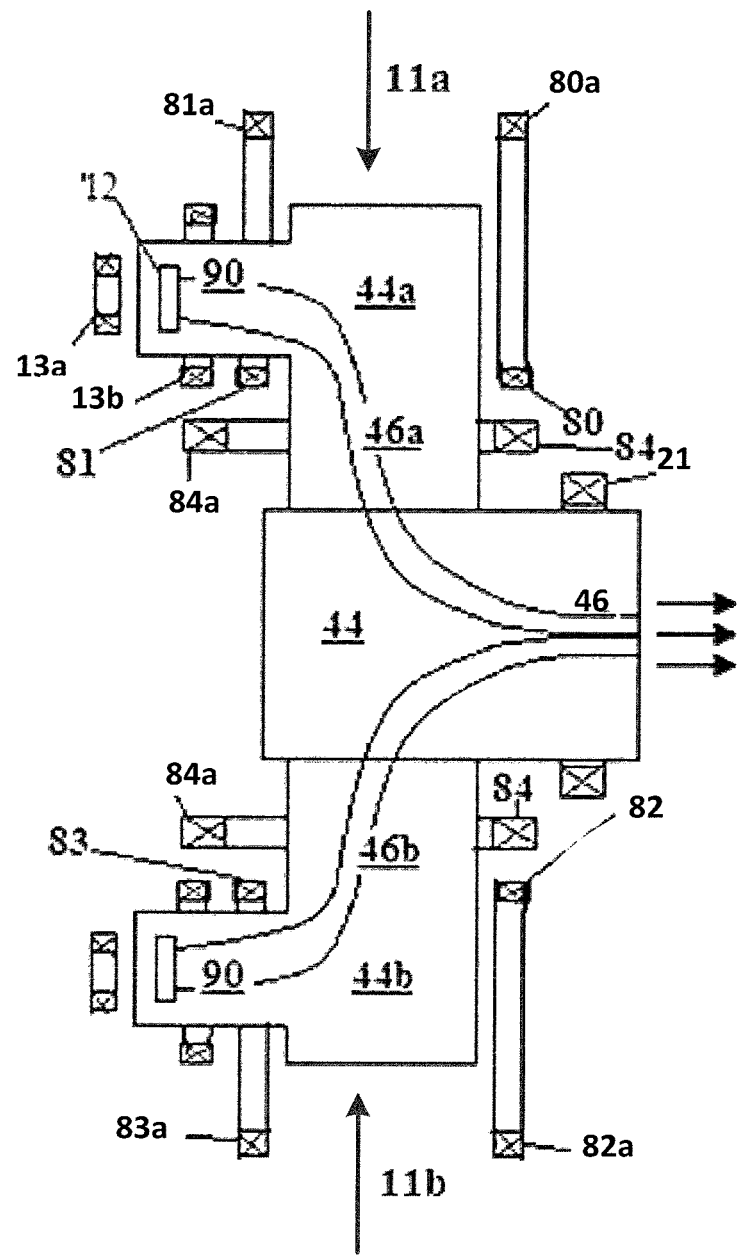

It will be appreciated that the plasma ducts 44a and 44b of the first filtration stage may have only one cathode chamber 90, attached to side wall of the deflection portion of the plasma ducts 44a and 44b as shown in a variation in FIG. 12b. In this case the pairs of offset deflecting cools 80, 81 of the primary filtered cathodic arc source 11a and pair of offset deflection coils 82, 83 of the primary filtered cathodic arc source 11b must have the same offset position in relation to the plasma duct 44 and the cathode chamber 90 as if their both cathode chambers were installed into the opposite side walls of the plasma ducts 11a and 11b as that of FIG. 12a. It can be seen that dual filtration source shown in FIG. 12b thus has a distribution of the magnetic deflecting and focusing fields similar to that of FIG. 12a. Therefore, the plasma stream generated by the cathode targets 12 of the primary cathodic arc sources 11a, 11b installed at the top of cathode chambers 90 will follow the same trajectories as that shown in FIG. 12a.

Figure 13A:
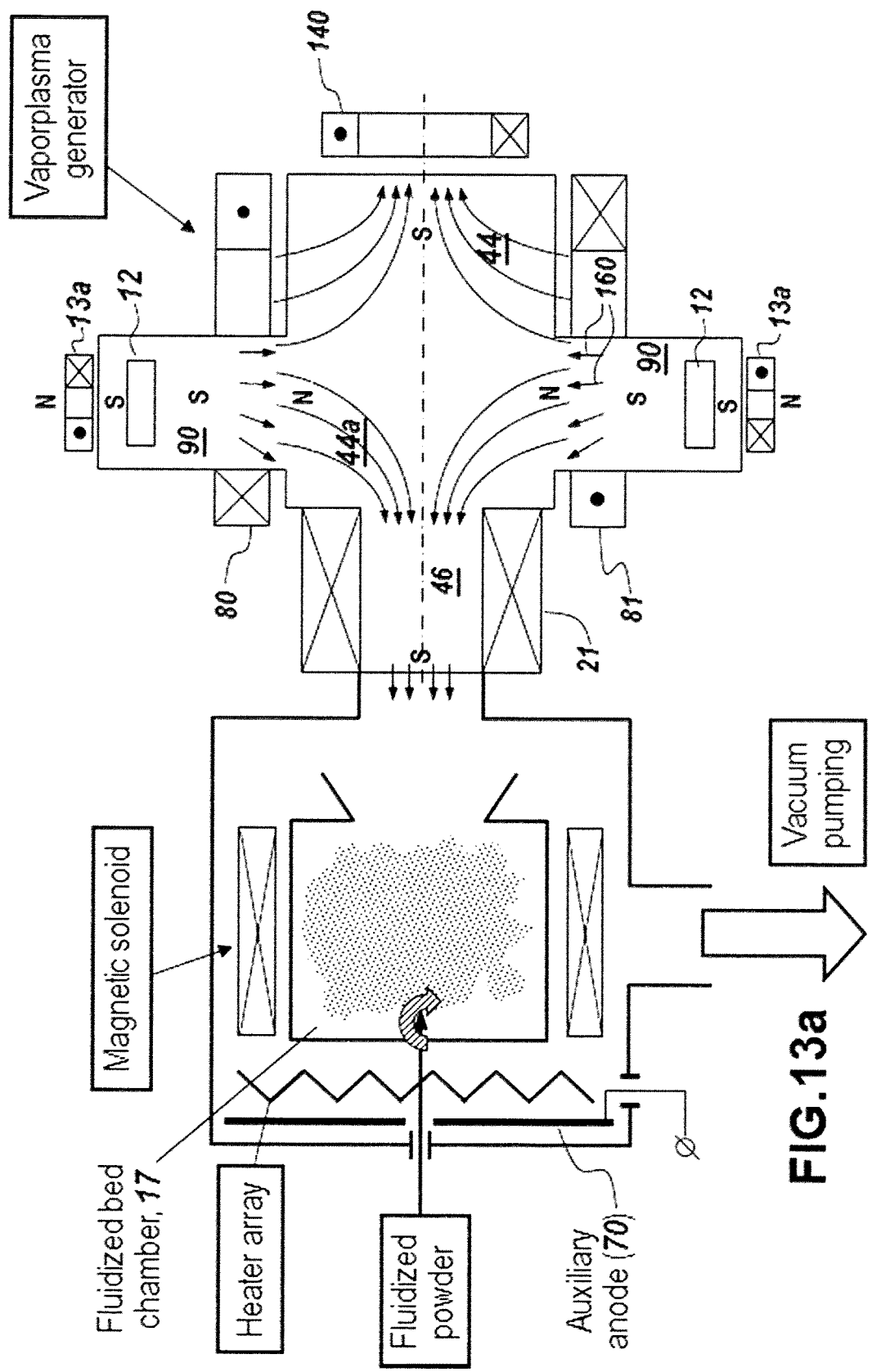
FIG. 13a is a schematic view of an embodiment of a filtered cathodic arc apparatus providing substrate holders configured for coating a fluidized powder.
Figure 13B:
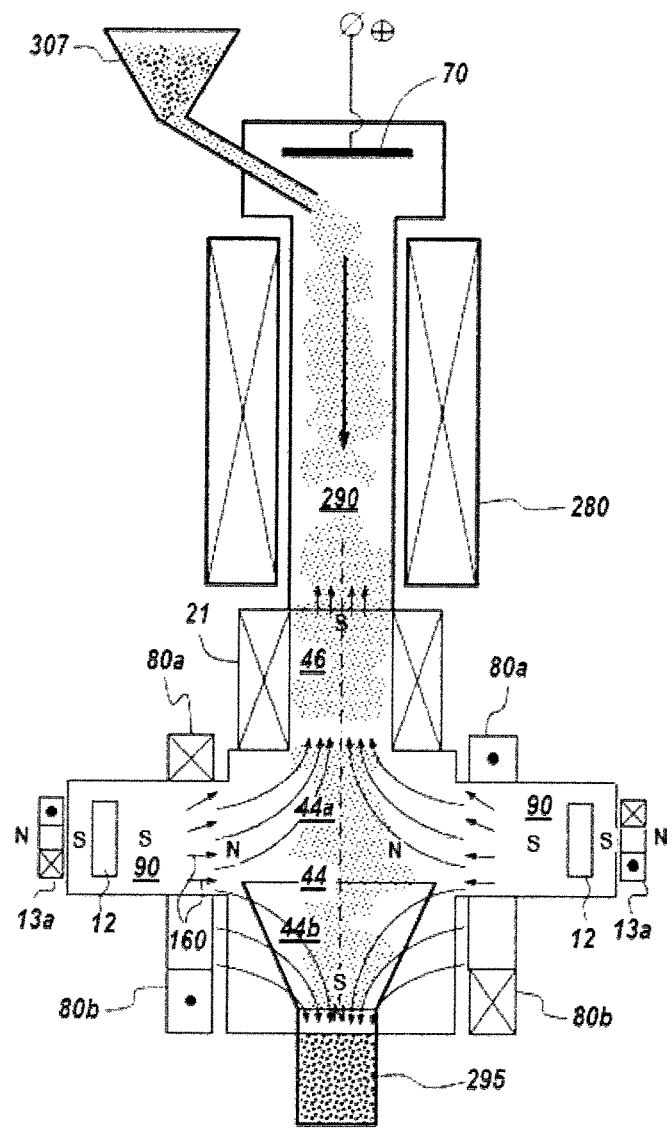
FIG. 13b is a schematic view of an embodiment of a filtered cathodic arc apparatus for free-fall PVD coating of powder.

FIGS. 13a and 13b illustrate variations of the embodiments of filtered cathodic arc method and apparatus of present invention configured for plasma treatment, coating and functionalization of powder through fluidized bed vapor plasma condensation (FBVPC). Herein, a "powder" refers to a collection of particles. In FIG. 13a, a unidirectional multi-cathode filtered arc vapor plasma source, of design similar to that shown in FIG. 7a, generates vapor plasma flow toward a cloud of powder prepared in a fluidized bed chamber 17 that is installed in a main chamber 10. The fluidized powder can be prepared by using a rotational fluid bed chamber 17 as shown in FIG. 13a, by subjecting of powder to vibration, using moving ribs or other means to agitate the powder.

Figure 13C:
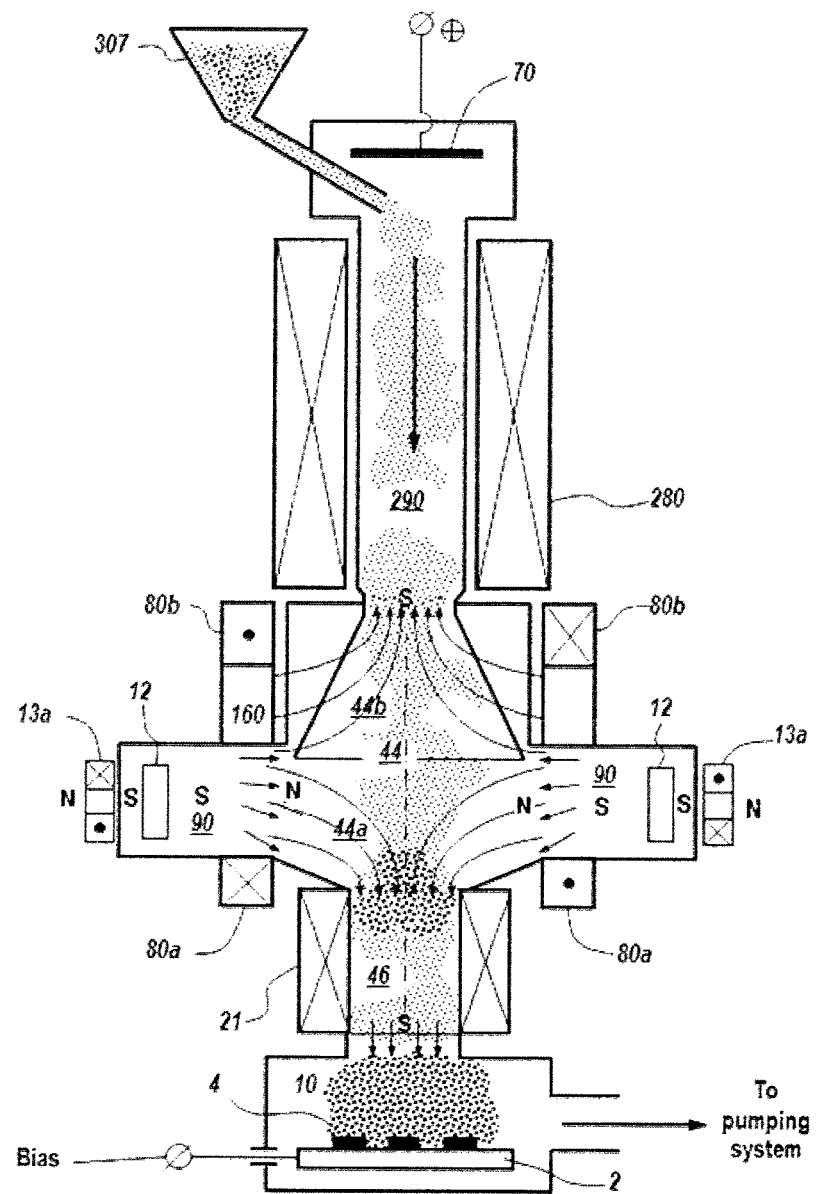
FIG. 13c is a schematic view of the apparatus shown in FIG. 13b for producing concurrent composite powder/metal vapor plasma coatings, in an embodiment.
Figure 13D:
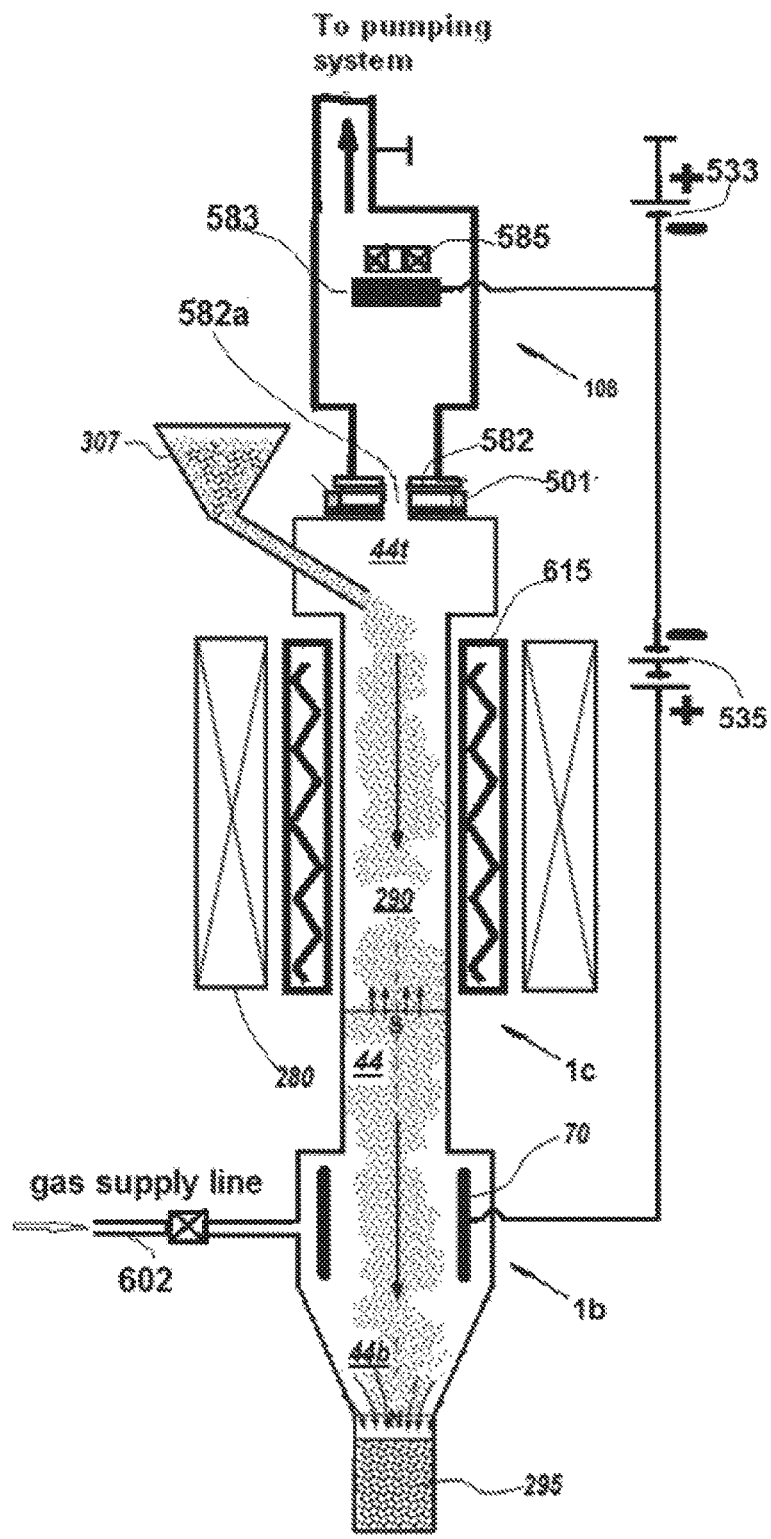
FIG. 13d is a schematic view of the apparatus shown in FIG. 13b for free-fall CVD coating of powder, in an embodiment.
Figure 13E:
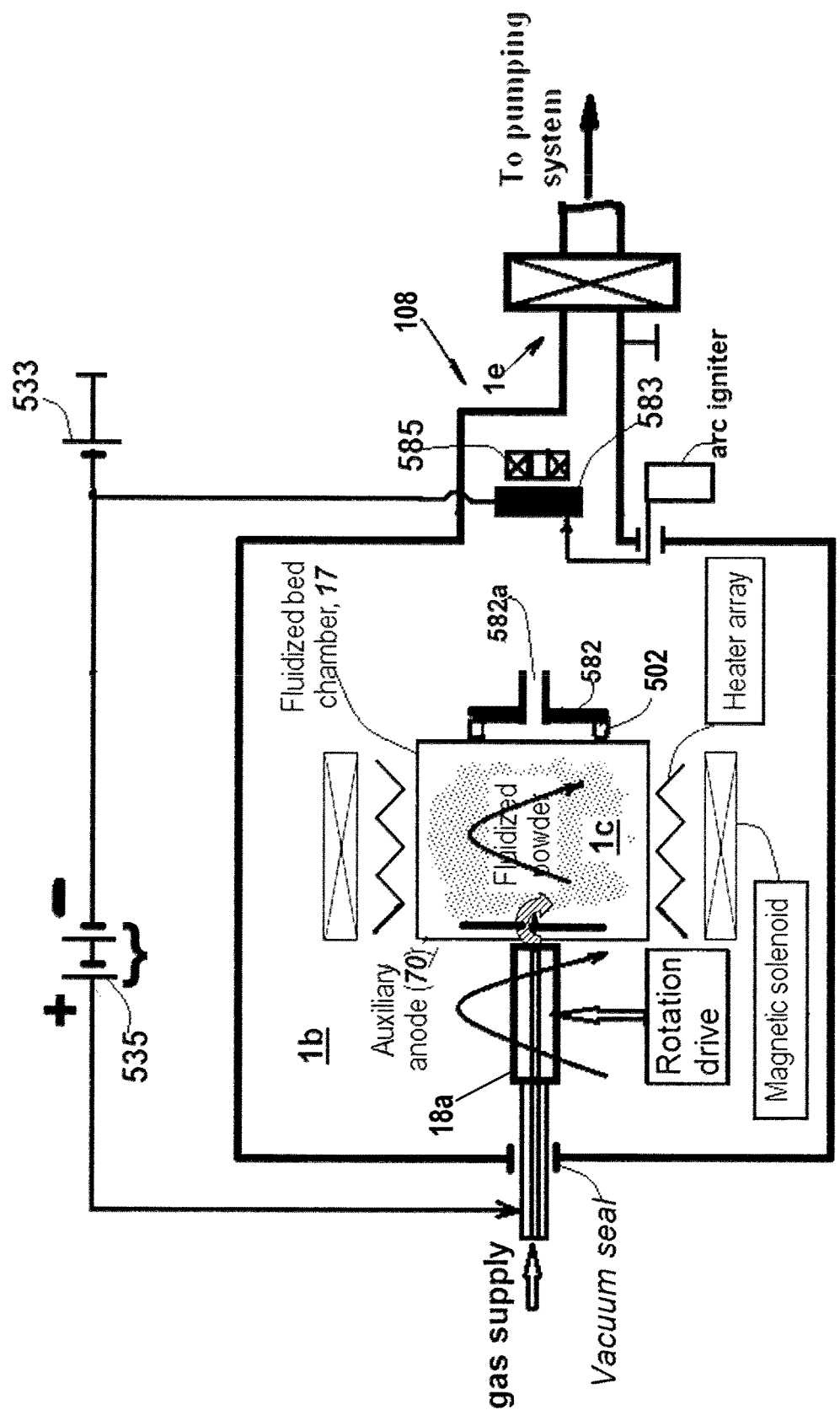
FIG. 13e is a schematic view of the fluidized bed PACVD apparatus shown in FIG. 13a with remote arc plasma assisted CVD rotating reaction chamber, in an embodiment.

In a refinement, the fluidized chamber 17 can be designed as a remote arc plasma assisted fluidized bed CVD reactor chamber as shown schematically, as an example, in FIG. 13e. In this design, the rotating reactor chamber 17 is driven by a rotating drive through a coaxial shaft 18a. The reactive gas is supplied in chamber 17 along shaft 18a, while remote anode 70 is mounted to shaft 18a inside rector chamber 17. Cathode chamber 108, connected to the pumping system, is attached to the opposite end of reactor chamber 17 via rotating seal 502. The rotating reactor chamber 17 is separated from cathode chamber 108 by separating baffle 582 with small orifice 582a. In this case, a large pressure difference can be established between high pressure reactor chamber 17 and low pressure cathode chamber 108 which allows processing diamond coating at higher pressures exceeding 1 Torr, resulting in greater productivity of synthesis of diamond powder or coating of powder in the reactor chamber 17, while securing the low pressure typically below 200 mTorr in cathode chamber 108, necessary for operating of vacuum cathodic arc plasma source. The pressure difference between the reactor chamber 17 (high pressure) and the cathode chamber 108 increases when the current of the remote arc discharge ignited between the cathode 583 and the remote anode 70 in the reactor chamber 17 increases partially due to friction forces between the electron current flow in remote arc discharge and opposite gas flow creating electrophoresis effect. The pressure difference is mostly located across the nozzle 582a. Chamber 17 can be optionally placed in the longitudinal magnetic field to increase the plasma density in the reaction area. Optionally, external heaters are installed around chamber 17 to independently control the temperature in the PACVD reaction area.

Alternatively the powder can be exposed in filtered metal vapor plasma during a free fall as shown in FIG. 13b. In this arrangement, the powder feeder injects the powder at the top of the cylindrical tube surrounded by solenoid 280. The cathode targets 12 in cathode chambers 90 are powered by the primary arc power supplies 19 and the remote anode 70 is powered by the remote arc power supply 26. The powder falls down throughout the column of highly ionized and magnetized plasma generated by a multi-cathode filtered arc source similar to that shown in FIG. 7a. The coated powder is collected in a powder collector 295 attached to the back flange of the filtered cathodic arc source. In the preferred embodiment the powder handling and treatment area is integrated into the filtered cathodic arc source plasma duct chamber 44.

A refinement of the free fall reactor for CVD coatings of powder is shown in FIG. 13d. In the reactor of FIG. 13d, the powder is exposed to the remote arc plasma generating between the cathode target 583 positioned in the cathode chamber 108 upstream of the reaction zone 290 and remote anode 70 positioned in the remote anode compartment downstream of the reaction zone 290. Furthermore, the fall of the powder is slowed by the flow of reactive gas from gas inlet 602 to the pumping system coupled to cathode chamber 108, which results in increased time spent in reaction zone 290 and thus increased coating time of the powder.

FIG. 13c illustrates a further preferred embodiment of the apparatus shown in FIG. 13b for producing concurrent composite powder/metal vapor plasma coatings. In this apparatus the substrates to be coated 4 such as cutting tool carbide inserts are disposed on the substrate holder 2 at the bottom of the substrate chamber 10. The cathode targets 12 in cathode chambers 90 are powered by the primary arc power supplies and the remote anode 70 is powered by the remote arc power supply as shown in FIG. 13b. Substrate holder 2 can be connected to the bias power supply to provide a negative bias potential typically ranging from −10V to −1200V in reference to the ground during different stages of the coating deposition process. The powder falls down through the column of highly ionized and magnetized plasma generated by a multi-cathode filtered arc source similar to that shown in FIG. 7a along the tubular upper tunnel portion of the plasma duct 290 and continues its free fall through the plasma duct 44 and its bottom exit portion 46 toward the bottom of the substrate chamber 10. During the time when solid particles are passing the plasma duct 44 they are getting partially coated by metal vapor plasma. Some of these particles are falling on the surface of the substrates 4 and the coating deposition process continues until a composite powder/metal vapor deposit is formed on the surface of substrates 4.

Following are examples of the treatment of substrates in the embodiments described above:

Example 1. Filtered Cathodic Arc Plasma Immersed Ion Cleaning

The arc coating apparatus shown in FIG. 4f was used in this process. The apparatus was equipped with two dual-filtered cathodic arc sources, having round conical cathode targets 12 measuring 3" in diameter and 2" in height, one filtered cathodic arc source having titanium targets and the other one having chromium targets. The exit openings of the filtered cathodic arc sources were equipped with load lock shutters 83a, 83b, electron-permeable to provide a free passage of electron current from the cathode targets 12 to distal auxiliary anodes 70 to thereby establish an auxiliary arc discharge. Augmented by the auxiliary arc discharge the ionization and activation of the gaseous component of the plasma environment in the coating chamber 42 was significantly increased (up to 3 to 4% in comparison with approximately 0.1% gas ionization rate in glow discharge without the auxiliary arc discharge) resulting in ion bombardment flux at the surface of the substrates exceeding 10 mA/cm$^2$.

HSS disc coupons as substrates 4, 2" diameter, ¼" thick, were washed in a water solution containing detergent and dried by isopropyl alcohol, and placed in a dry cabinet for 2 hours at 200° C. The substrates 4 were then loaded into the coating chamber 10 and attached to the rotary satellites of the substrate platform 2, for double rotation at a rotational speed of 12 rpm. The vacuum chamber was evacuated to $4\times10^{-6}$ Torr and then a gas mixture containing 80% argon, 18% hydrogen and 2% oxygen as an ion cleaning gas, was injected to create a total pressure ranging from $4\times10^{-4}$ to $8\times10^{-4}$ Torr. Both load lock shutters 83a, 83b were locked and cathodic arc sources, having respective cathode targets 12, were activated in at least one filtered cathodic arc source, preferably that with the titanium targets. The deflecting magnetic system was not activated. The auxiliary arc discharge was activated between the cathodes 12 of the active filtered cathodic arc source and the distal auxiliary anodes 70 installed in the coating chamber 42. The total auxiliary discharge current was established at 80 amps. The RF bias power supply was activated and a self-bias potential was established at 600 volts. The ion cleaning stage was performed for 10 minutes.

Example 2. Plasma Immersed Ionitriding and Ion Implantation in the Auxiliary Arc Discharge The apparatus and substrate coupons 4 of Example 1 were used in this process. After the ion cleaning stage the gas mixture was changed to nitrogen as an ionitriding gas, injected to create a total pressure ranging from $2\times10^{-4}$ to $8\times10^{-4}$ Torr. For ionitriding the substrates 4 were preliminary heated to 300° C. to 450° C. using conventional heaters (not shown) installed in front of the distal auxiliary anodes 70 in the coating chamber 42. A self-bias voltage was established at a range from 100 to 400 volts. The current applied to distal auxiliary anodes 70 was set at 100 amps and the ionitriding stage was performed for 1 hour.

For low-energy ion implantation the substrate temperature was set to a lower level, about 150 to 300° C., and the bias voltage ranged from 200 to 3000 volts. The ion implantation stage was performed for 1 hour.

The ionitriding and ion implanted layers were characterized by structure, thickness, microhardness depth profile, and surface roughness. It was found that ionitriding in this process provided a greater roughness of the substrate surface in comparison to ion implantation, while the rate of ionitriding was up to one order of magnitude greater than the rate of ion implantation. The rate of ionitriding for HSS steel had reached up to 1 μm/hr in comparison with 0.08 to 0.12 μm/hr for low energy ion implantation with the same 600 volt self-bias on the substrates 4.

Example 3. Auxiliary Arc Plasma Immersed Deposition of Chromium Nitride Filtered Cathodic Arc PVD Coating The apparatus of FIG. 4f was equipped with the same cathode targets 12 as in Example 1. The same substrate coupons 4 as in Example 1 were installed on the rotary satellites of substrate holder 2 with single rotation and preheated to 400° C. by conventional heaters installed in the coating chamber 10. After ion cleaning as described in Example 1 the load lock shutter 83b of the filtered cathodic arc source 1b with the chromium cathode targets 12 was opened and the gas was changed to pure nitrogen with total pressure of $2 \times 10^{-4}$ to $3 \times 10^{-4}$ Torr. The focusing and deflecting magnetic coils 13, 80 and 21 of the filtered cathodic arc source magnetic systems were activated to deflect the chromium plasma stream toward substrates. The deflecting anode 50 was electrically isolated and set at floating potential vs. surrounding plasma flow. The current between each of the chromium cathodes 12 and distal auxiliary anodes 70 was established at 50 amps. The currents between Cr cathode targets and the nearby primary ground anode was established at 150 amps to make a total arc current per one chromium target 200 amps. The load lock shutters 83a corresponding to the filtered cathodic arc source 1a, with the titanium cathode targets 12, remained locked and the corresponding offset deflecting coils 80 and deflecting anode 50 were inactive while both cathodic arc sources with titanium targets 12 were activated. Without the deflecting electromagnetic fields the plasma stream remained substantially confined to the cathode chamber 90, and the titanium cathode targets served as electron emitters, providing additional current to the distal auxiliary anodes 70 up to 80 amps. Coating deposition was performed for 3 hours. The deposition rate of filtered cathodic arc CrN coating deposited by unidirectional dual filtered cathodic arc source 1b with offset deflecting coils was 3.8 µm/hr.

Example 4. Large Area TiN Filtered Cathodic Arc Coatings

The apparatus of FIG. 4f was equipped with the same cathode targets 12 as in Example 1. In this example the substrate coupons 4 were made from stainless steel as bars with a 1" width, ½" thickness and 14" length. The substrates 4 were installed on the rotary satellite positions of substrate platform 2, with double rotation. The substrates 4 were preheated to 400° C. before the deposition stage commenced.

After ion cleaning as described in Example 1 the load lock shutter 83b of filtered cathodic arc source 1a with the titanium cathode targets 12 was opened while filtered cathodic arc source 1b with chromium targets was inactive. The gas was changed to pure nitrogen with total pressure of $2 \times 10^{-4}$ to $3 \times 10^{-4}$ Torr. The deflecting and focusing magnetic coils 20, 80 and 21 of the filtered cathodic arc source magnetic systems were activated to deflect the titanium plasma stream toward substrates. The deflecting anode 50 was electrically isolated and set at floating potential vs. surrounding plasma flow. The currents between each of the titanium cathodes 12 and distal auxiliary anodes 70 were established at 50 amps. The currents between Ti cathode targets and the nearby primary ground anode were established at 150 amps to make a total arc current per one titanium target 200 amps. The load lock shutters 83a corresponding to the filtered cathodic arc source 1b, with the chromium cathode targets 12, remained locked and both cathodic arc sources with chromium targets 12 were remained inactive. Coating deposition was performed for 3 hours.

In this trial the alternative vertical magnetic field with a frequency of 60 Hz and amplitude (maximum value) of 70 Gs created by a pair of vertical scanning coils, one of them positioned on the top side of the plasma duct and another one positioned under the bottom of the plasma duct (not shown in FIG. 4f) was applied to raster the vapor plasma flow in a vertical direction transversal to the plane of rotation of the plasma stream. Scanning by the vertically rastering magnetic coils in this fashion allowed to reach up to 90% uniformity of coating thickness over the large area coating zone (14" in this example). By way of contrast, in a conventional direct cathodic arc deposition process it is not possible to scan the plasma flow with electromagnetic fields due to the neutral phase (atoms, clusters and macroparticles) which constitute up to 60% of the total erosion mass of the vacuum arc jet.

The deposition rate of the TiN coating deposited by unidirectional dual filtered cathodic arc source 1a with offset deflecting coils was approximately 5 µm/hr.

In a refinement, this technology is applied for deposition of erosion and corrosion resistant coatings on airfoils of turbine engine. For example, the coating system shown schematically in FIG. 10e is used for this coating deposition process. The airfoils are installed at the turntable 2 either at the 60° to the radius as shown in airfoil samples 4a, or with double rotation as shown in airfoil sample 4b in FIG. 10e, wherein airfoil sample 4b further undergoes rotation about a longitudinal axis of airfoil sample 4b, which is parallel to the rotation axis of turntable 2. Both primary cathodic arc sources of the filtered cathodic arc source 1 are equipped with cathode targets 12 made of titanium. Both targets of the magnetron sputtering sources 245 are also made of titanium. The shielded cathodic arc source 2b in a cathode chamber 321 is also equipped with a titanium target 12y.

At the first stage, the remote arc discharge is ignited in argon at 2 mtorr between the cathode target 12y and the remote anode 70, powered by the power supplies 26a and 26c, while the primary arc discharge in chamber 321 is powered by power supply 26 between the cathode target 12y and grounded anode. The argon arc plasma is filling the substrate chamber 10 effectively immersing the substrate table 2 with substrates to be coated in dense strongly ionized plasma. The bias voltage of 250 V is applied to the substrate table 2 for 30 min for ion cleaning the substrates to be coated 4. The rotation speed of substrate table 2 is set at 4 rpm. At the second stage both cathodic arc sources of the filtered cathodic arc source 1 are activated, both the deflection and focusing magnetic coils of the plasma duct 44 are also activated to direct metal vapor plasma generated by the cathodic arc sources of the filtered cathodic arc source 1 toward substrates to be coated 4 in coating chamber 10. The substrate table 2 bias is increased to 1000 V for metal ion implantation of the substrates to be coated 4. The metal ion implantation stage is lasting for 3 min followed by filtered cathodic arc coating deposition stage. At this stage the substrate bias is reduced to 30 V and titanium adhesive sublayer is deposited during 10 min in argon at 2 mtorr. At the third stage nitrogen is added to the chamber to maintain Ar:$N_2$ ratio of 1:10 at 4 mtorr and TiN second sublayer is depositing during 15 min. At the fourth stage the pressure is increased to 2 mtorr and Ar:$N_2$ ratio is changed to 1:3. Both magnetron sputtering sources are activated without interruption of the filtered cathodic arc source at 5 W/cm$^2$ sputtering power and a hybrid filtered cathodic arc-magnetron coating deposition process continues for 3 to 5 hrs to deposit TiN coatings on airfoils. The coating thickness is typically ranging from 10 to 40 µm.

This technology is capable of producing a wide variety of coating architectures and structures. For example, by periodically turning OFF and ON the nitrogen supply line it is possible to deposit multilayer coatings with a sequence of ceramic (TiN) and metallic sublayers having thicknesses ranging from 50 nm to 1000 nm. Alternatively, by turning ON and OFF a magnetic deflecting coil with repetition frequencies typically ranging from 0.1-1000 Hz (magnetic shutter mode) the filtered cathodic arc vapor plasma flow generating by the filtered cathodic arc source can be periodically SHUT OFF and SHUT ON which can provide a periodical change in ion bombardment rate by metal ions (Ti) of growing magnetron sputtering TiN films. This generates a periodic multilayer structure of the TiN based coatings with sublayer thicknesses at nanometric scale, which is beneficial for the coating toughness, erosion and corrosion protection properties.

In advanced embodiment of the coating process for deposition of erosion and corrosion resistant cermet coatings on turbomachinery component the deposited coating is either nanocomposite or micro-nano-laminated. The coating system shown in FIG. 10e is used for this process. While this process may be used both for production of nanocomposite coatings and for production of micro/nano-laminated coatings, the following discussion pertains to micro/nano-laminated coatings. The micro/nano-laminated coating architecture is built by a sequence of metal-ceramic pairs comprising of the metal layers followed by ceramic layers. The arc cathode targets, magnetron targets and PACVD reactive gaseous precursors are selected for the plasma vapor generation as they are capable of forming hard, wear resistant, and erosion and corrosion resistant compounds by gaseous-metal plasma vapor deposition. The metallic and non-metallic elements which are preferred in such compound formation are titanium, chromium, vanadium, molybdenum, aluminum, hafnium, zirconium, niobium, tungsten, their alloys, carbon, boron, silicon, and elements of similar nature. The preferred reaction gaseous precursors are nitrogen, hydrogen, oxygen, hydro-carbon gases, borazin, boron trichloride, trimethylsilane (3MS) and gases of similar nature. During deposition of such a coating the gas atmosphere in the cathodic arc depositing device is controlled such that it can yield either a vapor deposited metal layer or a vapor deposited ceramic compound layer. The ceramic compounds that have desired wear resistance, corrosion resistance and hardness are the carbides, nitrides, carbonitrides, oxycarbides, oxynitrides, borides, silicates, of the above listed metals. The plasma for depositing the desired ceramic layers contains one or more of the following gases: nitrogen, methane or other hydro-carbon gas, borazin, 3MS and oxygen. In the vapor deposition of layers of the above listed metals only argon or similar inert gas containing plasma is used. Argon may also be utilized to dilute or carry the gases reacting with the metal vapor or metal deposit, to form the desired ceramic-metal compounds. The metal and ceramic compound combinations suitable for forming hard, wear, erosion and corrosion resistant coatings by vapor deposition in the present invention, are listed in Table 1 below. In addition to the coating compositions presented in Table 1 the carbon based diamond-like coatings with addition of different metals such as Ti, B, Si or Cr doped DLCs having hardness above 30 GPa can also be selected preferably for the top segment coating.

TABLE 1

| Item # | Metal Layer | Ceramic metal compound layer in combination with the metal, having desired wear resistant properties |
|---|---|---|
| 1 | Ti | TiC, TiN, Ti(CN), Ti(OCN) |
| 2 | Zr | ZrC, ZrN, Zr(CN), Zr(OCN) |

TABLE 1-continued

| Item # | Metal Layer | Ceramic metal compound layer in combination with the metal, having desired wear resistant properties |
|---|---|---|
| 3 | V | VC, VN, V(CN), V(OCN) |
| 4 | Cr | CrN, CrC, CrCN |
| 5 | Hf | HfN |
| 6 | Mo | MoN |
| 7 | Nb | NbN, NbC |
| 8 | W | WC |
| 9 | Ti—Zr alloy | TiZrC, TiZrN, TiZr(CN), TiZr(OCN) |
| 10 | Ti—Cr alloy | TiCrC, TiCrN, TiCr(CN) |
| 11 | V—Ti alloy | VTiC, VTiN, VTi(CN) |
| 12 | Ti Mo | TiMoN |
| 13 | Ti, Al | TiAlN, TiAlON |
| 14 | Ti, Al, Si | TiAlSiN |
| 15 | Ti, Nb | TiNbN |
| 16 | Al | AlN, $Al_2O_3$ |
| 17 | Cr, B | $CrB_2$ |
| 18 | Ti, B | $TiB_2$ |
| 19 | Al, B | $AlB_2$ |

Example 5

TiBCN erosion and corrosion resistant nanocomposite coatings on compressor blades (airfoils) of turbine engine. The process and a hybrid dual filtered cathodic arc-magnetron sputtering coating system similar to one used in Example 4 shown in FIG. 10e is used for deposition of superhard TiBCN nanocomposite coatings on airfoils, a set of compressor blades of turbine engine. As shown in FIG. 10e, the airfoils are installed at the rotational turntable 2. The airfoils 4 are installed either at acute angle ranging from 30 to 75 deg to the radius of turntable 2 as for example shown in FIG. 10e for airfoils 4a or with ability of double rotation as for example shown in FIG. 10e for airfoil 4b. Cathodic arc targets 12 of the primary cathodic arc sources of filtered arc source 1 are made of titanium, while the magnetron targets of the magnetrons 245 magnetically coupled with filtered arc source 1 are made of $B_4C$ ceramic. Cathode target 12 of shielded cathodic arc source 2b is also made of titanium and is further aimed on generation of remote arc discharge between the shielded cathodic arc target 12y and remote anode 70 in the coating chamber 10. The airfoils are subjected to wet blasting pre-treatment before being loaded in the vacuum chamber for plasma processing. After loading the airfoils, the vacuum chamber is pumped down to ultimate vacuum of 1E-6 Torr, after which argon as plasma creating gas is added to the pressure of 0.5 mTorr. The auxiliary arc discharge is ignited between shielded cathode 12y and remote anode 70. The current of the remote arc discharge is ranging from 100 to 200 amperes. At the same time, switch 407 is closed, switch 409 is opened, bias power supply 29b is turned off and electron heating power supply 29a is turned on to provide intensive electron heating of airfoils 4. The electron current conveyed to turntable 2 from shielded cathode 12a is ranging from 200 to 400 amperes. Optionally, radiation heater 75 is used to stabilize the temperature of airfoils 4 within the range 400-450° C. (the substrate temperature may be measured by IR pyrometer, shown in FIG. 4m). The heating stage is following by the ion cleaning stage. During ion cleaning, switch 407 is opened, switch 409 is closed, power supply 29a is turned off, and bias power supply 29b is turned on. Negative bias potential of −400 volts is applied to turntable 2 with substrates to be coated (airfoils) 4 to provide ion cleaning in argon remote arc discharge plasma by means of ion bombardment for 30 min. After this stage, a short stage of metal ion etching is provided for 5 min specifically aimed to improve coating adhesion. During the metal ion etching stage, the bias potential provided by the power supply 29b is increased to −1000 volts. The primary cathodic arc sources of dual filtered cathodic arc source 1 are activated and vacuum arcs are ignited at the titanium cathode targets 12. The current of this primary arc discharge is ranging from 100 to 140 amperes. The deflecting and focusing magnetic system of dual filtered cathodic arc source 1 is activated by turning on deflecting pair of coils 80 and 81 and focusing coil 21 such that the titanium metal vapor plasma is directed toward airfoils 4 on turntable 2. After the metal etching stage, the bias potential of turntable 2 is reduced to −50 volts, the total arc current (a sum of the primary arc current and remote arc current) of each cathodic arc target 12 is in the range from 240 amperes to 400 amperes, and nitrogen is added to the reactive gas atmosphere in the coating chamber maintaining the ratio of partial pressures with argon $P_{N2}:P_{Ar}=10:1$ at a total gas pressure of 0.2 mTorr. The first ceramic layer of TiN is deposited from nearly 100% ionized titanium metal vapor plasma generated by cathode targets 12 in nitrogen reactive atmosphere with the rate of deposition (defining the intensity of metal ion bombardment) exceeding 3 μm/hr, but typically within the range from 3 to 30 μm/hr. The thickness of the first TiN layer typically ranges from 2 to 5 μm. After this stage, the pressure is increased to 2 mTorr by increasing the flowrate of argon while keeping the argon to nitrogen ratio $P_{N2}:P_{Ar}=1:3$. The magnetron sputtering sources 245 are activated with specific power (total power per 1 cm$^2$ of the target area) ranging from 3 to 20 W/cm$^2$, but typically within the range from 4 to 10 W/cm$^2$ and a nanocomposite TiBCN superhard coating is deposited by the hybrid filtered cathodic arc-magnetron sputtering process for 5 hrs to achieve a coating thickness in the range from 10 μm to 40 μm. During this stage, the TiN component deposition rate may be reduced to 1 μm/hr and the specific power applied to magnetron targets may be increased within the range from 3 to 20 W/cm$^2$. The deposition of the TiBCN nanocomposite layer may start from predominantly TiN filtered arc deposition by nearly 100% ionized titanium metal vapor plasma flow followed by a gradual reduction of the deposition rate of the filtered arc source and/or increase of the power applied to magnetron sputtering sources 245, which will result in a reduction of the ionization degree in a combined filtered arc-magnetron sputtering flow from nearly 100% at the beginning of the deposition of TiBCN layer to nearly 1% ionization at the end of deposition of the TiBCN layer. The ionization degree may be also modulated from 1% to 100% during deposition of the TiBCN layer by modulating the outcome of ion flux of the filtered arc source vs. the outcome of the metal atoms sputtering flux of the magnetron sputtering source. For example, in the magnetic shutter mode, by turning ON and OFF magnetic coils 80 and 81 and focusing coil 21 of filtered arc source 1, a nano-multilayer coating architecture with nanolayers of BCN followed by nanolayers of TiBCN may be deposited, which may improve the toughness and other functional properties of the coating.

Example 6. Large Area Filtered Cathodic Arc Deposition of Diamond-Like Coatings (DLC)

This example uses an embodiment of the arc coating apparatus shown in FIG. 4f, wherein each of the two dual unidirectional filtered cathodic arc sources implements the design shown in FIG. 8d with stream baffles 185. In this example, stream baffles 185 were made of pure iron strips installed at entrance 44a into tunnel portion 46 of plasma duct 44, such that stream baffles 185 are electrically isolated from the coating chamber. The primary cathodic arc sources installed in cathode chambers 90 of the filtered cathodic arc source 1a were equipped with targets 12 made of pyrolytic graphite and provided with pulse operation mode using pulse electrical ignition. The primary cathodic arc sources installed in cathode chambers 90 of the filtered cathodic arc source 1b were equipped with targets 12 made of titanium. Stream baffles 185 and regular wall baffles were used to further reduce the macroparticle content in the coating. Indexable carbide inserts as substrate coupons 4 were installed on the satellites of substrate platform 2 with single rotation at a rotational speed of 12 r.p.m. The apparatus was evacuated to 5×10−6 Torr and a 13.56 MHz RF bias voltage was set up to establish a self-biasing potential of turntable 2 with substrates 4 during coating deposition process. After an ion cleaning stage similar to that described in Example 1, high voltage metal ion etching was performed using filtered cathodic arc source 1b equipped with titanium primary cathode targets 12. During this stage, the load lock shutter of filtered cathodic arc source 1b was open, while the load lock shutter of filtered cathodic arc source 1a (equipped with graphite primary cathode targets 12) was closed. Filtered cathodic arc source 1b was turned ON. The steering coils 13a, offset deflection coils 80 and focusing coils 21 of the filtered cathodic arc source 1b were activated. The autopolarized bias of turntable 2 was set at 1000 volts. The metal ion etching stage lasted 2 minutes and was followed by deposition of TiC bond coat interfacial layer. The TiC bond coat was deposited by filtered cathodic arc source 1b following a procedure similar to that of Example 4, but with a mixture of argon and methane as a reactive gas at a pressure of 1 mtorr. The thickness of the TiC bond coat was 0.5 μm. In some processes, a ultra-thin titanium layer having thickness in the range from 5 to 20 nm was deposited between the substrate surface and the TiC bond coat layer. After the TiC bond coat deposition stage, the gas supply line was closed to stop injecting both reactive (methane) and buffer (argon) gases in the coating chamber, titanium filtered cathodic arc source 1b was turned off and filtered cathodic arc source 1a with graphite targets was turned ON to commence a DLC deposition process. The DLC deposition process lasted 5 hrs. During this stage, load lock shutter 83a of filtered cathodic arc source 1b with titanium targets was shut off, while load lock shutter 83a of filtered cathodic arc source 1a was opened. Cathodic arcs were ignited on the side surface of the conical graphite targets using the pulse electrical ignition. Pulse cathodic arc sources with graphite targets 12 were activated with a pulse arc discharge repetition frequency of 10 Hz. During the first minute of this process, the self-bias potential of substrates 4 was established at 1000 volts to provide a sublayer between the TiC bond coat interlayer and the DLC film while, during deposition of DLC coating, the self-bias potential of the substrates was reduced to 100 volts. The microhardness of DLC deposited in this process has reached 65 Gpa. The use of stream baffles 185 facilitated a reduction of the density of defects in DLC film by two orders of magnitude. The rate of deposition of DLC over a 12" high and 20" diameter coating zone have reached 0.6 μm/hr.

Example 7. Large Area Deposition of Remote Arc Plasma Assisted Polycrystalline Diamond CVD Coatings In this example, the apparatus of FIG. 7p was used for deposition of polycrystalline diamond CVD coatings on Si wafers. Boron-doped conductive Si wafers 3 inches in diameter as substrates 4 were positioned on top of substrate holder 2. Prior to loading into the plasma processing reactor, substrates 4 were subjected to pre-treatment in sub-micron diamond slurry under ultrasonic agitation conditions to improve the density of diamond nucleation sites. After loading substrates 4 into the reactor, the reactor was evacuated and filled with argon to pressure of 100 mTorr. Argon (along with reactive gases during the later stages of the coating deposition process) was supplied via gas inlet 602 in anode chamber 106. This processing gas flows along the plasma duct 1*c* and propagates into cathode chamber 108 across the small opening 582*a* in separating baffle 508. The processing gas is pumped out by pumping system 1*e* connected to cathode chamber 108. The pressure in plasma duct 1*c* during deposition of diamond coatings was typically in the range from 300 mTorr to 100 Torr, but preferably from 0.5 Torr to 10 Torr. This pressure range was controlled by the balance between the flow rate of gas supply system 602 and the pumping speed of pumping system 1*d* attached to plasma duct 1*c*, while a low pressure below 200 mTorr during the entire process was established in the cathode chamber 108 by pumping system 1*e*. An additional improvement of the pumping speed in cathode chamber 108 was provided by gettering of residual gases by condensation of the titanium film on (a) grounded and optionally water-cooled walls of the cathode chamber and/or (b) negatively biased water-cooled chevron baffle 581 consisting of enclosure 581*a* with openings 581*b*, wherein baffle 581 serves as negatively biased electrode immersed into the primary vacuum arc discharge, while cathode chamber 108 walls serve as primary arc anode as illustrated in FIG. 7*m*. In this design, the pumping system valve can be closed and the pumping of the cathode chamber 108 can be performed exclusively by gettering by condensation of the metal vapor on walls of the cathode chamber 108 and baffle 581. A highly ionized titanium metal vapor was generated by vacuum arc evaporation of the cathode target 583 of the primary cathodic arc source in the cathode chamber 108. During a first (conditioning) stage of the plasma deposition process, the heater was turned ON and the temperature of substrates to be coated 4 was established in the range 700-950° C. A substrate temperature below 700° C. or above 950° C. may result in a decrease of the quality of the depositing diamond polycrystalline coatings. After conditioning in argon for 15 min, the processing gas was changed to high purity hydrogen with 2% of methane. A remote arc with 200 A current and voltage ranging from 50V to 150V was ignited between primary cathode 583 in cathode chamber 108 and remote anode 551 in anode chamber 106, and plasma duct 1*c* was filled with remote arc plasma. The remote arc plasma typically had density in the range from 1E9 cm$^{-3}$ to 1E13 cm$^{-3}$ and electron temperature in the range from 1 to 5 eV. The electrons emitted from primary cathode 583 in cathode chamber 108 were extracted through small orifice 582*a* in separation baffle 582 separating plasma duct 1*c* from the cathode chamber 108, while heavy particles (atoms, ions and macroparticles were captured within cathode chamber 108 through condensing on the water-cooled walls of this chamber. The electron current density within opening 582*a* reaches 200 A/cm$^2$ resulting in increase of pressure in plasma duct up to 3 Torr from initial pressure (before igniting the remote arc discharge) of 1.5 Torr, while the pressure in the cathode chamber remains almost undisturbed within the range 20-50 mTorr. When the electron current is conducted through opening 582*a*, the pressure in the plasma duct 1*c* increases when the electron current density of the remote arc discharge within the opening 258*a* increases, while keeping the pressure in the cathode chamber almost unchanged. Further increase of the pressure in the plasma duct 1*c* up to atmospheric pressure (1000 Torr) can be achieved by using the cascade nozzle shown in FIG. 9*f* in place of the opening 582*a*. The nucleation stage in H$_2$+2% CH$_4$ plasma at the pressure of 3 Torr continued for 10 to 20 min and was followed by diamond coating deposition stage. During the diamond coating deposition stage, the methane concentration in the H$_2$+CH$_4$ mixture was reduced to 0.5%. During the diamond coating deposition stage, the pressure in plasma duct was typically in the range from 300 mTorr to 100 Torr, typically about 3 Torr, and can be increased up to 1000 Torr (1 atm) in pulsed remote arc mode with repetition frequency typically ranging from 50 to 2000 Hz. A pressure below 300 mTorr is too small to provide sufficient deposition rate of diamond coatings, while a pressure above 100 Torr is typically too high for operation of remote arc discharge in a constant current mode. However, in a pulse mode the operating pressure may be as high as atmospheric pressure (1000 Torr). During the diamond deposition process, substrate holder 2 with substrates to be coated 4 was connected to the positive terminal of remote arc power supply 535*a* when switch 611*a* was closed while switch 611*b* was open. In this case, the substrate holder served as an additional remote anode in reference to primary cathode 583 in cathode chamber 108. The current of remote arc power supply 535*a* conducted to substrate holder 2 in anodic mode was typically in the range from 50 to 500 A. Anodic mode of the operation of the substrate holder 2 was periodically switched to the negatively biased mode by opening switch 611*a* and closing switch 611*b*. In this cathodic mode of operation, the substrate holder was biased negatively by bias power supply 535*b* at a potential typically in the range from −10 to −100V in reference to primary arc cathode 583. During cathodic mode, the coating morphology and microstructure may be changed, which allows deposition of multilayer diamond coating with polycrystalline diamond layer interrupted by thin diamond layer of different morphology and microstructure. At a process pressure of 1-10 Torr, the deposition rate of the diamond coating in remote arc assisted diamond CVD process was typically in the range from 1 to 3 μm/hr. The deposition rate may be further increased by applying an external longitudinal magnetic field along the plasma duct (as shown in FIG. 7*h*).

Example 8. Large Area Filtered Cathodic Arc Deposition of TiN Coating on Diamond Powder In this example the apparatus of FIG. 13*a* was equipped with the same targets as in Example 4. The drum was loaded with 200 mesh diamond powder. In this case the inside surface of the drum 2 was provided with the ribs coaxial to the drum 17. The rotating speed of the drum 17 was set at 6 RPM to create a fluidized diamond powder inside of the drum 17. The coating process was performed identical to that of the Example 4 resulting in a deposition of TiN bondcoat on the surface of the diamond powder. The strength of the coated polycrystalline diamond particles has increased by 50% in comparison with uncoated powder.

Example 9. Synthesis of Diamond Powder in Rotating Remote Arc Plasma Assisted CVD Reactor In this example, the apparatus of FIG. 13*e* is used for synthesis of diamond powder on seed tungsten powder. The seed tungsten powder with average size of 3 μm is placed in the rotating fluidized bed chamber 17. Chamber 17 is rotated at 12 RPM. After evacuating the reactor, the reactive gas mixture of H$_2$+1% CH$_4$ is supplied along the rotating shaft 18*a* and the heater is used to establish a temperature within chamber 17 of about 800° C. The magnetic solenoid is turned on to establish a longitudinal magnetic field of 100 gauss along chamber 17. The primary arc discharge is ignited in primary cathodic arc chamber 108, where the pressure is set to 50 mTorr. The initial pressure in reaction chamber 17 is kept at 3 Torr by gas flow rate of 1500 sccm (standard cubic centimeters per minute). The remote arc discharge is conducted between primary cathode target 583 in cathode chamber 108 and remote anode 70 in fluidized bed chamber 17. The diamond coating deposition process lasts for 10 hrs resulting in synthesis of diamond powder having average size of 10 μm.

Example 10. Deposition of Diffusion Barrier Coating on Drug Powders

In this example, the Si-based inorganic diffusion barrier topcoat-shell is deposited on fine paclitaxel prepared by mechanical attrition. The coating deposition process, called the fluidized bed vapor plasma condensation (FBVPC) process, is conducted in a vacuum chamber equipped with a fluidized bed arrangement schematically shown in FIG. 13*a* which is capable of making a powder cloud in a vacuum against a RF-magnetron equipped with Si-target (not shown). The RF-magnetron coupled with filtered cathodic arc source can be installed within deflection section 44*a* of the plasma duct 44 similar to the arrangement shown in FIG. 10*a*. The plasma assisted CVD PACVD) source can be also used instead of magnetron to ionize and activate the Si-contained plasma environment for deposition of Si-based coating on powder. The PACVD plasma source can be attached to the back wall of the plasma duct 44 in the arrangement similar to that shown in FIG. 7*d*. The gas compositions during different coating deposition processes vary as according to the Table 2. The FBVPC process is capable of depositing a uniform continuous topcoat on a fluidized drug nanopowder, as opposed to the partially coated drug particles from multi-cycled magnetron sputtering. In the FBVPC process, a vapor, sputtering plasma, and/or a high-energy ion beam will interact with the cloud of fluidized drug nanopowder in the vacuum processing chamber as schematically illustrated in FIG. 13*a*. For coating deposition on fluidized powder substrates, the rotating drum-like fluidized powder container with seed bulk powder will be installed on the substrate holder platform. Our experimental work on the coating of sugar particles using the FBVPC process also indicated no structural or thermally-inspired degradation of the drug particles during the coating process thanks to low heating of powder exposed in FBVPC process. The FBVPC process is capable of forming a uniform continuous inorganic topcoat over drug-containing particles.

In one embodiment of the present invention, in order to prepare the drug-eluting nanocomposites, the coated drug particles will be deposited on a metal surface by conventional or ultrasonically enhanced electrophoretic deposition (EPD) process from a suspension of the organic-inorganic core-shell drug-containing nanoparticles mixed with a silica colloidal dispersion. The dimensions of the drug nanoparticles produced by mechanical attrition will range from 50 to 500 nm while the colloidal silica nanoparticles of 5 to 20 nm will fill the gaps between the core-shell drug particles, and will provide an interfacial toughening and will block the drug's outward boundary diffusion and inward diffusion from the surrounding media of the compacted nanocomposite material.

TABLE 2

Examples of Si-based topcoats deposited by RF-magnetron sputtering.

| Item # | Coating description | Thickness (nm) | % Porosity | Crystallinity | Gas Composition |
|---|---|---|---|---|---|
| 1 | a-Si | 10-100 | Porous (30%, 60%) | amorphous | Ar |
| 2 | a-Si | 10-100 | non-porous | amorphous | Ar |
| 3 | nc-Si | 10-100 | Porous (30%, 60%) | nano-crystalline | Ar |
| 4 | nc-Si | 10-100 | non-porous | nano-crystalline | Ar |
| 5 | a-Si—H | 10-100 | non-porous | amorphous | Ar + 10% H2 |
| 6 | a-Si—H | 10-100 | non-porous | amorphous | Ar + 20% H2 |
| 7 | a-Si—H | 10-100 | non-porous | amorphous | Ar + 30% H2 |
| 8 | a-Si—H | 10-100 | non-porous | amorphous | Ar + 40% H2 |
| 9 | a-Si—H | 10-100 | non-porous | amorphous | Ar + 50% H2 |
| 10 | $SiO_2$ | 10-100 | Porous (30%, 60%) | nanocrystalline | Ar + 30% O2 |
| 11 | $SiO_2$ | 10-100 | non-porous | nanocrystalline | Ar + 30% O2 |
| 12 | a-SiCH | 10-100 | non-porous | amorphous | Ar + 10% H2 |
| 13 | a-SiCH | 10-100 | non-porous | amorphous | Ar + 20% H2 |
| 14 | a-SiCH | 10-100 | non-porous | amorphous | Ar + 30% H2 |
| 15 | a-SiCH | 10-100 | non-porous | amorphous | Ar + 10% SiH4 + 30% H2 |
| 16 | nc-SiCH | 10-100 | non-porous | nanocrystalline | Ar + 10% H2 |
| 17 | nc-SiCH | 10-100 | non-porous | nanocrystalline | Ar + 20% H2 |
| 18 | nc-SiCH | 10-100 | non-porous | nanocrystalline | Ar + 30% H2 |
| 19 | nc-SiCH | 10-100 | non-porous | nanocrystalline | Ar + 10% SiH4 + 30% H2 |

In an embodiment of the filtered cathodic arc deposition method and apparatus of present invention shown in FIG. 13*a*, the inorganic topcoat-shell deposited on the drug-containing powder must be chosen to provide the same charge of the core-shell drug-containing particles as that of the colloidal silica nanoparticles in colloidal dispersion. Both inorganic coating and colloidal particles must have low conductivity which secure large electrical field between cathode and anode within the EPD setup. Appropriate surfactants can be also optionally added to the colloidal dispersion to prevent agglomeration of the drug-containing core-shell powder in dispersion. In this case the surfactant will be chosen to have the same charge in dispersion as colloidal silica and drug-containing core-shell powder. As both drug-containing particles and colloidal silica nanoparticles have the same charge they will move toward the same electrode (anode in anodic deposition or cathode in cathodic deposition) in EPD process forming a nanocomposite drug-containing organic-inorganic coating on metal substrate connected to appropriate electrode (anode or cathode). It is found in our experimental work that using different Si-based coatings, including pure silicon, silica, hydrogenated silicon carbide, or silicon nitride as a topcoat-shell deposited over the core-drug-containing particles results in fabrication of core-shell particles which have the same charge as silica in a colloidal dispersion. Without wishing to be bound by theory, this may be explained by the formation of an ultra-thin oxide scale forming a nm-thin silica layer on the surface of the Si-based compounds which secure the same charge of the coated core-shell powder as silica nanoparticles in a colloidal dispersion during the EPD of the drug-containing organic-inorganic nanocomposite coating.

Features described above as well as those claimed below may be combined in various ways without departing from the scope hereof. For example, it will be appreciated that aspects of one filtered cathodic arc deposition method or apparatus described herein may incorporate or swap features of another filtered cathodic arc deposition method or apparatus described herein. The following examples illustrate possible, non-limiting embodiments and combinations of embodiments described above. It should be clear that many other changes and modifications may be made to the methods and apparatuses herein without departing from the spirit and scope of this invention:

(A1) A filtered cathodic arc deposition apparatus may include (i) at least one cathodic arc source having at least one respective cathode located in at least one respective cathode chamber, (ii) a substrate chamber for holding, non-coincidentally with an optical axis of each of the at least one cathode, at least one substrate to be coated, (iii) a plasma duct in communication with the cathode chamber and the substrate chamber, and (iv) at least one offset deflecting coil, disposed adjacent to a side of the at least one cathode chamber, respectively, and spaced from the plasma duct, that generates a deflecting magnetic field within the at least one cathode chamber, respectively, for filtering output of the at least one cathodic arc source, respectively, by deflecting a plasma flow from therefrom into the plasma duct.

(A2) In the filtered cathodic arc deposition apparatus denoted as (A1), the at least one cathodic arc source may further include at least one respective stabilizing coil, disposed behind a respective one of the at least one cathode or surrounding a respective one of the at least one cathode, for controlling position of an arc discharge generated by the at least one cathodic arc source.

(A3) In the filtered cathodic arc deposition apparatuses denoted as (A1) and (A2), the at least one cathodic arc source may further include at least one anode associated with the at least one cathode for generating arc discharge.

(A4) The filtered cathodic arc deposition apparatuses denoted as (A1) through (A3) may include at least one focusing conductor adjacent to a focusing tunnel section of the plasma duct for generating a focusing magnetic field, wherein the focusing tunnel section is in communication with the substrate chamber.

(A5) In the filtered cathodic arc deposition apparatus denoted (A4), the deflecting magnetic field may couple with the focusing magnetic field to direct plasma toward a substrate holder in the substrate chamber.

(A6) The filtered cathodic arc deposition apparatuses denoted as (A1) through (A5) may include at least one deflecting coil adjacent to the plasma duct and the at least one cathode chamber.

(A7) In the filtered cathodic arc deposition apparatuses denoted as (A1) through (A6), the at least one offset deflecting coil may include at least one respective proximate offset conductor disposed adjacent to a side of the cathode chamber facing the substrate chamber, generating a saddle-shaped concave deflecting magnetic field in a part of the at least one cathode chamber closer to the substrate chamber for deflecting a plasma flow from the cathodic arc source into the plasma duct toward the substrate chamber.

(A8) In the filtered cathodic arc deposition apparatus denoted as (A7), the at least one offset deflecting coil may include at least one respective distal offset conductor disposed adjacent to a side of the cathode chamber that faces away from the substrate chamber, generating a saddle-shaped concave deflecting magnetic field in a part of the at least one cathode chamber further from the substrate chamber for deflecting a plasma flow from the at least one cathodic arc source into the plasma duct.

(A9) In the filtered cathodic arc deposition apparatus denoted as (A8), midpoint between corresponding ones of the at least one proximate offset conductor and at least one distal offset conductor may be located within a corresponding one of the at least one cathode chamber.

(A10) In the filtered cathodic arc deposition apparatus denoted as (A8), distance between corresponding ones of the at least one distal offset conductor and center of the at least one cathode may be 1.2 to 10 times distance between the center of the at least one cathode and back wall of a corresponding one of the at least one cathode chamber, wherein the back wall is a wall of the corresponding one of the at least one cathode chamber that is away from the substrate chamber.

(A11) In the filtered cathodic arc deposition apparatuses denoted as (A1) through (A6), the at least one offset deflecting coil may include at least one pair of distal offset conductors, disposed adjacent to a side of the at least one cathode chamber facing away from the substrate chamber on opposite sides of the plasma duct, generating a saddle-shaped concave deflecting magnetic field in a part of the at least one cathode chamber further from the substrate chamber for deflecting a plasma flow from the cathodic arc source into the plasma duct.

(A12) The filtered cathodic arc deposition apparatuses denoted as (A1) through (A11), may include a gaseous plasma source disposed at an end of the plasma duct opposite the substrate chamber.

(A13) In the filtered cathodic arc deposition apparatus denoted as (A12), the gaseous plasma source may include an electron-permeable shield permitting electrons to flow toward the substrate chamber.

(A14) The filtered cathodic arc deposition apparatuses denoted as (A12) and (A13) may include an arc plasma enhanced magnetron sputtering source in combination with one or more low pressure arc sources, selected from the group consisting of filtered arc, hollow cathode arc, thermionic arc, and any combination thereof, wherein each arc source couples with a magnetron source to increase an ionization rate of a magnetron sputtering flow.

(A15) In the filtered cathodic arc deposition apparatuses denoted as (A1) through (A14), the substrate chamber may include a substrate holder for holding the at least one substrate.

(A16) The filtered cathodic arc deposition apparatuses denoted as (A1) through (A15) may include baffles to trap the macroparticles, said baffles disposed at the walls of the plasma duct and/or cathode chamber.

(A17) The filtered cathodic arc deposition apparatuses denoted as (A1) through (A16) may include additional baffles to trap the macroparticles, said baffles disposed in the cathode camber in front of the cathode spaced from the cathode at 1 to 10 cm and having generally positive potential in reference to the cathode or be insulated and have a floating potential or be electrically grounded.

(A18) In the filtered cathodic arc deposition apparatus denoted as (A1) through (A16), the at least one cathode chamber may include a plurality of cathode chambers, each cathode chamber provided with an offset deflecting coil and a rastering coil with at least one rastering conductor parallel to the plane of rotation of metal plasma flow and disposed near the end of the cathode chamber adjacent to the plasma duct.

(A19) The filtered cathodic arc deposition apparatuses denoted as (A1) through (A18), may include electron beam evaporator disposed in the plasma duct near the stagnation area of the magnetic cusp created by the deflecting magnetic coils while at least one electron beam gun is positioned at the wall of the plasma duct adjacent to the wall occupied by the cathode chamber.

(B1) A filtered cathodic arc deposition apparatus may include (i) at least one cathodic arc source having at least one respective cathode located in at least one respective cathode chamber, (ii) a substrate chamber for holding, non-coincidentally with an optical axis of each of the at least one cathode, at least one substrate to be coated, (iii) a plasma duct in communication with the cathode chamber and the substrate chamber, (iv) at least one coil generating a deflecting magnetic field for deflecting the plasma toward the substrate chamber; and (v) a plurality of stream baffles having a positive potential relative to the plasma, installed in the plasma duct generally at an angle to a plane parallel to a direction of plasma flow, at position of the plurality of stream baffles, to enhance filtration of macroparticles.

(B2) In the filtered cathodic arc deposition apparatus denoted as (B1), the at least one cathodic arc source may further include at least one respective stabilizing coil, disposed behind a respective one of the at least one cathode or surrounding a respective one of the at least one cathode, for controlling position of an arc discharge generated by the at least one cathodic arc source.

(B3) In the filtered cathodic arc deposition apparatuses denoted as (B1) and (B2), the at least one cathodic arc source may further include at least one anode associated with the at least one cathode for generating arc discharge.

(B4) In the filtered cathodic arc deposition apparatuses denoted as (B1) through (B3), each of the plurality of stream baffles may be generally oriented to lie between a plane tangential to magnetic field lines at position of the plurality of stream baffles and a plane tangential to plasma stream lines at the position of the plurality of stream baffles.

(B5) In the filtered cathodic arc deposition apparatuses denoted as (B1) through (B3), the plurality of stream baffles may include adjustable stream baffles having adjustable orientation and an optimal orientation that is generally tangential to the plasma flow at the position of the plurality of stream baffles.

(B6) The filtered cathodic arc deposition apparatus denoted as (B5) may further include at least one probe, selected from the group of a Langmuir ion collecting probe and a mass flux collecting probe, for determining the optimal orientation, wherein the at least one probe (i) is disposed in the deflecting magnetic field or in a focusing magnetic field, (ii) has an ion collecting area with adjustable orientation, and (iii) measures a maximum ion current when the ion collecting area is perpendicular to the plasma flow.

(B7) In the filtered cathodic arc deposition apparatuses denoted as (B1) through (B5), the plurality of stream baffles may include a magnetic material for substantially tangential alignment of the stream baffles with field lines of the deflecting magnetic field, or field lines of a focusing magnetic field, under magnetic influence of the deflecting magnetic field.

(B8) The filtered cathodic arc deposition apparatuses denoted as (B1) through (B7) may include at least one focusing conductor adjacent to a focusing tunnel section of the plasma duct for generating a focusing magnetic field, wherein the deflecting magnetic field couples with the focusing magnetic field to direct plasma toward the at least one substrate.

(B9) The filtered cathodic arc deposition apparatuses denoted as (B1) through (B8) may include at least one offset deflecting coil, disposed adjacent to a side of the at least one cathode chamber facing the substrate chamber, which generates a deflecting magnetic field within the cathode chamber that deflects a plasma flow from the cathodic arc source into the plasma duct toward the substrate chamber.

(B10) The filtered cathodic arc deposition apparatuses denoted as (B1) through (B9) may include a gaseous plasma source disposed at an end of the plasma duct opposite the substrate chamber.

(B11) In the filtered cathodic arc deposition apparatus denoted as (B10), the gaseous plasma source may include an electron-permeable shield permitting electrons to flow toward the substrate chamber.

(B12) The filtered cathodic arc deposition apparatuses denoted as (B10) and (B11) may include an arc plasma enhanced magnetron sputtering source in combination with one or more low pressure arc sources, selected from the group consisting of filtered arc, hollow cathode arc, thermionic arc, and any combination thereof, wherein each arc source couples with a magnetron source to increase an ionization rate of a magnetron sputtering flow.

(C1 A filtered cathodic arc deposition apparatus may include (i) at least one cathodic arc source having at least one respective cathode located in at least one respective cathode chamber, (ii) a substrate chamber for holding, non-coincidentally with an optical axis of each of the at least one cathode, at least one substrate to be coated, (iii) a plasma duct in communication with the cathode chamber and the substrate chamber, (iv) at least one focusing coil surrounding a focusing tunnel section of the plasma duct for generating a focusing magnetic field, (v) at least one deflecting coil generating a deflecting magnetic field for deflecting the plasma along a path toward the substrate chamber, and (vi) at least one magnetron facing the at least one substrate, the magnetron being positioned such that at least a portion of magnetic force lines of the focusing magnetic field overlap and are substantially parallel with at least a portion of magnetic force lines generated by the magnetron, wherein each arc source couples with a magnetron source to increase an ionization rate of a magnetron sputtering flow.

(C2) In the filtered cathodic arc deposition apparatus denoted as (C1), the at least one cathodic arc source may further include at least one respective stabilizing coil, disposed behind a respective one of the at least one cathode or surrounding a respective one of the at least one cathode, for controlling position of an arc discharge generated by the at least one cathodic arc source.

(C3) In the filtered cathodic arc deposition apparatuses denoted as (C1) and (C2), the at least one cathodic arc source may further include at least one anode associated with the at least one cathode for generating arc discharge.

(C4) The filtered cathodic arc deposition apparatuses denoted as (C1) through (C3) may include a gaseous plasma source disposed at an end of the plasma duct opposite the substrate chamber to improve ionization of gaseous plasma component within filtered arc metal vapor plasma flow.

(C5) In the filtered cathodic arc deposition apparatus denoted as (C4), the gaseous plasma source may include an electron-permeable shield permitting electrons to flow toward the substrate chamber.

(C6) The filtered cathodic arc deposition apparatuses denoted as (C4) and (C5) may include an arc plasma enhanced magnetron sputtering source in combination with one or more low pressure arc sources, selected from the group consisting of filtered arc, hollow cathode arc, thermionic arc, and any combination thereof, wherein each arc source couples with a magnetron source to increase an ionization rate of a magnetron sputtering flow.

(C7) The filtered cathodic arc deposition apparatuses denoted as (C1) through (C6) may include at least one metal vapor source and a plurality of deflecting conductors, each of the plurality of deflecting conductors respectively associated with the at least one cathodic arc source and the metal vapor source, wherein at least some of the plurality of deflecting conductors can be independently activated to alternate between deposition of vapor associated with the at least one filtered arc source and metal vapor from the at least one metal vapor source.

(C8) The filtered cathodic arc deposition apparatuses denoted as (C1) through (C7) may include at least one offset deflecting coil, disposed adjacent to a side of the at least one cathode chamber facing the substrate chamber, which generates a deflecting magnetic field within the cathode chamber for deflecting a plasma flow from the arc source into the plasma duct toward substrate chamber.

(C9) The filtered cathodic arc deposition apparatuses denoted as (C1) through (C8) may further include at least one deflecting coil adjacent to the plasma duct and the at least one cathode chamber.

(C10) The filtered cathodic arc deposition apparatuses denoted as (C1) through (C9) may include a plurality of stream baffles, having a positive potential relative to the plasma, installed in the plasma duct generally at an angle to a plane parallel to a direction of plasma flow, to enhance filtration of macroparticles.

(C11) In the filtered cathodic arc deposition apparatuses denoted as (C1) through (C10), each of the plurality of stream baffles may be generally oriented to lie between a plane tangential to magnetic field lines at position of the stream baffles and a plane tangential to plasma stream lines at the position of the stream baffles.

(C12) In the filtered cathodic arc deposition apparatuses denoted as (C1) through (C11), the plurality of stream baffles may include a magnetic material for substantially tangential alignment of the stream baffles with field lines of the deflecting magnetic field under magnetic influence of the deflecting magnetic field.

(C13) The filtered cathodic arc deposition apparatuses denoted as (C1) through (C12) may include at least one focusing conductor adjacent to the focusing tunnel section for generating at least a portion of the focusing magnetic field.

(C14) In the filtered cathodic arc deposition apparatus denoted as (C13), the deflecting magnetic field may couple with the focusing magnetic field to direct plasma toward the at least one substrate.

(D1) A method of coating a substrate located in a substrate chamber that is in indirect communication with a cathode chamber via a plasma duct includes (i) generating an arc discharge using a cathode located in the cathode chamber and having an optical axis non-coincidental with the substrate, and (ii) deflecting plasma flow, from the cathode toward the plasma duct, before the plasma exits the cathode chamber.

(D2) The method denoted as (D1) may include generating a magnetic field for performing the step of deflecting.

(D3) A method of coating a substrate located in a substrate chamber includes (i) generating an arc discharge in a cathode chamber using a cathode having an optical axis non-coincidental with the substrate, and (ii) applying a potential voltage to a plurality of stream baffles, located in a plasma duct in communication with the cathode chamber and the substrate chamber in a potential range from −150V to +150V relative to the cathode.

(D4) The method denoted as (D3) may include (iii) orienting at least some of the plurality of stream baffles in an orientation generally transverse to a plane parallel to a direction of plasma flow in a section of the plasma duct, in which the plasma flow is deflected towards the substrate chamber.

(D5) In the methods denoted as (D3) and (D4), target ions may pass through spaces between the stream baffles while macroparticles and/or ions having a different weight or charge than the target ions follow a trajectory into faces of the baffles, such that at least some ions having different weight, different charge, or different weight and charge, as compared to the target ions, are blocked from reaching the substrates.

(D6) The methods denoted as (D4) and (D5) may include generating a magnetic field to deflect the plasma flow towards the substrate chamber.

(D7) The methods denoted as (D3) through (D6) may include orienting the plane of at least some of the plurality of stream baffles in an orientation that is generally parallel to magnetic force lines in the section of the plasma duct in which the plasma flow is deflected towards the substrate chamber.

(D8) The methods denoted as (D3) through (D7) may include orienting the plane of at least some of the plurality of stream baffles in an orientation that is generally parallel to streamlines of plasma flow in the section of the plasma duct in which the plasma flow is deflected towards the substrate chamber.

(D9) In the methods denoted as (D7) and (D8), the at least some of the plurality of stream baffles may be located in a section of the plasma duct, in which the plasma flow is deflected towards the substrate chamber.

(D10) In the methods denoted as (D7) through (D9), the at least some of the plurality of stream baffles may be located in front of the cathode in cathode chamber.

(D11) The methods denoted as (D3) through (D10) may include deflecting plasma flow, from the cathode toward the plasma duct, before the plasma exits the cathode chamber.

(E1) In the filtered cathodic arc deposition apparatus denoted as (A1), the at least one cathode chamber may include a plurality of cathode chambers, each provided with an offset deflecting coil and a rastering coil with at least one rastering conductor parallel to the plane of rotation of metal plasma flow and disposed near the end of the cathode chamber adjacent to the plasma duct.

(E2) In the filtered cathodic arc deposition apparatus denoted as (E1), the deflection section of the plasma duct may be a section of the plasma duct, in which the plasma flow is deflected toward the substrate chamber.

(E3) In the filtered cathodic arc apparatuses denoted as (E1) and (E2), each of the at least one cathode chamber may be generally tubular.

(E4) In the filtered cathodic arc apparatuses denoted as (E1) through (E3), the plasma duct may be generally tubular and the cathode chambers are positioned coaxially around the deflecting section of the plasma duct.

(E5) The filtered cathodic arc apparatuses denoted as (E1) through (E4) may include at least one gaseous plasma source located in the plasma duct generally concentric with the plasma duct.

(E6) In the filtered cathodic arc apparatus denoted as (E5), the gaseous plasma source may include a discharge chamber having a thermionic cathode, hollow cathode or vacuum arc cathode, wherein the discharge chamber has at least one opening facing the substrate chamber to permit plasma to flow from the discharge chamber into the plasma duct.

(E7) In the filtered cathodic arc apparatus denoted as (E6), the at least one substrate may be a tubular substrate in communication with an exit of the plasma duct.

(E8) The filtered cathodic arc apparatus denoted as (E7) may include at least one distal anode in an anode chamber in communication with the side of the tubular substrate opposite the plasma duct.

(E9) In the filtered cathodic arc apparatus denoted as (E8), the tubular substrate may be electrically insulated from the at least one cathode chamber and anodes associated therewith, and be connected to a negative pole of a high voltage power supply.

(E10) In the filtered cathodic arc apparatuses denoted as (E5) through (E9), the at least one substrate may include a flowable medium and the substrate chamber may include a mechanism for agitation of the medium.

(E11) In the filtered cathodic arc apparatus denoted as (E10), the flowable medium may be a powder.

(E12) The filtered cathodic arc apparatuses denoted as (E10) and (E11) may be used to coat or surface treat the flowable medium.

(E13) In the filtered cathodic arc apparatuses denoted as (E10) through (E12), the substrate chamber may be disposed vertically allowing the flowable medium to fall through the plasma.

(E14) The filtered cathodic arc apparatuses denoted as (E1) through (E13) may further include an additional anode disposed in the plasma duct for repelling ions, macroparticles, or a combination thereof.

(E15) In the filtered cathodic arc apparatus denoted as (E14), the additional anode may include baffles for capturing macroparticles.

(E16) In the filtered cathodic arc apparatuses denoted as (E14) and (E15), the additional anode may include at least one focusing coil for focusing the plasma vapor, rastering the plasma vapor, or a combination thereof.

(E17) In the filtered cathodic arc apparatuses denoted as (E14) through (E16), the additional anode may include a vapor source and an evaporation opening in optical alignment with the substrate chamber.

(E18) The filtered cathodic arc apparatus denoted as (E17) may include a crucible disposed in the plasma duct and an electron beam gun disposed on the opposite side of the substrate holder coaxially with the plasma duct.

(E19) The filtered cathodic arc apparatuses denoted as (E1) through (E18) may include baffles disposed in front of a cathode target at a distance from the evaporating surface of the cathode target ranging from 10 to 100 mm.

(E20) In the filtered cathodic arc apparatus denoted as (E19), the baffles may be insulated and have a floating potential or be electrically grounded.

(E21) In the filtered cathodic arc apparatus denoted as (E19), the baffles may be connected to a positive pole of a power supply and serve as an additional proximate anode improving arc stability.

(E22) The filtered cathodic arc apparatuses denoted as (E1) through (E21) may include a solenoid, disposed about a focusing tunnel section of the plasma duct, to create a magnetic field cusp in the plasma guide having a plane of symmetry transversal to an axis of the plasma guide.

(E23) The filtered cathodic arc apparatus denoted as (E22) may include a positively charged repelling solenoid disposed adjacent to a back wall of the plasma duct in alignment with the solenoid disposed about the focusing tunnel, the back wall of the plasma duct being a wall that is located on the side of the plasma duct that is away from the substrate chamber.

(E24) The filtered cathodic arc apparatuses denoted as (E1) through (E23) may include at least one set of baffles located in the plasma duct parallel to the plane of rotation of a filtered arc flow.

(E25) In the filtered cathodic arc apparatus denoted as (E24), the at least one set of baffles may be surrounded by a magnetic field.

(E26) The filtered cathodic arc apparatuses denoted as (E1) through (E25) may include two cathode chambers disposed in opposition and one or more solenoids disposed in a saddle configuration including conductors aligned along the intersections of the plasma duct with the cathode chambers and conductors extending obliquely toward a back wall of the plasma guide, generating a poloidal magnetic field confining the filtered arc vapor plasma flow and toroidal magnetic field directing the filtered arc vapor plasma flow toward the coating chamber, the back wall of the plasma duct being a wall that is located on the side of the plasma duct that is away from the substrate chamber.

(E27) The filtered cathodic arc apparatus denoted as (E26), may include focusing solenoids disposed around the front and back of the plasma duct to create a magnetic cusp configuration in the plasma duct, wherein the back of the plasma duct is further from the substrate chamber, as compared to the front of the plasma duct.

(E28) The filtered cathodic arc deposition apparatuses denoted as (E1) and (E14) through (E18), may include electron beam evaporator disposed in the plasma duct, near the stagnation area of the magnetic cusp created by the deflecting magnetic coils, while at least one electron beam gun is positioned at the wall of the plasma duct adjacent to the wall occupied by the cathode chamber.

(F1) A filtered cathodic arc apparatus for generating energetic particles may include (i) a shielded cathodic arc source, positioned in a cathode chamber coupled to a proximal end of a plasma duct, for generating and delivering electrons to the proximal end of the plasma duct, (ii) a magnetic solenoid surrounding at least a portion of the plasma duct for radially confining plasma in the plasma duct, (iii) at least one distal anode associated with the cathode of the cathodic arc source for generating a remote arc discharge along the plasma duct, and (iv) an output port for outputting energetic particles generated within the plasma duct.

(F2) The filtered cathodic arc apparatus denoted as (F1) may include a gas handling system for providing discharge gas.

(F3) Either or both of the filtered cathodic arc apparatuses denoted as (F1) and (F2) may include a baffle that is (a) positioned between the cathode chamber and the plasma duct and (b) configured to restrict flow of gas between the cathode chamber and the plasma duct.

(F4) In the filtered cathodic arc apparatus denoted as (F3), the baffle may be configured with only a single opening between the cathode chamber and the plasma duct.

(F5) In the filtered cathodic arc apparatus denoted as (F4), the single opening may have diameter, or similar transverse extent if the single opening is not circular, in the range from 1 mm to 5 cm.

(F6) Any of the filtered cathodic arc apparatuses denoted as (F3) through (F5) may include (a) a gas inlet for receiving discharge gas into the plasma duct and (b) a gas outlet for removing gas from the cathode chamber, such that the gas inlet and the gas outlet may cooperate with the baffle to maintain a higher pressure in the plasma duct than in the cathode chamber.

(F7) Any of the filtered cathodic arc apparatuses denoted as (F1) through (F6) may include an anode chamber for containing the distal anode, wherein the anode chamber is coupled to a distal end of the plasma duct opposite the proximal end.

(F8) In the filtered cathodic arc apparatus denoted as (F7), a gas inlet may be connected to the anode chamber to receive the discharge gas into the plasma duct via the anode chamber.

(F9) Any of the filtered cathodic arc apparatuses denoted as (F1) through (F8) may include a power supply for providing positive voltage to the plasma duct to accelerate ions generated by the remote arc discharge and generate the energetic particles through collisions between the ions.

(F10) Any of the filtered cathodic arc apparatus denoted as (F1) through (F9) may be configured to accelerate the ions in a direction that is substantially perpendicular to a longitudinal axis of the plasma duct.

(F11) Any of the filtered cathodic arc apparatuses denoted as (F1) through (F10) may be configured to generate the energetic particles from collisions between ions accelerating towards a longitudinal axis of the plasma duct.

(F12) In any of the filtered cathodic arc apparatuses denoted as (F1) through (F11), the energetic particles may be neutrons.

(F13) In any of the filtered cathodic arc apparatuses denoted as (F1) through (F12), the cathodic arc source may include an electron-permeable shield permitting electrons to flow toward the plasma duct.

(F14) In any of the filtered cathodic arc apparatuses denoted as (F1) through (F13), the plasma duct may include at least one intermediate anode to extend the remote arc discharge along the plasma duct.

(F15) In the filtered cathodic arc apparatus denoted as (F14), the at least one intermediate anode may include an array of wire electrodes disposed coaxially with plasma duct for generating a plasma sheath around each of the wire electrodes.

(F16) In the filtered cathodic arc apparatus denoted as (F15), the array of wire electrodes may be electrically connected to the plasma duct.

(F17) The filtered cathodic arc apparatus denoted as (F16) may include a direct current (DC) power supply having positive output connected to the plasma duct and negative output connected to the cathode for generating a remote arc discharge plasma within the array of wire electrodes.

(F18) In the filtered cathodic arc apparatus denoted as (F17), the DC power supply may be configured to generate the remote arc discharge plasma with discharge current in the range from 50 Amperes to 10,000 Amperes and discharge voltage in the range from 30 Volts 500 Volts.

(F19) The filtered cathodic arc apparatus denoted as (F16) may include an unipolar pulse power supply, having positive output connected to the plasma duct and negative output connected to the cathode, for generating a high voltage potential within the array of wire electrodes.

(F20) In the filtered cathodic arc apparatus denoted as (F19), the unipolar pulse power supply may be configured to generate the positive potential in the range from 0.1 kV to 10,000 kilovolt.

(F21) In any of the filtered cathodic arc apparatuses denoted as (F15) through (F20), the array of wire electrodes may have density such that the plasma sheaths respectively associated with the wire electrodes overlap and provide a positive plasma potential throughout the array of wire electrodes.

(F22) In the filtered cathodic arc apparatus denoted as (F21), the array of wire electrodes may have density such that the positive plasma potential is uniform within the array of wire electrodes.

(F23) In either or both of the cathodic arc apparatuses denoted as (F21) and (F22), the diameter of each of the wire electrodes may range from 0.01 mm to 1 mm, and the distance between neighboring wire electrodes may range from 0.1 mm to 5 cm.

(F24) In any of the filtered cathodic arc apparatuses denoted as (F15) through (F23), the array of wire electrodes may radially surround a region that is coaxial with the plasma duct.

(F25) In the filtered cathodic arc apparatus denoted as (F24), the region may be substantially centered about the longitudinal axis of the magnetic solenoid.

(F26) In any of the filtered cathodic arc apparatuses denoted as (F1) through (F25), the plasma duct may be tubular.

(F27) A filtered cathodic arc method for generating energetic particles may include (i) injecting gas into a plasma duct, (ii) pumping out the gas through a cathode chamber connected to the plasma duct and, optionally, through the plasma duct, (iii) generating primary arc discharge in the gas in the cathode chamber, (iv) generating a remote arc discharge in the gas in the plasma duct, (v) generating a magnetic field in the plasma duct, substantially along a longitudinal direction of the plasma duct, to at least partially confine, in the radial dimension, a plasma created by the remote arc discharge and the ions, and (vi) applying a positive pulse voltage to the plasma duct to accelerate ions in the plasma duct and generate energetic particles from collisions between the ions.

(F28) The method denoted as (F27) may further include a step of restricting gas flow from the plasma duct to the cathode chamber to maintain a higher pressure in the plasma duct than in the cathode chamber to provide (a) a lower pressure environment in the cathode chamber favorable for generating the primary arc discharge and (b) a higher pressure environment in the plasma duct favorable for producing the energetic particles.

(F29) In the method denoted as (F28), the steps of restricting, injecting, and pumping may cooperate to produce (a) a pressure in the plasma duct in the range from 300 mTorr to 1000 Torr, or up to 1 atmosphere in pulse mode, and (b) a pressure in the cathode chamber less than 200 mTorr.

(F30) In the method denoted as (F28), the steps of restricting, injecting, and pumping may cooperate to produce a pressure in the plasma duct that is at least three times the pressure in the cathode chamber.

(F31) In the method denoted as (F30), the pressure in the cathode chamber may be less than 200 mTorr.

(F32) In any of the methods denoted as (F27) through (F31), the step of injecting may include injecting the gas into the plasma duct via an anode chamber, wherein the anode chamber is coupled to a distal end of the plasma duct and the cathode chamber is coupled to a proximal end of the plasma duct opposite the distal end.

(F33) In any of the methods denoted as (F27) through (F32), the step of generating the primary arc discharge may include generating the primary arc discharge between a cathode and a proximal anode, wherein both the cathode and the proximal anode are located in the cathode chamber.

(F34) In any of the methods denoted as (F27) through (F33), the step of generating the primary arc discharge may include generating the primary arc discharge with a current in the range from 50 Amperes to 500 Amperes and a voltage in the range from 20 Volts to 50 Volts.

(F35) In any of the methods denoted as (F27) through (F34), the step of generating the remote arc discharge may include generating the remote arc discharge between a cathode, located in the cathode chamber, and a distal anode located in an anode chamber coupled to a distal end of the plasma duct, wherein the cathode chamber is coupled to a proximate end of the plasma duct opposite the distal end.

(F36) In any of the methods denoted as (F27) through (F35), the step of generating the magnetic field may include generating a magnetic field of strength between 0.01 Tesla and 20 Tesla.

(F37) In any of the methods denoted as (F27) through (F36), the step of applying the positive pulse voltage may include applying a voltage in the range from 0.1 kilovolt to 10,000 kilovolt.

(F38) Any of the methods denoted as (F27) through (F37) may include generating an intermediate arc discharge, between a cathode, in the cathode chamber, and an array of wire electrodes in the plasma duct, wherein the wire electrodes are oriented substantially parallel to the longitudinal direction.

(F39) In the method denoted as (F38), the step of generating the intermediate arc discharge may include generating the intermediate arc discharge with current in the range from 50 Amperes to 10,000 Amperes and voltage in the range from 30 Volts to 500 Volts.

(F40) In any of the methods denoted as (F27) through (F39), the step of injecting gas may include injecting a deuterium-tritium mixture.

(F41) In the method denoted as (F40), the energetic particles may be neutrons that are generated in fusion reactions between accelerated deuterium and tritium ions within the plasma duct.

(F42) In the method denoted as (F41), the neutrons may have energy of 14.1 Megaelectronvolt (MeV).

(F43) A filtered cathodic arc apparatus for energetic ion deposition may include (i) a shielded cathodic arc source, positioned in a cathode chamber coupled to a proximal end of a plasma duct, for generating and delivering electrons to the proximal end of the plasma duct, (ii) at least one distal anode associated with the cathode of the cathodic arc source for generating a remote arc discharge along the plasma duct, (iii) at least one intermediate anode associated with the cathode of the cathodic arc source for generating energetic ions within the plasma duct, and (iv) a substrate holder within the plasma duct for holding substrates to be coated by the energetic ions.

(F44) In the apparatus denoted as (F43), the substrate holder may be grounded, insulated, or have floating potential.

(F45) Either of both of the filtered cathodic arc apparatuses denoted as (F43) and (F44) may be configured to accelerate the ions toward the substrate holder.

(F46) In any of the filtered cathodic arc apparatuses denoted as (F43) through (F45), the substrate holder may include a heater to heat the substrates to be coated.

(F47) In any of the filtered cathodic arc deposition apparatuses denoted as (F43) through (F46), the substrate holder may be positively biased by connecting to positive pole of an auxiliary arc power supply while its negative pole is connected to the cathode of the shielded cathodic arc source.

(F48) In any of the filtered cathodic arc deposition apparatuses denoted as (F43) through (F46), the substrate holder may be negatively biased by connecting to negative pole of an auxiliary arc power supply while its positive pole is connected to the cathode of the shielded cathodic arc source or grounded.

(F49) In any of the filtered cathodic arc apparatuses denoted as (F43) through (F48), the gas composition in the plasma duct may include argon, methane and hydrogen for deposition of polycrystalline diamond coatings.

(F50) Any of the filtered cathodic arc apparatuses denoted as (F43) through (F49) may include a gas handling system for providing discharge gas.

(F51) The filtered cathodic arc apparatuses denoted as (F50) may include a baffle that is (a) positioned between the cathode chamber and the plasma duct and (b) configured to restrict flow of gas between the cathode chamber and the plasma duct.

(F52) In the filtered cathodic arc apparatus denoted as (F51), the baffle may be configured with only a single opening between the cathode chamber and the plasma duct.

(F53) In the filtered cathodic arc apparatus denoted as (F52), the single opening may have diameter, or similar transverse extent if the single opening is not circular, in the range from 1 mm to 5 cm.

(F54) Any of the filtered cathodic arc apparatuses denoted as (F51) through (F53) may include (a) a gas inlet for receiving discharge gas into the plasma duct and (b) a gas outlet for removing gas from the cathode chamber, such that the gas inlet and the gas outlet may cooperate with the baffle to maintain a higher pressure in the plasma duct than in the cathode chamber.

(F55) Any of the filtered cathodic arc apparatuses denoted as (F43) through (F54) may include an anode chamber for containing the distal anode, wherein the anode chamber is coupled to a distal end of the plasma duct opposite the proximal end.

(F56) In the filtered cathodic arc apparatus denoted as (F55), the gas inlet may be connected to the anode chamber to receive the discharge gas into the plasma duct via the anode chamber.

(F57) In any of the filtered cathodic arc apparatuses denoted as (F43) through (F56), the cathodic arc source may include an electron-permeable shield permitting electrons to flow toward the plasma duct.

(F58) In any of the filtered cathodic arc apparatuses denoted as (F43) through (F57), the at least one intermediate anode may include an array of wire electrodes disposed coaxially with plasma duct for generating a plasma sheath around each of the wire electrodes.

(F59) In the filtered cathodic arc apparatus denoted as (F58), the array of wire electrodes may be electrically connected to the plasma duct.

(F60) The filtered cathodic arc apparatus denoted as (F59) may include a direct current (DC) power supply having positive output connected to the plasma duct and negative output connected to the cathode for generating a remote arc discharge plasma within the array of wire electrodes.

(F61) In the filtered cathodic arc apparatus denoted as (F60), the DC power supply may be configured to generate the remote arc discharge plasma with discharge current in the range from 50 Amperes to 10,000 Amperes and discharge voltage in the range from 30 Volts 500 Volts.

(F62) The filtered cathodic arc apparatus denoted as (F59) may include an unipolar pulse power supply, having positive output connected to the plasma duct and negative output connected to the cathode, for generating a high voltage potential within the array of wire electrodes.

(F63) In the filtered cathodic arc apparatus denoted as (F62), the unipolar pulse power supply may be configured to generate the positive potential in the range from 0.1 kV to 10,000 kilovolt.

(F64) In any of the filtered cathodic arc apparatuses denoted as (F58) through (F63), the array of wire electrodes may have density such that the plasma sheaths respectively associated with the wire electrodes overlap and provide a positive plasma potential throughout the array of wire electrodes.

(F65) In the filtered cathodic arc apparatus denoted as (F64), the array of wire electrodes may have density such that the positive plasma potential is uniform within the array of wire electrodes.

(F66) In either or both of the cathodic arc apparatuses denoted as (F64) and (F65), the diameter of each of the wire electrodes may range from 0.01 mm to 1 mm, and the distance between neighboring wire electrodes may range from 0.1 mm to 5 cm.

(F67) In any of the filtered cathodic arc apparatuses denoted as (F58) through (F66), the array of wire electrodes may radially surround a region that is coaxial with the plasma duct.

(F68) In the filtered cathodic arc apparatus denoted as (F67), the region may be substantially centered about the longitudinal axis of the magnetic solenoid.

(F69) In any of the filtered cathodic arc apparatuses denoted as (F43) through (F68), the plasma duct may be rectangular.

(F70) A reactor for plasma assisted chemical vapor deposition may include (a) a plasma duct configured to contain one or more substrates to be coated by ions, (b) a remote arc discharge generation system for generating a flow of electrons through the plasma duct in direction from a proximal end of the plasma duct toward a distal end of the plasma duct, (c) a gas inlet coupled to the distal end for receiving a reactive gas, (d) a gas outlet coupled to the proximal end for removing at least a portion of the reactive gas to generate a flow of the reactive gas through the plasma duct in direction from the distal end toward the proximal end, so as to generate the ions from collisions between the electrons and the reactive gas, and (e) a separating baffle positioned between the plasma duct and the gas outlet for restricting flow of the reactive gas out of the plasma duct to maintain a high pressure in the plasma duct to increase rate of deposition of the ions onto the substrates, wherein the separating baffle is configured with at least one opening between the cathode chamber and the plasma duct, and wherein each of the at least one opening has transverse extent in the range from 1 mm to 5 cm.

(F71) The reactor denoted as (F70) may further include, within the plasma duct, at least one intermediate anode associated with the cathode for extending the remote arc discharge along the plasma duct to assist generation of the ions.

(F72) In the reactor denoted as (F71), the at least one intermediate anode may include an array of wire electrodes disposed coaxially with the plasma duct for generating a plasma sheath around each of the wire electrodes when the wire electrodes are positively biased.

(F73) In any of the reactors denoted as (F70) through (F72), the remote arc discharge generation system may include (i) a shielded cathodic arc source, positioned in a cathode chamber coupled to the proximal end, for generating the electrons and (ii) a distal anode for cooperating with cathode of the cathodic arc source to generate the flow of electrons.

(F74) In the reactor denoted as (F73), the separating baffle may be positioned between the plasma duct and the cathode chamber, and the gas outlet may be implemented in the cathode chamber, to (1) maintain the high pressure in the plasma duct while maintaining a lower pressure in the cathode chamber favorable for generation of the electrons and (2) achieve overlapping counter-propagating flow of the electrons and the reactive gas through the at least one opening of the separating baffle.

(F75) In either or both of the reactors denoted as (F73) and (F74), the distal anode may further serve as a substrate holder for holding the substrates.

(F76) In any of the reactors denoted as (F73) through (F75), the shielded cathodic arc source may be configured to produce metal vapor that condenses on walls of the cathode chamber to form a getter pump for pumping the reactive gas out of the plasma duct through the separating baffle.

(F77) In any of the reactors denoted as (F73) through (F76), the substrate holder may be a rotatable substrate holder configured to rotate the substrates during deposition of the ions thereon.

(F78) In the reactor denoted as (F77), the rotating substrate holder may be positioned coaxially to axis of the remote arc discharge column formed between shielded cathode chamber and remote anode.

(F79) Any of the reactors denoted as (F70) through (F78) may include a substrate holder for holding the substrates and a magnetron sputtering source, facing the substrate holder, for generating a metal sputtering flow to deposit metal on the substrates.

(F80) The reactor denoted as (F79) may further include at least one intermediate anode that includes an array of wire electrodes disposed adjacent to a target surface of the magnetron sputtering source for ionization of metal flow generated by the magnetron sputtering source when the wire electrodes are positively biased.

(F81) Any of the reactors denoted as (F70) through (F80) may further include a heated substrate holder for holding and heating the substrates.

(F82) In any of the reactors denoted as (F70) through (F81), at least a portion of interior surface of the plasma duct may be dielectric.

(F83) Any of the reactors denoted as (F80) through (F82) may further include at least one magnetic coil for producing a magnetic field, transverse to longitudinal axis of the plasma duct, to bias a remote arc plasma column toward periphery of reaction zone for reactions between the electrons and the reactive gas.

(F84) In any of the reactors denoted as (F70) through (F83), the separating baffle may implement each of the at least one opening as an alternating stack of metal washers and dielectric washers.

(F85) In any of the reactors denoted as (F70) through (F83), the separating baffle may be formed at least in part by refractory metal, wherein each of the at least one opening is formed the refractory metal to prevent heat-induced damage to the separating baffle.

(F86) Any of the reactors denoted as (F70) through (F85) may further including a water-cooling system coupled with the separating baffle to prevent overheating of the separating baffle.

(F87) In the reactor denoted as (F70), the substrates may be particles of a powder and the plasma duct may be a rotatable barrel for coating of the particles disposed in the rotatable barrel onto the substrates in a fluidized bed process, wherein the rotatable barrel is configured for having its rotation axis be non-parallel to force of gravity such that the powder, during rotation of the rotatable barrel, continuously falls through the rotatable barrel to be coated by the ions.

(F88) In the reactor denoted as (F70), the substrates may be particles of a powder, and the plasma duct may include an inlet for receiving a powder at the proximal end such that, when the plasma duct is oriented with the proximal end above the distal end, gravity causes the particles to fall from the proximal end to the distal end while being coated by the ions.

(F89) The reactor denoted as (F88) may further include a reservoir, at the distal end, for collecting the powder, or alternatively, the reactor denoted as (F88) may further include a coating chamber, at the distal end, for holding one or more substrates to be coated by the powder subsequently to coating of the powder by the ions.

(F90) A reactor-based method for plasma assisted chemical vapor deposition may include (a) flowing a reactive gas through a plasma duct in direction from a distal end of the plasma duct toward a proximal end of the plasma duct, the plasma duct containing one or more substrates to be coated, (b) flowing electrons through the plasma duct in direction from the proximal end toward the distal end to cooperate with the reactive gas to form a remote arc discharge plasma throughout the plasma duct so as to deposit, onto the substrates, ions generated in the remote arc discharge plasma, and (c) restricting gas flow out of the plasma duct to maintain a high pressure of the reactive gas in the plasma duct to increase rate of deposition of the ions onto the substrates.

(F91) In the coating deposition method denoted as (F90), the steps of flowing a reactive gas and restricting gas flow may cooperate to maintain a pressure in the plasma duct in the range from 300 mTorr to 1 atmosphere.

(F92) In either of both of the coating deposition methods denoted as (F90) and (F91), the step of flowing electrons may include producing an electron current density across the plasma duct in the range from 1 mA/cm2 to 1000 A/cm2.

(F93) In any of the coating deposition methods denoted as (F90) through (F92), the step of flowing a reactive gas may include flowing the reactive gas and a carrier gas through the plasma duct.

(F94) In the coating deposition method denoted as (F93), the carrier gas may be one or more noble gases.

(F95) In the coating deposition method denoted as (F94), the reactive gas may include hydrogen and carbon for depositing a diamond coating onto the substrates.

(F96) In the coating deposition method denoted as (F94), the reactive gas may include boron, hydrogen and nitrogen for depositing a cubic boron nitride coating onto the substrates.

(F97) In any of the coating deposition methods denoted as (F90) through (F96), the steps of flowing a reactive gas and restricting gas flow may include letting the reactive gas into the plasma duct at the distal end, and pumping the reactive gas out of the proximal end through a flow-restricting separating baffle positioned at the proximal end.

(F98) In the coating deposition method denoted as (F97), the step of flowing electrons may include generating a remote arc discharge between (i) a cathode located in a cathode chamber coupled to the proximal end and (ii) a distal anode, such that the remote arc discharge passes through the flow-restricting separating baffle and through at least a portion of the plasma duct from the proximal end toward the distal end.

(F99) The coating deposition method denoted as (F98) may further include extending, using at least one positively biased intermediate anode disposed within the plasma duct, the remote arc discharge along the plasma duct to assist generation of the ions.

(F100) In the coating deposition method denoted as (F99), the at least one intermediate anode may include an array of wire electrodes disposed coaxially with the plasma duct for generating a plasma sheath around each of the wire electrodes.

(F101) In any of the coating deposition methods denoted as (F98) through (F100), the steps of flowing a reactive gas and restricting gas flow may cooperate to maintain a pressure in the plasma duct in range from 300 mTorr to 1 atmosphere, while maintaining a pressure in the cathode chamber below 200 mTorr to provide low-pressure conditions favorable for the step of generating the remote arc discharge.

(F102) In any of the coating deposition methods denoted as (F98) through (F101), in the step of generating, the distal anode may be selected from the group consisting of the substrate holder, the substrates, and a combination thereof.

(F103) The coating deposition method denoted as (F102) may further include heating the substrates using a heater external to the substrates and the substrate holder.

(F104) Any of the coating deposition methods denoted as (F90) through (F103) may further include generating metal ions using a magnetron sputtering source located in the plasma duct and facing the substrates, and depositing the metal ions onto the substrates.

(F105) A reactor for plasma-assisted generation of energetic particles may include (a) a plasma duct, (b) a shielded cathodic arc source positioned in a cathode chamber coupled to a proximal end of the plasma duct, (c) a distal anode, positioned in an anode chamber at a distal end of the plasma duct, for cooperating with cathode of the cathodic arc source to generate a remote arc discharge through the plasma duct, (d) a gas inlet coupled to the distal end for receiving a reactive gas to facilitate reactions between the reactive gas and electrons of the remote arc discharge, (d) an array of wire electrodes disposed coaxially with the plasma duct for, when the wire electrodes are positively biased, extending the remote arc discharge and generating a plasma sheath around each of the wire electrodes to further facilitate the reactions, (e) a magnetic solenoid surrounding at least a portion of the plasma duct for radially confining plasma, associated with the remote arc discharge, in the plasma duct, and (f) an output port for outputting energetic ions generated from the reactions and accelerated by applying a positive bias voltage to the plasma duct.

(F106) In the reactor denoted as (F105), the array of wire electrodes may have density such that the plasma sheaths respectively associated with the wire electrodes overlap and provide a positive plasma potential throughout the array of wire electrodes.

(F107) In the reactor denoted as (F106), the array of wire electrodes may radially surround a region that is coaxial with the plasma duct.

(F108) Any of the reactors denoted as (F105) through (F107) may further include (i) a gas outlet coupled to the proximal end for removing at least a portion of the reactive gas to generate a flow of the reactive gas through the plasma duct in direction from the distal end toward the proximal end, and (ii) a separating baffle positioned between the plasma duct and the gas outlet for restricting flow of the reactive gas out of the plasma duct to maintain a high pressure in the plasma duct, the separating baffle including at least one opening for flowing the reactive gas and electrons of the remote arc discharge through the at least one opening in opposite directions.

(G1) A filtered cathodic arc deposition apparatus, may include (a) at least one cathodic arc source having (i) at least one cathode and at least one igniter contained within at least one cathode chamber, (ii) at least one anode associated with the cathode for generating arc discharge, and (iii) at least one stabilizing coil, disposed behind or surrounding a respective cathode for controlling position of arc discharge; (b) a substrate chamber containing a substrate holder for mounting at least one substrate to be coated, the substrate holder being non-coincidental with an optical axis of each cathode; (c) a plasma duct with a deflection section in communication with the cathode chamber and a focusing tunnel section in communication with the substrate chamber; and (d) at least one offset deflecting coil disposed adjacent to a side of the cathode chamber, and spaced from the plasma duct, generating a deflecting magnetic field within the cathode chamber for filtering output of the cathodic arc source by deflecting plasma flow therefrom into the plasma duct.

(G2) The filtered cathodic arc apparatus denoted as (G1) may include at least one focusing conductor adjacent to the focusing tunnel section for generating a focusing magnetic field.

(G3) The filtered cathodic arc apparatuses denoted as (G1) and (G2) may further include at least one deflecting coil adjacent to the plasma duct and the at least one cathode chamber.

(G4) In the filtered cathodic arc apparatus denoted as (G2), the deflecting magnetic field may couple with the focusing magnetic field to direct plasma toward the substrate holder.

(G5) In the filtered cathodic arc apparatuses denoted as (G1) through (G4), the at least one offset deflecting coil may include at least one respective proximate conductor disposed adjacent to a side of the at least one cathode chamber facing the substrate chamber, generating a saddle-shaped concave deflecting magnetic field in a part of the cathode chamber closer to the substrate chamber for deflecting a plasma flow from the at least one cathodic arc source into the plasma duct toward the substrate chamber.

(G6) In the filtered cathodic arc apparatus denoted as (G5), the at least one offset deflecting coil may include at least one respective distal offset conductor disposed adjacent to a side of the at least one cathode chamber facing away from the substrate chamber, generating a saddle-shaped concave deflecting magnetic field in a part of the at least one cathode chamber further from the substrate chamber for deflecting a plasma flow from the at least one cathodic arc source into the plasma duct.

(G7) In the filtered cathodic arc apparatuses denoted as (G1) through (G6), at least one proximate deflecting coil may include at least one respective pair of proximate offset conductors, disposed adjacent to a side of the at least one cathode chamber facing the substrate chamber on opposite sides of the plasma duct, generating a saddle-shaped concave deflecting magnetic field in a part of the at least one cathode chamber closer to the substrate chamber for deflecting a plasma flow from the at least one cathodic arc source into the plasma duct toward the substrate chamber.

(G8) In the filtered cathodic arc apparatuses denoted as (G1) through (G7), at least one distal deflecting coil may include at least one respective pair of distal offset conductors, disposed adjacent to a side of the at least one cathode chamber facing away from the substrate chamber on opposite sides of the plasma duct, generating a saddle-shaped concave deflecting magnetic field in a part of the at least one cathode chamber further from the substrate chamber for deflecting a plasma flow from the at least one cathodic arc source into the plasma duct.

(G9) In the filtered cathodic arc apparatus denoted as (G6), midpoint between corresponding ones of the at least one proximate offset conductor and the at least one distal offset conductor may be located within a corresponding one of the cathode chamber.

(G10) In the filtered cathodic arc apparatuses denoted as (G6) and (G9), distance between corresponding ones of the at least one distal offset conductor and center of the at least one cathode may be 1.2 to 10 times distance between the center of the at least one cathode and back wall of a corresponding one of the at least one cathode chamber, the back wall being a wall of the corresponding one of the at least one cathode chamber that is away from the plasma duct.

(G11) The filtered cathodic arc apparatuses denoted as (G1) through (G8) may include a gaseous plasma source disposed at an end of the plasma duct opposite the substrate chamber.

(G12) In the filtered cathodic arc apparatus denoted as (G11), the gaseous plasma source may include an electron-permeable shield permitting electrons to flow toward the substrate chamber.

(G13) The filtered cathodic arc apparatuses denoted as (G11) and (G12) may include an arc plasma enhanced magnetron sputtering source in combination with one or more low pressure arc sources, selected from the group consisting of filtered arc, hollow cathode arc, thermionic arc, and any combination thereof, wherein each arc source couples with a magnetron source to increase an ionization rate of a magnetron sputtering flow.

(G14) A filtered cathodic arc apparatus includes (a) at least one cathodic arc source including (i) at least one cathode and at least one igniter contained within at least one cathode chamber, (ii) at least one anode associated with the at least one cathode for generating arc discharge, and (iii) at least one stabilizing coil, disposed behind or surrounding a respective cathode for controlling position of the arc discharge; (b) a substrate chamber containing a substrate holder for mounting at least one substrate to be coated, the substrate holder being positioned non-coincidental with an optical axis of the at least one cathode; (c) a plasma duct in communication with the cathode chamber and the substrate chamber; (d) at least one coil generating a deflecting magnetic field for deflecting the plasma toward the substrate chamber; and (e) a plurality of stream baffles having positive potential relative to the plasma to enhance filtration of macroparticles when in the plasma duct generally at an angle to a plane parallel to direction of plasma flow.

(G15) In the filtered cathodic arc apparatus denoted as (G14), each of the plurality of stream baffles may be generally oriented to lie between a plane tangential to magnetic field lines at position of the plurality of stream baffles and a plane tangential to plasma stream lines at the position of the plurality of stream baffles.

(G16) In the filtered cathodic arc apparatuses denoted as (G14) and (G15), the plurality of stream baffles may include adjustable stream baffles having adjustable orientation and an optimal orientation that is generally tangential to the plasma flow at the position of the plurality of stream baffles.

(G17) The filtered cathodic arc apparatus denoted as (G16) may further include at least one probe, selected from the group of a Langmuir ion collecting probe and a mass flux collecting probe, for determining the optimal orientation, the at least one probe (i) being disposed in the deflecting magnetic field, (ii) having an ion collecting area with adjustable orientation, and (iii) measuring a maximum ion current when the ion collecting area is perpendicular to the plasma flow.

(G18) In the filtered cathodic arc apparatuses denoted as (G14) through (G16), the stream baffles may include a magnetic material for substantially tangential alignment of the stream baffles with field lines of the deflecting magnetic field lines under magnetic influence of the deflecting magnetic field.

(G19) The filtered cathodic arc apparatuses denoted as (G14) though (G18) may include at least one focusing conductor adjacent to a focusing tunnel section of the plasma duct for generating a focusing magnetic field, wherein the deflecting magnetic field couples with the focusing magnetic field to direct plasma toward the substrate holder.

(G20) The filtered cathodic arc apparatuses denoted as (G14) through (G19) may include at least one offset deflecting coil disposed adjacent to a side of the at least one cathode chamber facing the substrate chamber, generating a deflecting magnetic field within the cathode chamber for deflecting a plasma flow from the cathodic arc source into the plasma duct.

(G21) The filtered cathodic arc apparatuses denoted as (G14) through (G20) may include a gaseous plasma source disposed at an end of the plasma duct opposite from the substrate chamber.

(G22) In the filtered cathodic arc apparatus denoted as (G21), the gaseous plasma source may include an electron-permeable shield permitting electrons to flow toward the substrate chamber.

(G23) The filtered cathodic arc apparatuses denoted as (G21) and (G22) may include an arc plasma enhanced magnetron sputtering source in combination with one or more low pressure arc sources, selected from the group consisting of filtered arc, hollow cathode arc, thermionic arc, or any combination thereof, wherein each arc source couples with a magnetron source to increase an ionization rate of a magnetron sputtering flow.

(G24) A filtered cathodic arc apparatus may include (a) a cathodic arc source including (i) at least one cathode and at least one igniter contained within at least one cathode chamber, respectively, (ii) at least one anode associated with the cathode for generating arc discharge, and (iii) at least one stabilizing coil, disposed behind or surrounding a respective cathode, for controlling position of the arc discharge; (b) a substrate chamber containing a substrate holder for mounting at least one substrate to be coated, the substrate holder being positioned non-coincidental with an optical axis of the at least one cathode; (c) a plasma duct, in communication with each cathode chamber and the substrate chamber and comprising (i) at least one focusing coil surrounding a focusing tunnel section of the plasma duct for generating a focusing magnetic field and (ii) at least one deflecting coil generating a deflecting magnetic field for deflecting the plasma along a path toward the substrate chamber; and (d) at least one magnetron facing the substrate holder, the magnetron being positioned such that at least a portion of magnetic force lines of the focusing magnetic field overlap and are substantially parallel with at least a portion of magnetic force lines generated by the magnetron, wherein each arc source couples with a magnetron source to increase an ionization rate of a magnetron sputtering flow.

(G25) The filtered cathodic arc apparatus denoted as (G24) may include a gaseous plasma source disposed at an end of the plasma duct opposite the substrate chamber.

(G26) In the filtered cathodic arc apparatus denoted as (G25), the gaseous plasma source may include an electron-permeable shield permitting electrons to flow toward the substrate chamber.

(G27) The filtered cathodic arc apparatuses denoted as (G24) through (G26) may include an arc plasma enhanced magnetron sputtering source in combination with one or more low pressure arc sources, selected from the group consisting of filtered arc, hollow cathode arc, thermionic arc, and any combination thereof, wherein each arc source couples with a magnetron source to increase an ionization rate of a magnetron sputtering flow.

(G28) The filtered cathodic arc apparatuses denoted as (G24) through (G27) may include at least one metal vapor source and a plurality of deflecting conductors, each of the plurality of deflecting conductors respectively associated with each cathodic arc source and the metal vapor source, wherein at least some of the plurality of deflecting conductors can be independently activated to alternate between deposition of vapor associated with the at least one filtered arc source and metal vapor from the at least one metal vapor source.

(G29) The filtered cathodic arc apparatuses denoted as (G24) through (G28) may include at least one offset deflecting coil respectively disposed adjacent to a side of each cathode chamber facing the substrate chamber, generating a deflecting magnetic field within the cathode chamber for deflecting a plasma flow from the arc source into the plasma duct.

(G30) The filtered cathodic arc apparatuses denoted as (G24) through (G29) may further include at least one deflecting coil adjacent to the plasma duct and each cathode chamber, respectively.

(G31) The filtered cathodic arc apparatuses denoted as (G24) through (G30) may include a plurality of stream baffles, having a positive potential relative to the plasma, installed in the plasma duct generally at an angle to a plane parallel to a direction of plasma flow, to enhance filtration of macroparticles.

(G32) In the filtered cathodic arc apparatus denoted as (G31), each of the plurality of stream baffles may be generally oriented to lie between a plane tangential to magnetic field lines at position of the stream baffles and a plane tangential to plasma stream lines at the position of the stream baffles.

(G33) In the filtered cathodic arc apparatuses denoted as (G31) and (G32), the plurality of stream baffles may include a magnetic material for substantially tangential alignment of the stream baffles with field lines of the deflecting magnetic field under magnetic influence of the deflecting magnetic field.

(G34) The filtered cathodic arc apparatuses denoted as (G24) through (G33) may include at least one focusing conductor adjacent to the focusing tunnel section for generating at least a portion of the focusing magnetic field, wherein the deflecting magnetic field couples with the focusing magnetic field to direct plasma toward the substrate holder.

I claim:

1. A reactor for plasma-assisted chemical vapor deposition, comprising:
    a plasma duct configured to contain one or more substrates to be coated by ions;
    a cathode chamber coupled to a proximal end of the plasma duct;
    a remote arc discharge generation system for generating a flow of electrons through the plasma duct in direction from the proximal end toward a distal end, the remote arc discharge generation system including (a) a cathodic arc source, positioned in the cathode chamber, for generating the electrons and (b) a distal anode, positioned in the plasma duct or past the distal end, for causing the flow of electrons;
    a gas inlet coupled to the distal end for receiving a reactive gas;
    a gas outlet coupled to the cathode chamber for removing at least a portion of the reactive gas to generate a flow of the reactive gas through the plasma duct in direction from the distal end toward the proximal end, so as to generate the ions from collisions between the electrons and the reactive gas; and
    a separating baffle positioned between the proximal end and the cathode chamber for restricting flow of the reactive gas out of the plasma duct to maintain (a) a high pressure in the plasma duct to increase rate of deposition of the ions onto the substrates and (b) a low pressure in the cathode chamber favorable for generation of the electrons, the separating baffle being configured with at least one orifice between the cathode chamber and the plasma duct, each of the at least one orifice having transverse extent in range from 1 mm to 5 cm.

2. The reactor of claim 1, further comprising, within the plasma duct, at least one intermediate anode associated with the cathode for extending the remote arc discharge along the plasma duct to assist generation of the ions.

3. The reactor of claim 2, the at least one intermediate anode comprising an array of wire electrodes disposed coaxially with the plasma duct for generating a plasma sheath around each of the wire electrodes when the wire electrodes are positively biased.

4. The reactor of claim 1, the
    cathodic arc source being a shielded cathodic arc source.

5. The reactor of claim 1, the distal anode further serving as a substrate holder for holding the substrates.

6. The reactor of claim 4, the shielded cathodic arc source being configured to produce metal vapor that condenses on walls of the cathode chamber to form a getter pump for pumping the reactive gas out of the plasma duct through the separating baffle.

7. The reactor of claim 5, the substrate holder being a rotatable substrate holder configured to rotate the substrates during deposition of the ions thereon.

8. The reactor of claim 7, the rotating substrate holder being positioned coaxially to axis of the flow of the electrons.

9. The reactor of claim 1, further comprising:
    a substrate holder for holding the substrates; and
    a magnetron sputtering source, facing the substrate holder, for generating a metal sputtering flow to deposit metal on the substrates.

10. The reactor of claim 9, further comprising at least one intermediate anode including an array of wire electrodes disposed adjacent to a target surface of the magnetron sputtering source for ionization of metal flow generated by the magnetron sputtering source when the wire electrodes are positively biased.

11. The reactor of claim 1, the substrates being particles of a powder, the plasma duct being a rotatable barrel for coating of the particles disposed in the rotatable barrel onto the substrates in a fluidized bed process, the rotatable barrel being configured for having its rotation axis be non-parallel to force of gravity such that the powder, during rotation of the rotatable barrel, continuously falls through the rotatable barrel to be coated by the ions.

12. The reactor of claim 1, the substrates being particles of a powder, the plasma duct comprising an inlet for receiving the powder at the proximal end such that, when the plasma duct is oriented with the proximal end above the distal end, gravity causes the particles to fall from the proximal end to the distal end while being coated by the ions, the reactor further comprising a reservoir, at the distal end, for collecting the powder.

13. The reactor of claim 1, the substrates being particles of a powder, the plasma duct comprising an inlet for receiving the powder at the proximal end such that, when the plasma duct is oriented with the proximal end above the distal end, gravity causes the particles to fall from the proximal end to the distal end while being coated by the ions, the reactor further comprising a coating chamber, at the distal end, for holding one or more secondary substrates to be coated by the powder subsequently to coating of the powder by the ions.

14. The reactor of claim 1, further comprising a heated substrate holder for holding and heating the substrates.

15. The reactor of claim 1, at least a portion of interior surface of the plasma duct being dielectric.

16. The reactor of claim 1, further comprising at least one magnetic coil for producing a magnetic field, transverse to longitudinal axis of the plasma duct, to bias a remote arc plasma column toward periphery of reaction zone for reactions between the electrons and the reactive gas.

17. The reactor of claim 1, the separating baffle implementing each of the at least one orifice as an alternating stack of metal washers and dielectric washers.

18. The reactor of claim 1, the separating baffle being formed at least in part by refractory metal, each of the at least one orifice being formed the refractory metal to prevent heat-induced damage to the separating baffle.

19. The reactor of claim 1, further including a water-cooling system coupled with the separating baffle to prevent overheating of the separating baffle.

20. The reactor of claim 1, plasma potential increasing across the at least one orifice from the cathode chamber to the plasma duct.

* * * * *